(12) United States Patent
Anderson

(10) Patent No.: US 10,680,562 B2
(45) Date of Patent: Jun. 9, 2020

(54) GUITAR AMPLIFIER SYSTEM AND METHOD

(71) Applicant: Thomas Clayton Anderson, Frisco, TX (US)

(72) Inventor: Thomas Clayton Anderson, Frisco, TX (US)

( * ) Notice: Subject to any disclaimer, the term of this patent is extended or adjusted under 35 U.S.C. 154(b) by 0 days.

(21) Appl. No.: 16/383,827

(22) Filed: Apr. 15, 2019

(65) Prior Publication Data

US 2019/0319591 A1    Oct. 17, 2019

Related U.S. Application Data

(60) Provisional application No. 62/658,755, filed on Apr. 17, 2018.

(51) Int. Cl.
| | |
|---|---|
| *H03G 9/18* | (2006.01) |
| *H03F 3/187* | (2006.01) |
| *H03F 3/213* | (2006.01) |
| *H03G 3/30* | (2006.01) |
| *H03G 5/10* | (2006.01) |
| *H04R 3/00* | (2006.01) |
| *G10K 15/08* | (2006.01) |
| *H03F 3/45* | (2006.01) |

(52) U.S. Cl.
CPC .......... *H03F 3/187* (2013.01); *G10K 15/08* (2013.01); *H03F 3/213* (2013.01); *H03G 3/3005* (2013.01); *H03G 5/10* (2013.01); *H04R 3/00* (2013.01); *H03F 3/45071* (2013.01); *H03F 2200/03* (2013.01); *H03F 2200/129* (2013.01); *H03F 2200/549* (2013.01); *H03F 2203/45116* (2013.01); *H03F 2203/45512* (2013.01); *H03F 2203/45528* (2013.01); *H03G 2201/103* (2013.01)

(58) Field of Classification Search
None
See application file for complete search history.

(56) References Cited

U.S. PATENT DOCUMENTS 8,204,254 B2 * 6/2012 Shannon .................. G10H 1/46
                                                      381/102

* cited by examiner

*Primary Examiner* — Ping Lee
(74) *Attorney, Agent, or Firm* — Kevin Mark Klughart

(57) ABSTRACT

A solid-state semiconductor guitar amplifier system/method mimicking the audio performance characteristics of conventional vacuum tube guitar amplifiers is disclosed. The disclosed system/method incorporates solid-state semiconductor circuitry implementing an input audio preamplifier (IAP) having asymmetric gain control (AGC) that feeds wave shape transformer (WST) circuitry implementing a piecewise/diode breakpoint (PDB) transform that emulates a conventional vacuum tube voltage-current transfer (VIT) characteristic. A breakpoint threshold controller (BTC) determines the offset associated with application of the PDB operation to the audio signal. Once the PDB transform has been applied to the audio signal, it is further processed by pick attack sag compressor (PAC) circuitry that applies positive sag control (PSC) and negative sag control (NSC) compression envelopes to the overall signal shape before presenting the resulting peak compressed signal through an audio volume control (AVC) and conventional solid-state semiconductor speaker power amplifier (SPA) for application to an audio speaker.

20 Claims, 112 Drawing Sheets

12AX7 AVERAGE TRANSFER CHARACTERISTICS
EACH SECTION $E_f = 12.6$ VOLTS

Plate Current (mA)

Grid Voltage (V)

*Prior Art*

0600

EL84 AVERAGE TRANSFER CHARACTERISTICS
*Prior Art*

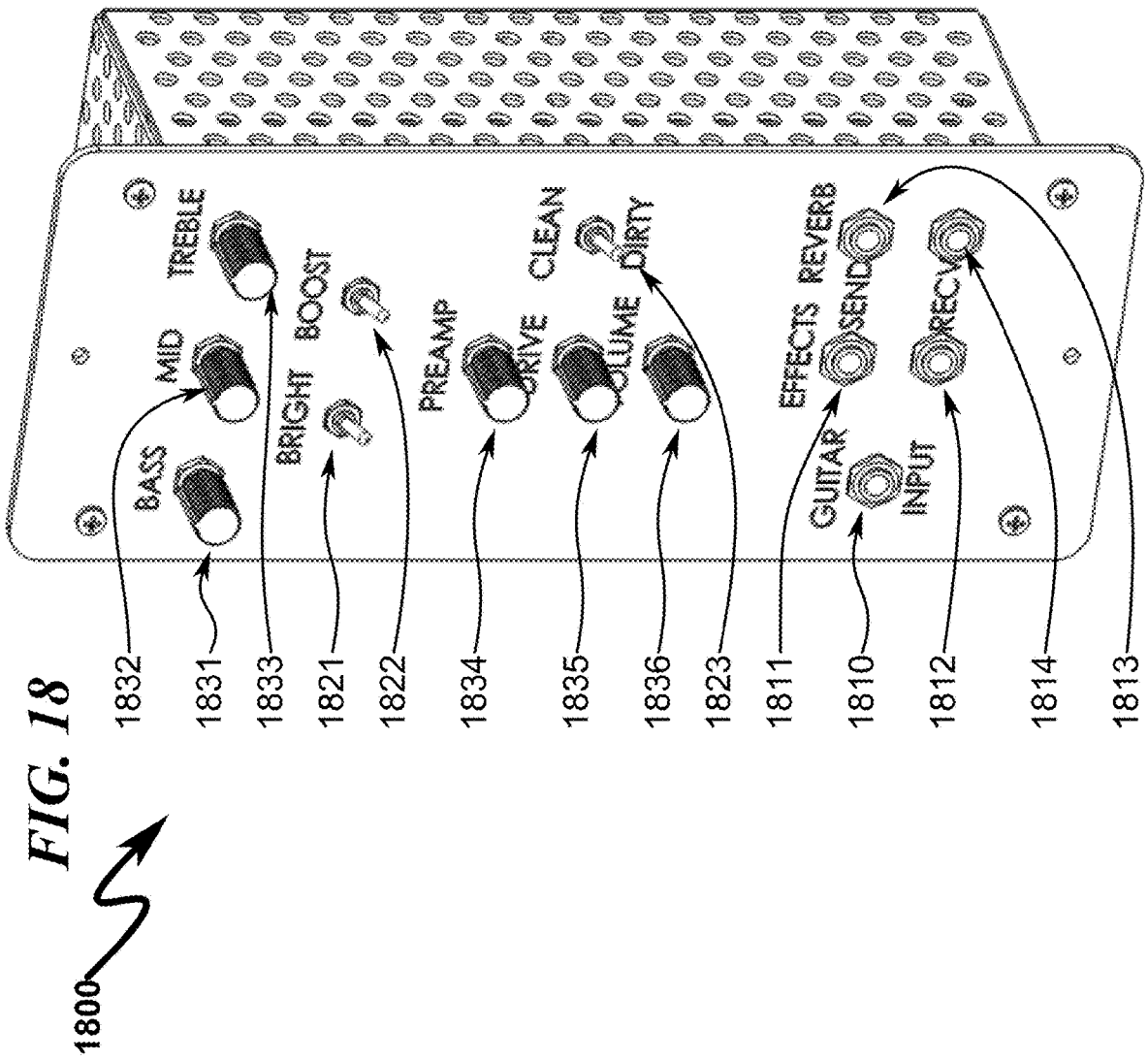
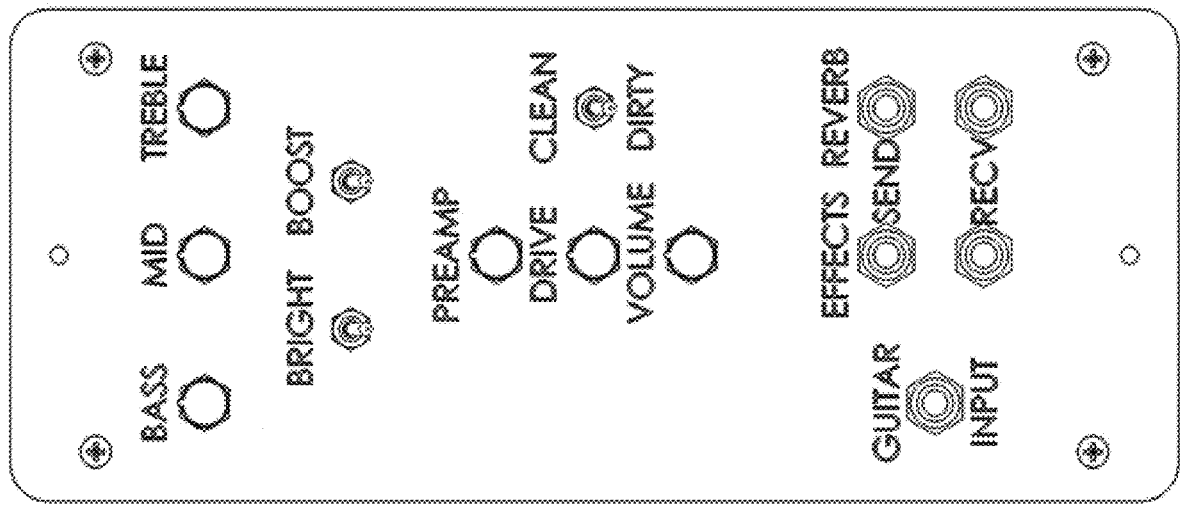
FIG. 18

| | Components | Functional Description |
|---|---|---|
| 1. | $R_{Ri}$ | Acts as a volume control by setting the voltage level allowed to the amplifier's input terminals. |
| 2. | $R_A$ | Provides DC voltage biasing for the single supply operation and bias current for the positive input terminal. |
| 3. | $C_A$ | Provides bias filtering. |
| 4. | C | Provides AC coupling at the input and output of the amplifier for single supply operation. |
| 5. | $R_B$ | Prevents currents from entering the amplifier's non-inverting input which may be passed through to the load upon power-down of the system due to the low input impedance of the circuitry when the under-voltage circuitry is off. This phenomenon occurs when the supply voltages are below 1.5V. |
| 6. | $C_C$ [1] | Reduces the gain (bandwidth of the amplifier) at high frequencies to avoid quasi-saturation oscillations of the output transistor. The capacitor also suppresses external electromagnetic switching noise created from fluorescent lamps. |
| 7. | $R_i$ | Inverting input resistance to provide AC Gain in conjunction with $R_{f1}$. |
| 8. | $C_i$ [1] | Feedback capacitor. Ensures unity gain at DC. Also a low frequency pole (highpass roll-off) at: $f_c = 1/(2\pi R_i C_i)$ |
| 9. | $R_{f1}$ | Feedback resistance to provide AC Gain in conjunction with $R_i$. |
| 10. | $R_{f2}$ [1] | At higher frequencies feedback resistance works with $C_f$ to provide lower AC Gain in conjunction with $R_{f1}$ and $R_i$. A high frequency pole (lowpass roll-off) exists at: $f_c = [R_{f1} R_{f2} (s + 1/R_2 C_f)]/[(R_{f1} + R_{f2})(s + 1/C_f(R_{f1} + R_{f2}))]$ |
| 11. | $C_f$ [1] | Compensation capacitor that works with $R_{f1}$ and $R_{f2}$ to reduce the AC Gain at higher frequencies. |
| 12. | $R_M$ | Mute resistance set up to allow 0.5 mA to be drawn from pin 8 to turn the muting function off. $-R_M$ is calculated using: $R_M \leq (|V_{EE}| - 2.6V)/I8$ where $I8 \geq 0.5$ mA. |
| 13. | $C_M$ | Mute capacitance set up to create a large time constant for turn-on and turn-off muting. |
| 14. | $R_{SN}$ [1] | Works with $C_{SN}$ to stabilize the output stage by creating a pole that eliminates high frequency oscillations. |
| 15. | $C_{SN}$ [1] | Works with $R_{SN}$ to stabilize the output stage by creating a pole that eliminates high frequency oscillations. $f_c = 1/(2\pi R_{SN} C_{SN})$ |
| 16. | L [1] | Provides high impedance at high frequencies so that R may decouple a highly capacitive load and reduce the Q of the series resonant circuit due to capacitive load. Also provides a low impedance at low frequencies to short out R and pass audio signals to the load. |
| 17. | R [1] | |
| 18. | $C_S$ | Provides power supply filtering and bypassing. |
| 19. | S1 | Mute switch that mutes the music going into the amplifier when opened |

(1) Optional components dependent upon specific design requirements.

4500

4600

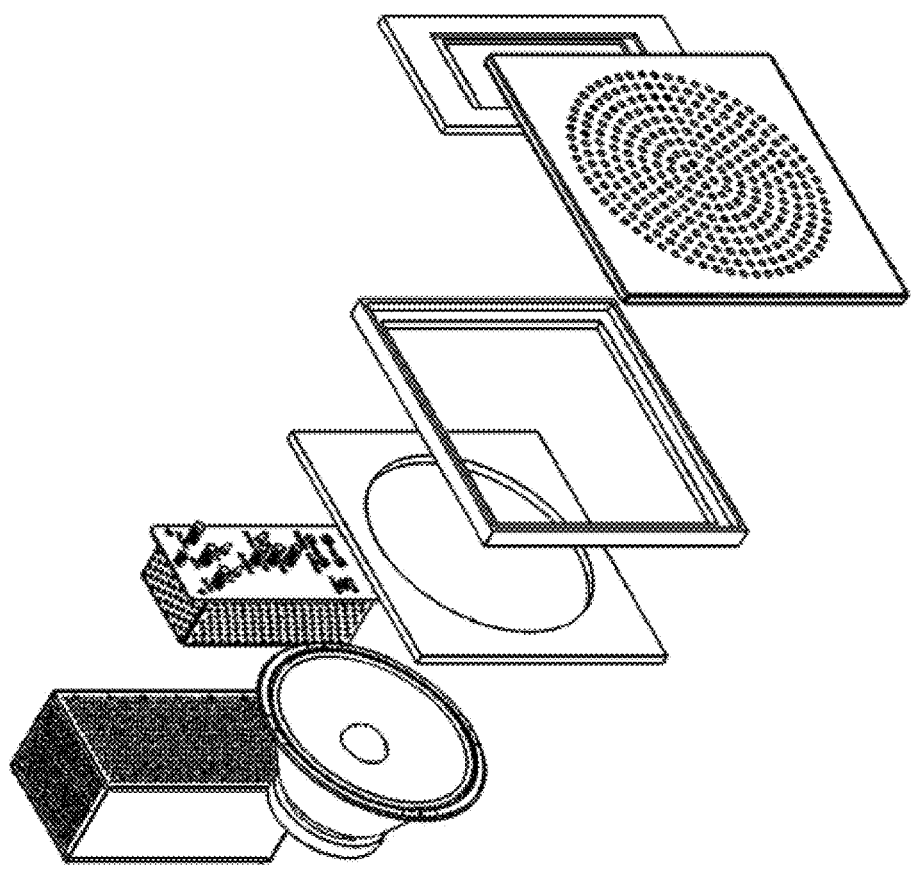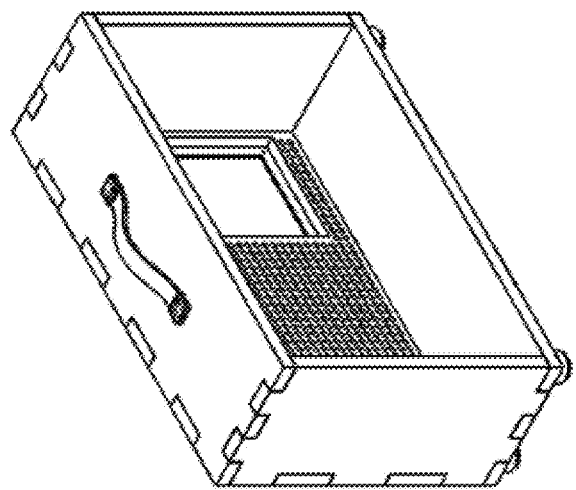
FIG. 56

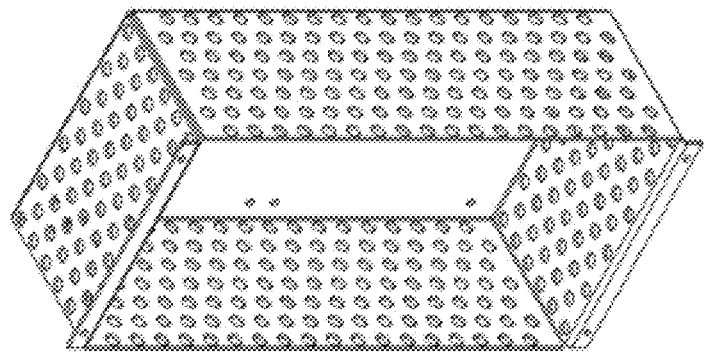
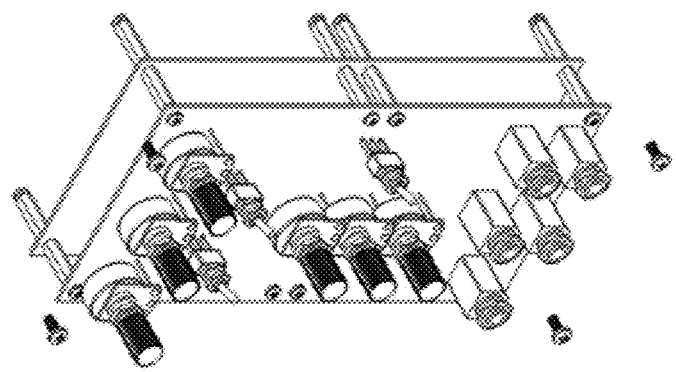
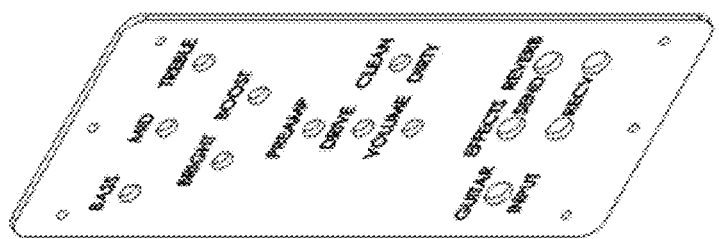
FIG. 57

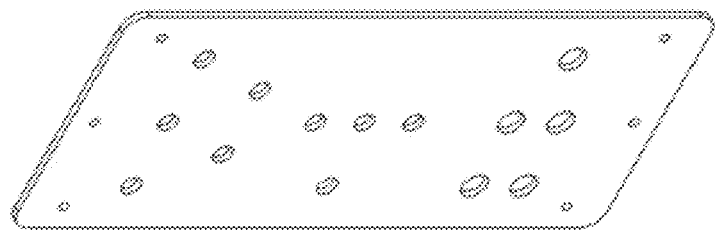
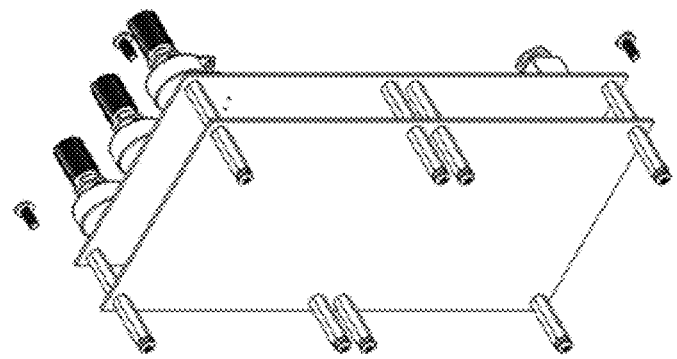
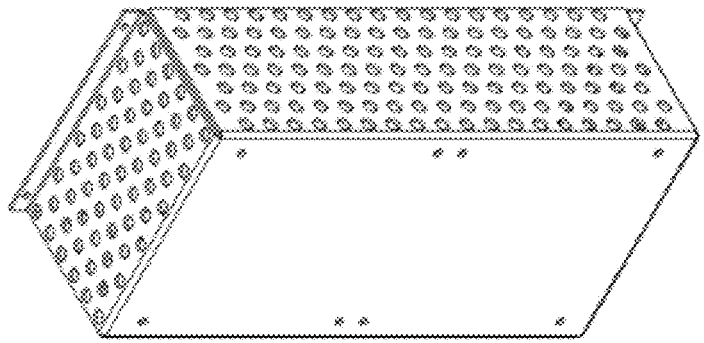
FIG. 59
5900

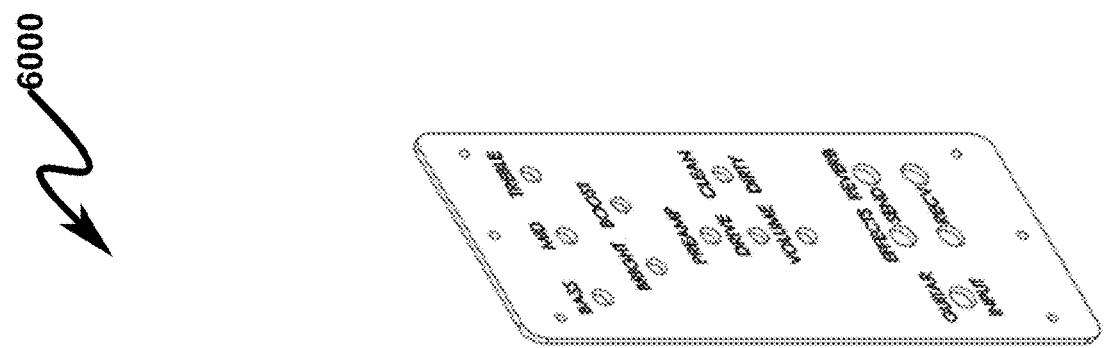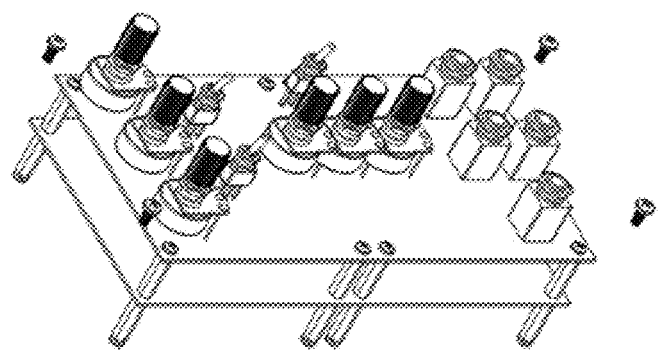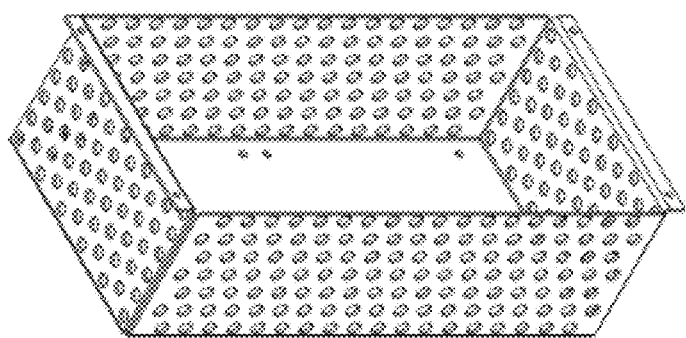
FIG. 60

Simple Clip Transfer

GUITAR AMPLIFIER SYSTEM AND METHOD

CROSS REFERENCE TO RELATED APPLICATIONS

Provisional Patent Applications

This Utility Patent Application claims benefit under 35 U.S.C. § 119 and incorporates by reference United States Provisional Patent Application for GUITAR AMPLIFIER SYSTEM AND METHOD inventor Thomas Clayton Anderson, filed with the USPTO on Apr. 17, 2018, with Ser. No. 62/658,755, EFS ID 32361272, confirmation number 8179.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention relates to the implementation of a solid-state guitar amplifier having audio performance characteristics that mimic that of a vacuum tube amplifier.

PRIOR ART AND BACKGROUND OF THE INVENTION

Traditional guitar amplifiers are constructed using vacuum tube technology. As such, these amplifiers have traditionally provided amazing tone implemented using simple schematic construction. Drawbacks to these implementations have included the overall system weight, expense of the completed system, power consumption, generally good tonal quality only when at high amplification, aging vacuum tubes causing changes in tonal quality and characteristic, vacuum tube reliability, failure of vacuum tubes, expense of vacuum tubes, availability of vacuum tubes, and the requirement of heavy and expensive output transformers.

Solutions to these deficiencies using solid state amplifiers have met with limited success because even though replacing vacuum tube components with solid-state transistors resulted in an overall lighter and smaller system having consistent tonal qualities with greater flexibility in features with high reliability and high volume capabilities, the overall tonal quality of the system was severely lacking when compared to conventional vacuum tube amplifiers.

As such, a long felt need in the field of guitar amplifiers has been the implementation of a solid-state guitar amplifier having the tonal qualifies of conventional vacuum tube amplifiers as well as the advantages inherent in a solid-state semiconductor design.

BRIEF SUMMARY OF THE INVENTION

The present invention pertains to a system and method in which a solid-state power amplifier is configured to mimic the performance characteristics of a vacuum tube guitar amplifier. The system and method mimic the static and dynamic characteristics of a vacuum tube amplifier using a four-stage approach as described below.

The first stage implements an input audio preamplifier (IAP) incorporating asymmetric gain control (AGC) to mimic the cathode-clipping that may be incorporated in conventional vacuum tube cascaded common-cathode guitar amplifiers. This AGC provides for different audio gain controls for positive and negative guitar audio pickup (GAP) signal amplification.

The second stage provides for wave shape transformation in which the non-linear characteristics of a selected vacuum tube are dissected into a plurality of piecewise/diode breakpoints (PDB) and individually implemented using solid-state components. This allows the non-linear V-I characteristic of a selected vacuum tube to be implemented using a plurality of solid-state circuits to form an overall emulated vacuum tube transfer characteristic. The baseline gain value on which this transfer is adjusted using a breakpoint threshold control (BTC) adjustment.

The third stage provides for pick attach sag compression (PAC) that compresses the power supply envelope available for amplification based on positive sag control (PSC) and negative sag control (NSC) adjustments. The PSC and NSC adjustments determine the power supply positive recovery and negative supply decay rates respectively and allow compression of the overall guitar audio signaling (GAS) that mimics the non-ideal power supply characteristics normally found in vacuum tube amplifiers.

The fourth stage provides for audio volume control (AVC) and solid-state amplification of the resulting compressed audio signal by a speaker power amplifier (SPA) and presentation to an audio speaker output (ASO). The SPA may be implemented using conventional audio power amplifier integrated circuits as are commonly available and well known in the art. While the SPA in this configuration is typically of a conventional linear amplification variety, it will nonetheless present audio signaling to the ASO that mimics that of a conventional vacuum tube amplifier as the previous pre-amplification and dynamic compression stages have introduced the required time-dependent non-linearity in the overall system to mimic that of a conventional vacuum tube amplifier.

The overall combination of these stages provides for a compact, efficient, and reliable solid-state guitar amplifier that closely matches the characteristics of a traditional vacuum tube guitar amplifier while simultaneously allowing for mimicking of a number of different vacuum tube characteristics. Thus, the present invention allows for user selection of a multiplicity of tonal qualifies that are associated with a variety of traditional vacuum tube amplifiers based on user preferences.

BRIEF DESCRIPTION OF THE DRAWINGS

For a fuller understanding of the advantages provided by the invention, reference should be made to the following detailed description together with the accompanying drawings wherein:

FIG. 6 illustrates a graph depicting the typical transfer characteristics of a prior art 12AX7 vacuum tube;

FIG. 18 illustrates front and front perspective views of a preferred exemplary control/input panel associated with a preferred exemplary invention embodiment;

FIG. 39 illustrates a schematic depicting a preferred exemplary speaker power amplifier (SPA) system embodiment (page 3/3);

FIG. 56 illustrates a top left front perspective assembly view depicting construction detail of a preferred exemplary system embodiment;

FIG. 57 illustrates a top right front perspective assembly view depicting construction detail of a preferred exemplary guitar amplifier electronics system embodiment;

FIG. 59 illustrates a top left rear perspective assembly view depicting construction detail of a preferred exemplary guitar amplifier electronics system embodiment;

FIG. 60 illustrates a top left front perspective assembly view depicting construction detail of a preferred exemplary guitar amplifier electronics system embodiment;

DESCRIPTION OF THE PRESENTLY PREFERRED EXEMPLARY EMBODIMENTS

Figure 1:
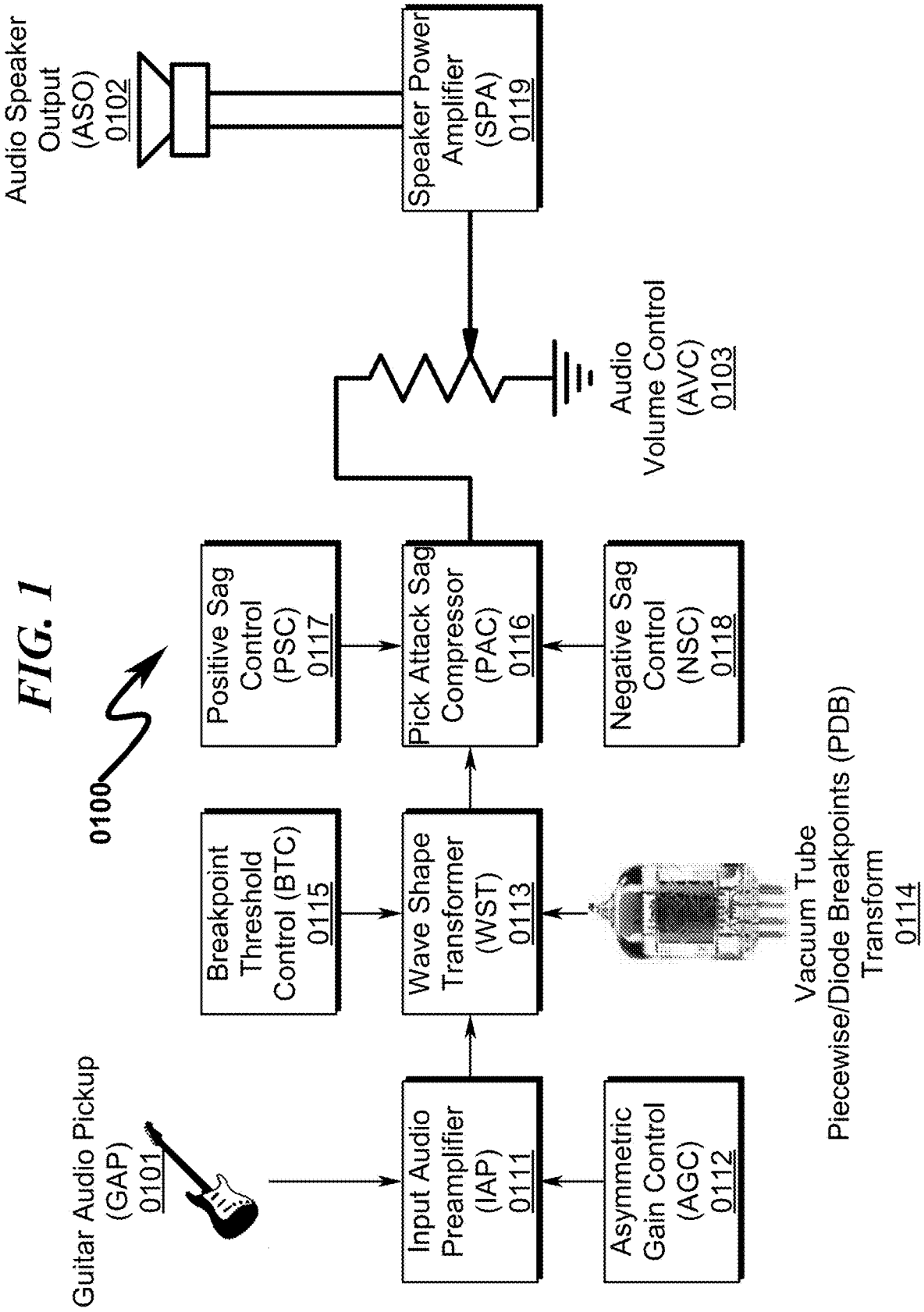
FIG. 1 illustrates a system block diagram depicting a preferred exemplary system embodiment of the present invention.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a GUITAR AMPLIFIER SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Audio Volume Control (AVC) Not Limitive

The audio volume control (AVC) discussed herein may take many forms and comprise a variety of potentiometers, rheostats, and/or solid-state components. The present invention does not limit the form in which the AVC is implemented.

Speaker Power Amplifier (SPA) Not Limitive

The speaker power amplifier (SPA) discussed herein may take many forms and comprise a variety of solid-state components. While in many preferred exemplary embodiments the use of a TEXAS INSTRUMENTS INCORPORATED model LM3886 or STMICROELECTRONICS NV model TDA7293 are discussed herein, the present invention is not limited to these forms of SPA.

Vacuum Tube Transfer Characteristics Not Limitive

The present invention in many different embodiments attempts to mimic the voltage-current (V-I) characteristic performance of a variety of vacuum tubes. While many preferred exemplary embodiments of the invention as depicted may mimic specific vacuum tube types (including but not limited to 12AX7; ECC83; 12AT7; 12AU7; EL34; EL84; 6L6; 6V6; and 5881 models that are often used in traditional guitar amplifiers) the present invention makes no limitation on the exact type of vacuum tube being emulated.

Wave Shape Transformer (WST) Not Limitive

The present invention in many different embodiments attempts to mimic the voltage-current (V-I) characteristic performance of a variety of vacuum tubes using a wave shape transformer (WST) that may mimic the vacuum tube characteristics using a piecewise/diode breakpoints (PDB) transform. This PDB may incorporate linear and/or nonlinear emulation of the vacuum tube characteristics over a plurality of V-I characteristic regions of operation with the individual regions tied together using diode crossover breakpoints. The present invention makes no limitation as to the number of transform regions or the linear/non-linear nature of the transfer characteristic regions.

Schematics Exemplary

The present invention may be taught to one of ordinary skill in the art via the use of exemplary schematics as depicted herein. One skilled in the art will recognize that these schematics represent only one possible variation of the invention as taught and that their specific connectivity, components, and values are only one possible configuration of the invention. As such, the presented schematics and their associated component values do not limit the scope of the claimed invention. Additionally, it should be noted that conventional power supply decoupling capacitors are omitted in the presented schematics as they are generally application specific in value and placement.

Vacuum Tube Amplifier Emulation Methodology

The present invention attempts to emulate the characteristics of conventional guitar vacuum tube amplifiers to produce the desirable tonal qualities of these devices but using more efficient, reliable, and cost effective solid-state components. While the tonal qualities of guitar vacuum tube amplifiers are somewhat subjective with respect to their quantification, there exist several performance characteristics associated with these amplifiers that can be quantified. These include:

- Cathode clipping within the preamplifier stage in which traditional guitar vacuum tube amplifiers provide asymmetric clipping of guitar pickup signals along with manual tone adjustments within a preamplifier section.
- Non-linear transfer characteristics of guitar vacuum tube amplifiers associated with individual performance characteristics of the vacuum tubes used to implement the series of common cathode amplifiers. These non-linearities provide for an artificial envelope compression at high gain amplifications in the overall system.
- Power supply sag within the overall system in which traditional guitar vacuum tube amplifiers do not provide a "stiff" power supply to power the system but rather due to performance characteristics of the overall guitar vacuum tube amplifier system, the overall compression envelope for peak output amplification results in sagging of the overall signal envelope. The sagging of the envelope and eventual recovery characteristic also impact the overall tonal quality of the guitar vacuum tube amplifier system.

The present invention attempts to emulate these behaviors within the context of a solid-state amplifier implementation.

System Overview (0100)

An overview of a preferred exemplary invention embodiment is presented in FIG. 1 (0100) wherein the system receives audio signaling from a guitar audio pickup (GAP) (0101) and produces amplified guitar audio that is presented to an audio speaker output (ASO) (0102). Volume control for the system is generally provided for by an audio volume control (AVC) (0103) that may be in the form of a conventional potentiometer/rheostat and/or any form of solid-state digital potentiometer.

The guitar audio signaling (GAS) from a guitar audio pickup (GAP) is input to an input audio preamplifier (IAP) (0111) that implements asymmetric gain control (AGC) (0112) in which positive peaks of GAS are amplified with different gain and/or frequency characteristics than negative peaks of GAS. The IAP (0111) output is then shaped using a wave shape transformer (WST) (0113) that mimics the gain characteristics of a selected vacuum tube using a vacuum tube piecewise/diode breakpoints (PDB) transform (0114). This PDB (0114) transform approximates the voltage-current transfer (VIT) characteristics of a selected vacuum tube using a piecewise approximation model that may include a plurality of linear/non-linear V-I transform characteristics that are stitched together using diode breakpoint transfer characteristics. This merging of a plurality of V-I transfer characteristics approximates the overall operation of a selected vacuum tube and allows for an overall non-linear V-I transfer characteristic to be achieved by the system. The threshold offsets under which the transfer characteristics are applied is in many preferred embodiments provided for by a breakpoint threshold control (BTC) (0115) that sets an overall DC bias threshold for application of the PDB (0114) transfer characteristic.

The output of the WST (0113) is applied to a pick attack sag compressor (PAC) that emulates the power supply sag associated with conventional vacuum tube amplifiers under high compression conditions. Tube amplifiers were generally not designed for high levels of peak compression or average voltages at maximum powers. These tube power supplies were not designed to support sustained high power output. Plate voltages might start at 350V, but when the output levels were high, the power supply would sag to as low as 250V after 100 msec following the pick attack. After 300-600 msec, as the pickup signal would begin to decay, the power supply would recover to a nominal supply voltage. This power supply sag and recovery would create a nice smooth natural sustain, as well as slightly modify the peak compression characteristics. This power supply sag compression is a characteristic of the vacuum tube power supplies and was superimposed on the vacuum tube characteristics to form an overall compression transfer characteristic. The present invention emulates this behavior by providing for a pick attack sag compressor (PAC) (0116) that incorporates controls for positive sag control (PSC) (0117) and negative sag control (NSC) (0118) that control the respective rise/fall characteristics of the overall compression envelope applied to the output of the WSG (0113).

The resulting output of the PAC (0116) is typically applied to any type of conventional audio volume control (AVC) (0103) and then input to a conventional solid-state speaker power amplifier (SPA) (0119) that drives a speaker or other audio speaker output (ASO) (0102).

Method Overview (0200)

Figure 2:
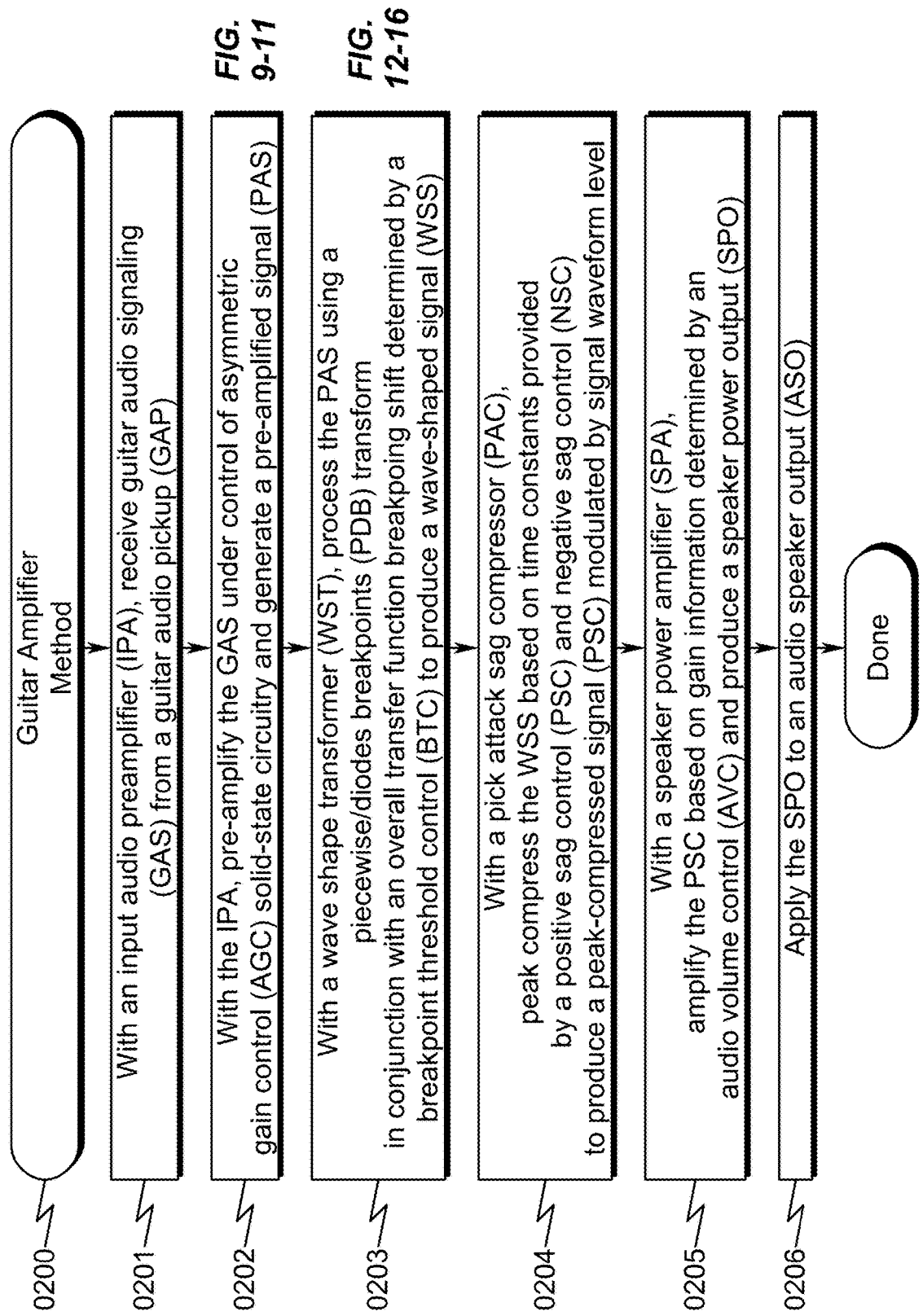
FIG. 2 illustrates a flowchart depicting a preferred exemplary method embodiment of the present invention.

A preferred exemplary method embodiment associated with the system depicted in FIG. 1 (0100) is generally depicted in FIG. 2 (0200) wherein the steps comprise:

(1) with an input audio preamplifier (IAP), receiving guitar audio signaling (GAS) from a guitar audio pickup (GAP) (0201);
(2) with the IAP, pre-amplifying the GAS under control of asymmetric gain control (AGC) solid-state circuitry and generate a pre-amplified signal (PAS) (0202);
(3) with a wave shape transformer (WST), processing the PAS using a piecewise/diodes breakpoints (PDB) transform in conjunction with an overall transfer function breakpoint shift determined by a breakpoint threshold control (BTC) to produce a wave-shaped signal (WSS) (0203);

(4) with a pick attack sag compressor (PAC), peak compressing the WSS based on time constants provided by a positive sag control (PSC) and negative sag control (NSC) to produce a peak-compressed signal (PSC) modulated by signal waveform level (0204);

(5) with a speaker power amplifier (SPA), amplifying the PSC based on gain information determined by an audio volume control (AVC) and producing a speaker power output (SPO) (0205); and (6) applying the SPO to an audio speaker output (ASO) (0206).

This method may be modified to incorporate additional features and/or eliminate some components/steps as determined by application context.

Exemplary Vacuum Tube Transfer Characteristics (0300)-(0800)

Figure 4:
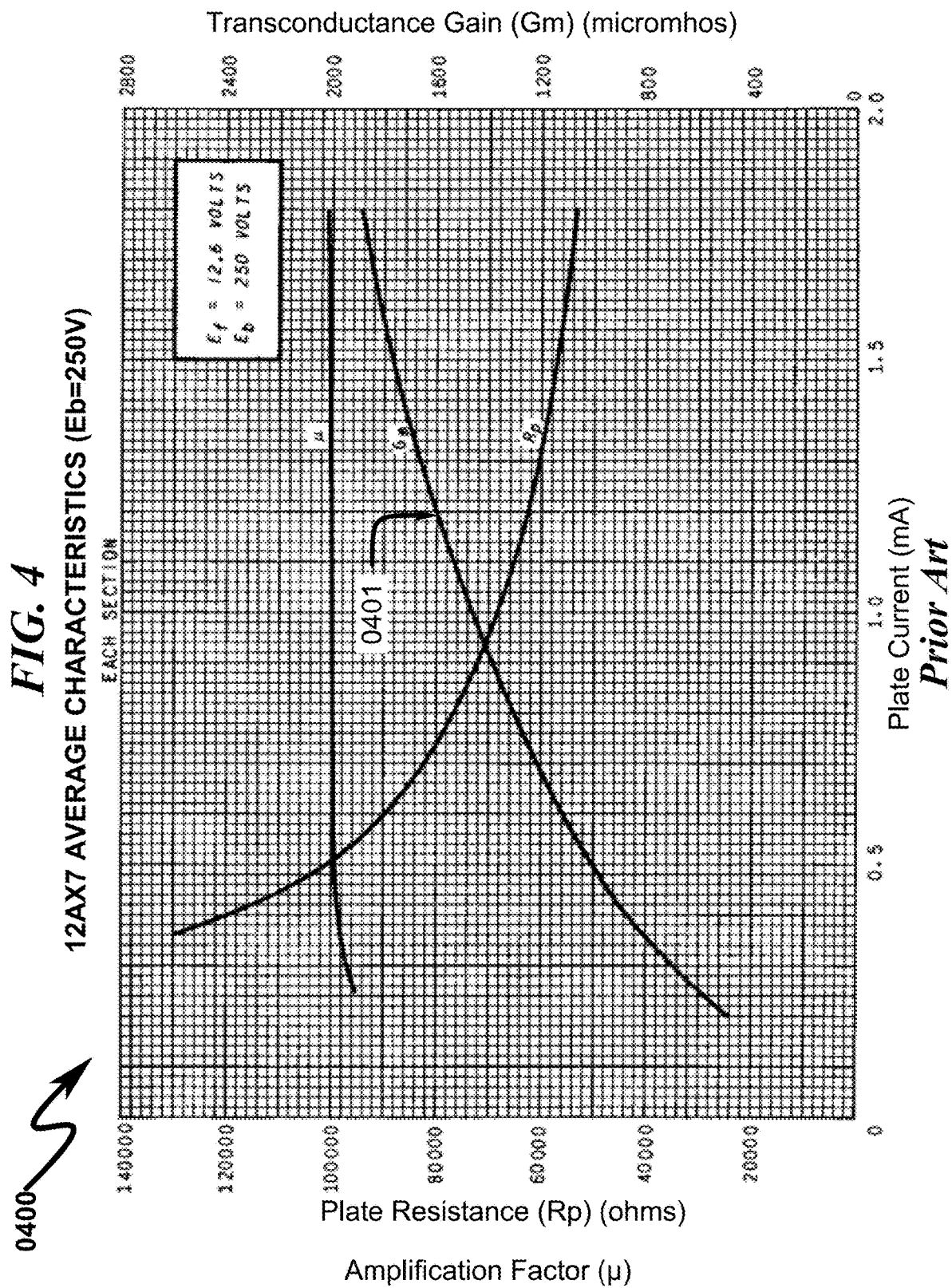
FIG. 4 illustrates a graph depicting the typical operating characteristics of a prior art 12AX7 vacuum tube operating at 250V.
Figure 5:
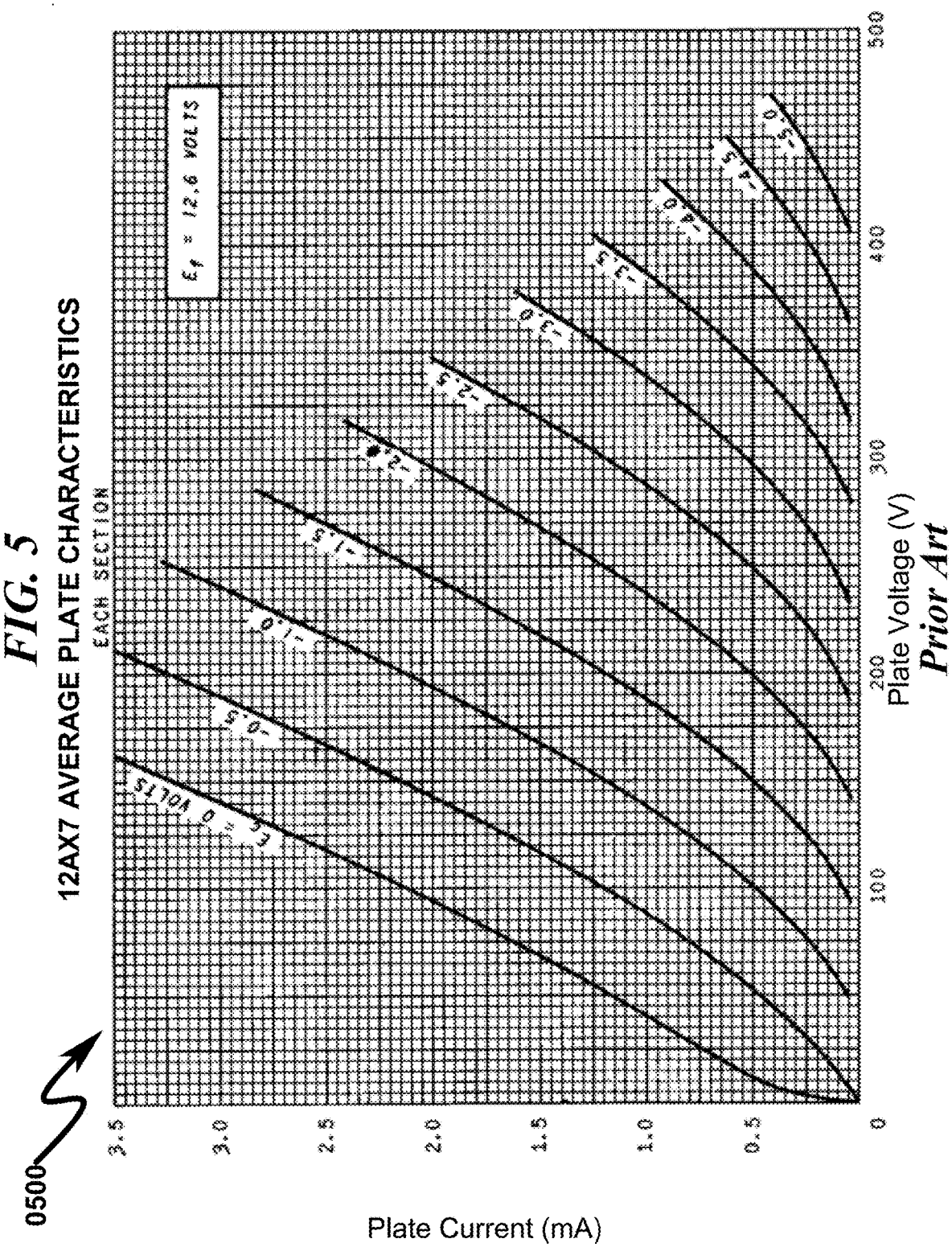
FIG. 5 illustrates a graph depicting the typical plate characteristics of a prior art 12AX7 vacuum tube.
Figure 6:
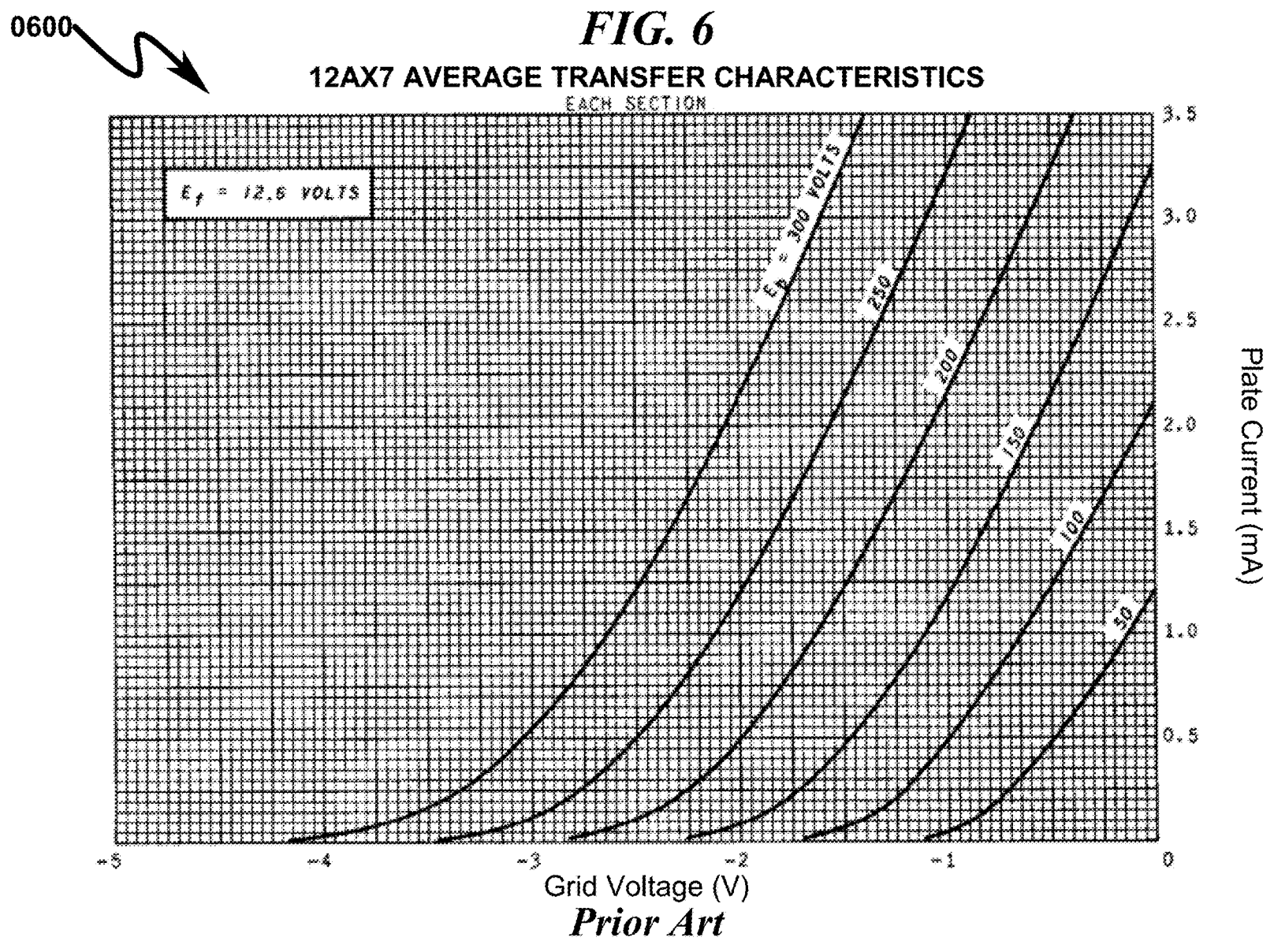
Figure 7:
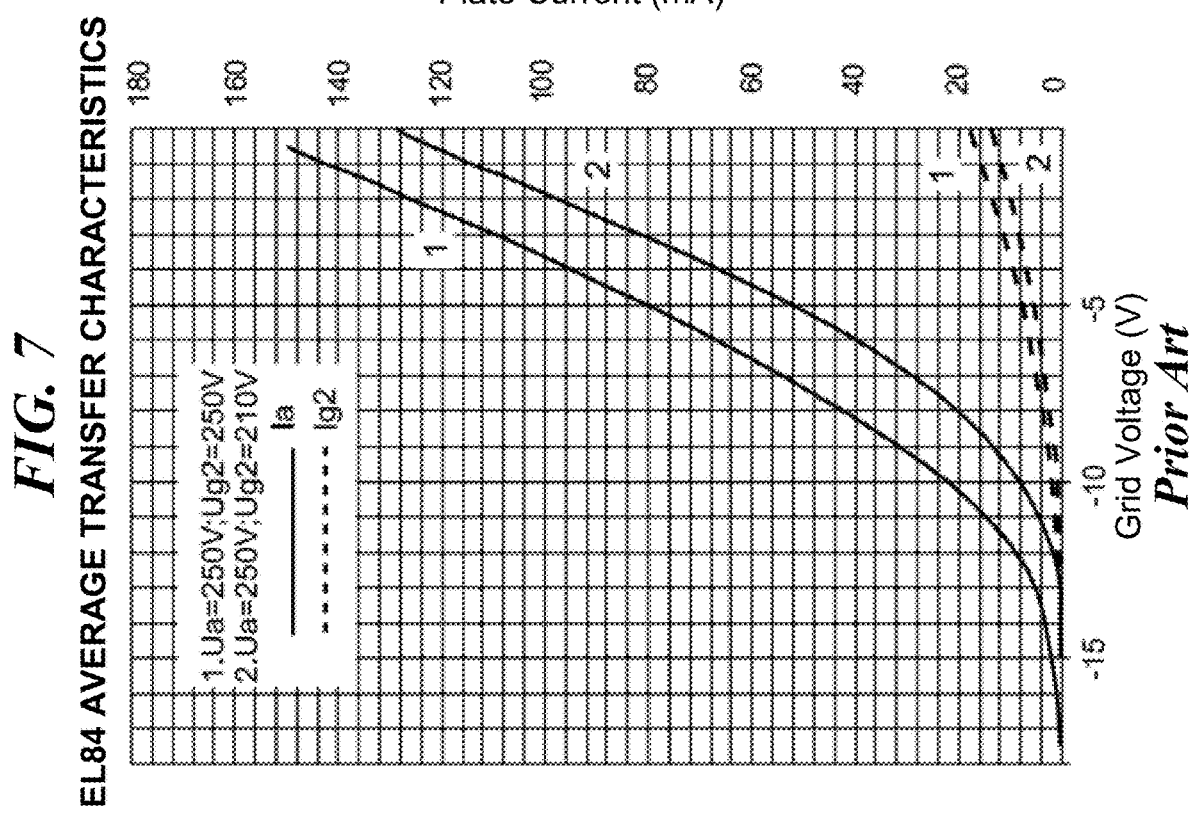
FIG. 7 illustrates a graph depicting the typical transfer characteristics of a prior art EL84 vacuum tube.

The use of vacuum tubes in guitar audio amplifiers introduces a significant non-linearity in the transfer characteristics of these amplifiers. Examples of this non-linearity can be seen in the transconductance (gm) curves for the 12AX7 vacuum tube depicted in FIG. 3 (0300) (0301) and FIG. 4 (0400) (0401) (with further detail on average plate characteristics provided in FIG. 5 (0500) and average transfer characteristics provided in FIG. 6 (0600)) as well as average EL84 vacuum tube depicted in FIG. 7 (0700) and FIG. 8 (0800). These vacuum tubes are commonly used in guitar amplifiers and along with other types of vacuum tubes (including but not limited to 12AX7; ECC83; 12AT7; 12AU7; EL34; EL84; 6L6; 6V6; and 5881) represent typical vacuum tubes that may be emulated by the present invention. As can be seen from these characteristic V-I transfer plots, the transconductance gain (gm) (0301, 0401) can vary widely based on operating plate voltages as well as non-linear operation of the grid voltage.

As can be seen from these vacuum tube performance characteristics, there is a high degree of non-linearity in the overall performance of these devices and this is reflected in the signal envelope compression produced when multiple vacuum tube amplifiers are connected in series to implement a traditional guitar amplifier.

Piecewise/Diode Breakpoint (PDB) Transform (0900)-(1600)

Figure 3:
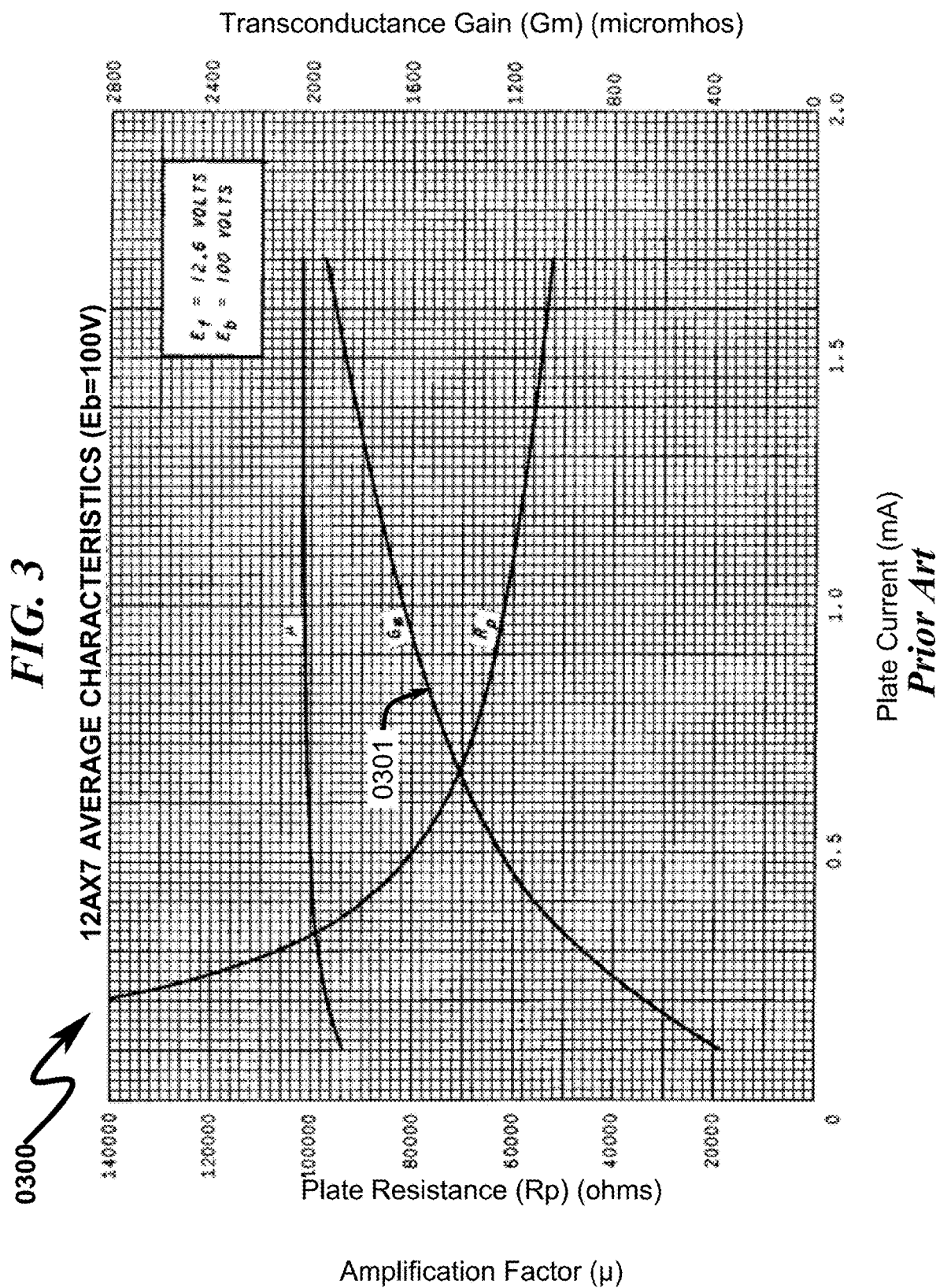
FIG. 3 illustrates a graph depicting the typical operating characteristics of a prior art 12AX7 vacuum tube operating at 100V.
Figure 8:
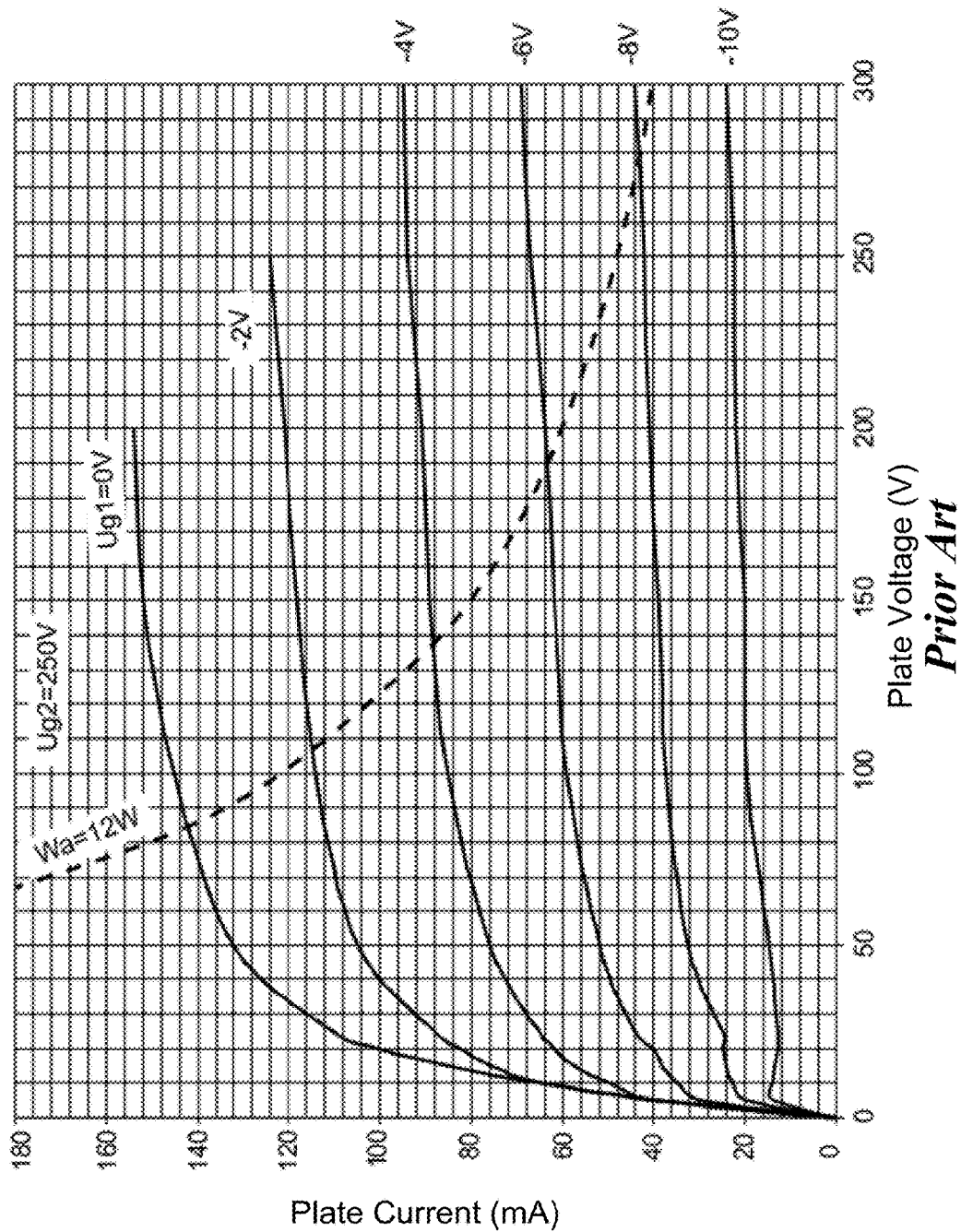
FIG. 8 illustrates a graph depicting the typical transfer characteristics of a prior art EL84 vacuum tube.

The present invention attempts to mimic the operation of traditional vacuum tube amplifiers by emulating the non-linear operation (and transfer characteristics) of traditional vacuum tubes (as generally depicted in FIG. 3 (0300)-FIG. 8 (0800)). This is accomplished by implementing a piecewise/diode breakpoint (PDB) transform that breaks apart the vacuum tube transfer characteristics into a plurality of emulation zones that are stitched together using ideal diode crossover networks to form an approximation of the vacuum tube transfer characteristics. This PDB transform may incorporate linear and/or non-linear emulation segments that are determined in part by specific solid-state circuitry responsible for emulating each individual segment of the overall vacuum tube transfer characteristic.

Figure 9:
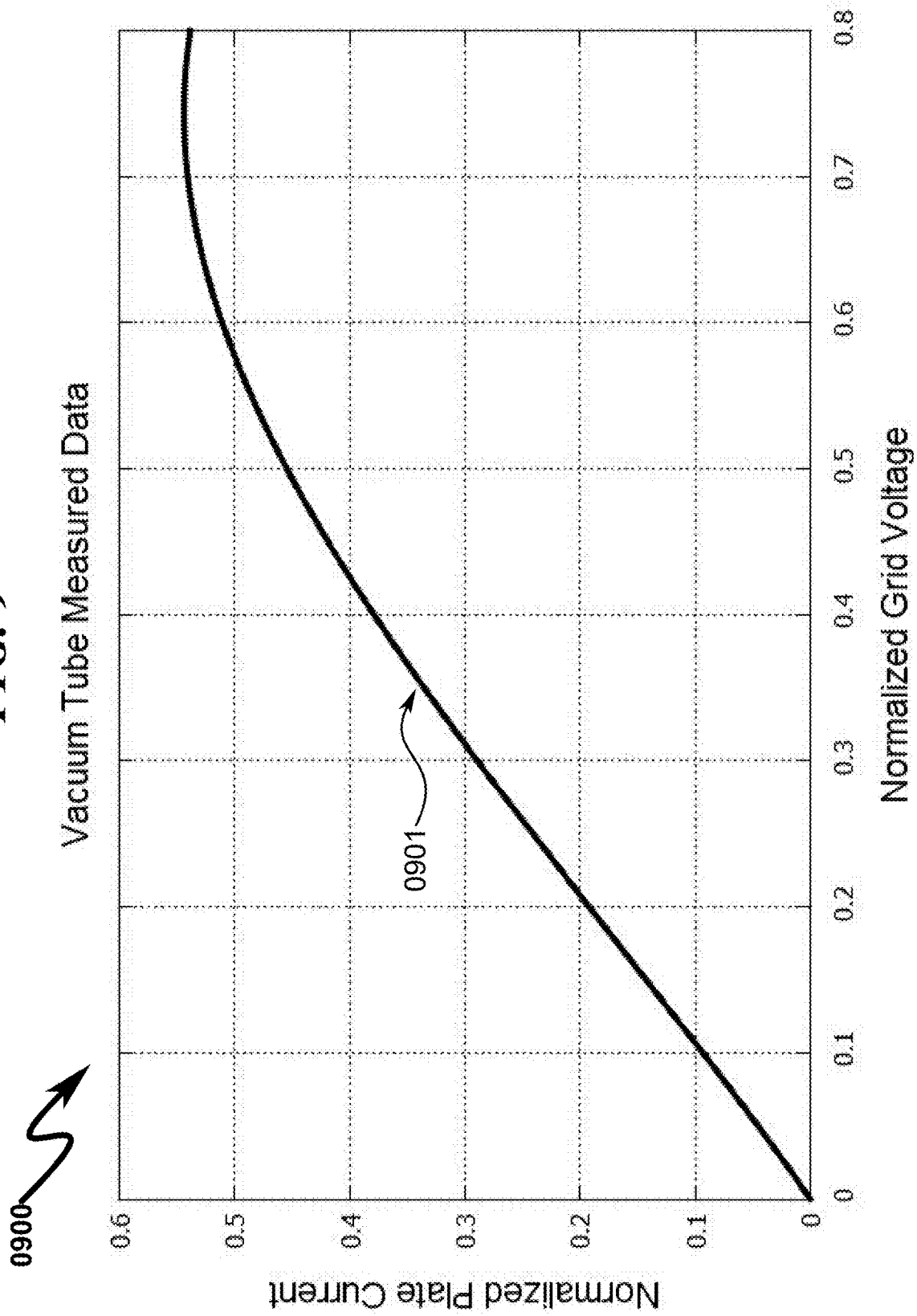
FIG. 9 illustrates a graph depicting an exemplary vacuum tube measured transfer characteristic that has been normalized as to grid voltage and plate current.

An example of this is provided in FIG. 9 (0900) wherein a typical non-linear vacuum tube characteristic is to be emulated using solid-state components. As seen in this exemplary vacuum tube transfer characteristic (0901), the measured vacuum tube data has been scaled and normalize such that the excitation voltage has been normalized in the range of [0:0.8] and the resulting plate current has been normalized in the range of [0:0.6]. These normalization ranges are arbitrary and may be adjusted according to application context but are used in this context to define a plurality of segments within the overall transfer function in which the vacuum tube behavior is to be emulated.

Figure 10:
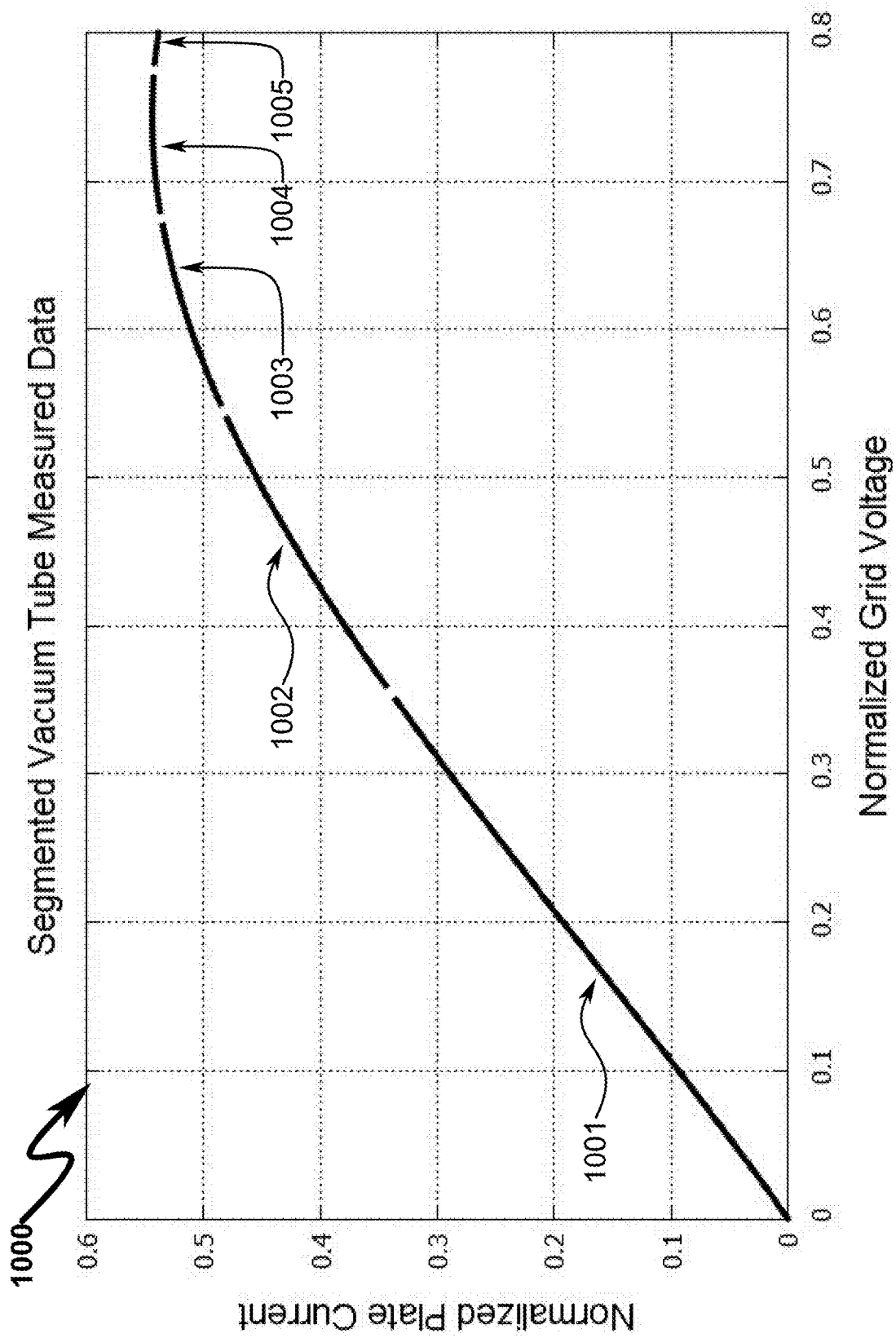
FIG. 10 illustrates a graph depicting an exemplary vacuum tube measured transfer characteristic that has been normalized as to grid voltage and plate current and segmented into a plurality of segmented regions.

Once the measured data has been normalized as generally depicted in FIG. 9 (0900), it is segmented into a plurality of segments (1001, 1002, 1003, 1004, 1005) as generally depicted in FIG. 10 (1000). While five segments (1001, 1002, 1003, 1004, 1005) are depicted in the example provided in FIG. 10 (1000), the present invention does not place any limit on the range of segment number that may be used in the invention. These segmented regions form the basis of solid-state emulation of the vacuum tube behavior for the overall solid-state amplifier design.

Figure 11:
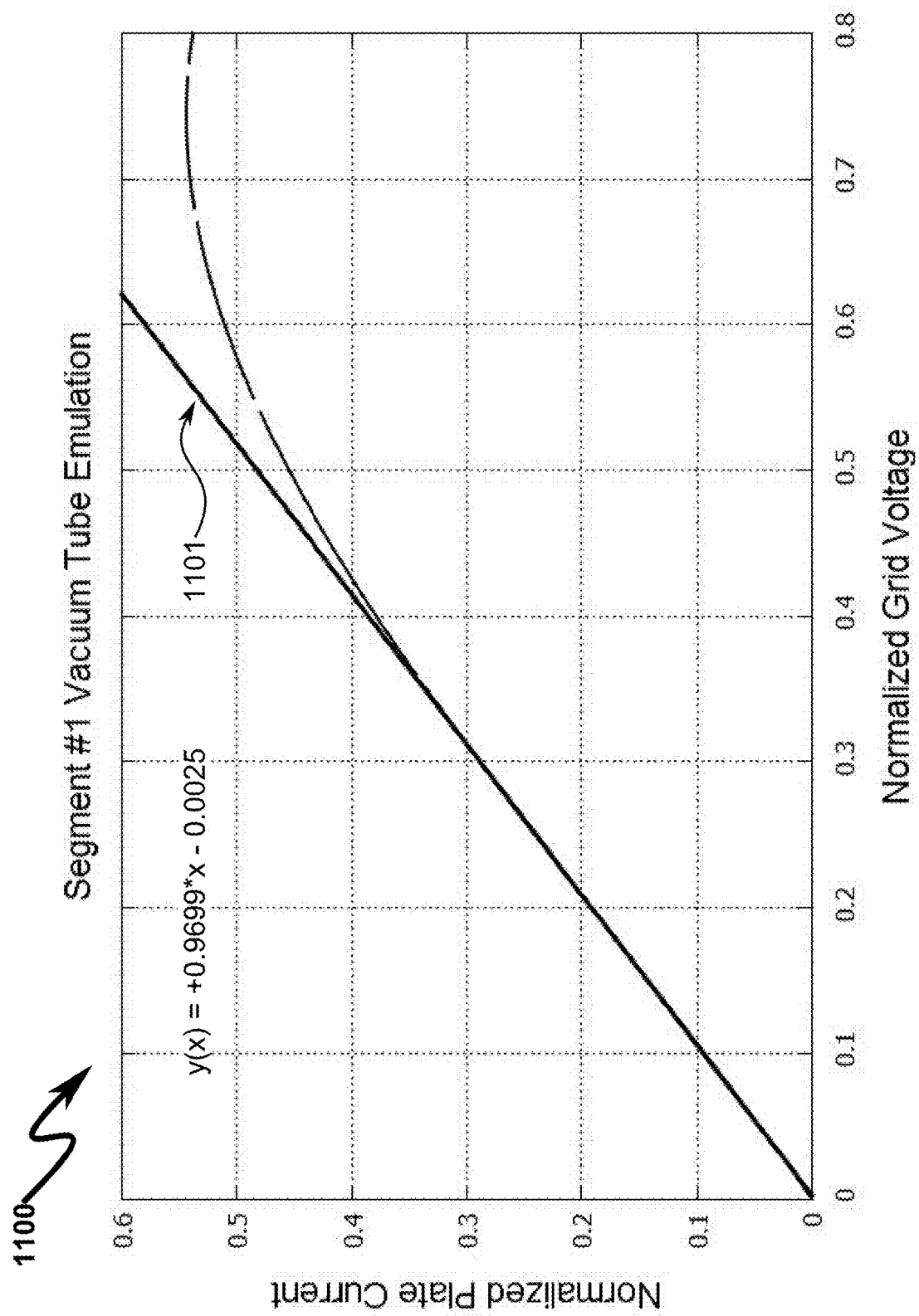
FIG. 11 illustrates a graph depicting an exemplary emulation of segment #1 of a typical vacuum tube measured transfer characteristic as depicted in FIG. 9 (0900)-FIG. 10 (1000)
Figure 12:
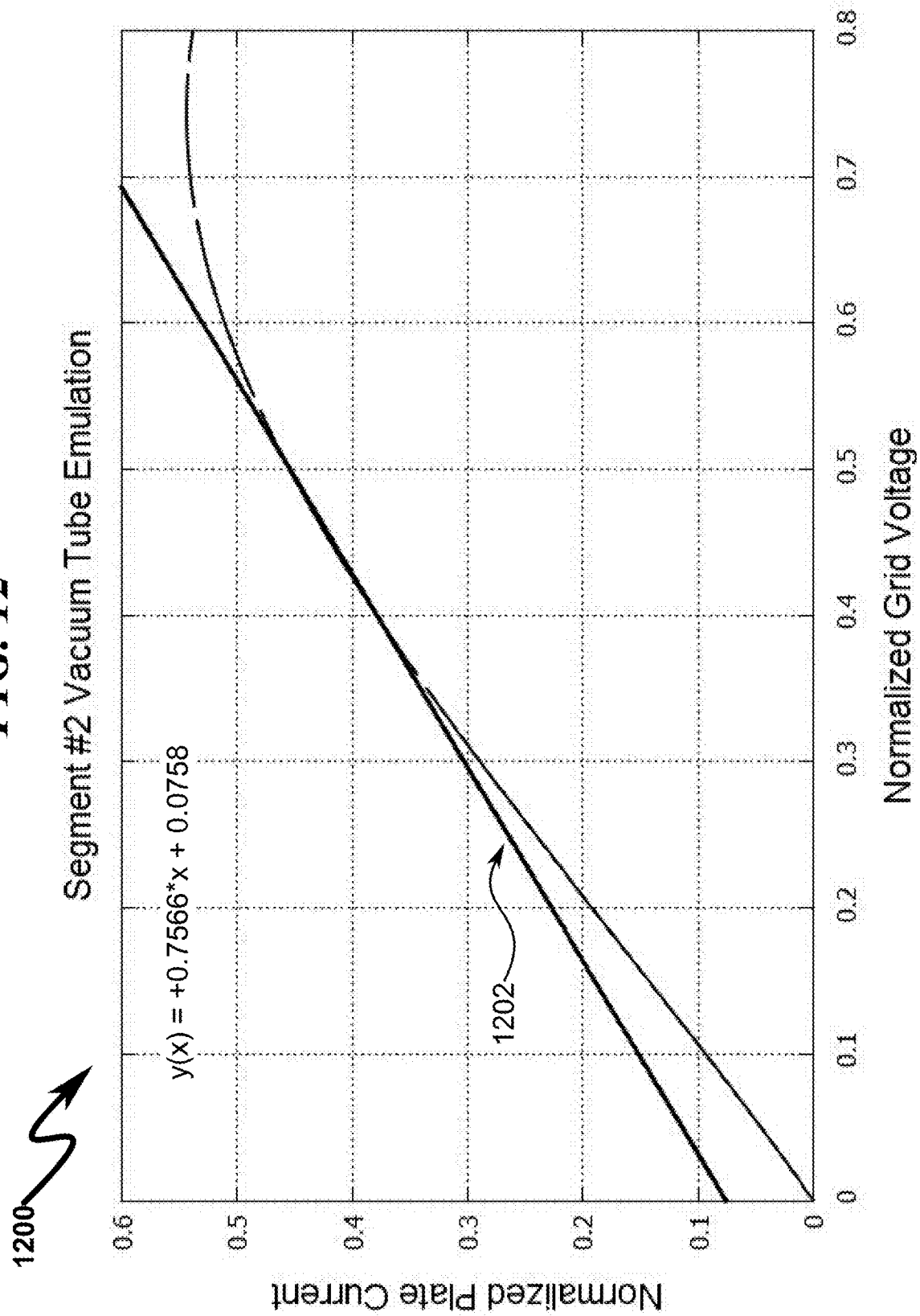
FIG. 12 illustrates a graph depicting an exemplary emulation of segment #2 of a typical vacuum tube measured transfer characteristic as depicted in FIG. 9 (0900)-FIG. 10 (1000)
Figure 13:
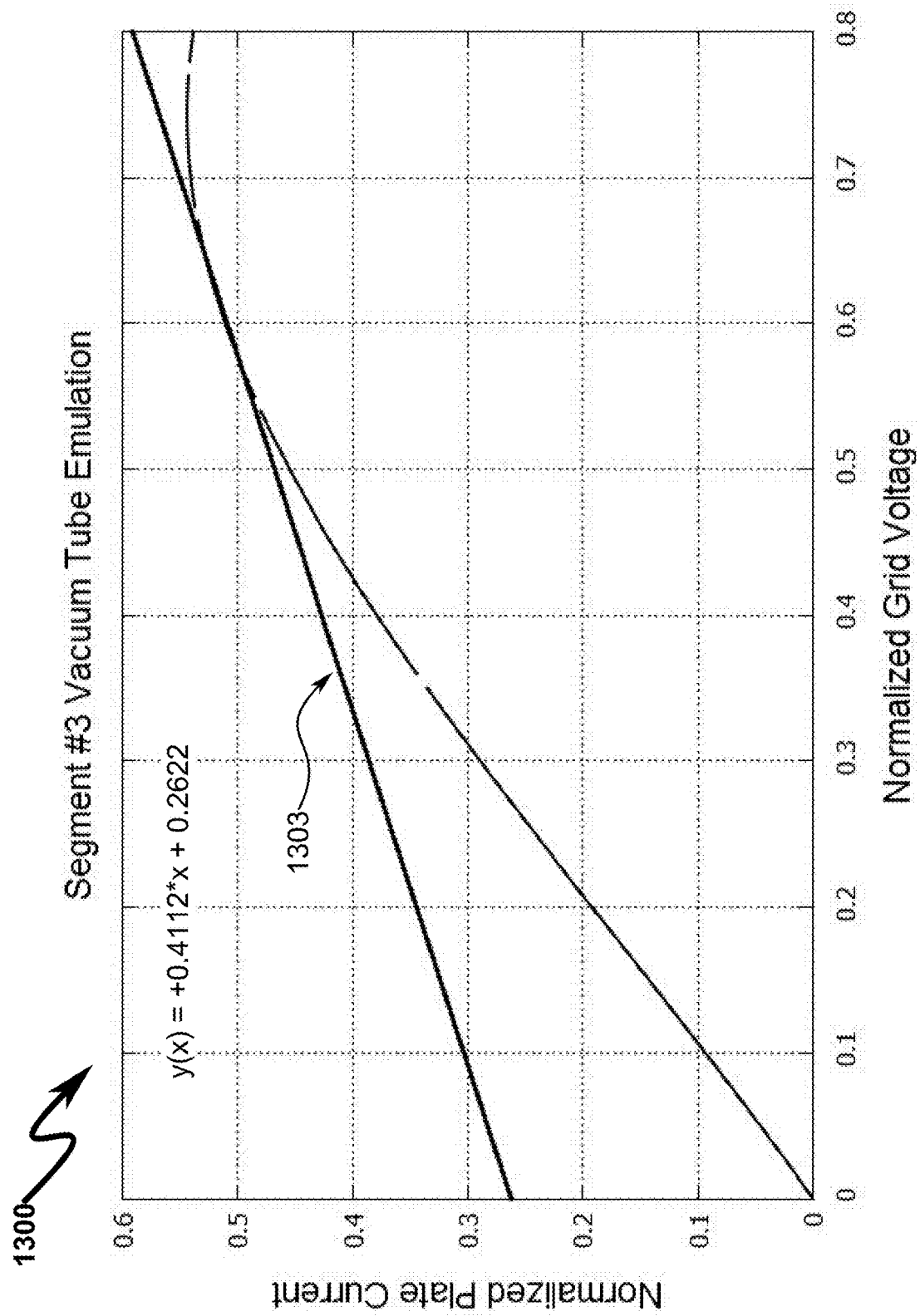
FIG. 13 illustrates a graph depicting an exemplary emulation of segment #3 of a typical vacuum tube measured transfer characteristic as depicted in FIG. 9 (0900)-FIG. 10 (1000)
Figure 14:
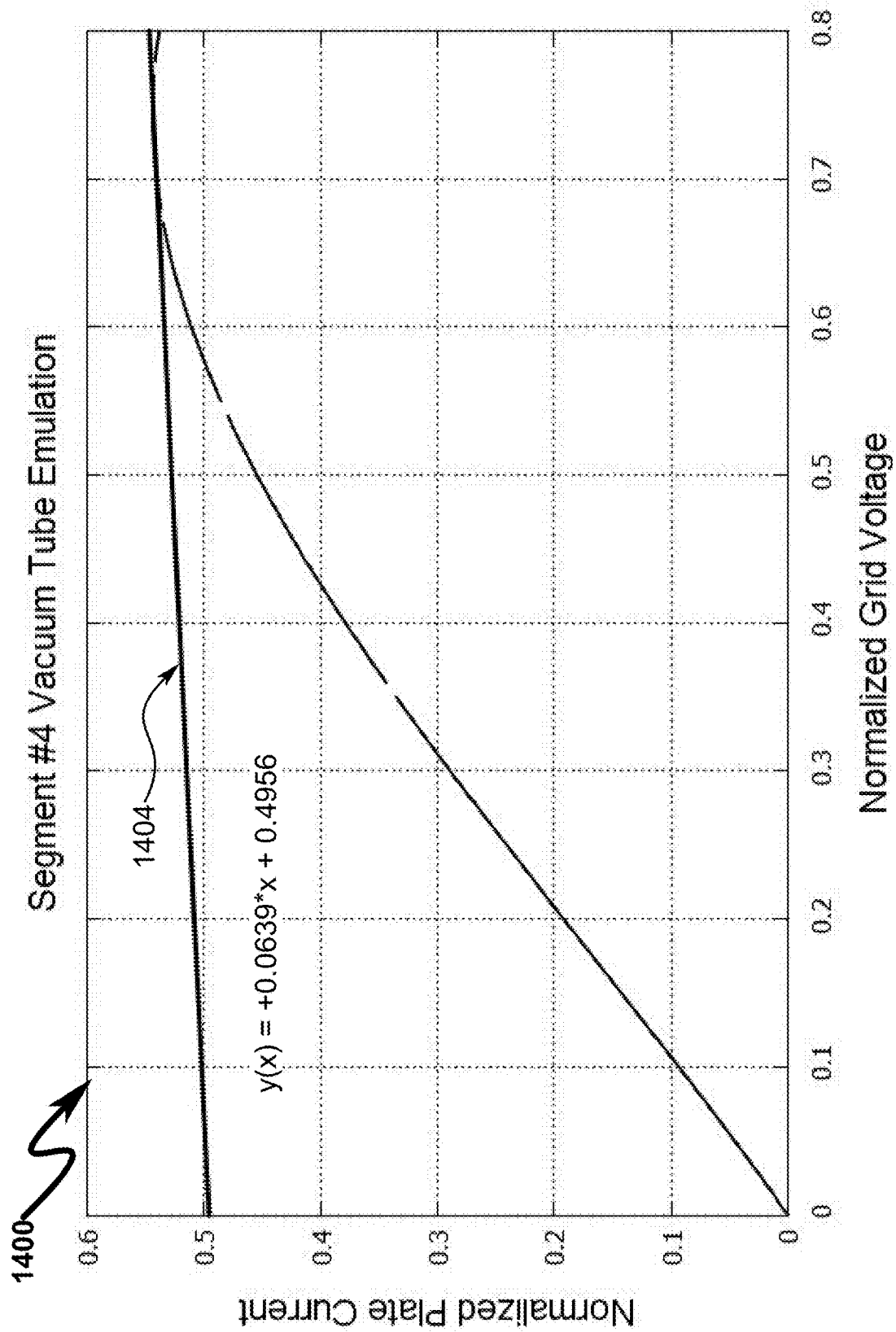
FIG. 14 illustrates a graph depicting an exemplary emulation of segment #4 of a typical vacuum tube measured transfer characteristic as depicted in FIG. 9 (0900)-FIG. 10 (1000)
Figure 15:
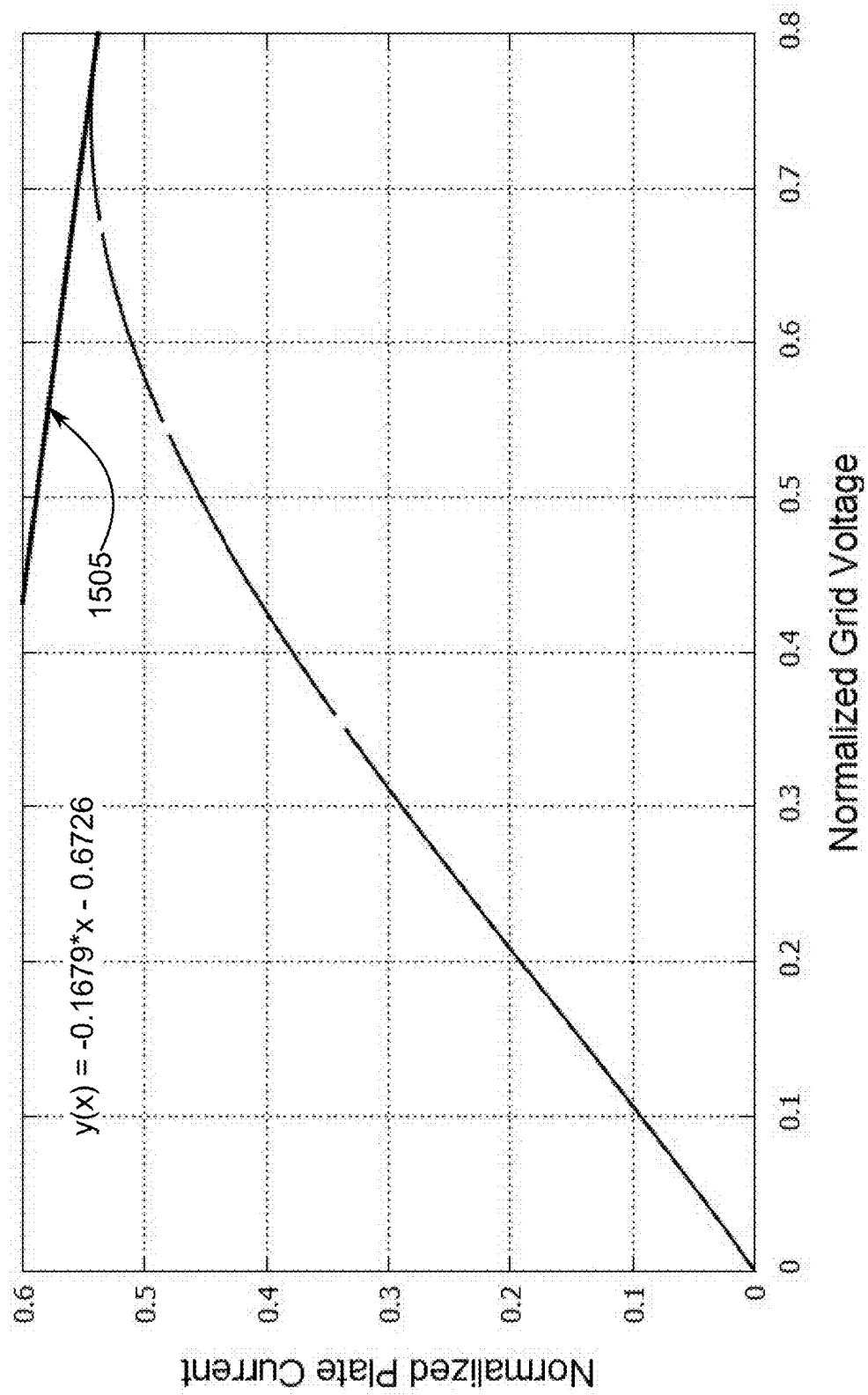
FIG. 15 illustrates a graph depicting an exemplary emulation of segment #5 of a typical vacuum tube measured transfer characteristic as depicted in FIG. 9 (0900)-FIG. 10 (1000)
Figure 16:
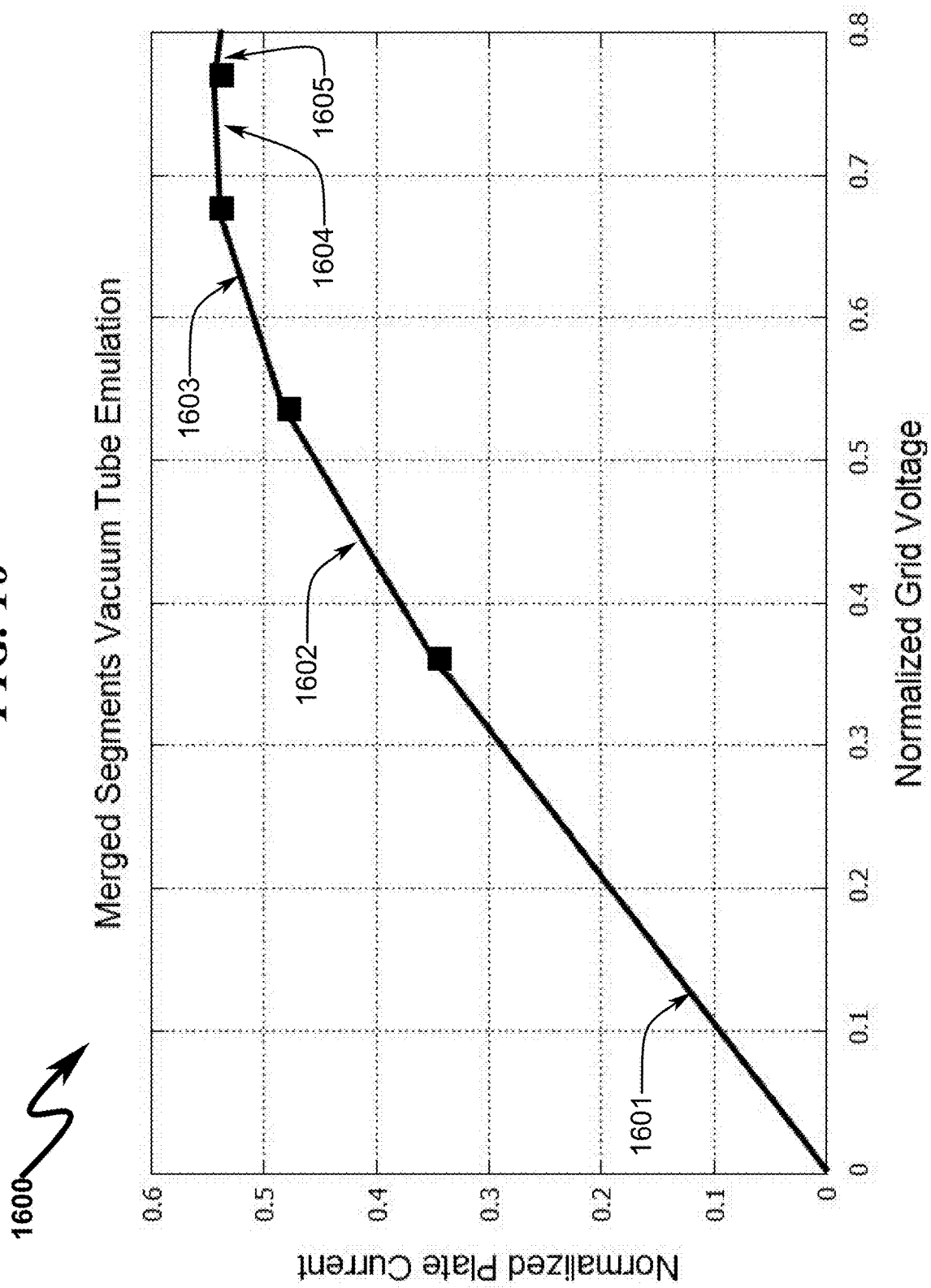
FIG. 16 illustrates a graph depicting an exemplary merged segment emulation of a typical vacuum tube measured transfer characteristic as depicted in FIG. 9 (0900)-FIG. 10 (1000)

These segmented regions are then stitched together using linear and/or non-linear functions to approximate the overall behavior of the vacuum tube. This stitching process is detailed in FIG. 11 (1100)-FIG. 16 (1600) wherein individual segments (1101, 1202, 1303, 1404, 1505) are approximated using linear and/or non-linear functions as indicated and the resulting segment functions are stitched together (1601, 1602, 1603, 1604, 1605) as indicated in FIG. 16 (1600) with the interface breakpoints transitioned using diode steering within the solid-state wave shape transformer Note that in some preferred invention embodiments, the negative slope (1505) indicated in FIG. 15 (1500) may be modeled by a slightly positive slope in order to achieve an overall uniform monotonic transfer function. Additionally, in some preferred embodiments the final segment (1505) illustrated in FIG. 15 (1500) may be eliminated and modeled by an extension of the next-to-last segment (1404) depicted in FIG. 14 (1400).

System Block Description (1700)

Figure 17:
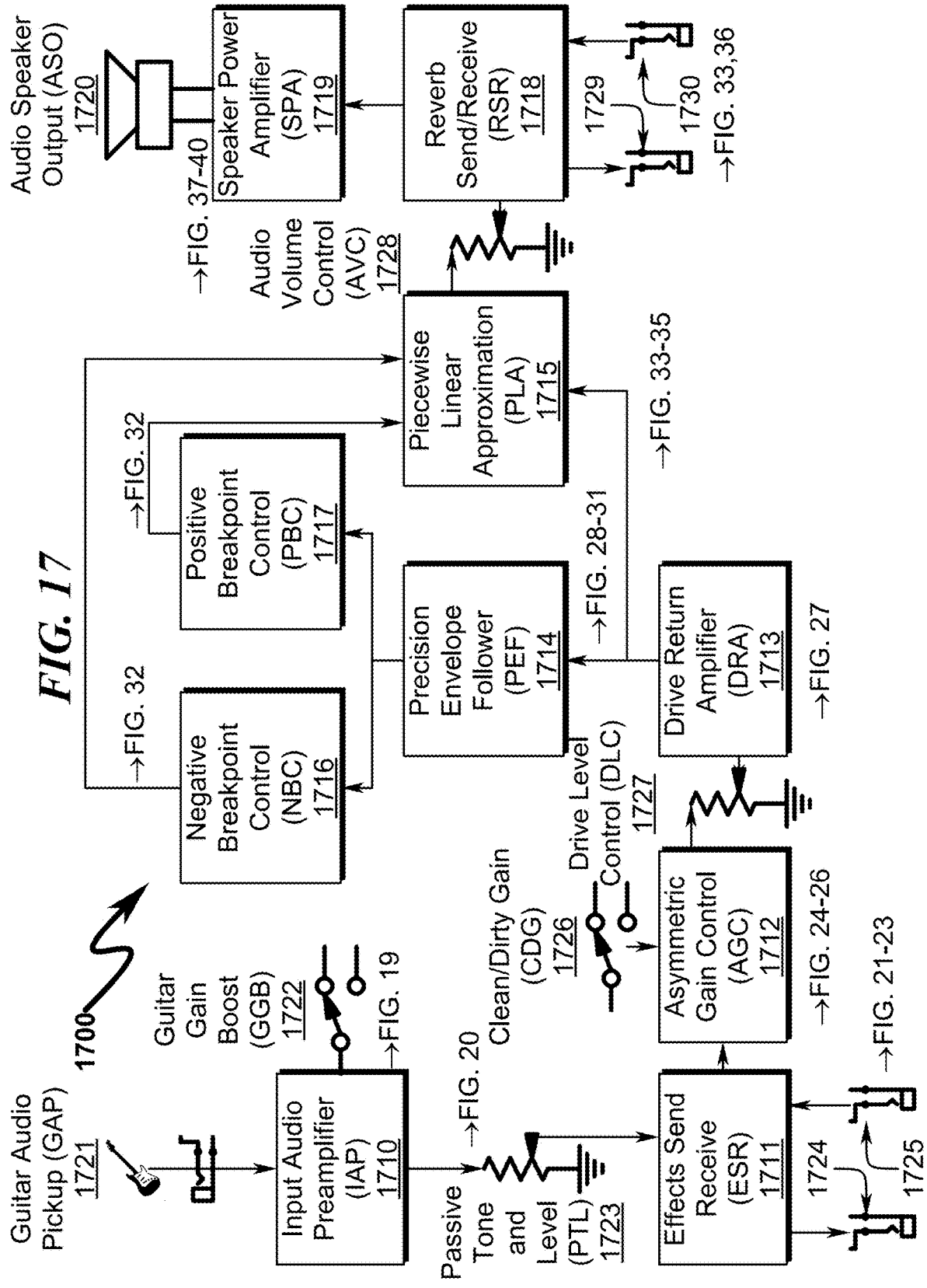
FIG. 17 illustrates a detailed system block overview diagram depicting a preferred exemplary system embodiment of the present invention.

The following discussion relates to a more detailed description of system block elements depicted generally in FIG. 17 (1700). Here it can be seen that the guitar audio pickup (GAP) (1721) is input to an input audio preamplifier (IAP) (1710) which may provide selective boosting via a guitar gain boost (GGB) switch (1722). Passive tone and level (PTL) controls (1723) are applied to the output of the TAP (1710) before it is sent through effects send/receive (ESR) (1711) circuitry (and associated output/input jacks (1724, 1725)) for optional additional off-board signal processing. The resulting signal is then run through an asymmetric gain control (AGC) (1712) circuitry in which the signal may be selected for clean/dirty processing (1726) via panel switch. A front panel drive level control (DLC) (1727) then defines a signal level applied to a drive return amplifier (DRA) (1713), the output of which is applied to both a precision envelope follower (PEF) (1714) and a piecewise linear approximation (PLA) (1715) circuitry. The PEF (1714) output is then adjusted using negative breakpoint controls (NBC) (1716) and positive breakpoint controls (PBC) (1717), the outputs of which are also applied to the PLA (1715). The PLA (1715) output is adjusted via an audio volume control (AVC) (1728) for presentation to a reverb send/receive circuit (RSR) (1718) (and associated output/input jacks (1729, 1730)) for optional additional off-board signal processing. The output of the RSR (1718) is applied to the speaker power amplifier (SPA) (1719) for presentation to the audio speaker output (ASO) (1720).

Exemplary Front Panel Control/Inputs (1800)

As an aid in the following discussion of exemplary invention features, an exemplary guitar amplifier front panel utilized in many preferred invention embodiments is generally depicted in the front and perspective views of FIG. 18 (1800). Here it can be seen that signals from the guitar pickup are presented via a GUITAR INPUT jack (1810) to the guitar amplifier. Additional jacks are provided for EFFECTS SEND (1811), EFFECTS RECEIVE (1812), REVERB SEND (1813), and EFFECTS RECEIVE (1814). Control switches are provided to support BRIGHTNESS ENHANCEMENT (1821), GUITAR GAIN BOOST (GGB) (1822), and CLEAN/DIRTY selection (1823). Adjustable potentiometers are provided for BASS (1831), MID (1832), TREBLE (1833), PREAMP GAIN (1834), DRIVE GAIN (1835), and overall speaker VOLUME (1836). Connections from the SPA to the ASO are typically not provided on the front panel but rather provide via connections on the SPA PCB.

Exemplary Embodiment Schematics (1900)-(4200)

Figure 19:
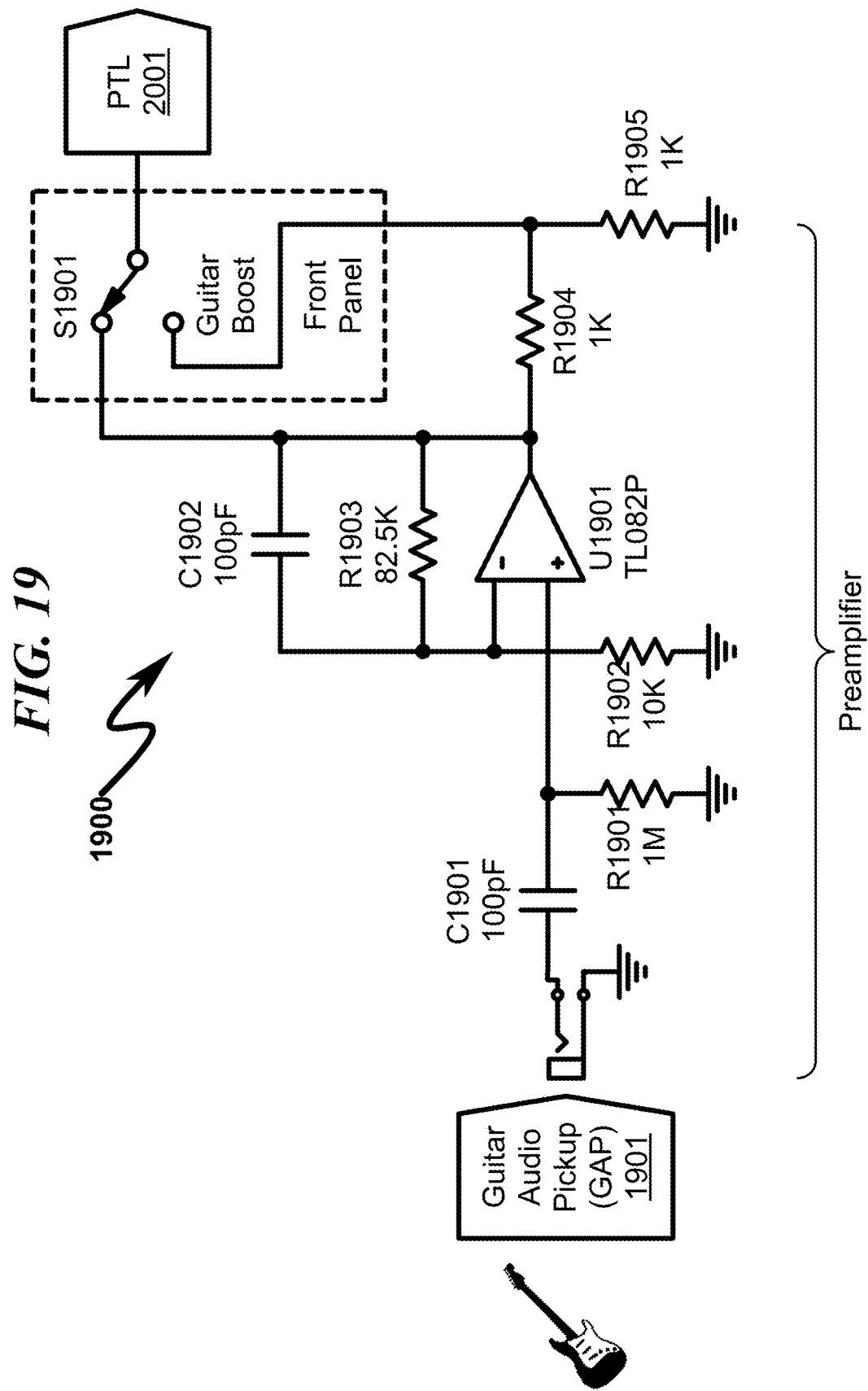
FIG. 19 illustrates a schematic depicting a preferred exemplary input audio preamplifier (IAP) system embodiment.
Figure 20:
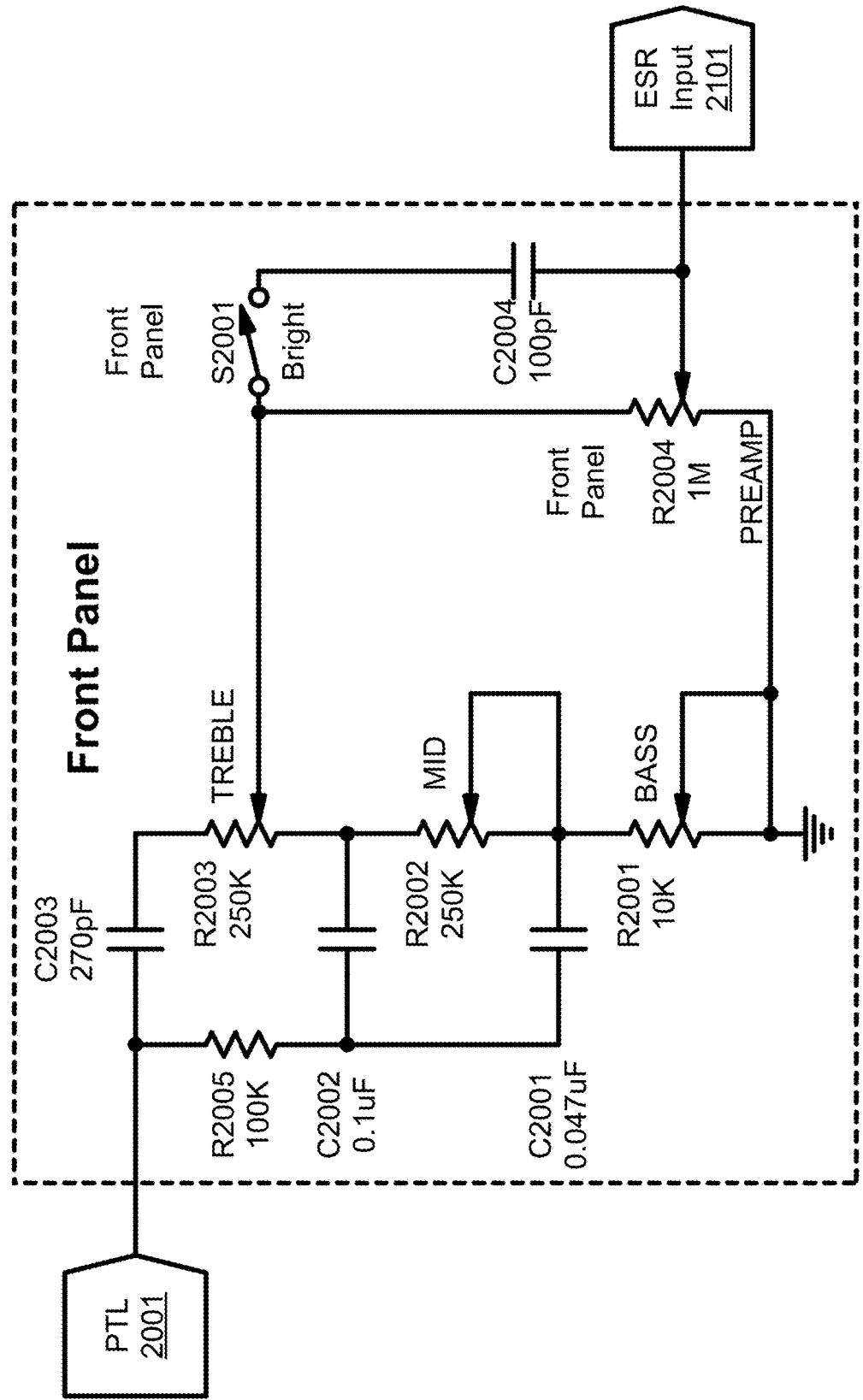
FIG. 20 illustrates a schematic depicting a preferred exemplary passive tone and level (PTL) control system embodiment.
Figure 21:
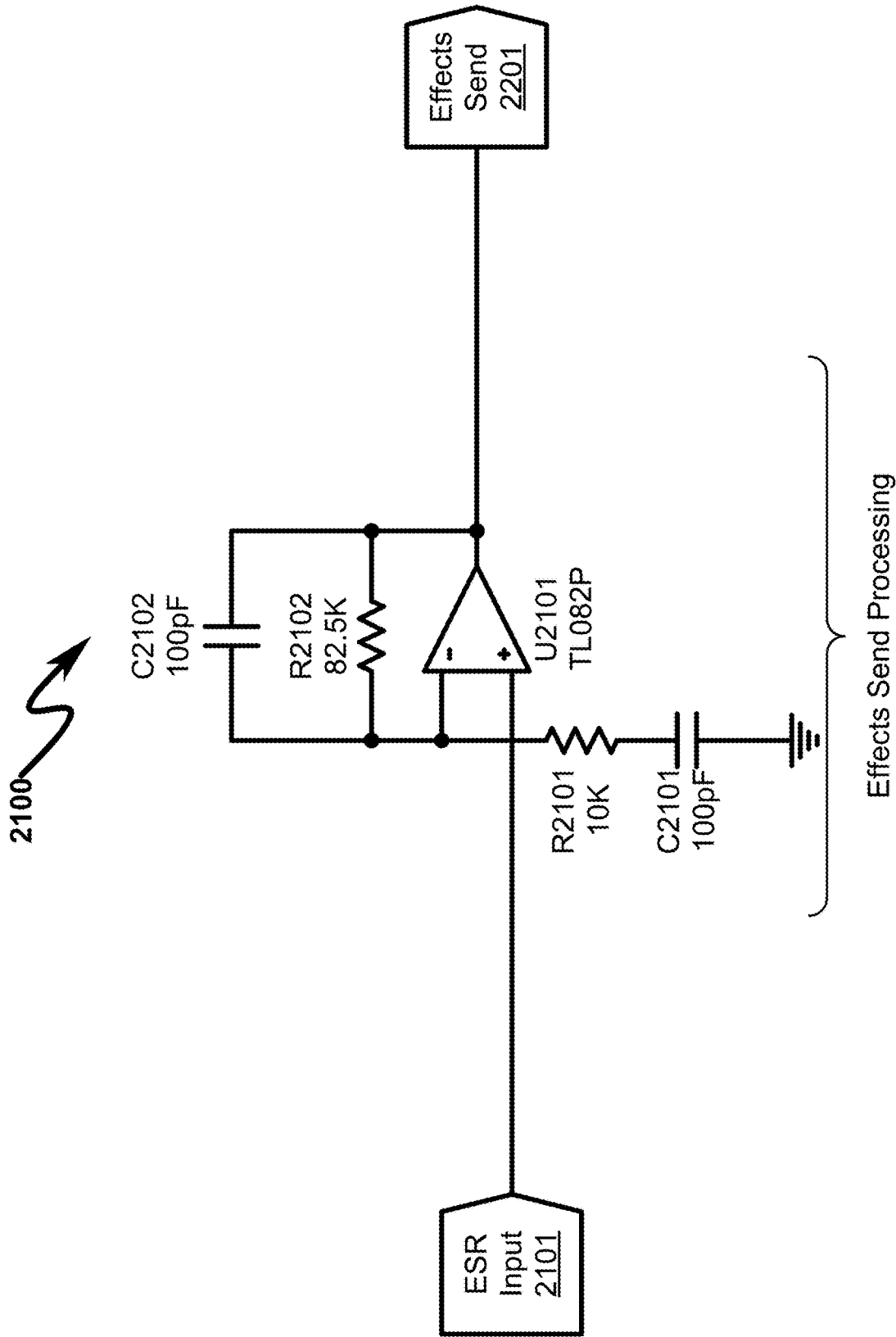
FIG. 21 illustrates a schematic depicting a preferred exemplary effects send/receive (ESR) system embodiment (page 1/3)
Figure 22:
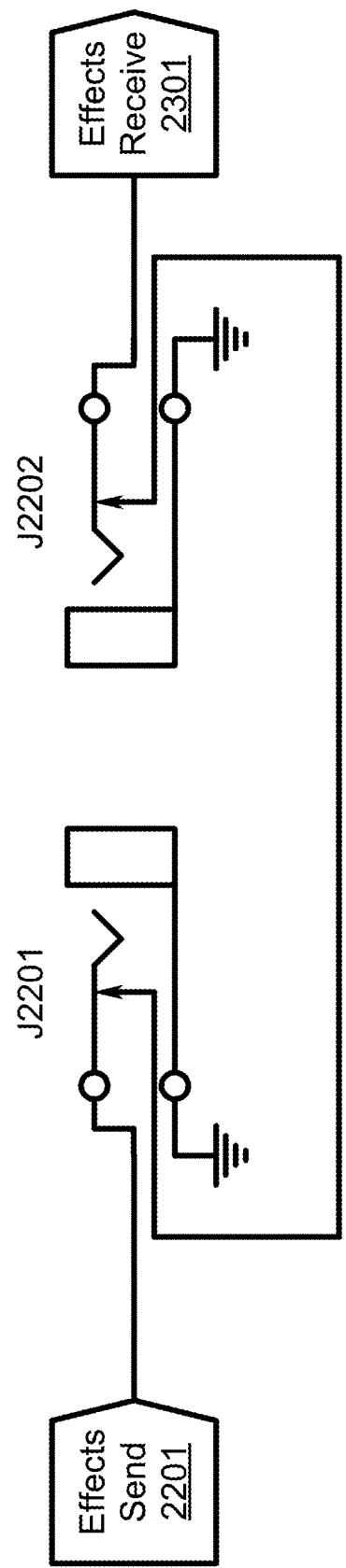
FIG. 22 illustrates a schematic depicting a preferred exemplary effects send/receive (ESR) system embodiment (page 2/3)
Figure 23:
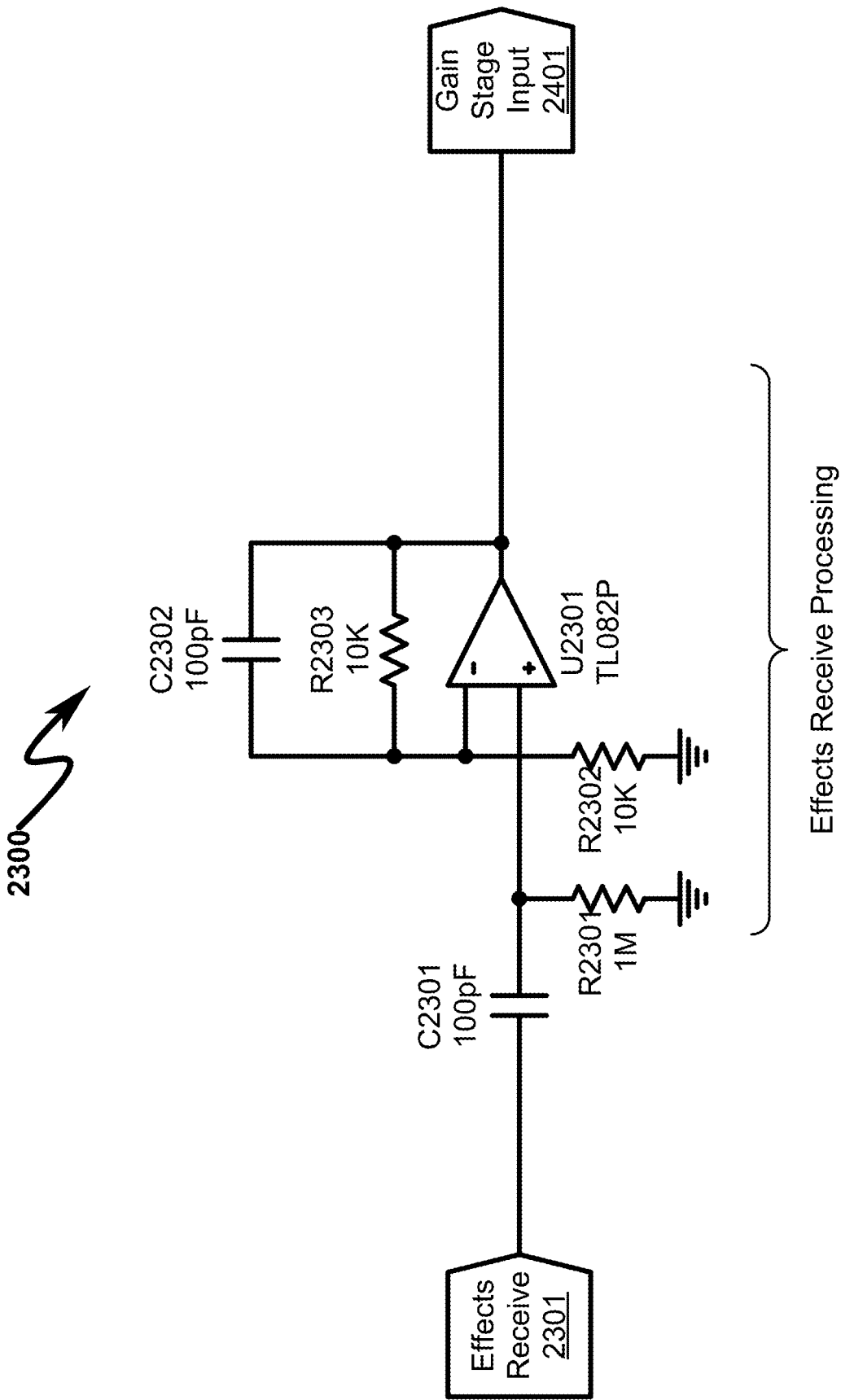
FIG. 23 illustrates a schematic depicting a preferred exemplary effects send/receive (ESR) system embodiment (page 2/3)
Figure 24:
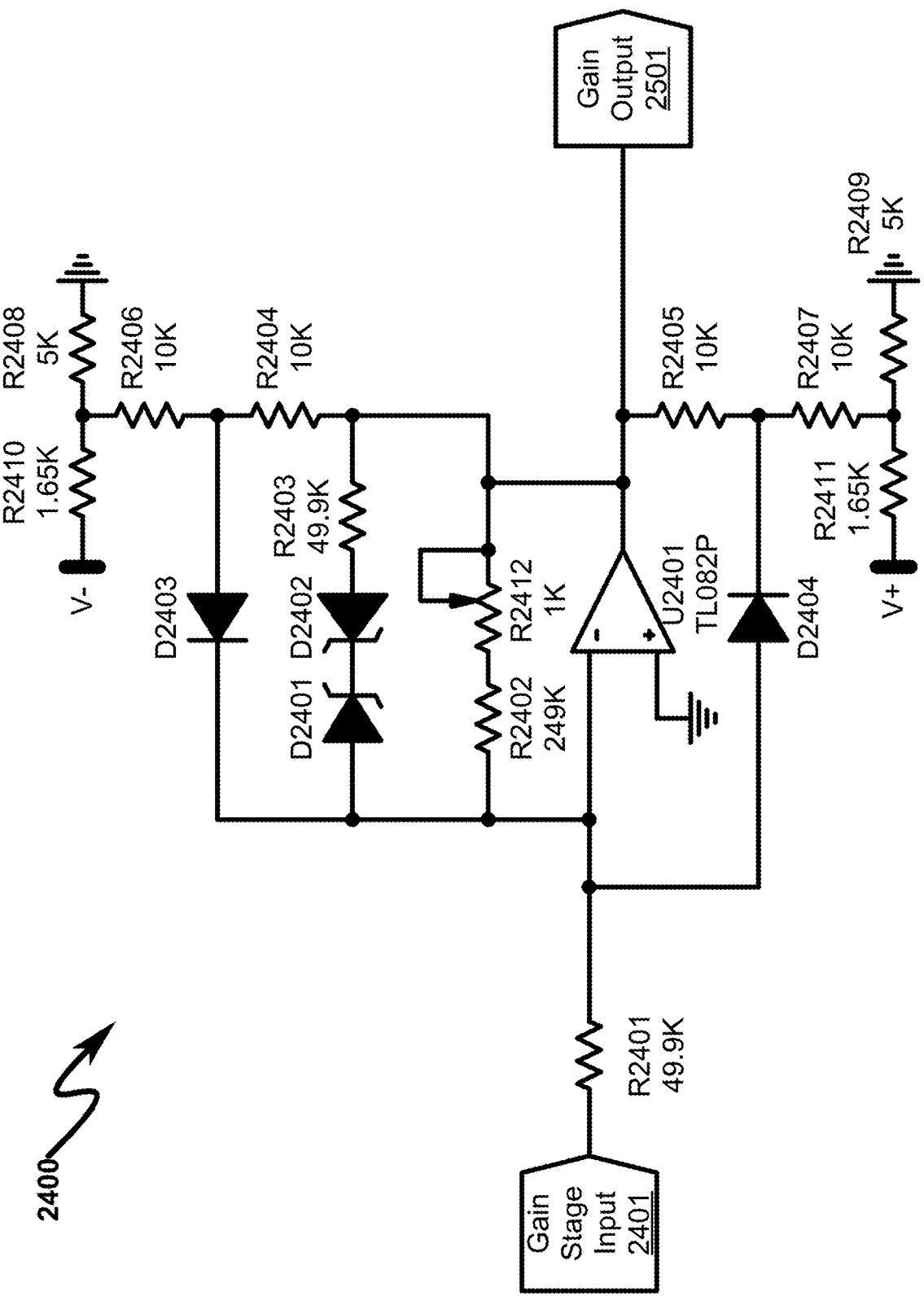
FIG. 24 illustrates a schematic depicting a preferred exemplary asymmetric gain control (AGC) system embodiment (page 1/3)
Figure 25:
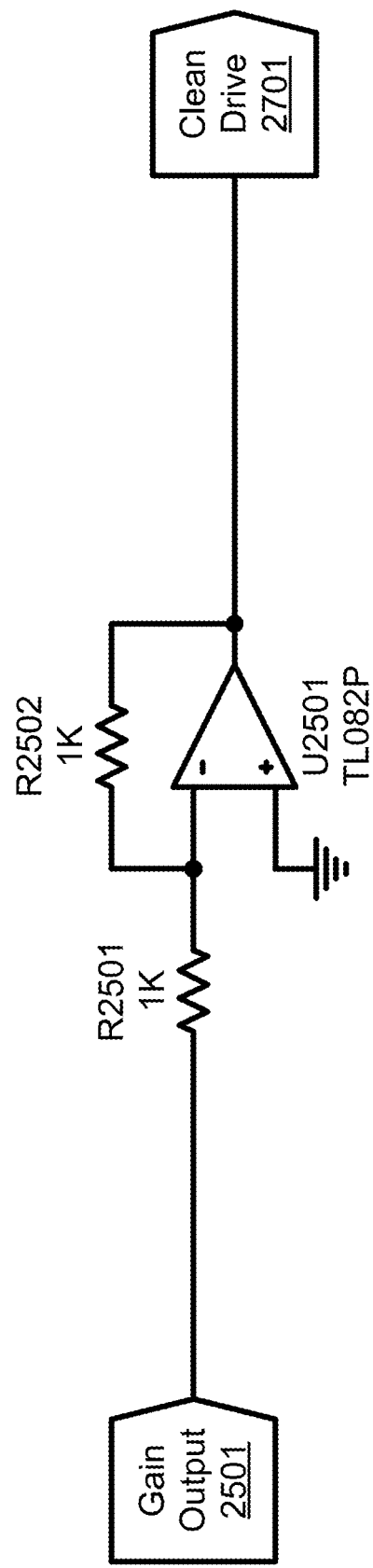
FIG. 25 illustrates a schematic depicting a preferred exemplary asymmetric gain control (AGC) system embodiment (page 2/3)
Figure 26:
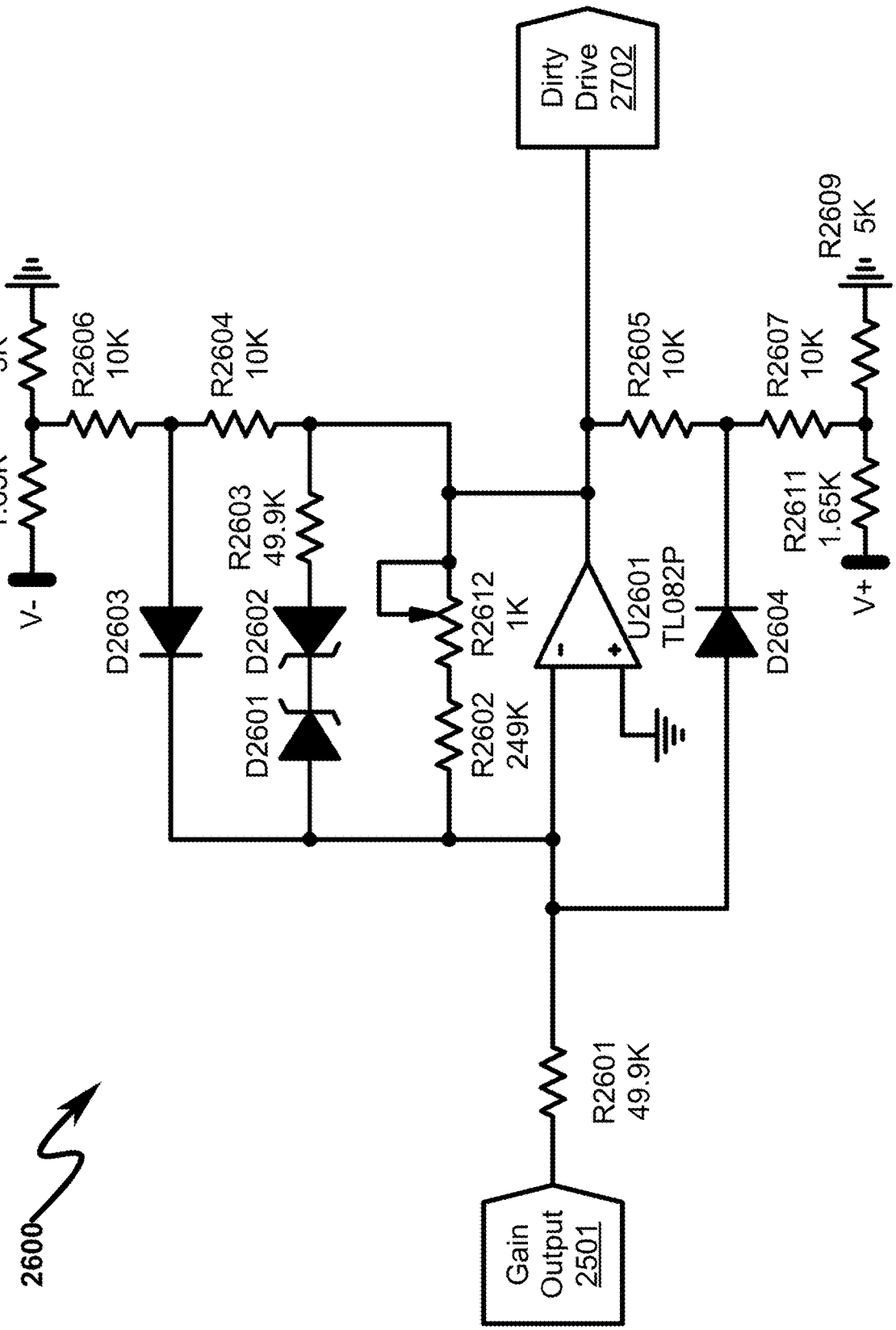
FIG. 26 illustrates a schematic depicting a preferred exemplary asymmetric gain control (AGC) system embodiment (page 3/3)
Figure 27:
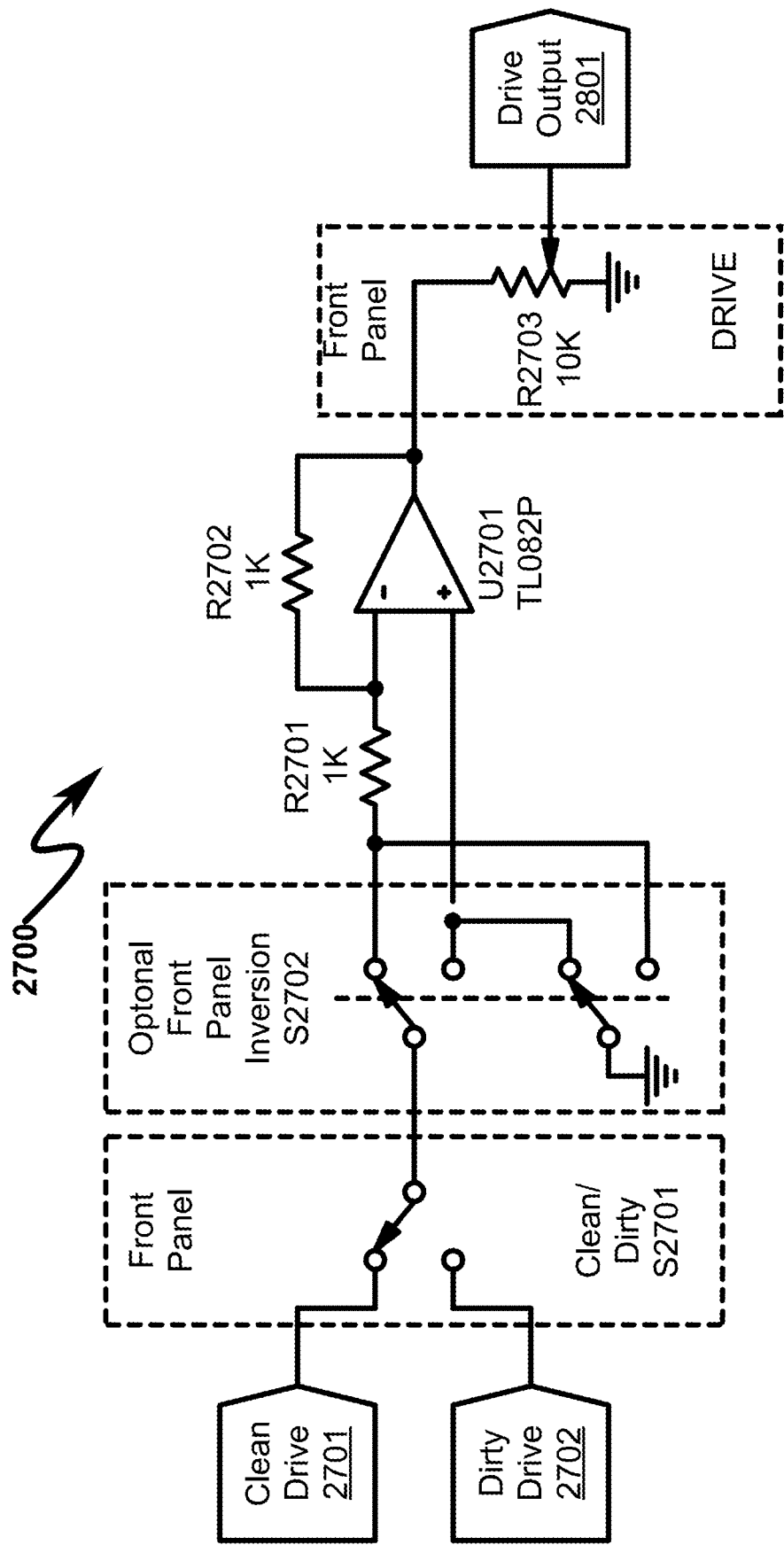
FIG. 27 illustrates a schematic depicting a preferred exemplary drive return amplifier (DRA) incorporating clean/dirty signal selection system embodiment.
Figure 28:
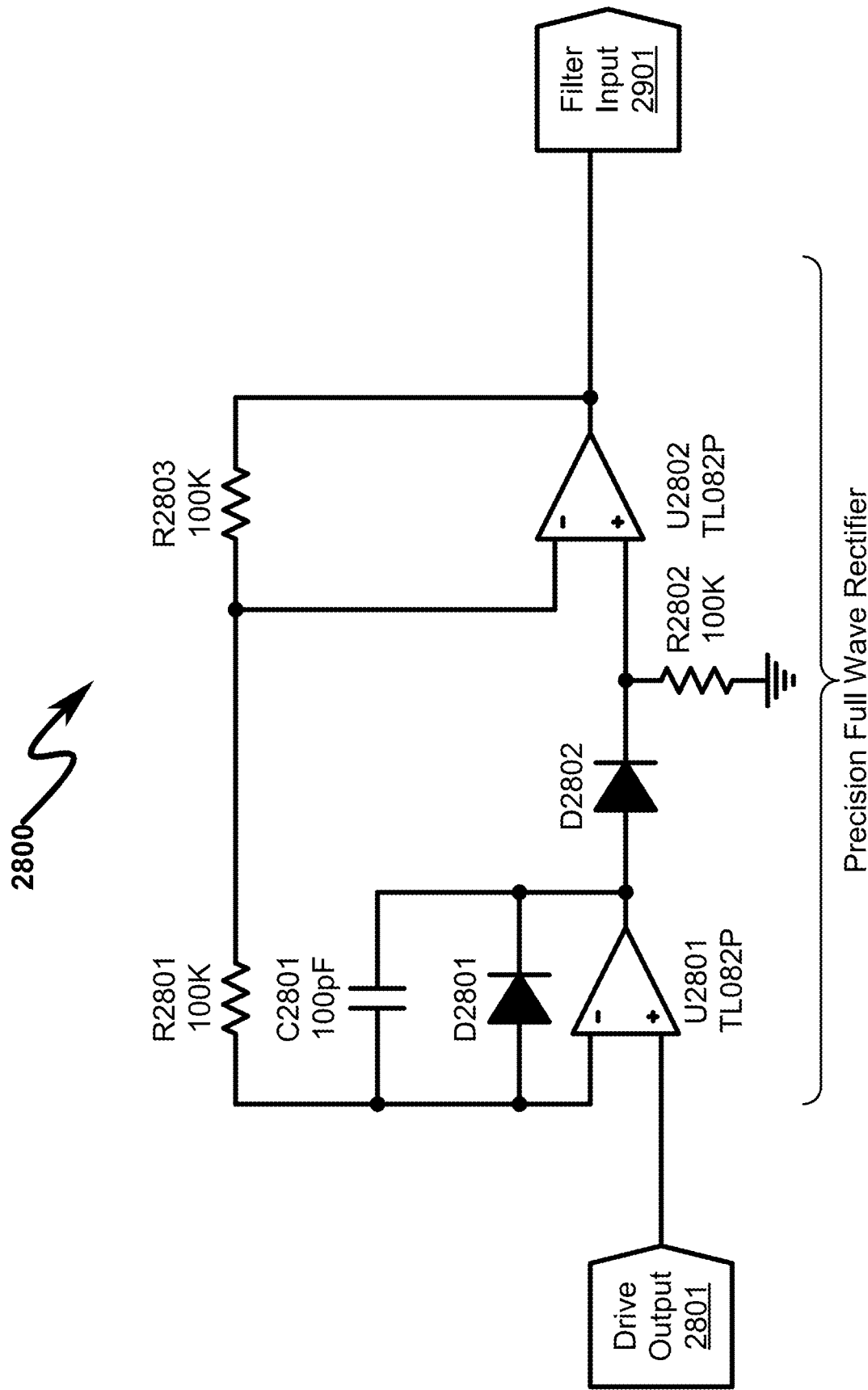
FIG. 28 illustrates a schematic depicting a preferred exemplary precision envelope follower (PEF) (precision full wave rectifier) system embodiment (page 1/4)
Figure 31:
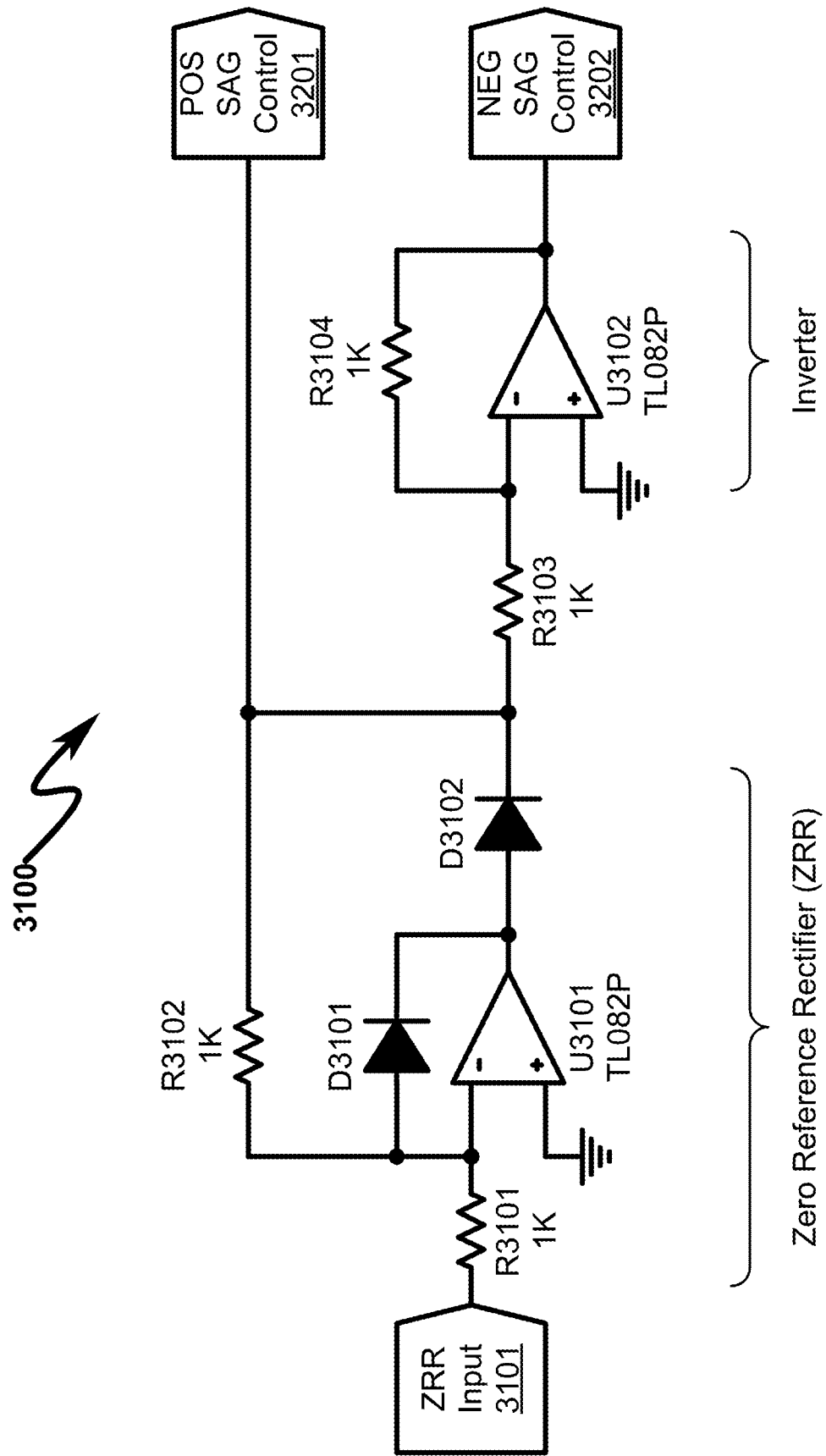
FIG. 31 illustrates a schematic depicting a preferred exemplary precision envelope follower (PEF) (attack/decay control/zero reference detector and positive/negative sag control) system embodiment (page 4/4)
Figure 32:
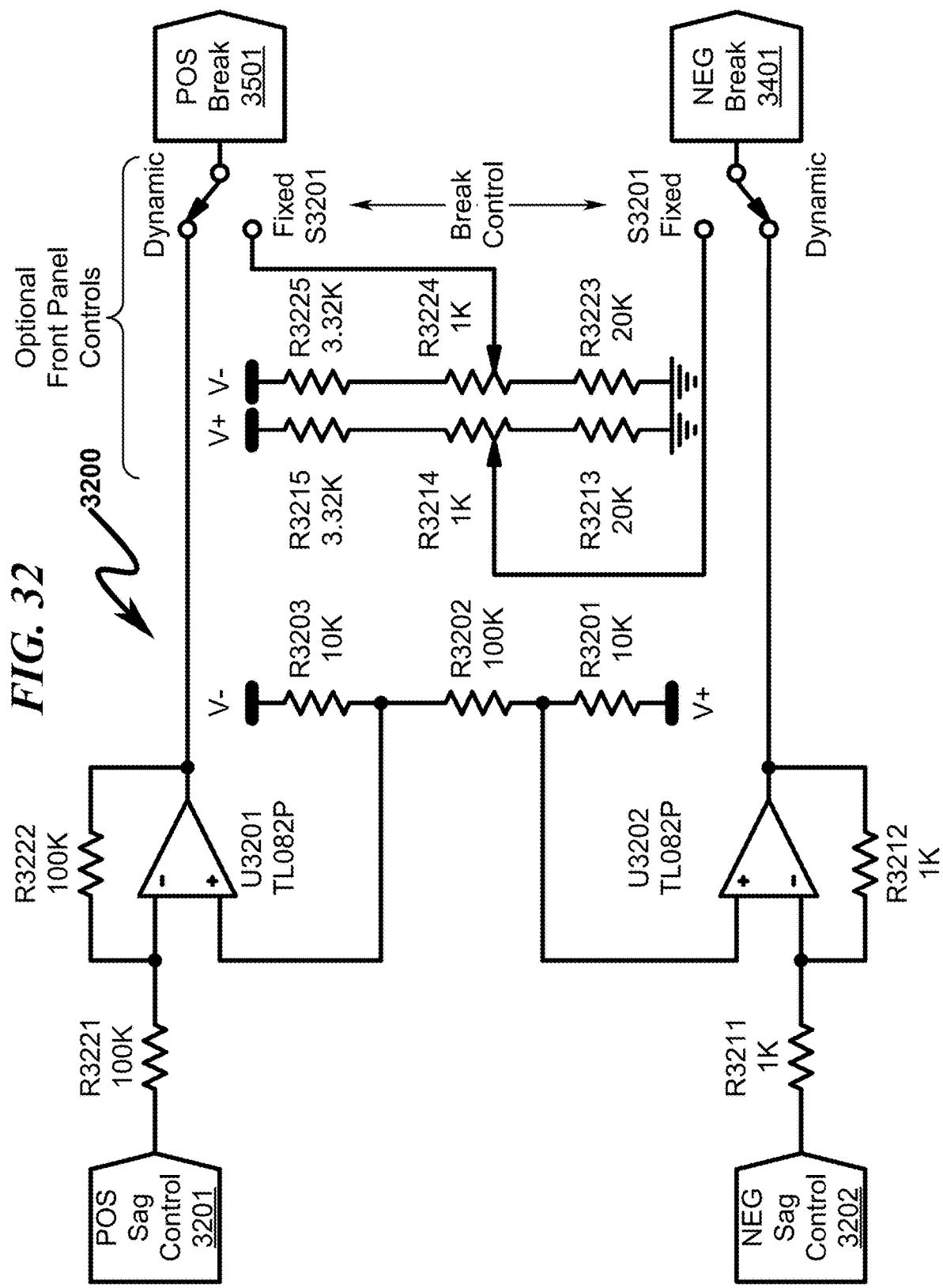
FIG. 32 illustrates a schematic depicting a preferred exemplary positive/negative breakpoint control system embodiment.
Figure 33:
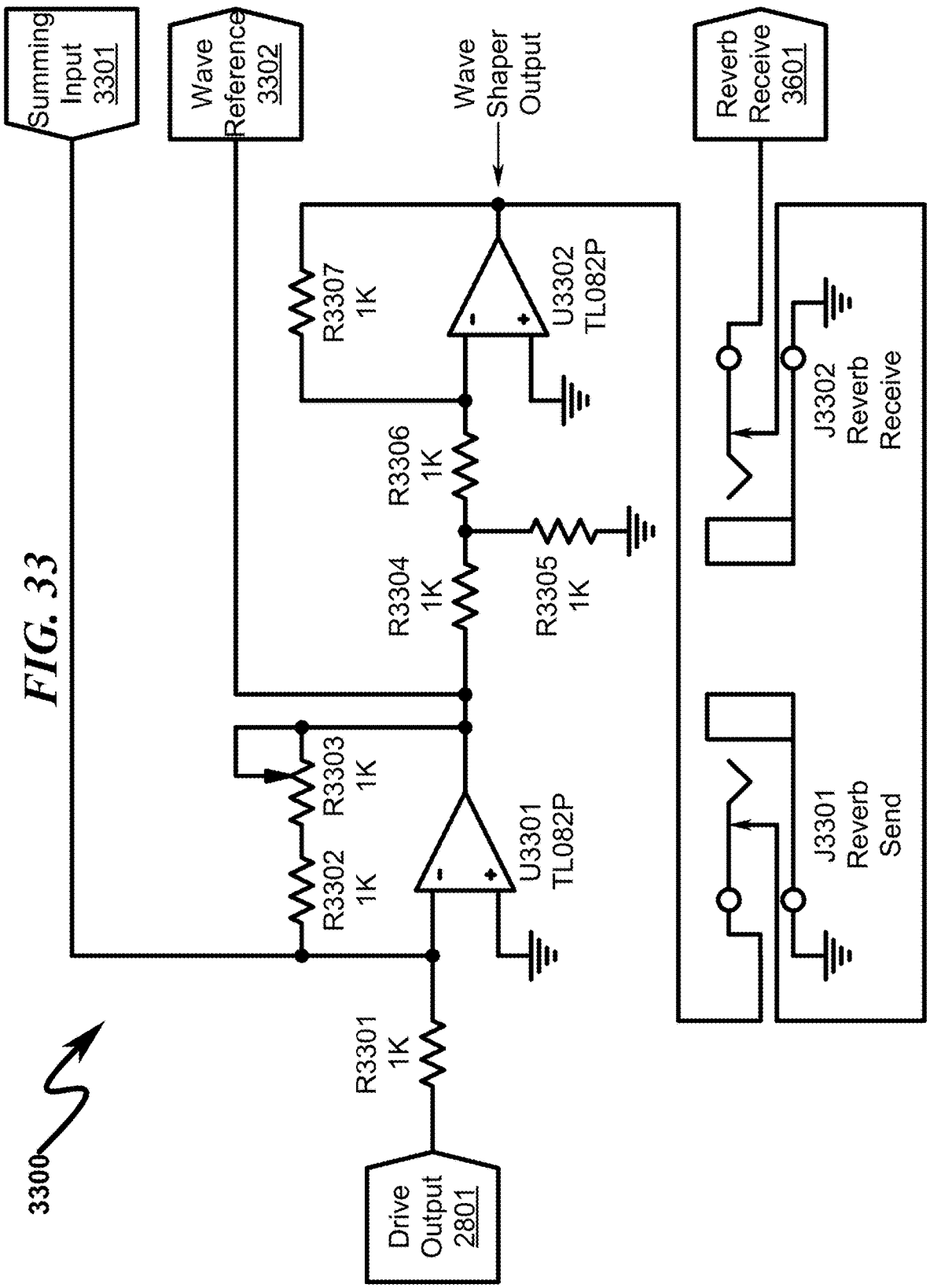
FIG. 33 illustrates a schematic depicting a preferred exemplary piecewise linear approximation (PLA)/breakpoint control input wave shape transformer (WST) system embodiment and reverb send/receive circuitry system embodiment.
Figure 34:
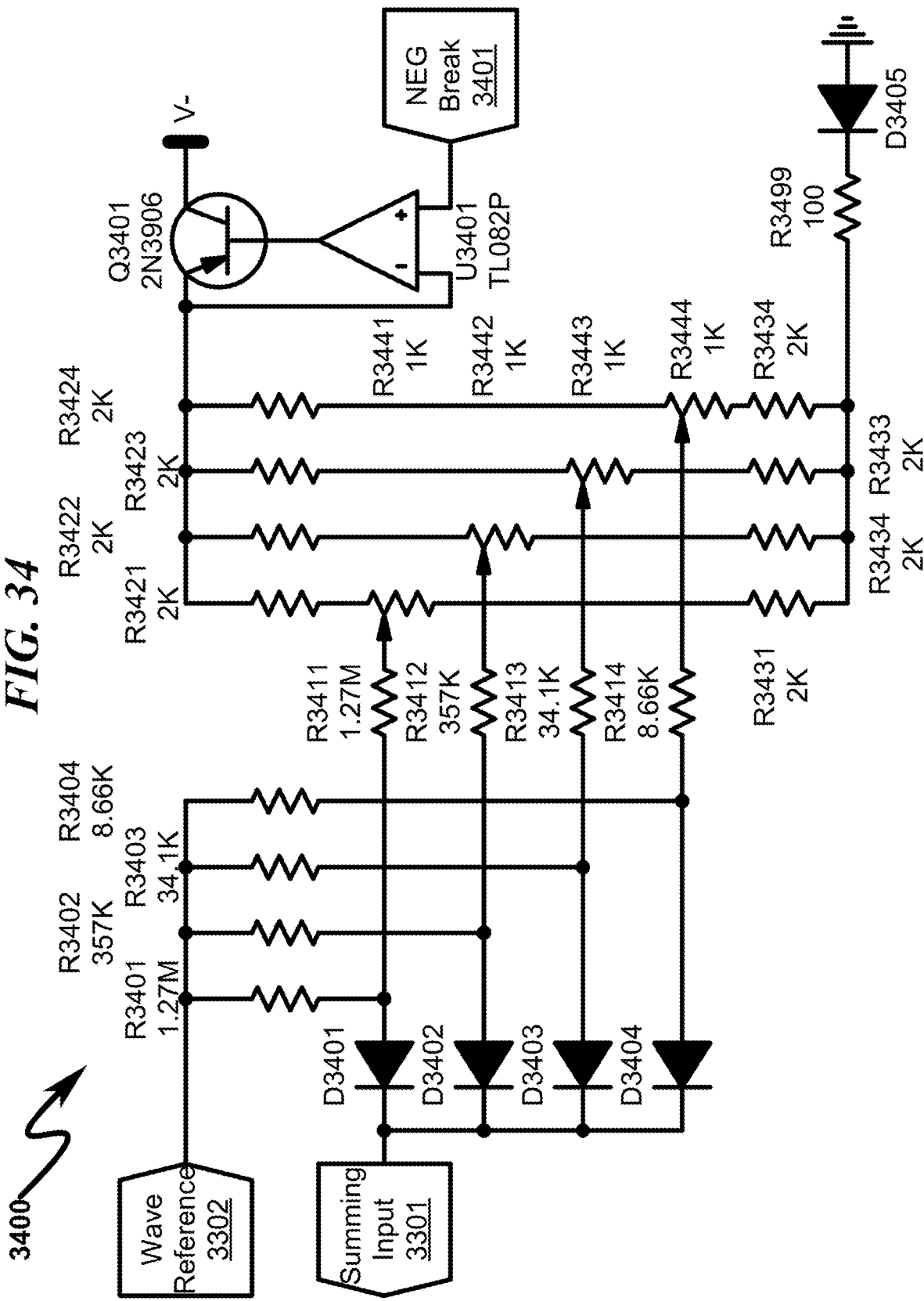
FIG. 34 illustrates a schematic depicting a preferred exemplary negative breakpoint control (NBC)/piecewise linear approximation (PLA) wave shape transformer (WST) system embodiment.
Figure 35:
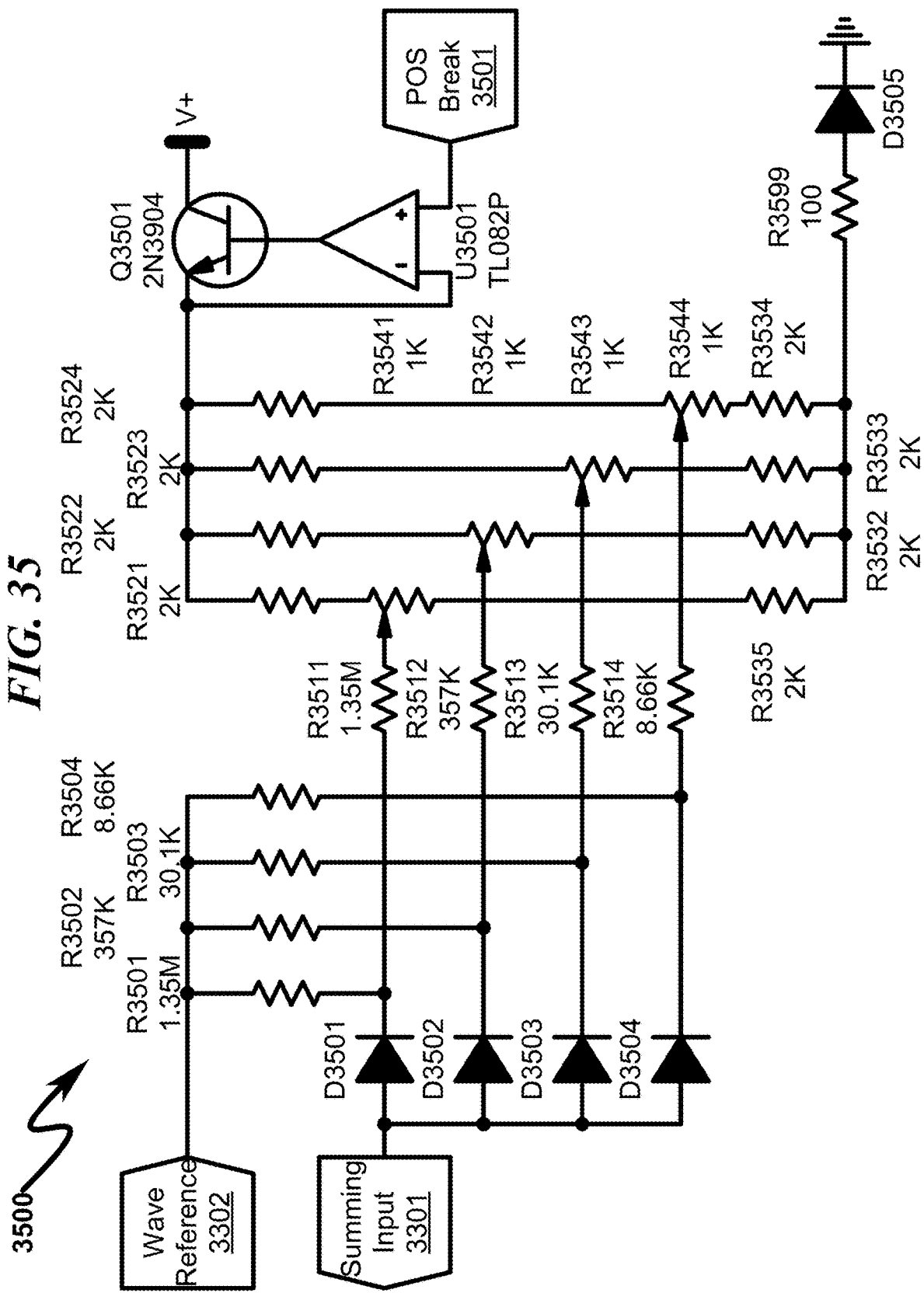
FIG. 35 illustrates a schematic depicting a preferred exemplary positive breakpoint control (PBC)/piecewise linear approximation (PLA) wave shape transformer (WST) system embodiment.
Figure 36:
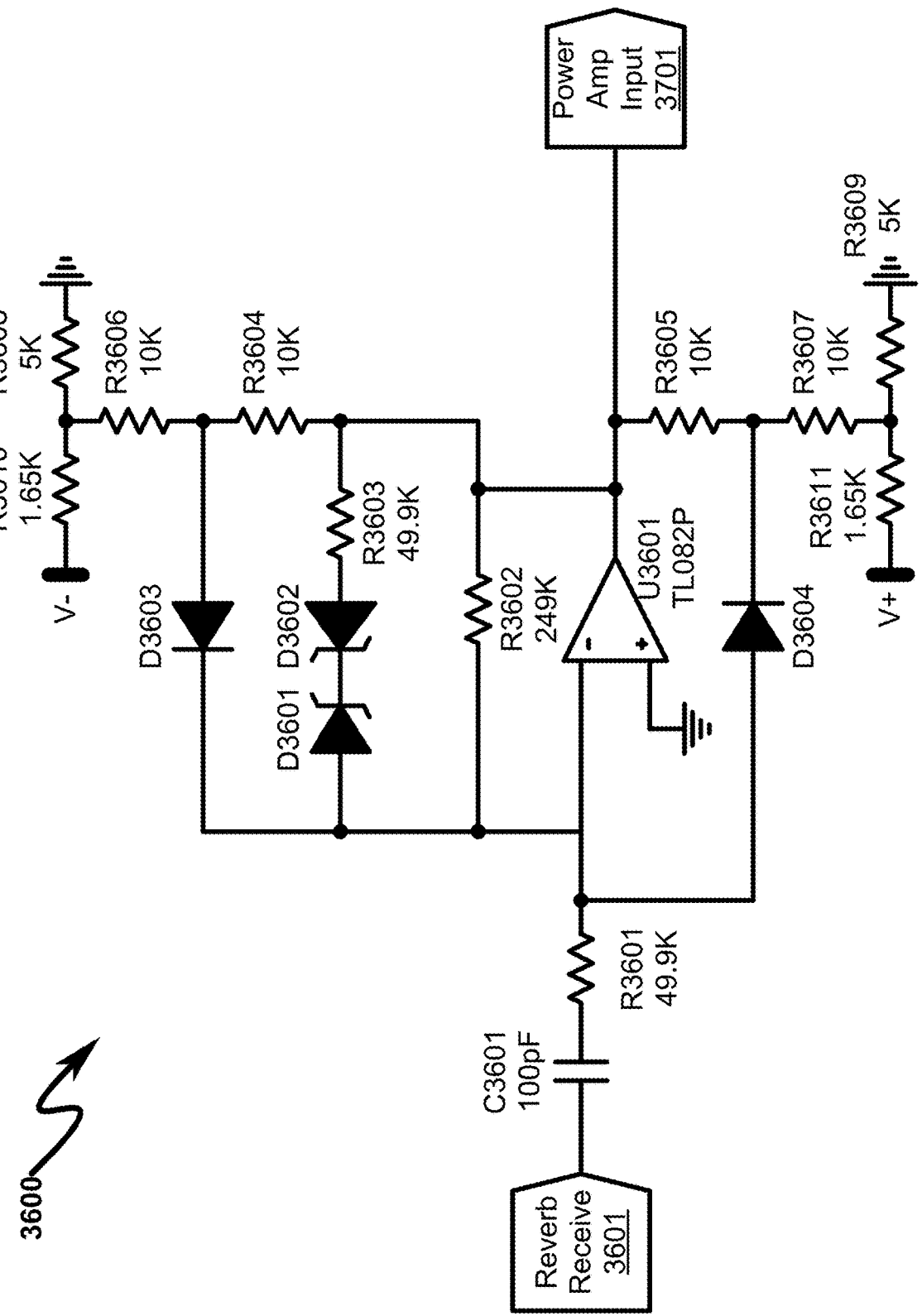
FIG. 36 illustrates a schematic depicting a preferred exemplary reverb receive circuitry system embodiment.
Figure 37:
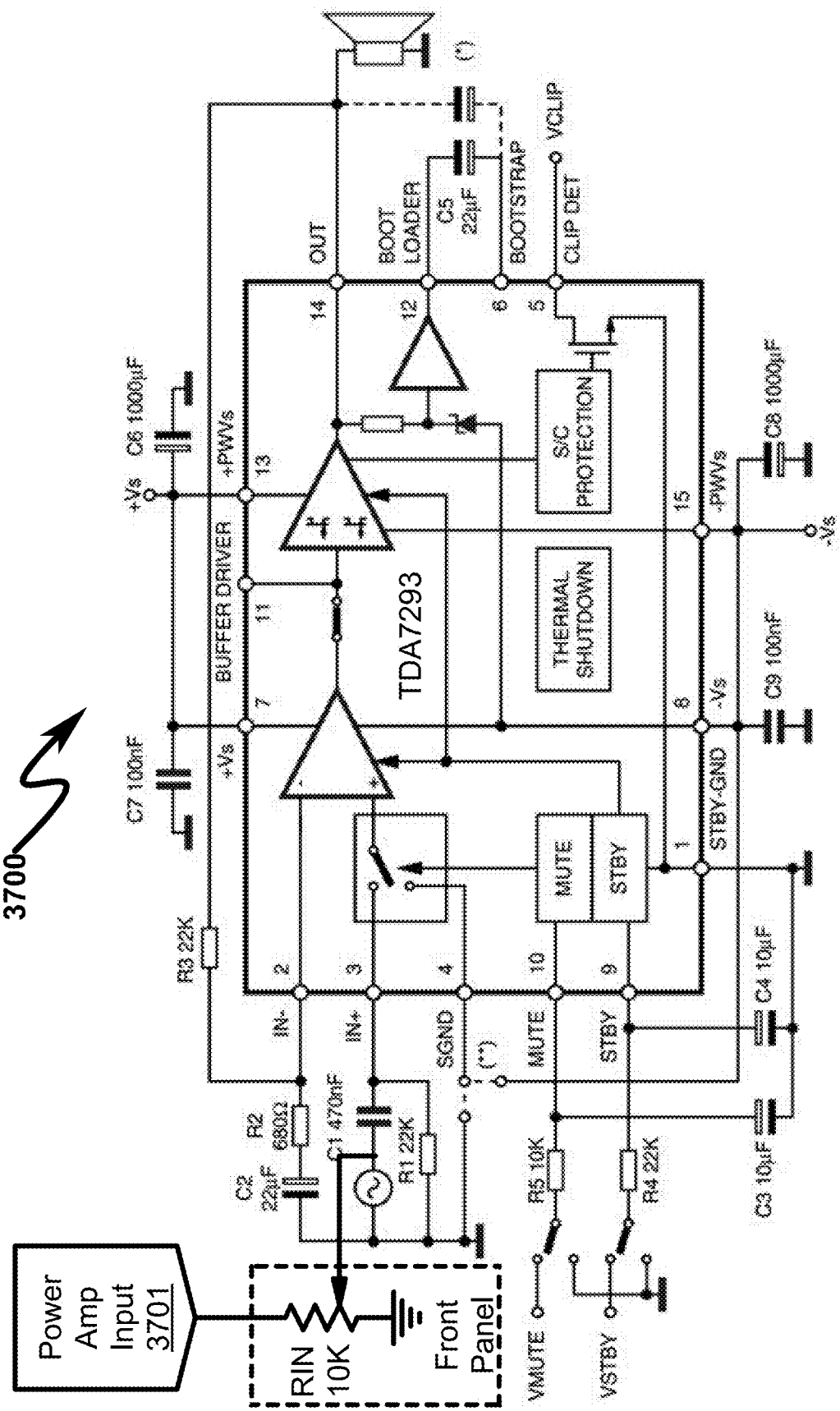
FIG. 37 illustrates an overview schematic depicting a preferred exemplary speaker power amplifier (SPA) system embodiment (page 1/3)
Figure 38:
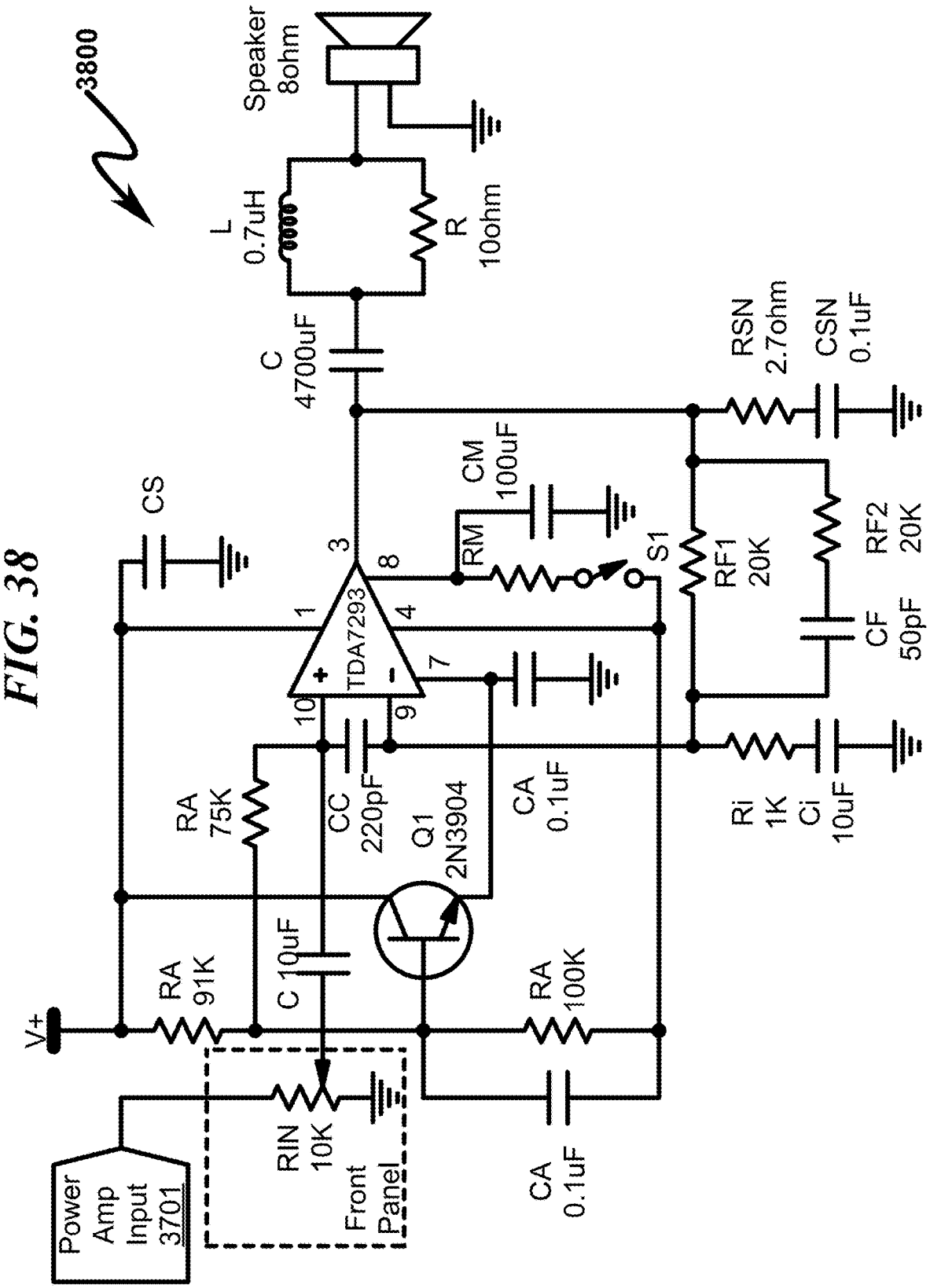
FIG. 38 illustrates a schematic depicting a preferred exemplary speaker power amplifier (SPA) system embodiment (page 2/3)
Figure 40:
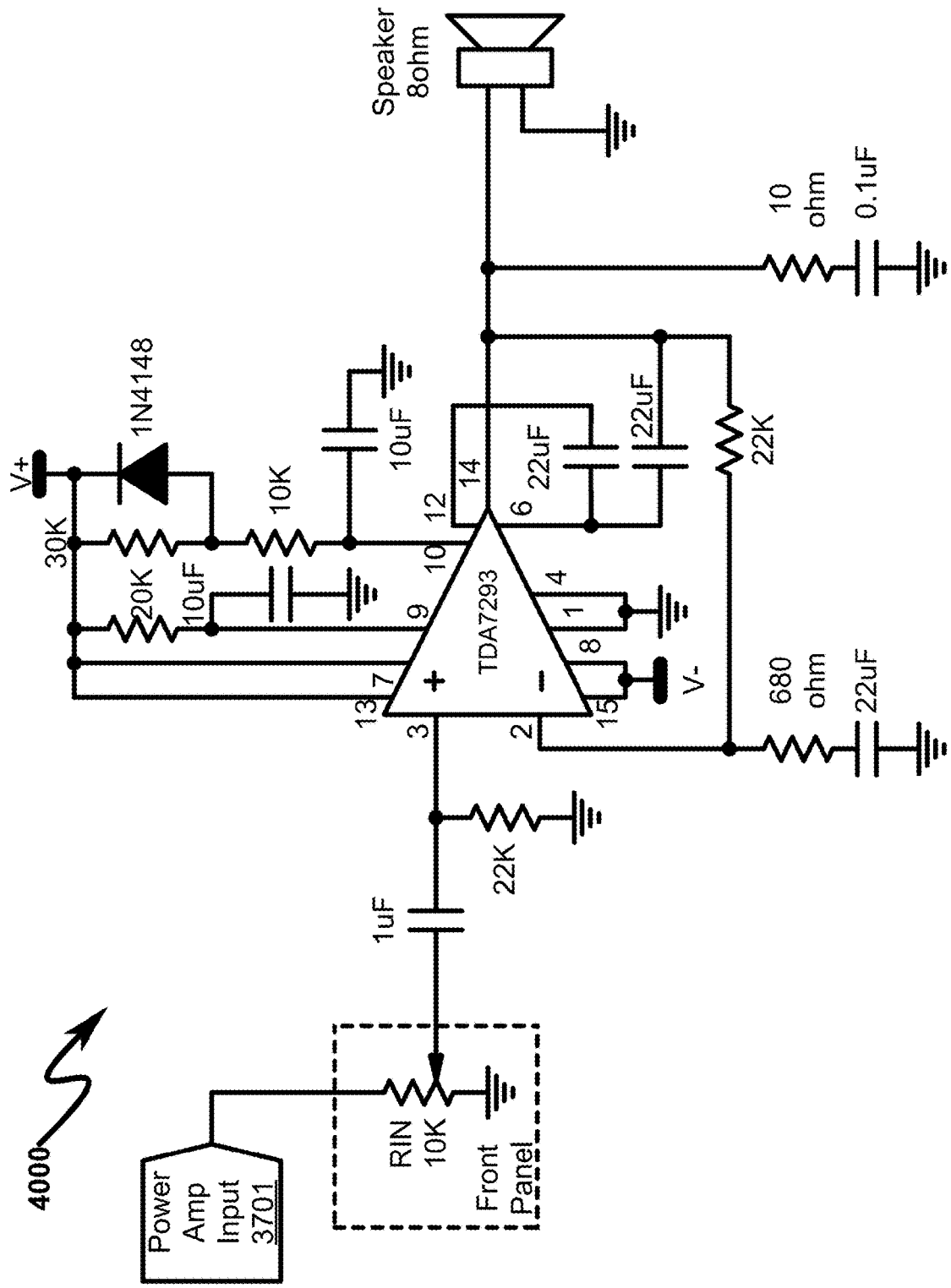
FIG. 40 illustrates an alternative design schematic depicting a preferred exemplary speaker power amplifier (SPA) system embodiment.
Figure 41:
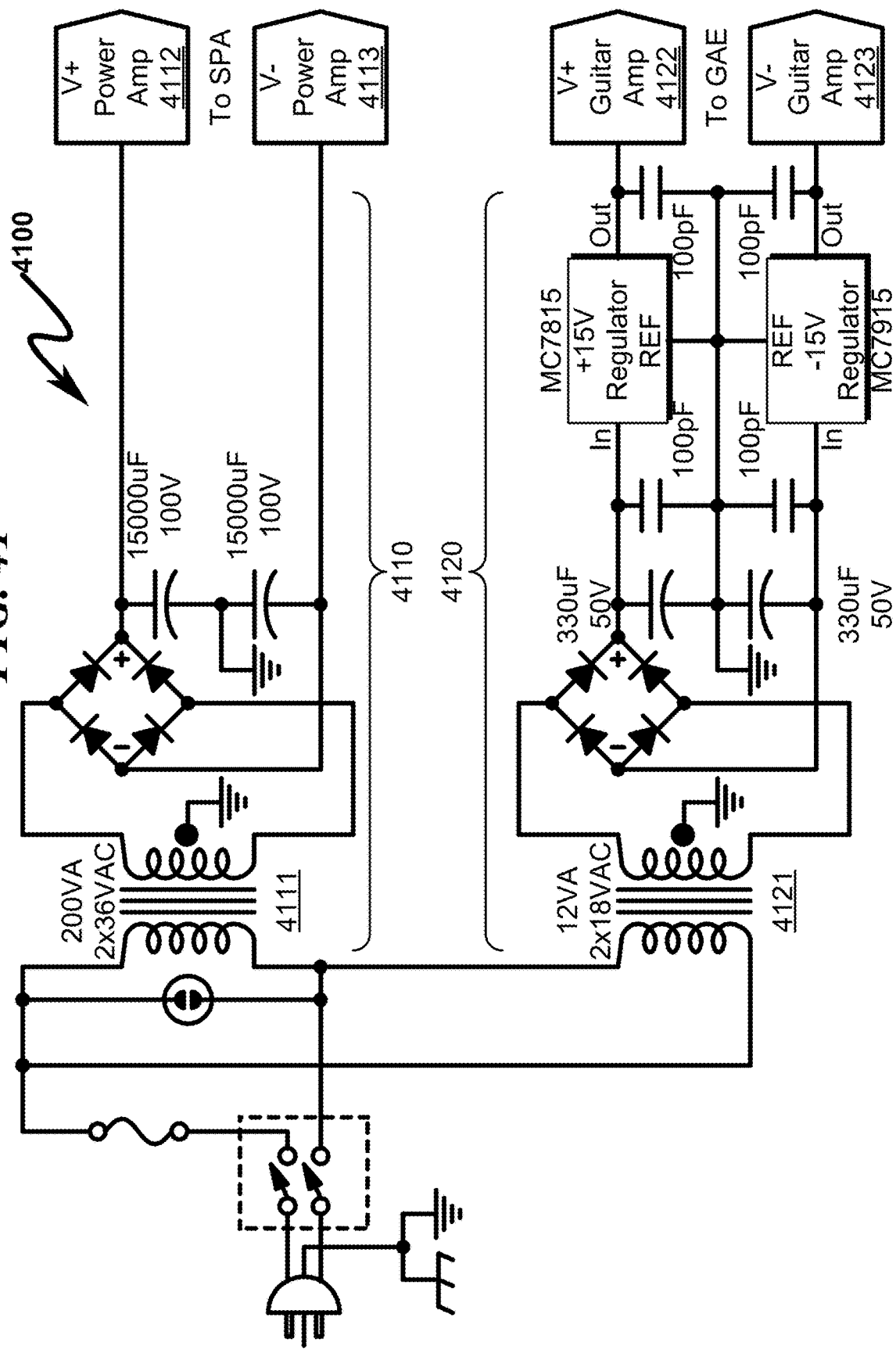
FIG. 41 illustrates a schematic depicting a preferred exemplary power supply implementation used in many preferred invention embodiments.
Figure 42:
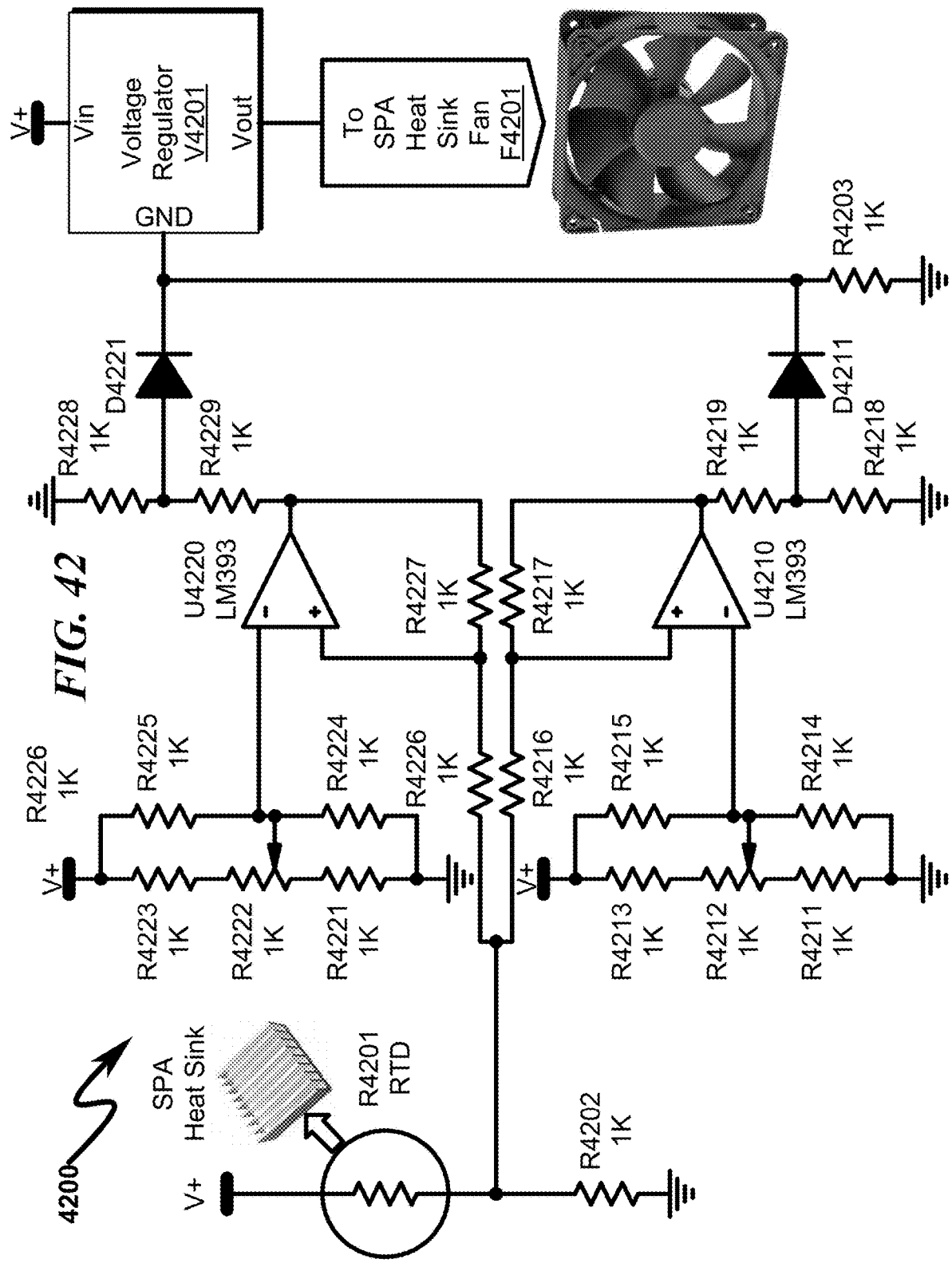
FIG. 42 illustrates a schematic depicting a preferred exemplary dynamic fan control (DFC) implementation used in many preferred invention embodiments.

FIG. 19 (1900)-FIG. 42 (4200) depict detailed schematics of a preferred exemplary invention embodiment. One skilled in the art will recognize that component values may be modified in many implementations and that these schematics may be heavily modified depending on specific application context. FIG. 19 (1900)-FIG. 20 (2000) depict schematics detailing a preferred exemplary input audio preamplifier (IAP) and passive level control. FIG. 21 (2100)-FIG. 23 (2300) depict schematics of a preferred exemplary effects send/receive (ESR) processor. FIG. 24 (2400)-FIG. 26 (2600) depict schematics of a preferred exemplary effects asymmetric gain control (AGC) and clean/dirty gain (CDG) processor. FIG. 27 (2700) depict schematics of a preferred exemplary drive return amplifier (DRA) processor. FIG. 28 (2800)-FIG. 31 (3100) depict schematics of a preferred exemplary precision envelope follower (PEF). FIG. 32 (3200) depicts schematics of a preferred exemplary negative breakpoint control (NBC) and positive breakpoint control (PBC) processor. FIG. 33 (3300)-FIG. 35 (3500) depict schematics of a preferred exemplary piecewise linear approximation (PLA) processor. FIG. 36 (3600) depict schematics of a preferred exemplary reverb send/receiver (RSR) processor. FIG. 37 (3700)-FIG. 40 (4000) depict schematics of several preferred exemplary speaker power amplifiers (SPA) implementing the teachings of the present invention. FIG. 41 (4100) depict schematics of a preferred exemplary power supply supporting the teachings of the present invention. FIG. 42 (4200) depict schematics of a preferred exemplary dynamic fan control (DFC) supporting the teachings of the present invention.

Power Supply (4100)

While one skilled in the art will recognize many forms of power supply may be utilized in implementing the present invention, some will be considered preferred. One such preferred embodiment is generally illustrated in FIG. 41 (4100) wherein two separate power supplies (4110, 4120) are implemented using separate AC transformers (4111, 4121) to provide separate power to the SPA (4112, 4113) and the remainder of the guitar amplifier electronics (GAE) (4122, 4123) respectively. As generally illustrated, the SPA power supply (4110) is unregulated but heavily filtered and the GAE power supply (4120) is regulated and filtered. This permits some degree of power supply sagging to occur with the SPA power supply (4110) while the GAE power supply (4120) is sufficiently regulated to allow more precise transfer characteristics to be maintained over a wide range of operating conditions. Separation of the power supply AC transformers (4111, 4121) permits isolation of dynamic SPA power supply (4110) demands by the SPA from the signal flow associated with the GAE.

Dynamic Fan Control (4200)

As generally illustrated in the mechanical drawings provided herein, it is anticipated that the SPA may incorporate a finned heat sink in order to dissipate heat associated with the integrated circuit SPA amplifier. This combination provides for significantly reduced static power consumption as compared with vacuum tube amplifiers taught by the prior art, but may require additional heat dissipation capabilities during periods of high output loading.

To address this issue of dynamic heating, the present invention may incorporate a dynamic fan control (DFC) as generally illustrated in FIG. 42 (4200) to monitor the temperature of the SPA heat sink and regulate the fan speed in accordance with detected heat sink temperature. Thermistor (R4201) (typically an NTC thermistor having 10K ohms resistance at room temperature) monitors the temperature of the SPA heat sink and OP AMP circuits associated with amplifiers (U4210, U4220). As the thermistor resistance goes down the voltage goes up with the fan off at room temperature. As such, much of the time the cooling fan will be off when the guitar amplifier is in use. At an elevated temperature such as 35° C., the fan is activated with a low voltage (such as 9V), providing for quiet fan operation. At higher temperatures like (such as 65° C.), the fan is operated at full speed with an operating voltage of 12VDC. Hysteresis incorporated into the provided design to keep the fan from unnecessarily cycling from ON-to-OFF and visa versa. The thermistor (R4201) modulates a GND reference voltage applied across a reference resistor (R4203) to voltage regulator (V4201) to produce an output voltage (Vout) applied to the SPA heat sink fan (F4201). While other voltage regulators may be used, a preferred invention embodiment utilizes a ST MICRO LD1086BV-DG as the driving voltage regulator (V4201). The circuit as shown is designed to operate a 12 VDC fan with a model 3110SB-04W-B50-E00 used in many preferred embodiments.

Detailed Subsystem Description

Input Audio Preamplifier (IAP) (1900)

The input audio preamplifier (IAP) consists of amplifier (U1901) and supporting passive components. This is a non-inverting amplifier with high input impedance designed to capture the full signal from the guitar pickup. It is AC coupled to protect against unwanted input offsets particularly from electronic sources.

This amplifier (U1901) is set for a gain of x9. This gain allows guitar pickup level signals and guitar effects outputs to be both capable of being input.

Resistors (R1904, R1905) comprise a voltage divider to this output. The front panel switch Guitar Gain Boost (GGB) (S1901) allows either the full level signal or the attenuated signal to be passed forward in the signal chain. This can be used for a variety of playing situations, but intended primarily to compensate for the difference in output from humbucker style to single coil style pickup designs.

Passive Tone and Level (PTL) (2000)

Passive tone and level (PTL) consists of passive components connected on the front panel. This particular realization is known as the 'Fender Tone Stack', and is similar to that used for about 50 years. This design does work extremely well with single-coil pickups. The present invention anticipates that some embodiment implementations may be chosen specifically for other guitar pickup designs.

This illustrated embodiment incorporates a BRIGHTNESS CONTROL switch (S2001) to enhance high frequency response. This circuitry allows for the frequency response of the audio signal from the guitar audio pickup to be modified for particular musician preferences. The BRIGHTNESS CONTROL switch (S2001) allows for a given amount of high frequencies to be allowed through.

The Preamp Input Level (R2004) control allows specified amounts of the signal through to the rest of the signal chain.

Effects Send Receive (ESR) (2100)-(2300)

This block consists of two grounded ¼-inch input jacks (U2201, U2202) on the front panel and amplifiers (U2101, U2301).

With no cables installed in these jacks (U2201, U2202), the signal is simply passed through unchanged.

If the musician wishes, one or more guitar effects pedals may be used to modify the sound. Design intent is for these effects to be chorus, delay, etc.

In order to maintain signal integrity while passing the signal through to the input of the effects, amplifier (U2301) is used. Gain is again ×9. This stage is also intended to provide frequency limits to signals well outside the bandwidth of the Guitar Audio Pickup. These are provided by (C2102, C2302).

Referred to as the Receive amplifier, in order to protect the audio signal and the amplifier electronics, an amplifier (U2301) is used to provide high input impedance, with no further gain. This input is also high impedance and a guitar audio pickup signal could be inserted here.

Asymmetric Gain Control (AGC)—Cathode Clip (2400)-(2700)

Two separate asymmetric gain blocks are used (U2401, U2601).

Each gain block individually is designed to provide peak compression as the signal gain creates peaks approaching the OP AMP power supply rails. Generally, the audio signal must not be allowed to clip from the power supply rails.

In realization depicted, the gain of each stage can be adjusted using a trimpot (R2412, R2612). The gain can go from ×5 to ×10.

The first layer of peak compression is a diode coupled piecewise breakpoint. The breakpoint voltage is set by (R2410, R2408) for negative excursion peaks through diode (D2403). The breakpoint for positive excursions is set by the voltage divider (R2411, R2409) for negative excursion peaks through diode (D2404).

The gain resistors (R2404, R2406, R2405, R2407) are placed in parallel with the series combination of (R2402, R2412).

A second layer of peak compression to prevent any unwanted clipping is provided by the back to back Zener diodes (D2401, D2402) allowing a series (R2403) to also be placed in parallel to the feedback resistors.

The second gain stage of (U2601) works in the same fashion. A switch on the front panel called Clean/Dirty (S2701) allows either one or both in series to be put forward to the signal chain. An inverter (U2701) of unity gain is used to maintain the overall signal inversion through this block.

These amplifiers are designed to emulate the performance of cathode coupled preamp gain stages of tube amplifiers. These tube amplifiers use a preamplifier tube such as the 12AX7 to provide gain. This type of gain is inverting, and if driven to clipping provides a different mechanism of clipping from positive to negative excursions. This nonsymmetric compression provides different harmonic content from symmetric peak compression.

Drive Level Control (DLC) (2700)

The front panel control Drive Level (R2703) is used to select how much of this signal is allowed to pass onto the rest of the signal chain. This is implemented using a simple rheostat or potentiometer.

Drive Return Amplifier (DRA) (2700)

The amplifier block (U2701) provides impedance buffering from the Drive Level Control, and allows selection of inversion state via (S2702). This can be used to create an overall signal chain of 'not inverted'. This allows a musician to use multiple amplifiers of different makes in parallel and not have phase cancellation.

Piecewise Linear Approximation (PLA)—Wave Shaper

This circuit is used to create a voltage transfer function which simulates the operation of a tube amplifier in a Class AB push-pull configuration with phase splitter, power tubes, output transfer, and speaker. These components in a tube amplifier consist of a completely integrated block. It is this circuit block that yields the tones for which guitar players have sought throughout the history of the electric guitar.

Many output power tubes are used in guitar amplifiers, and many variations of each are available. Typically pentode type tubes are used, also known as thermionic pentodes and beam pentodes. Various models are EL34, EL84, 6V6, 6L6, 5881, etc. Different amplifier manufacturers are known for their use of tube families and have distinct tonal qualities well known by guitarists for over 50 years. This particular emulation of these various tubes using this method allows the tonal qualities from these different tubes to be presented by this amplifier through the use of different schematic tuning of the various means presented.

Analysis of the circuit yields a symmetric compression of peaks from positive to negative excursion creating odd harmonic addition to the original frequencies. This amplifier played at lower volumes can yield amplification with low levels of harmonic distortion, known as a clean sound. At higher volumes, the peaks are lightly compressed, and this slightly increased amount of harmonic distortion is known as a warm sound, or a chimy sound. With larger volumes, the peak compression is noticeably distorted, this is known as a crunchy or grungy tone (e.g., rock'n'roll).

A feature of quality tube amplifiers is the ability to play more than one note at the same time with various levels of harmonic distortion adding further frequencies to the combination of notes. A quality amplifier will allow a great deal of recognition of groups of notes, both intervals of two notes or chords of three or more notes, which are more complex musically. For instance, minor chords, suspended chords, etc. Poor quality amplifiers, particularly previous solid-state amplifiers do not provide the 'perfect tube' creation of harmonic distortion. When these musical combinations are played, the tone is muddy, and the intervals and chords are not recognizable.

This also is referred to as 'punching through the mix'. A good amplifier allows the guitar to be heard through the complex sound mix of bass guitar, keyboard, vocal and drums without using excessive power and creating excessive sound pressure levels. A poor amplifier cannot be distinguished through the mix even at very high volume levels.

The present invention provides a unique means and method of duplicating this sound and is separated from many attempts by not trying to find a solid-state device to 'place into the schematic' of the tube amplifier, but to mathematically emulate the peak compression functionality of the tube output power stage.

Further analysis of the tube push-pull power stage of tube amplifiers is performed by using the plate characteristic curves of the power tube. Audio Power Amplifiers in Class AB mode are designed by superimposing the DC Load Line onto this curve set. This load line is set by plate characteristics, any series resistances, and the power supply voltage, along with the desired maximum power, seen by the plate current maximum. Each curve in this chart is seen as the possible voltage-current possibilities from a certain fixed grid voltage. The grid voltage is what is used to control the valve characteristic of the tube, in other words, the voltage input. Examples of these characteristics are generally depicted in FIG. 3 (0300)-FIG. 8 (0800).

As a starting point for one exemplary present invention embodiment, a set of points for input voltage and output voltage was generated for the EL84 power tube (known as a thermionic pentode). These points were charted in MICROSOFT® EXCEL® to create an input/output transfer function. Once these points were entered, various equations were used to determine the appropriate mathematical model, which is a third order polynomial. This process is generally depicted in FIG. 9 (0900).

The transfer function is seen as being quite non-linear at low levels; this is seen in purely Class B amplifiers. This is why the output tubes are biased partially on at DC. The other output excursion is then added in MICROSOFT® EXCEL® to represent the push-pull functionality for positive and negative excursions.

Before digital computers were prevalent, analog computers were used to calculate real time equations used in applications such as tossing objects through the air. The path an object takes, its trajectory, is known to be a quadratic equation:

$$Y=Ax^2+Bx+C$$

This is referred to as a non-linear due to the 'squared' function. Simple amplifier blocks do not perform this function. Several similar realizations were used, all performing what was called piecewise linear approximation. A series of different gains, triggered at different voltages created a series of line segments in the transfer function. The more line segments, and or course, the more accurate they were, overall function accuracy was created of better than 1%.

The realization used in this circuit uses diodes in the feedback path, coupled to an offset voltage. One series of diodes coupling cathodes to positive offsets for negative excursions and another coupling the anodes to negative voltages for positive excursions.

Circuit analysis demonstrates that at low voltages, the standard gain equations are present:

$$V=Rf/Ri$$

However, as the output voltage exceeds the voltage references, the diode begins to conduct presenting additional resistances in parallel to the feedback resistor and the gain is reduced. This particular transfer function is a decreasing gain transfer function.

The depicted exemplary realization uses four line segments for both positive and negative excursions, and is tuned to be extremely symmetric for both excursions to yield a high purity of odd harmonic byproducts.

This is similar to but potentially more accurate than the purchasing of expensive matched tube sets for tube power amplifiers. And of course, this electronic version does not change with time as tubes age and will not need to have components replaced at irregular intervals.

Digital oscilloscope waveforms were captured and the data was imported into MICROSOFT® EXCEL® for analysis demonstrating the smoothness of the time domain waveform through the breakpoints. Excellent $R^2$ residual correlation was achieved demonstrating this accuracy. The resulting tonal sound quality was determined to be similar to that of conventional vacuum tube electronics.

Exemplary Realization of the Wave Shaper Mathematics

Piecewise Linear Approximation (PLA) (3300)

OP AMP (U3301) provides the gain block for the circuit. The overall gain is set by the series combination of (R3302, R3303) with the input resistor (R3301), allowing a gain of x5 to x10. This is the gain presented to the signal at very low voltage levels.

Resistors (R3421, R3431) present a low impedance negative voltage source through the resistive voltage divider. When the output voltage at OP AMP (U3301) goes twice this voltage in a positive excursion, diode (D3401) begins to conduct and (R3401) is placed in parallel to the feedback resistor combination. This lowers the gain for all voltages between this breakpoint and the next. Diode (D3501) performs the same breakpoint function along with its components for negative excursions:

$$Rf=[(R3302+R3303)*R3401]/[([(R3302+R3303))+R3401]$$

Likewise, when the output voltages exceed the next voltage divider (R3422, R3434), diode (D3402) is forward biased and current flow places resistor (R3402) in parallel with the combination of the low voltage combination feedback resistors in parallel with (R3401) in parallel with (R3402). Again, symmetric function for opposite excursion is provided in FIG. 35 (3500). This gain is applied for voltages between the first and second breakpoints. In this fashion, four breakpoints are realized, the last for all voltages above the final breakpoint.

One critical performance capability for this realization is that it is very difficult for high input voltages to allow the output voltage to go above the output swing capability of the OP AMP, creating a power supply rail clip, which creates extremely bad harmonic addition.

Envelope Driven Open Loop Output Power Limiting-Sag Control

The following discussion describes the basics of limiting the output power to simulate the tube amplifier power supply sag. Early guitar amplifiers were not designed for the highly peak compressed harmonic distortion common in modern music (e.g., rock'n'roll). The clean sound, still used in much music today, utilized a much lower output power to stay in the linear region of the output voltage swing in the push-pull stage.

However, when musicians wanted to play louder, and turned up the gain, the harmonic distortion was much higher, likewise the output average power went much higher.

In a guitar amplifier using two EL84 tubes in push-pull output configuration, the clean output range was perhaps 5 watts average for a clean sound. With a much higher output harmonic distortion, the average power could go as high as 20 watts average. In fact, to achieve this crunchy harmonic sound, the output volume in decibels sound pressure level had to be this high. In other words, the tone of the amplifier is completely controlled by the output volume. In the depicted present invention exemplary realization, by achieving a precise mathematical harmonic content, the volume at the speakers is independent of harmonic content. In fact, therefore this realization has the capability which is referred to as the REVERB SEND/RECEIVE. This allows the reverb effect, as well as frequency tuning for speaker response, can be utilized after the harmonic distortion generation.

In the prior art tube amplifiers, this amount of output power was often higher than the capability of the speaker.

It was also higher than many of the main plate power supplies could sustain. The typical plate voltage for the EL84 was 450 VDC. When the output power design levels were exceeded, the power transformer magnetic flux could not sustain this 450 VDC, and would 'sag' down to lower voltages, such as 300 VDC. This would limit the output power. This sag is a function of many things, primarily the transformer flux capability, the output capacitor value and ESR, as well as the tube rectifier series resistance, or voltage drop. In fact, some tube amplifiers use solid-state silicon rectifier modules to present a stiffer power supply for some musical tastes.

This power supply sag occurs during the time when the musician 'plays a note'. This process begins when the string is struck, and the Guitar Audio Pickup generates a signal. The process consists of three stages: the attack, the sustain, and the decay. During the attack, the plate supply is at 450 VDC and the output power is at full, for a period of perhaps 15 to 100 msec. This is the attack phase.

As the power supply output capacitors drain, and the tube rectifier forward voltage drop increases and the power transformer is not able to magnetically supply sufficient output power, the power supply drops. However, the tone is harmonically sound due to the third order push-pull tube functionality.

During this time the output power is limited. As the signal from the Guitar Audio Pickup naturally fades as the string vibration amplitude drops, the power supply gradually recovers. The output volume does not increase, because the power supply increase is compensation for the string vibration amplitude fading. This is a form of automatic gain control or sustain. This is the sustain phase.

As the power supply is at full level, and the string continues to dampen naturally, the volume from the speakers gradually diminishes, and the harmonic content is gradually lessened from less peak compression. This is the decay phase of the 'note'.

Musicians see this as a greater 'sustain' of the note. They also refer to the 'bloom' of the note as the string subsides.

But further, the musician refers to the 'pick attack' and can use this phenomenon in the way the string is struck. A great deal of sound nuance is given to the musician.

Lastly, this time segment consisting of the 'note', referred to as attack, sustain, and decay is called the NOTE ENVELOPE. The power supply sag is a function of the amplitude of the note envelope.

In the depicted exemplary invention realization, the note envelope is generated using precision OP AMP circuitry, and has the capability of controlling the entry and exit of the envelope voltage waveform. This first realization does not incorporate musician control of these features of the SAG CONTROL, but this feature is anticipated in some invention embodiments.

The basic sections of the depicted circuit realization include a waveform envelope follower to create a signal representative of the output power. This signal is level shifted to provide an output threshold referenced to an 80 W output power to an eight-ohm load. This signal is modified to create two signals out of phase with each other. These signals are referenced to the plus and minus power sources which drive the breakpoint voltages in the piecewise linear amplifier circuit.

The following discusses realization of the circuits used to limit the output power as in tube amp power supply sag.

Precision Envelope Follower (PEF) (2800)-(2900)

The first stage is to create a precision full wave rectifier which takes the negative excursions of the signal and inverts then creating a DC version of the input signal. This is comprised of the two amplifiers (U2801, U2802). OP AMP (U2801) creates a precision rectifier function where the diodes (D2801, D2802) inside the feedback loop of the OP AMP become fully forward biased at the first currents and create a rectifier without the 0.6V forward drop of a silicon diode, and its soft forward voltage response. This creates a rectifier for signals in the millivolt region, with a non-inverted orientation.

This signal is then added to the original input signal with a gain of two in the inverting input, thus creating the full-wave rectification, accurate at low level signals.

Figure 29:
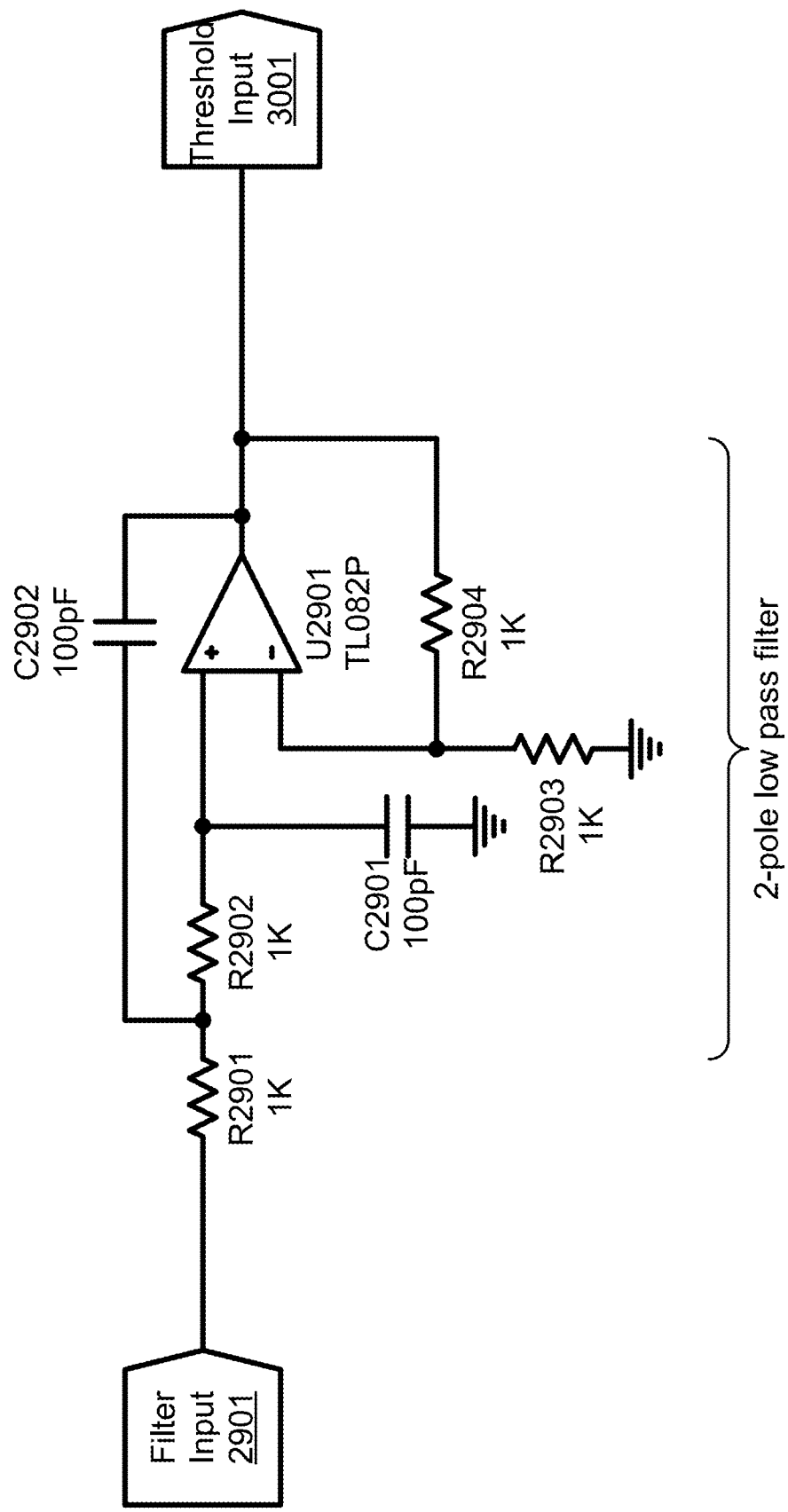
FIG. 29 illustrates a schematic depicting a preferred exemplary precision envelope follower (PEF) (2-pole low pass filter) system embodiment (page 2/4)
Figure 30:
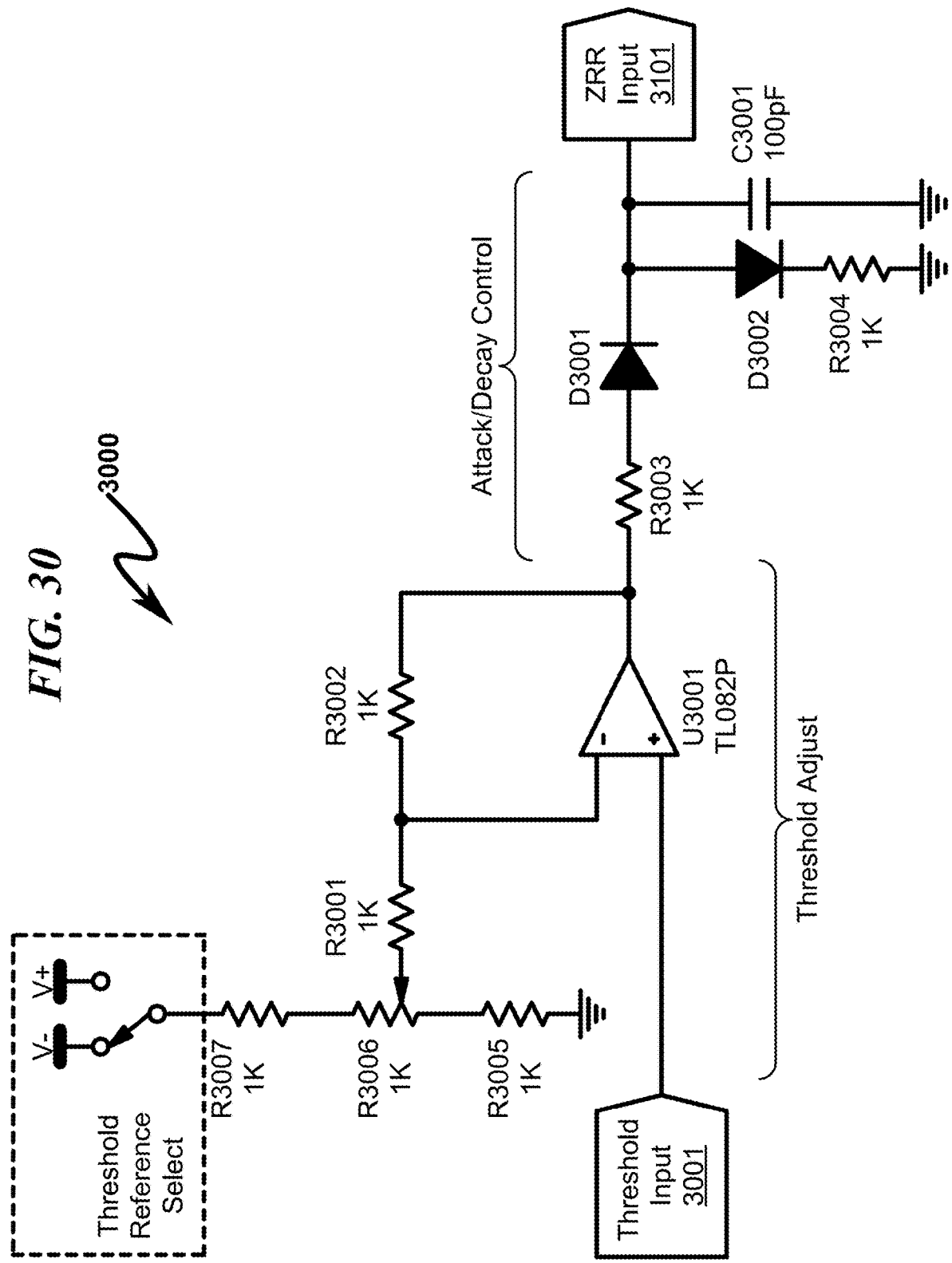
FIG. 30 illustrates a schematic depicting a preferred exemplary precision envelope follower (PEF) (threshold/offset control) system embodiment (page 3/4)

The second stage in FIG. 29 (2900) receives the full-wave rectified signal and provides a low-pass filter with two-poles. This is done with the amplifier (U2901) with a Sallen-Key topology filter set at 100 Hz with a Bessel alignment to minimize pulse response phase shifts. This creates the basic envelope signal. The exact frequency of the cut-off in this circuit is application specific and may vary depending on application context.

Power limiting should not affect the signal unless the output signal has enough level to trigger it. So, the signal is DC shifted the correct amount, this is performed with the amplifier (U3001) and the trimpot (R3006) is used to adjust the amount of shift to correspond to an 80 W output. This input signal is taken from the waveform presented at the wiper of the Drive Control front panel control. Some preferred embodiments of the present invention may incorporate another rectifier to eliminate the 'negative excursion' in this design.

This signal will have both a positive and negative voltage component, and this needs to be only a positive excursion during the waveform envelope above the 80 W reference voltage, so a precision rectifier is required to eliminate the negative portion. This is performed by OP AMP (U3101) in a similar fashion as the amplifier (U2801). There is a gain control in order to make the envelope signal compatible with the requirements of the breakpoint power supplies discussed later.

Following the trigger waveform, the exact waveform can be further modified by using a diode coupled capacitor. Resistor (R3003) and diode (D3001) charge capacitor (C3001) and can be used to slow down the attack portion of the control. Likewise, when the output of the OP AMP (U3101) signal goes below the level of capacitor (C3001), then the decay can be delayed by diode (D3002) through resistor (R3004).

This signal is the Gain Control signal used by the breakpoint drive power supply amplifier inputs to control the breakpoint references. The last thing is that the drive signal must generate a positive reference adjustment and a negative reference adjustment so the amplifier (U3102) is used to invert without gain.

Negative Breakpoint Control (NBC) and Positive Breakpoint Control (PBC);

These two circuits are completely symmetric so will be described together.

The breakpoint voltage references described in the section Piecewise Linear Approximation are voltage dividers with both a lower voltage limit and an upper voltage variable supply on both the positive and negative voltage controls.

The positive excursion in the Piecewise Linear Approximation circuit is driven through diodes (D3401, D3402, D3403, D3404). The voltage dividers are adjusted by the fixed resistors and the trimpots (R3411, R3412, R3413, R3414). These reference voltages are in parallel and their lower voltage end is limited by the series combination of (R3499) and (D3405). Their upper voltage end is created by a transistor buffered variable voltage source created by OP AMP (U3401) and (Q3401). The input source for this variable power supply is determined by circuitry described in FIG. 32 (3200).

An exact duplicate of this circuitry is formed for the other excursion components for the Piecewise Linear Approximation breakpoints using (U3501) and (Q3501).

To disable the Sag Control, the breakpoints can become fixed by selecting DYNAMIC or FIXED breakpoint operation of switches (S3201, S3202) in FIG. 32 (3200).

The envelope generated by the Precision Envelope Follower and its ancillary functions is a ground referenced signal with a positive excursion for a limiting function. The breakpoint control amplifiers and their power sources have a high voltage reference—which is to say that when no gain reduction is required, their outputs are at a high level, either approximately −12VDC for the positive signal excursions or +12VDC for the negative signal excursions at the Piecewise Linear Approximation amplifier. When power limiting is required, these voltages are symmetrically reduced.

To shift the reference voltage from the ground references signals, amplifier (U3201) is used for the Positive Breakpoint Control at (U3501), and amplifier (U3202) is used for the Negative Breakpoint Control used at (U3401).

These reference shift amplifiers use a symmetric voltage divider from +15 VDC and −15 VDC through resistors (R3201, R3202, R3203). Providing these voltages at the positive input of the amplifier of the level shift amplifiers (U3201, U3202) allow the references of the outputs of these amplifiers to be at those voltages, and any signal component at the negative inputs of these amplifiers, presented at resistors (R3211, R3221), to be reductions of these reference voltages. This signal will be passed to the breakpoint reference voltages through the power output of the two power sources (e.g., the emitters of (Q3401, Q3501)).

Reverb Send Receive (RSR)

This peak compressed signal at OP AMP (U3301) output is presented to a voltage divider of (R3304, R3305) to reduce the signal to guitar effects used in the second Send/Receive loop called the Reverb Send/Receive. The buffer for the send function is formed by (U3302) at unity gain. The receive function may be implemented on a first PCBA, the Preamp board, and comprises a gain block of (U3601) with a gain of ×5. This gain block is a similar topology to the preamp blocks, also used to make sure no uncontrolled peaks get clipped by the OP AMP power supply rails.

The output of this amplifier is sent to the front panel control, a rheostat labeled Volume Level.

Speaker Power Amplifier (SPA)

The power amplifier is typically a conventional 'Hi-Fi' amplifier with very low Total Harmonic Distortion and is used in its low distortion area of operation. In this realization the choice is to use the TDA7293 with a +/−50 VDC power supply input. This amplifier is rated at 100 W average sine wave power which gives a maximum voltage excursion of approximately 40 VDC peak. This yields a peak power of 200 watts. This is an extremely high level of audio headroom when compared to a playable, clean output of perhaps 50 watts. 50 watts average power is extremely loud through this loudspeaker which is rated at 90 watts.

In some preferred prototypes, an LM3886 Speaker Power Amplifier may be used with +/−35 VDC Power Supplies driven through a 30-watt speaker. This combination has been determined to be extremely successful for lower SPL sound levels and is preferred in some application contexts.

In both the prototypes constructed (50 watt and the 100-watt versions) the circuit schematics used were derived directly from the IC manufacturers data sheets. Careful design consideration is given to setting the gain on these amplifiers so that the power amplifier, much as the OP AMPS, will never clip at their power supply rails which gives very unwanted harmonic additions.

Exemplary Mechanical Construction (4300)-(6400)

While the present invention may be constructed using a wide variety of mechanical variations, some combinations are preferred. One such preferred exemplary mechanical construction embodiment is generally depicted in the various views of FIG. 43 (4300)-FIG. 64 (6400). It should be noted that this construction technique permits the overall guitar amplifier system (GAS) to be modularized such that the speaker and power supply are contained within a suitable enclosure and the guitar amplifier electronics (GAE) to be confined to a modularized module that may be inserted or removed into the enclosure to permit different tonal qualities to be selected by the user.

Figure 43:
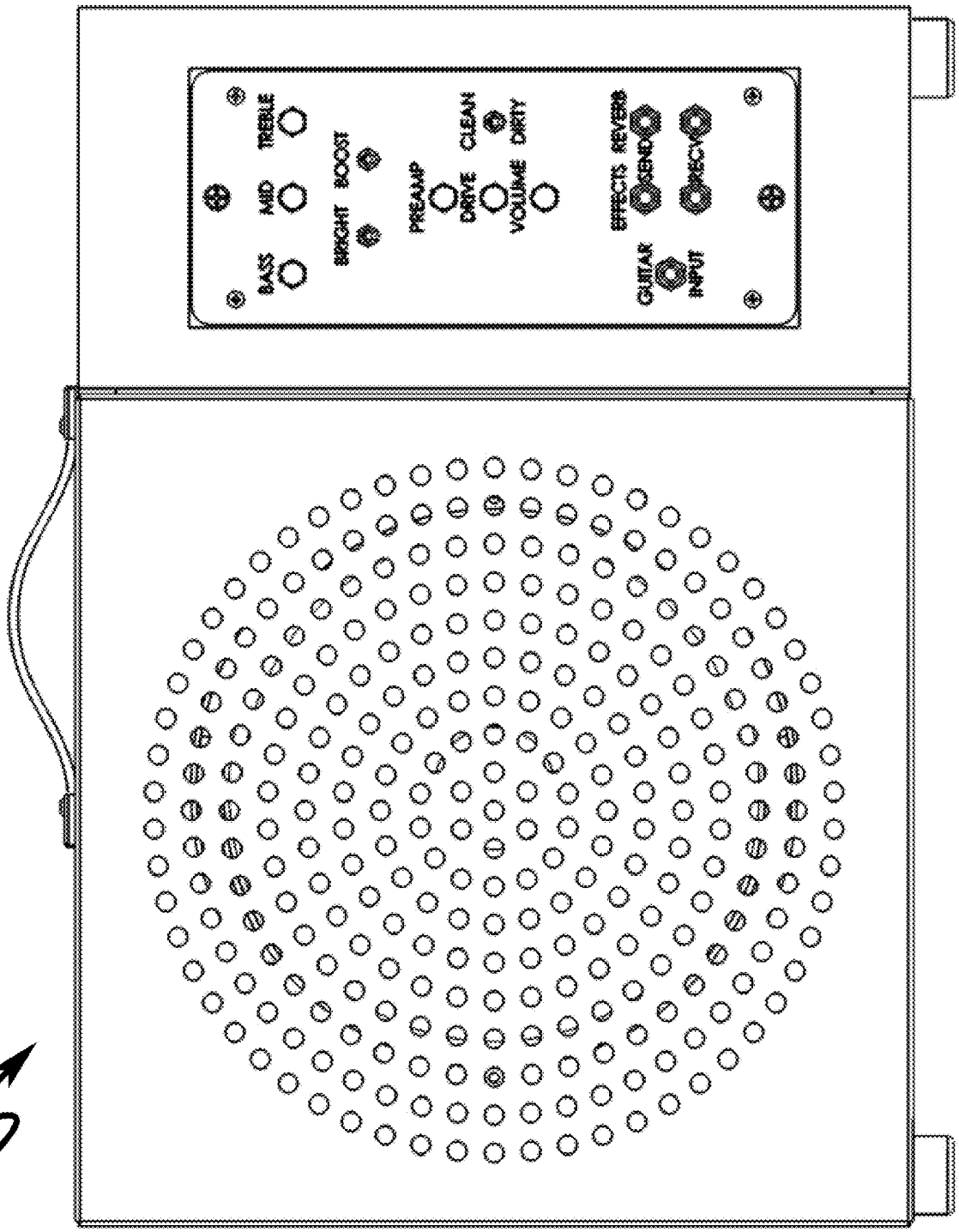
FIG. 43 illustrates a front view depicting construction detail of a preferred exemplary system embodiment.
Figure 44:
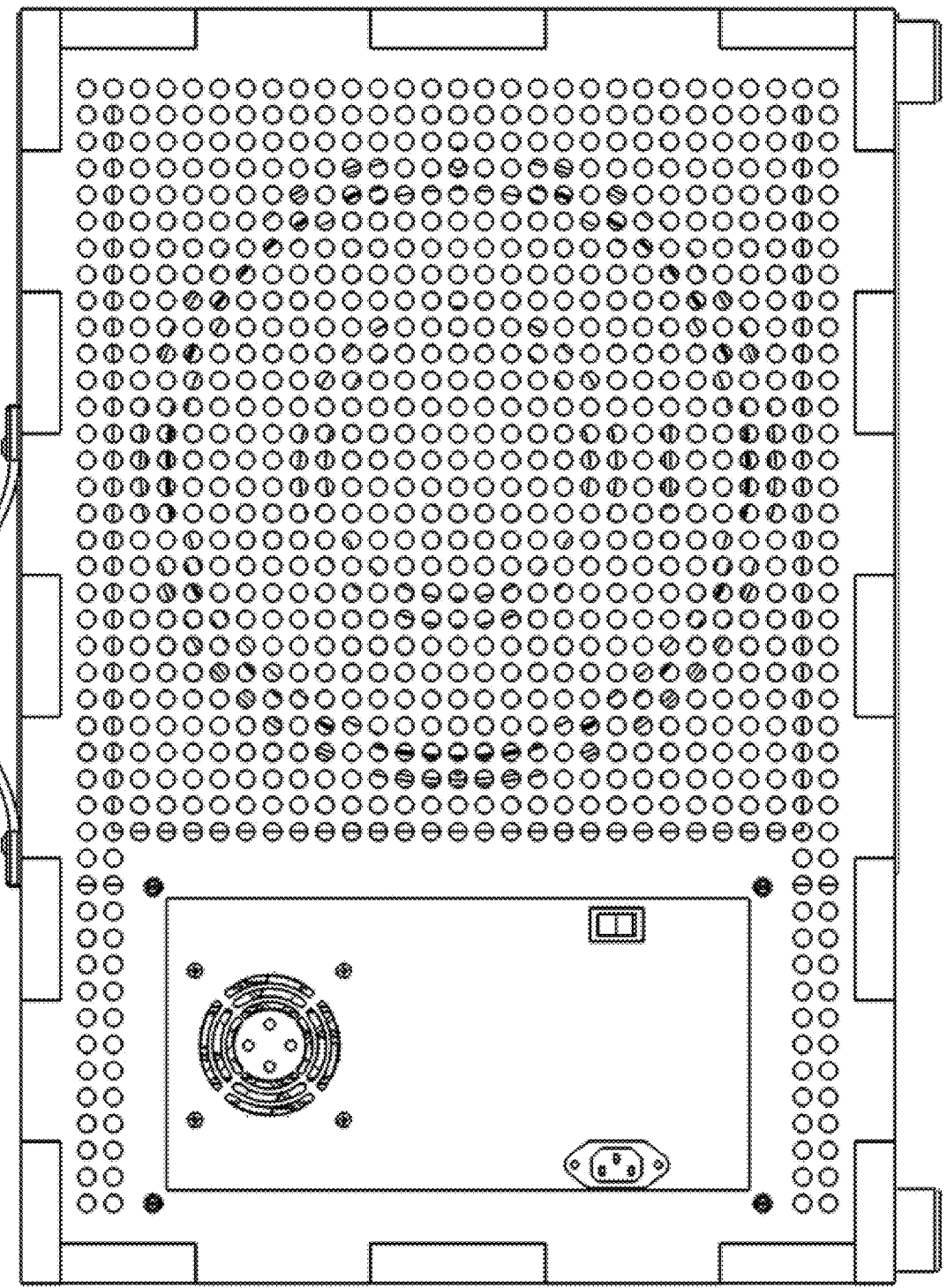
FIG. 44 illustrates a back view depicting construction detail of a preferred exemplary system embodiment.
Figure 45:
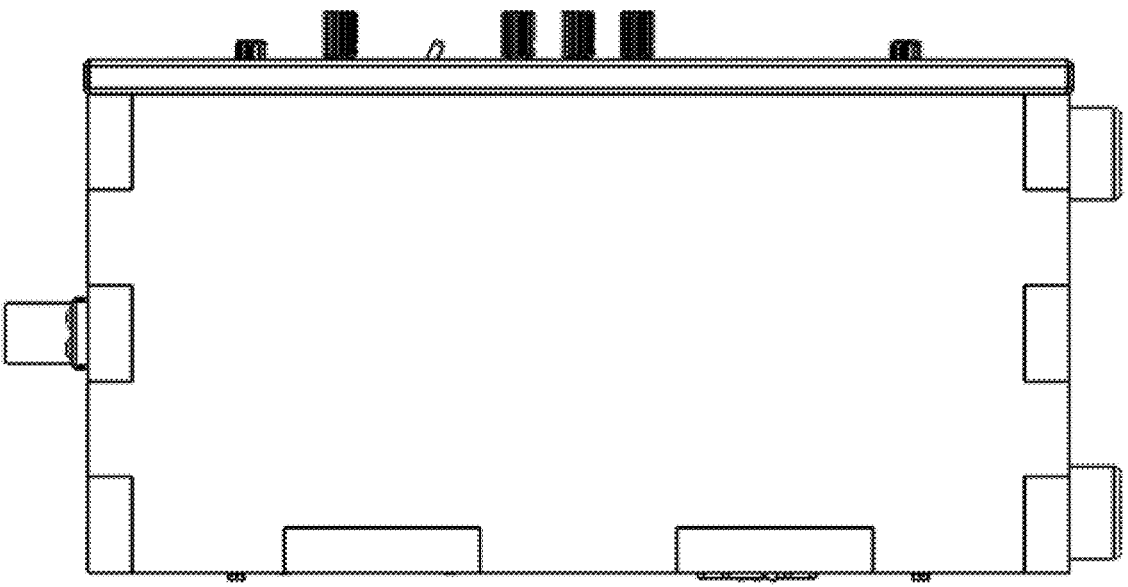
FIG. 45 illustrates a left side view depicting construction detail of a preferred exemplary system embodiment.
Figure 46:
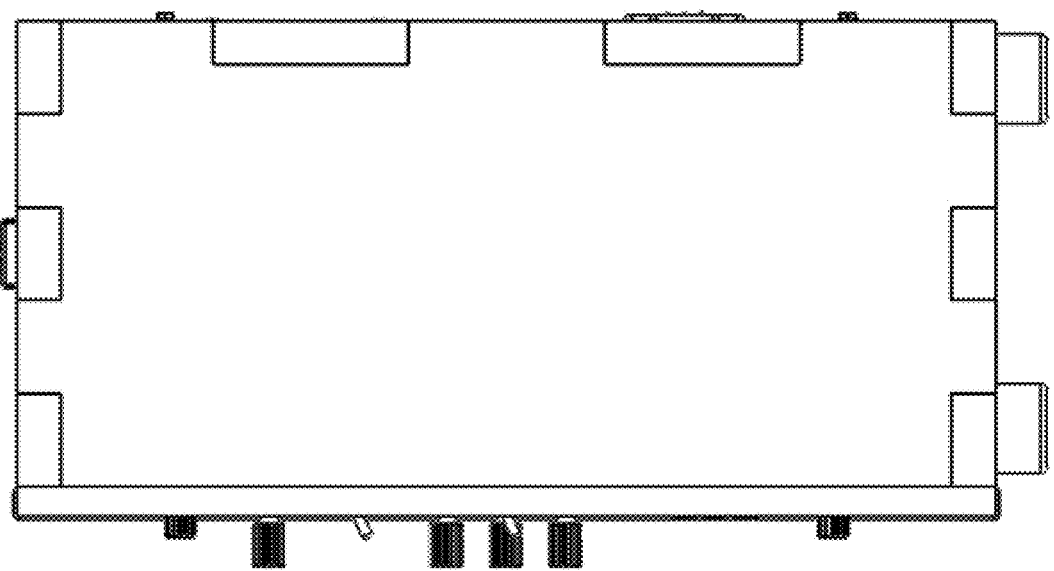
FIG. 46 illustrates a right side view depicting construction detail of a preferred exemplary system embodiment.
Figure 47:
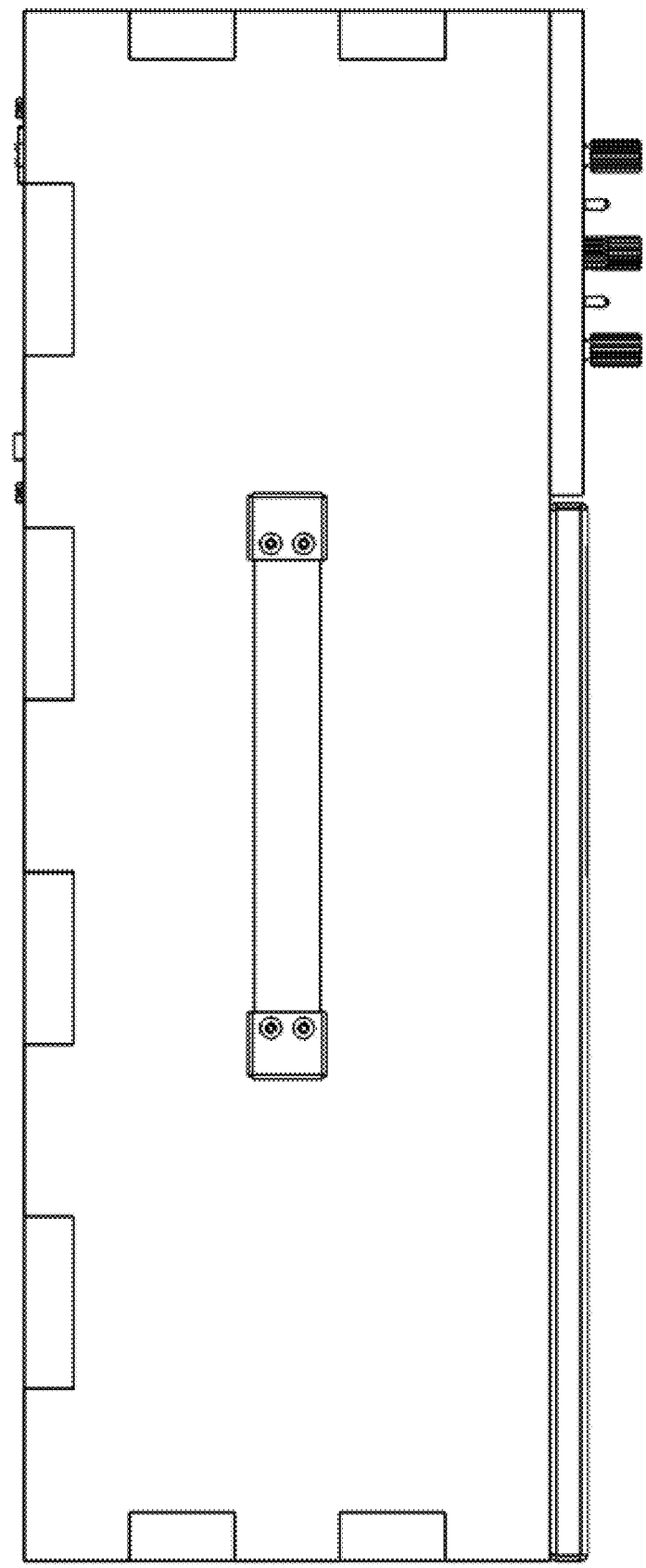
FIG. 47 illustrates a top view depicting construction detail of a preferred exemplary system embodiment.
Figure 48:
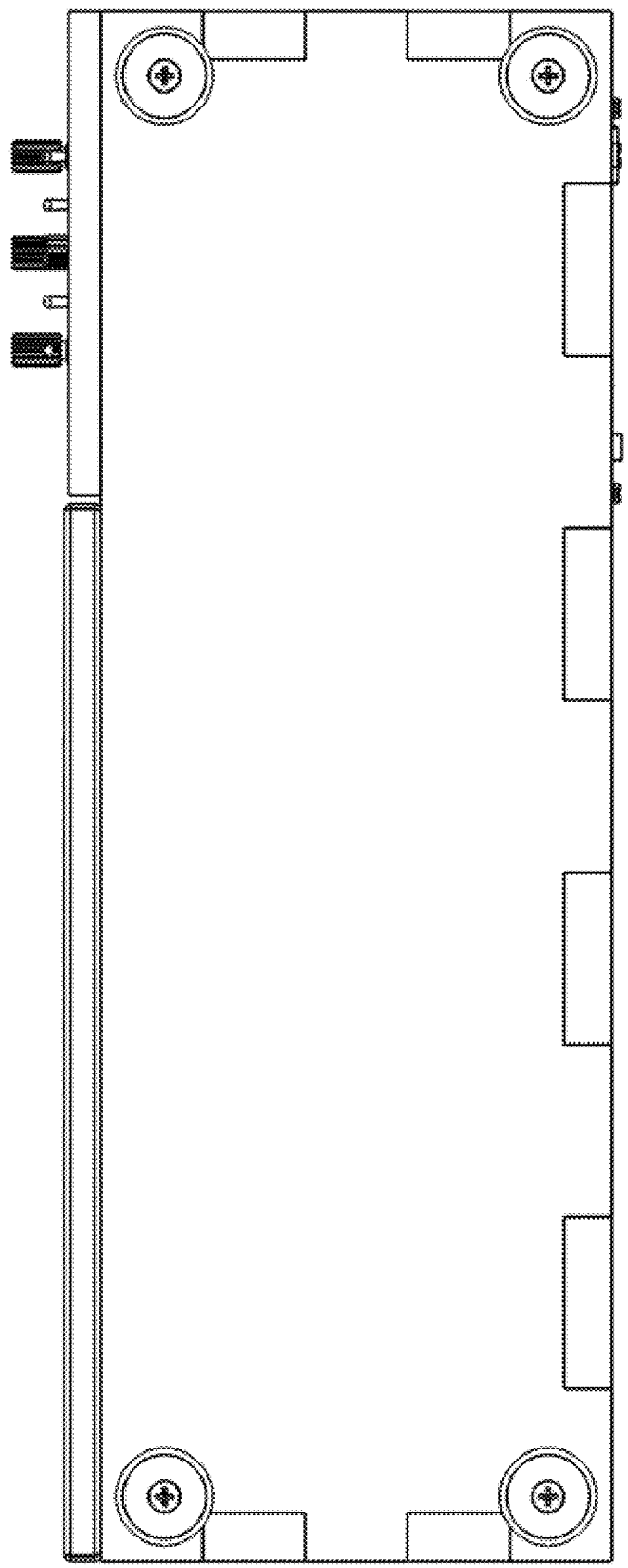
FIG. 48 illustrates a bottom view depicting construction detail of a preferred exemplary system embodiment.
Figure 49:
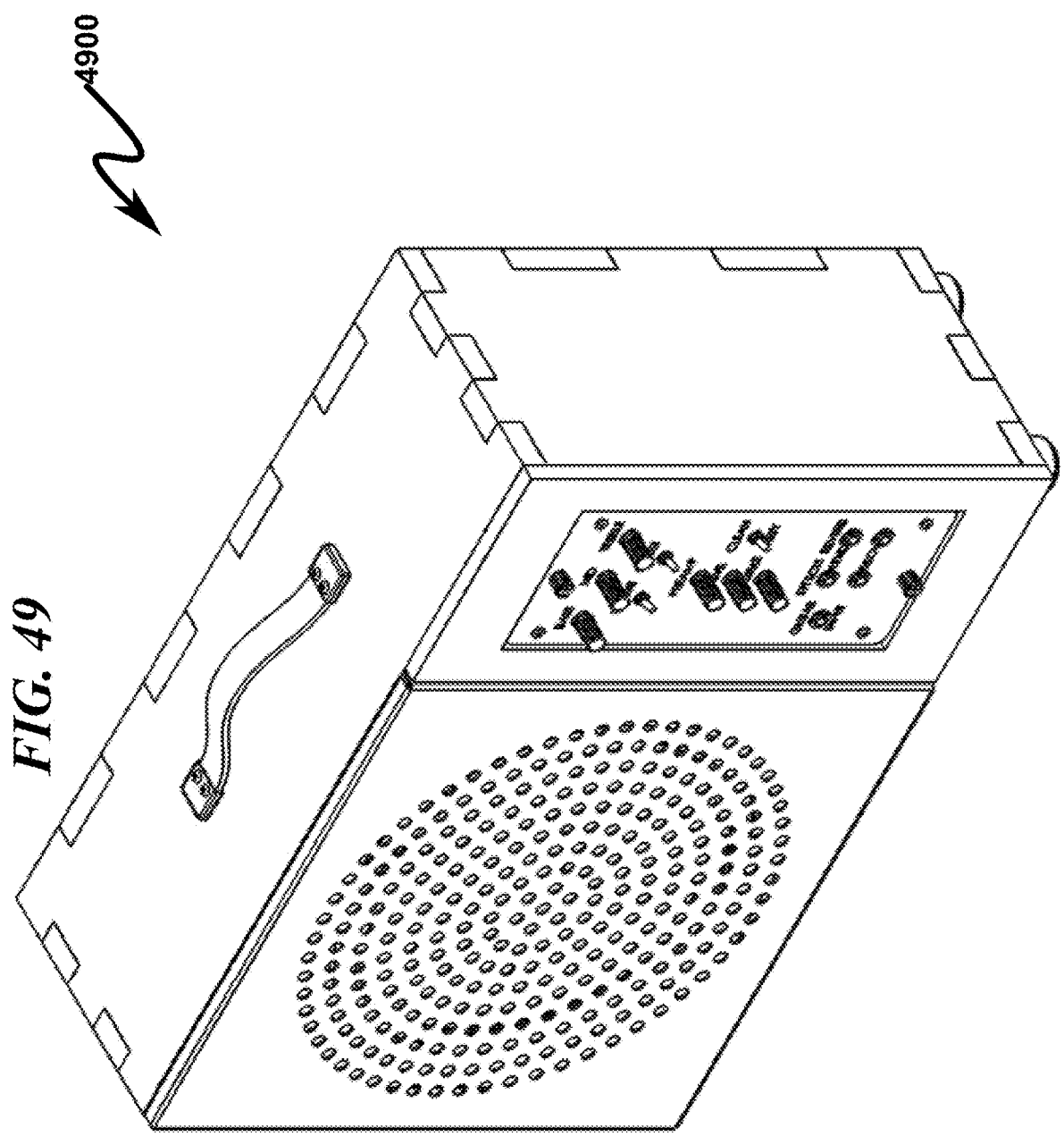
FIG. 49 illustrates a top right front perspective view depicting construction detail of a preferred exemplary system embodiment.
Figure 50:
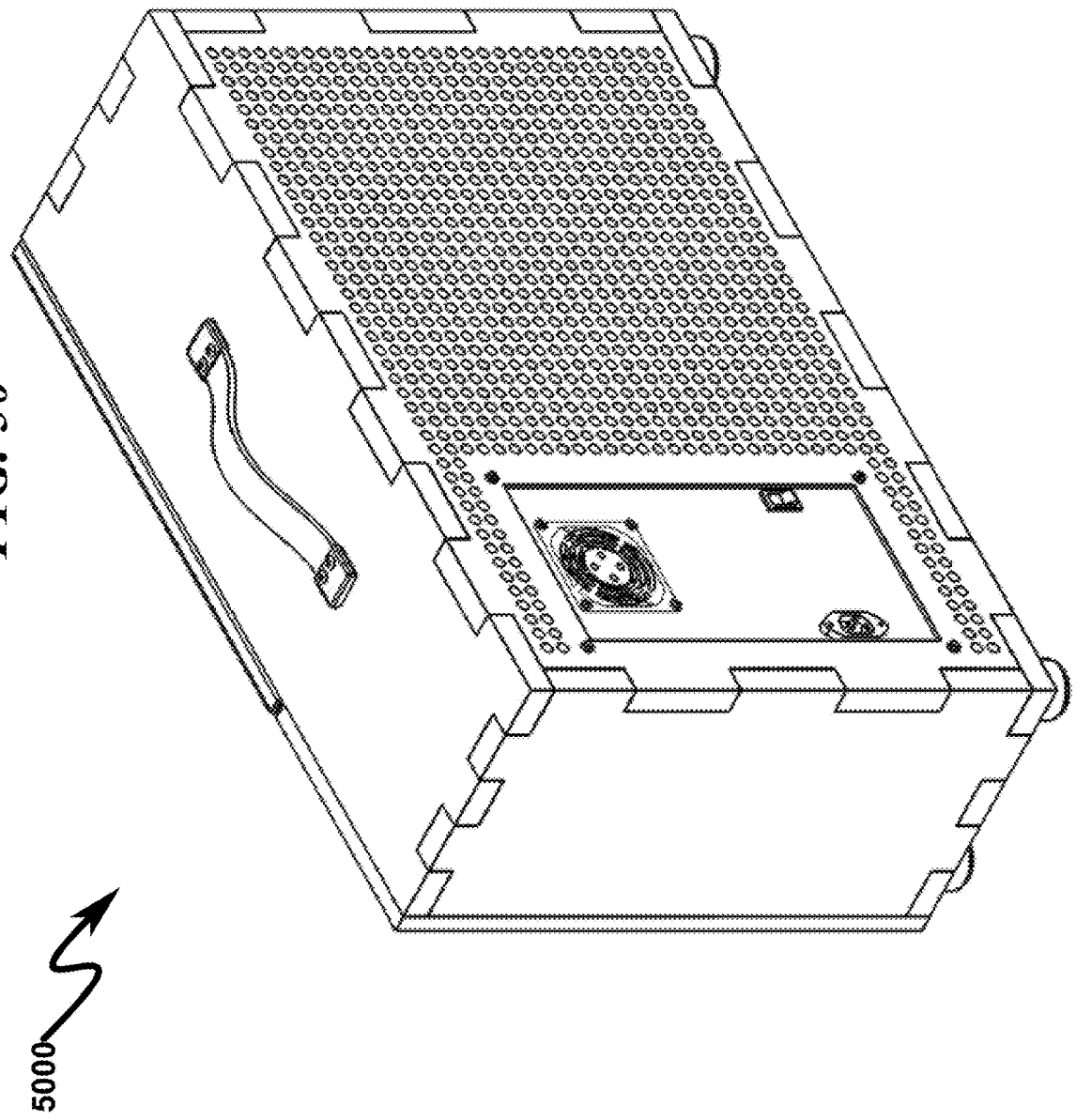
FIG. 50 illustrates a top right rear perspective view depicting construction detail of a preferred exemplary system embodiment.
Figure 51:
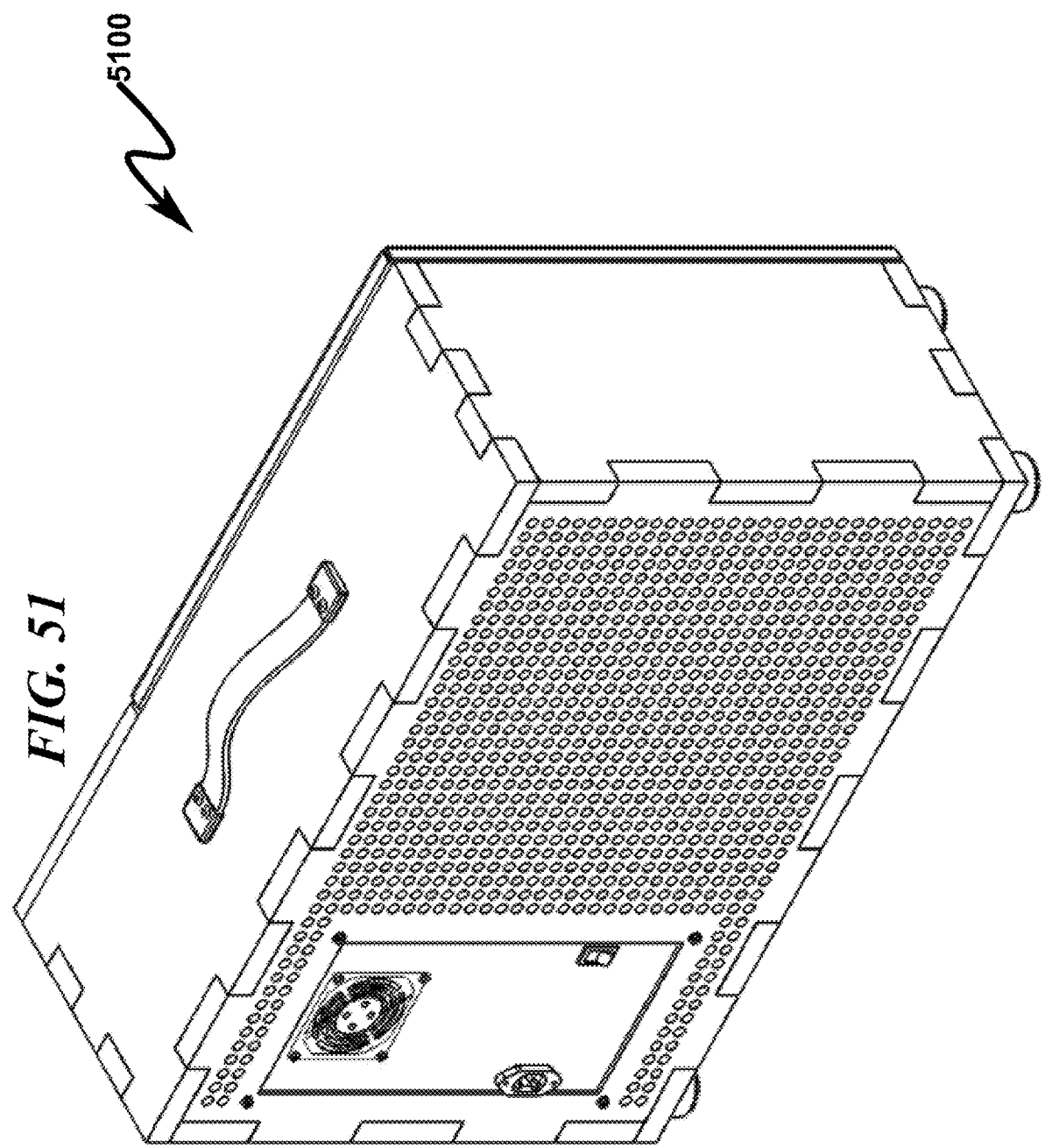
FIG. 51 illustrates a top left rear perspective view depicting construction detail of a preferred exemplary system embodiment.
Figure 52:
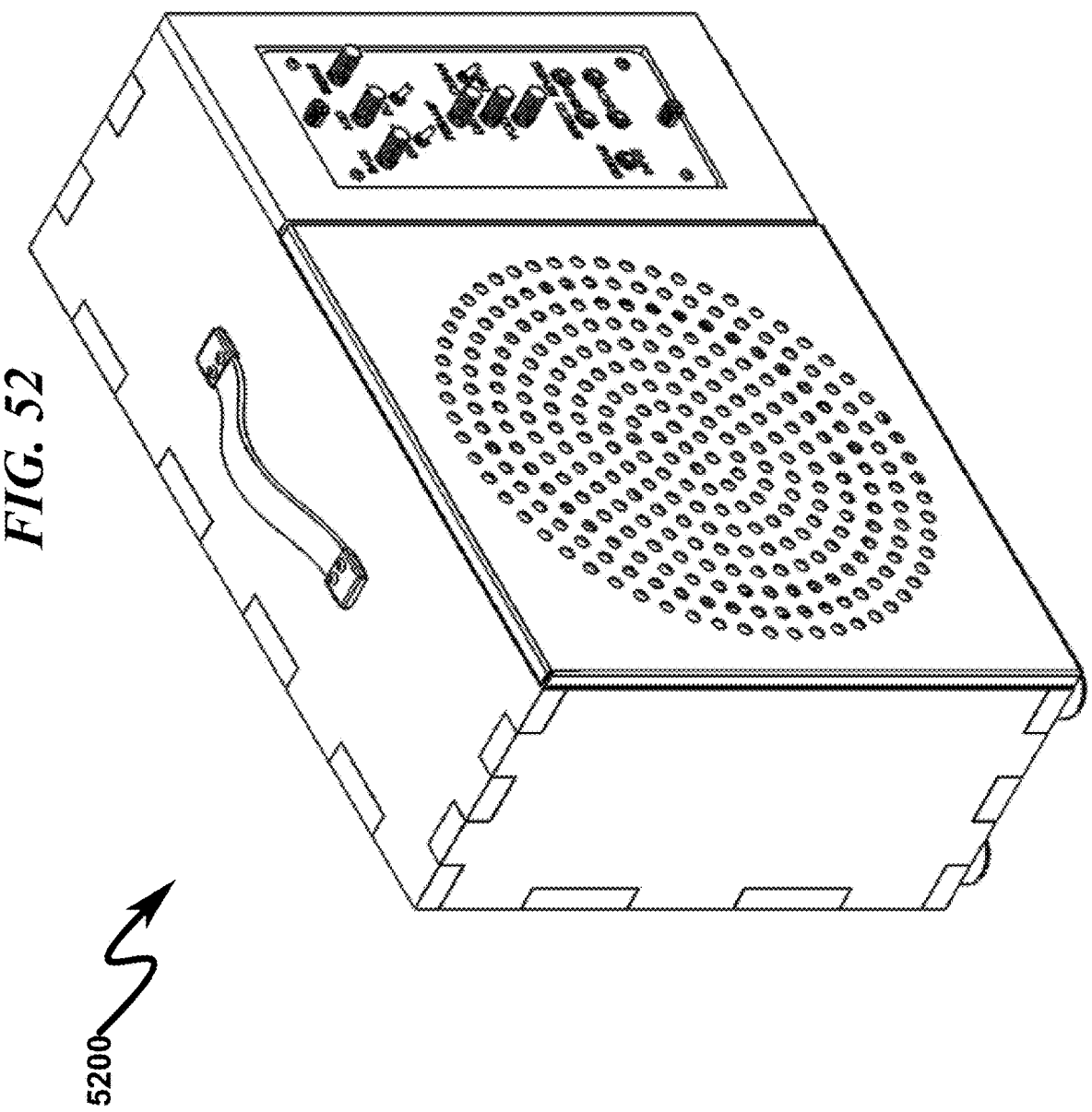
FIG. 52 illustrates a top left front perspective view depicting construction detail of a preferred exemplary system embodiment.
Figure 53:
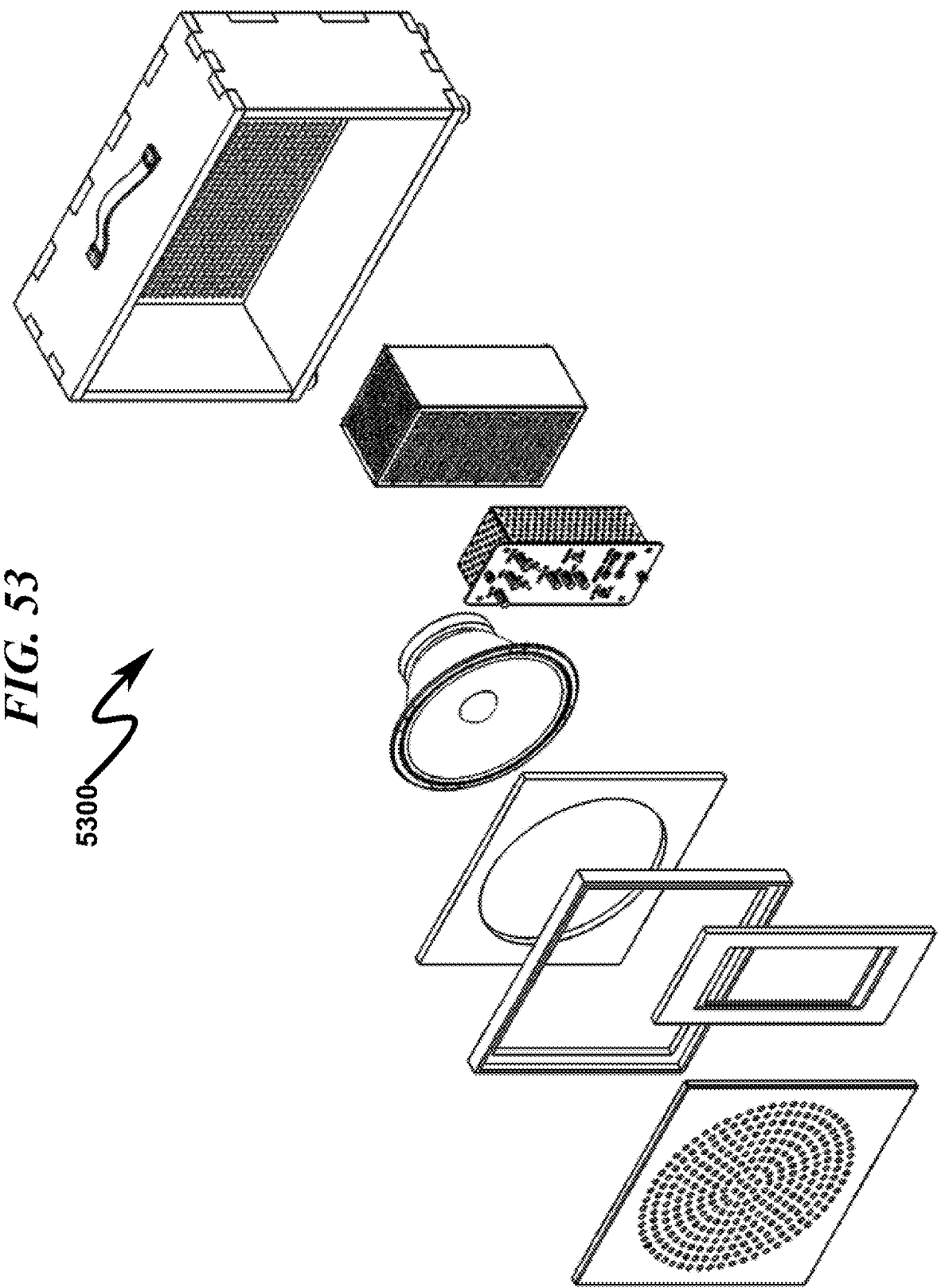
FIG. 53 illustrates a top right front perspective assembly view depicting construction detail of a preferred exemplary system embodiment.
Figure 54:
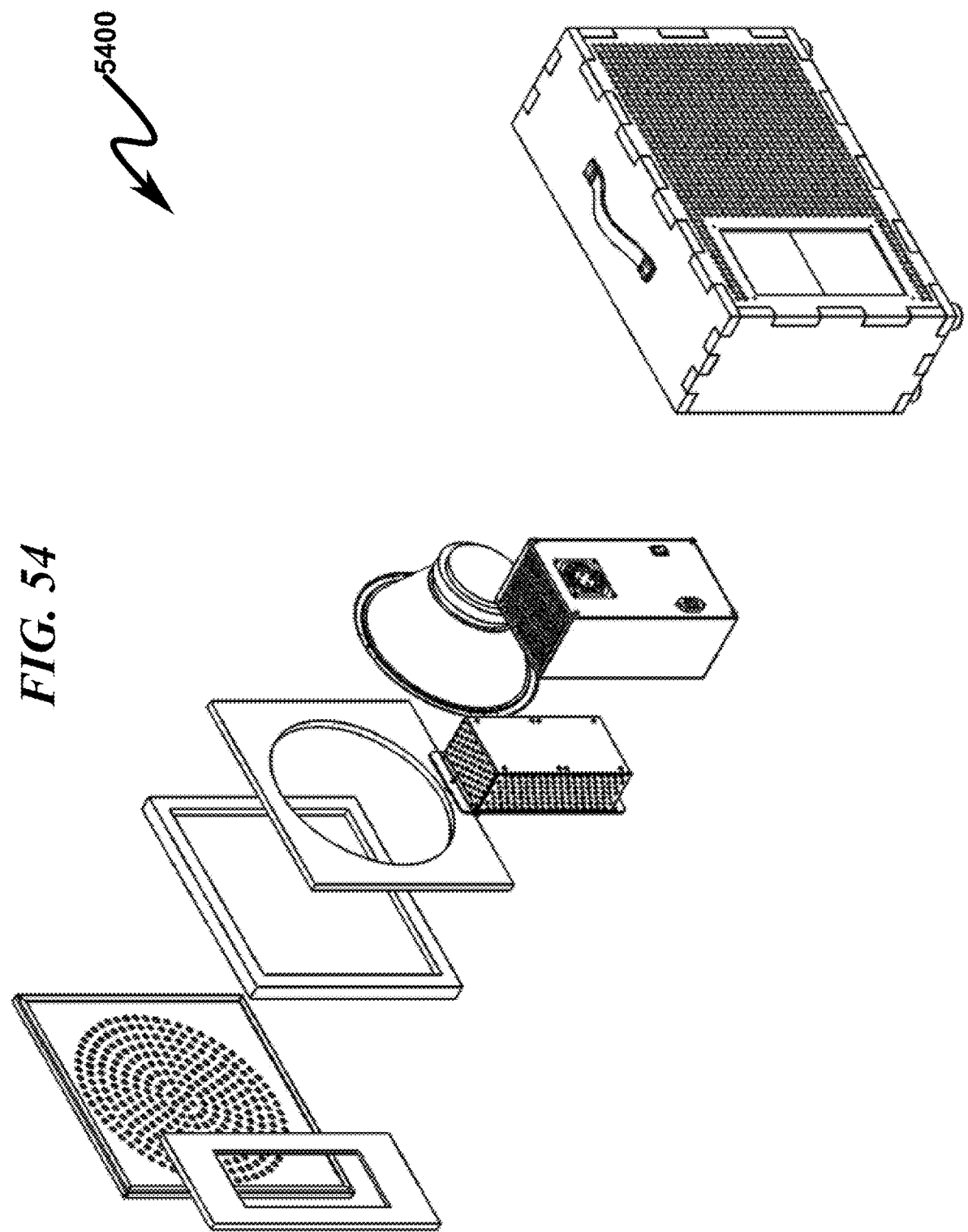
FIG. 54 illustrates a top right rear perspective assembly view depicting construction detail of a preferred exemplary system embodiment.
Figure 55:
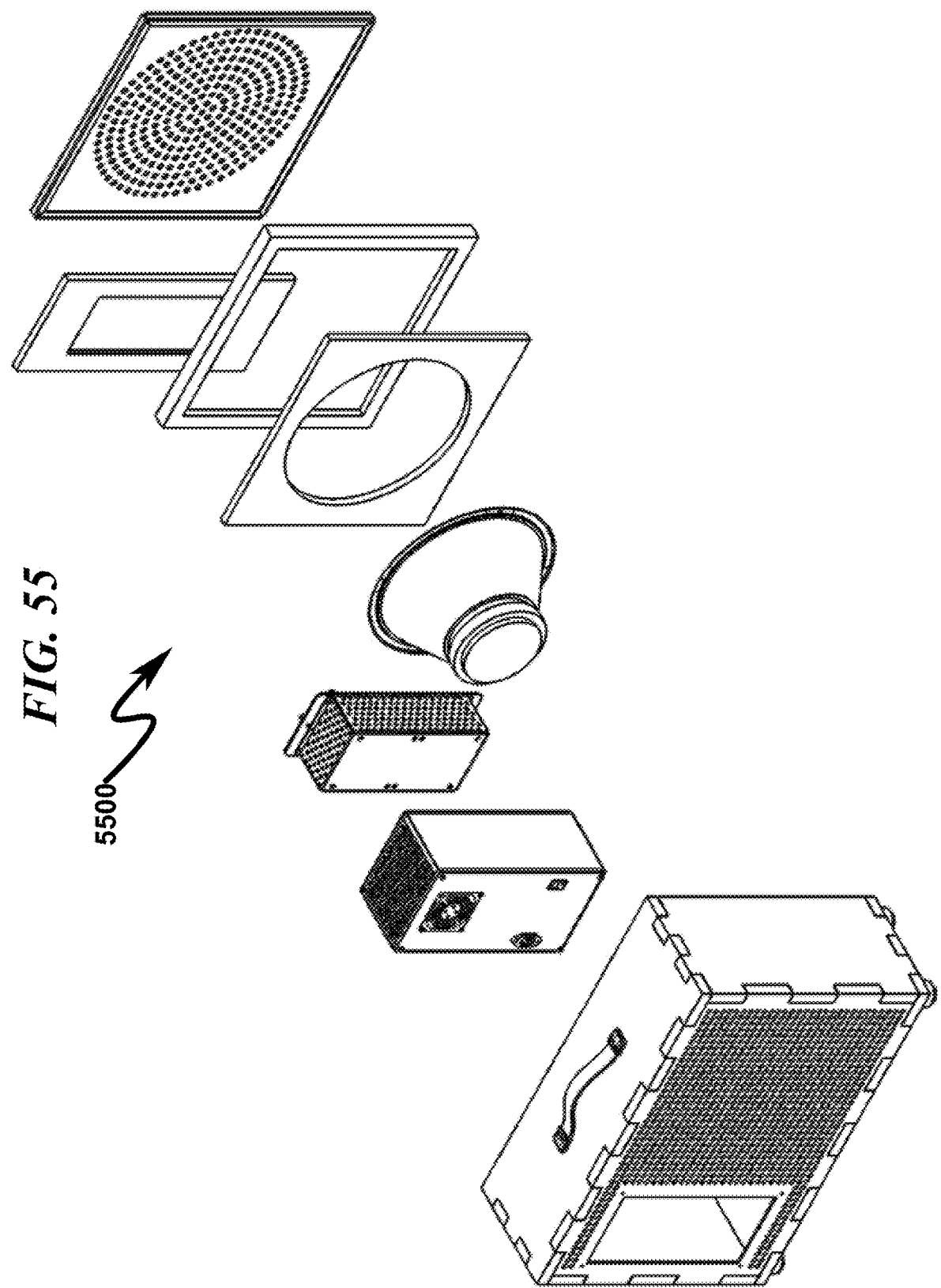
FIG. 55 illustrates a top left rear perspective assembly view depicting construction detail of a preferred exemplary system embodiment.
Figure 58:
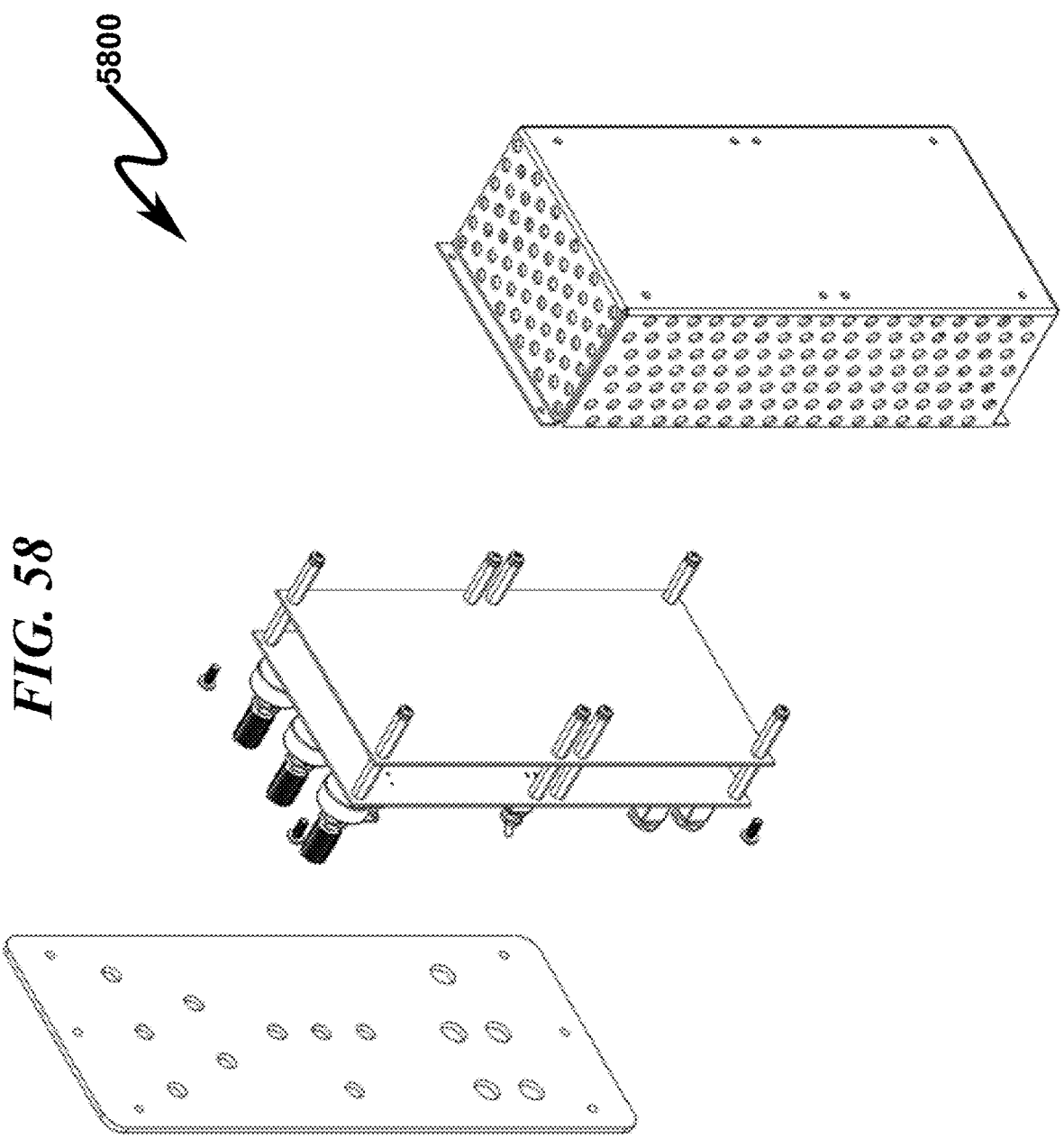
FIG. 58 illustrates a top right rear perspective assembly view depicting construction detail of a preferred exemplary guitar amplifier electronics system embodiment.
Figure 61:
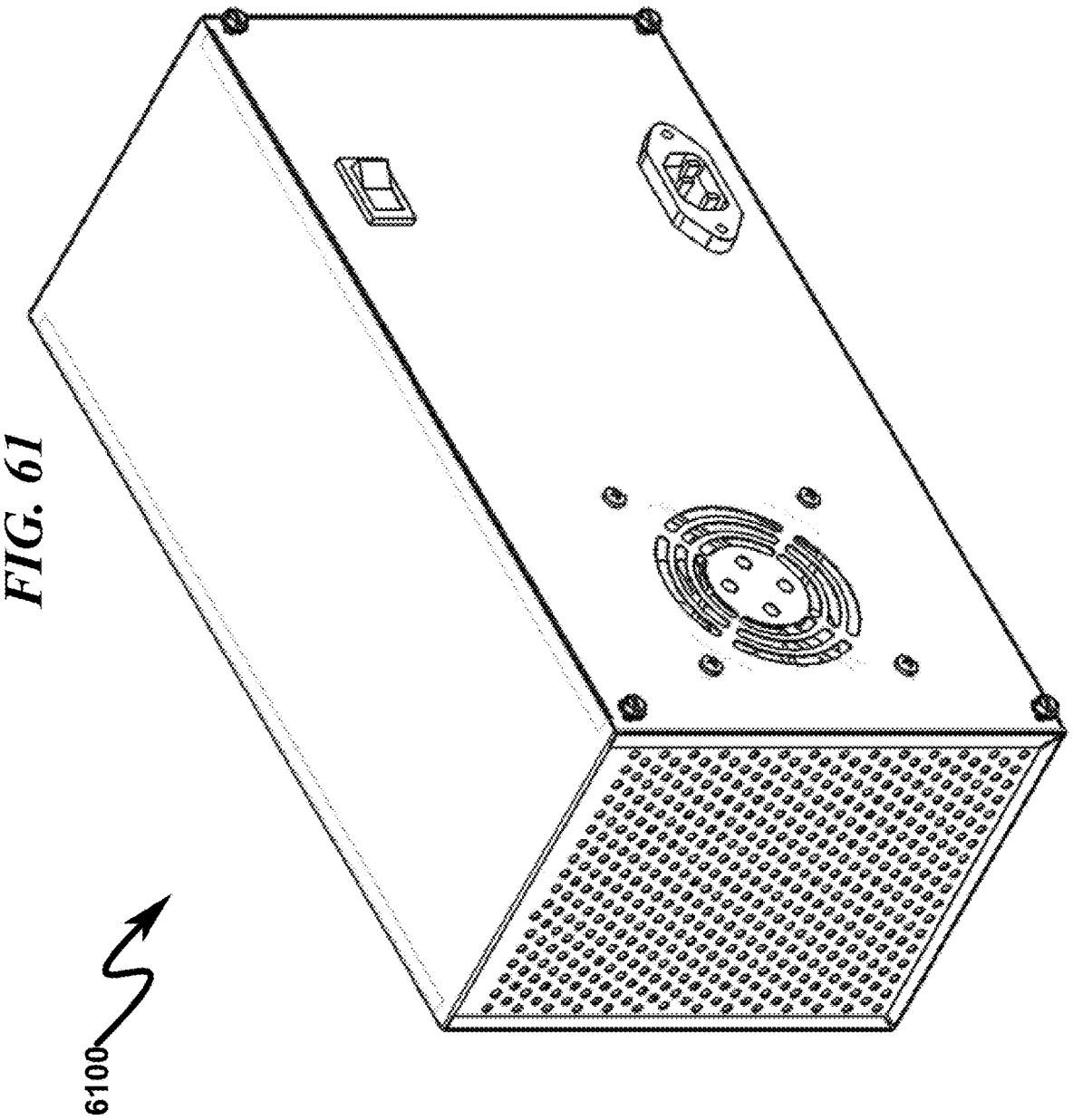
FIG. 61 illustrates a top left front perspective view depicting construction detail of a preferred exemplary power supply electronics system embodiment.
Figure 62:
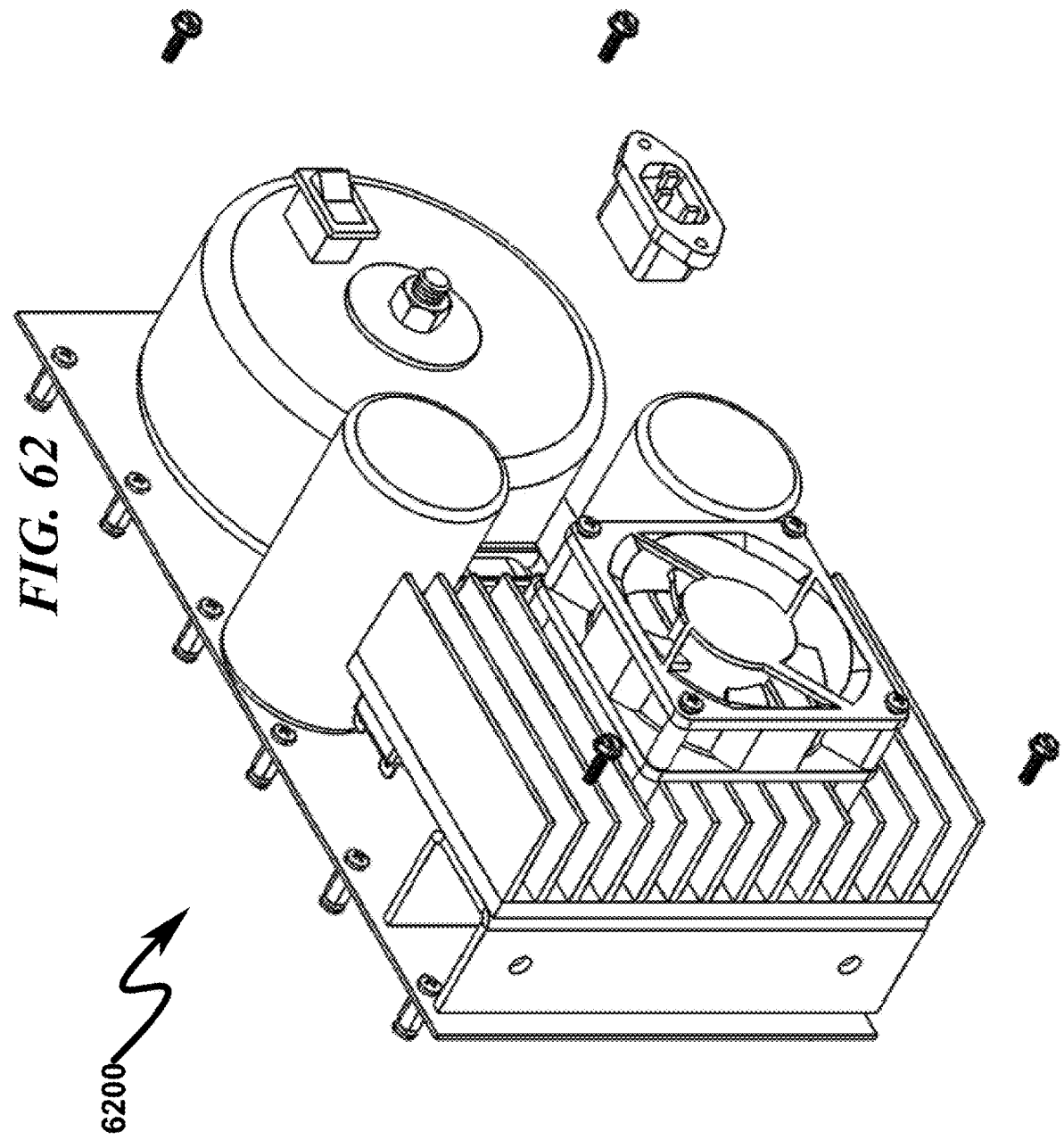
FIG. 62 illustrates a top left front perspective view depicting construction detail of a preferred exemplary power supply electronics system embodiment with enclosure covers removed.
Figure 63:
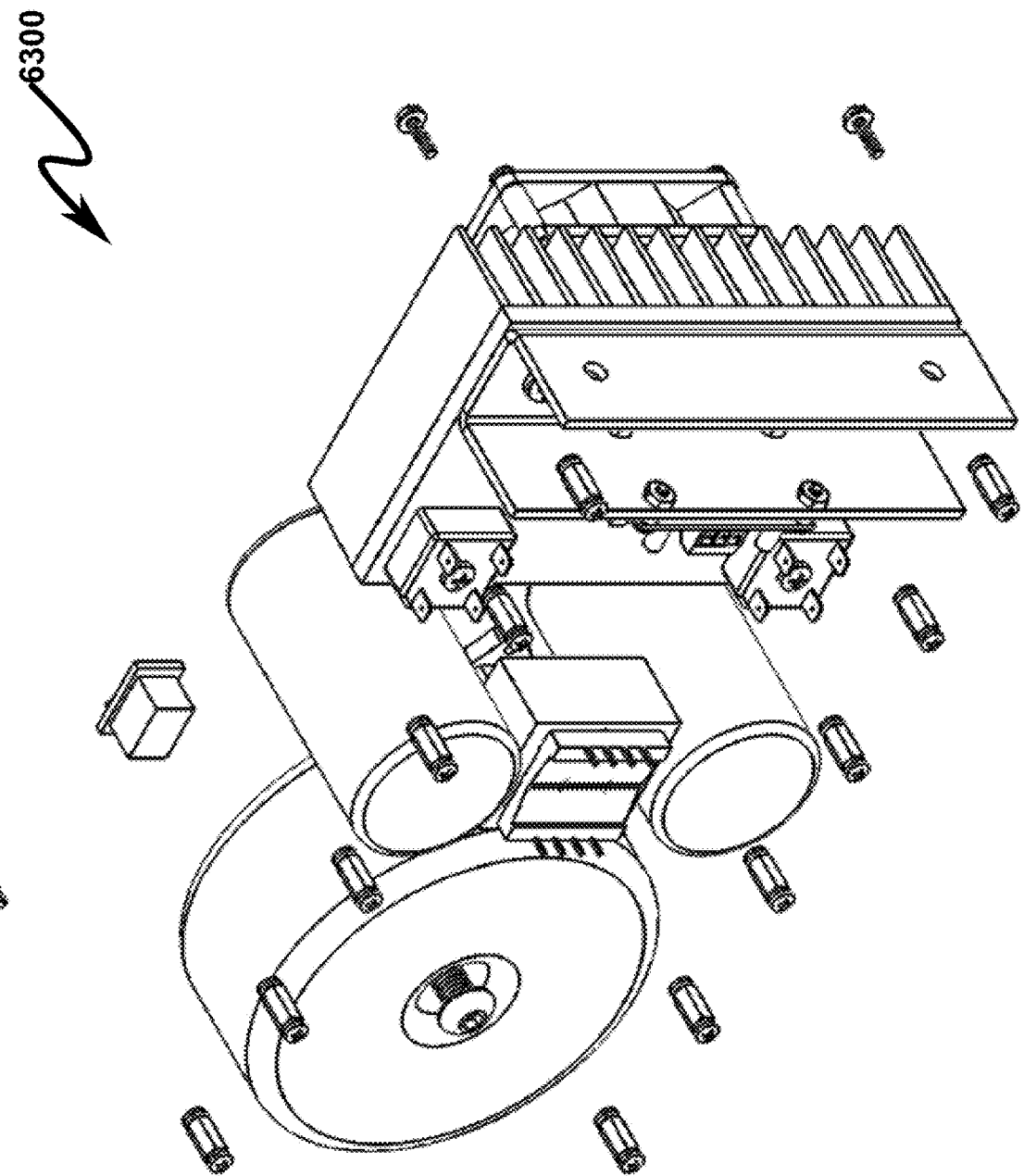
FIG. 63 illustrates a top left rear perspective assembly view depicting construction detail of a preferred exemplary power supply electronics system embodiment with enclosure covers and internal mounting PCB removed.

FIG. 43 (4300)-FIG. 48 (4800) depict side views of a preferred exemplary invention embodiment with perspective views depicted in FIG. 49 (4900)-FIG. 52 (5200). Perspective assembly views showing major system components are depicted in FIG. 53 (5300)-FIG. 56 (5600). Assembly detail of a preferred exemplary guitar amplifier electronics (GAE) module is generally depicted in FIG. 57 (5700)-FIG. 60 (6000). Assembly detail of a preferred exemplary power supply electronics module is generally depicted in FIG. 61 (6100)-FIG. 64 (6400). This assembly is shown utilizing two PCBs as constructed, but one skilled in the art will recognize that this is not a limitation of the present invention.

Note throughout these drawings that internal cable harnesses are not shown for clarity of visualization.

Figure 64:
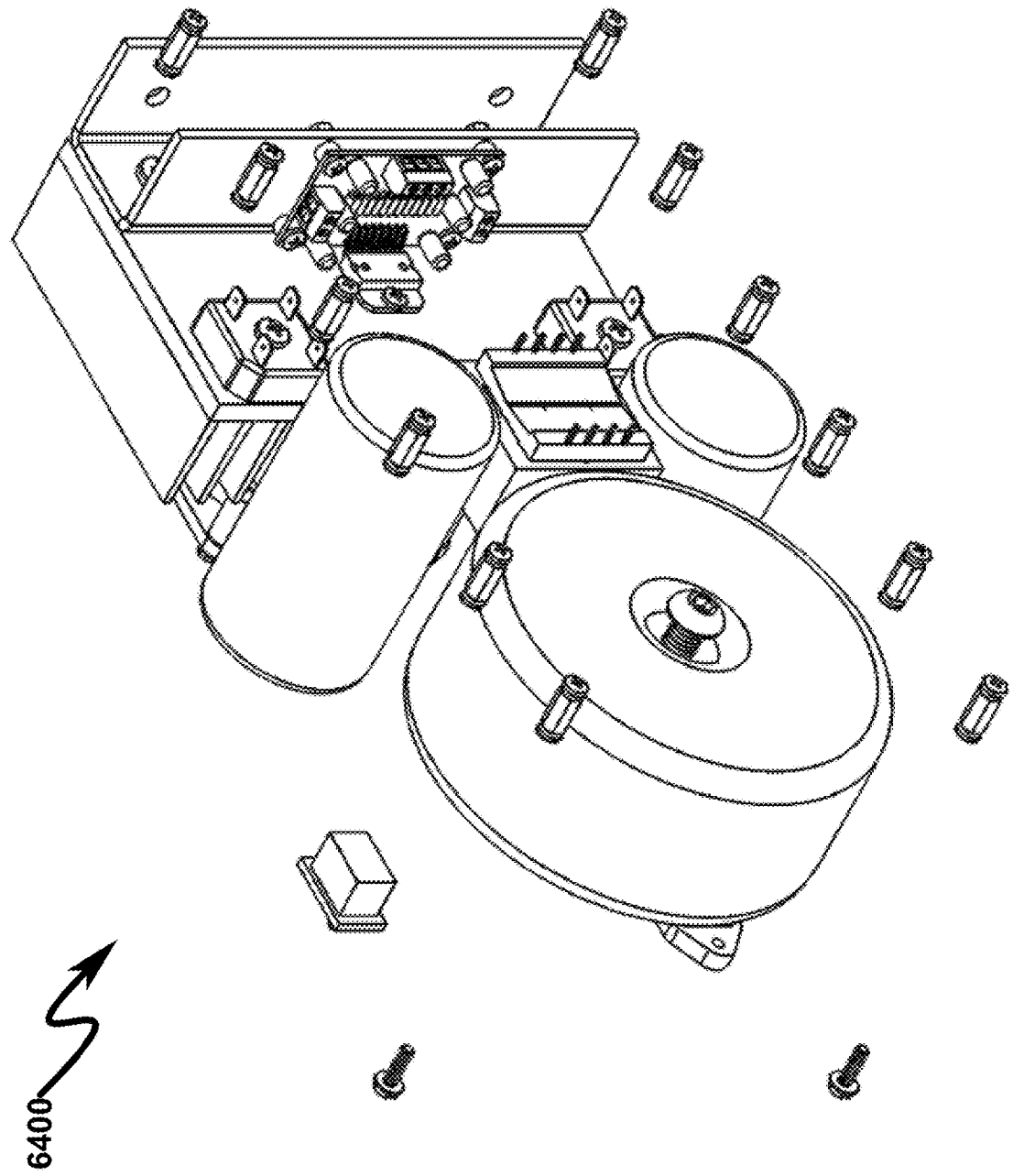
FIG. 64 illustrates a top right rear perspective assembly view depicting construction detail of a preferred exemplary power supply electronics system embodiment with enclosure covers and internal mounting PCB removed.

Additionally, note that the preferred exemplary guitar amplifier electronics (GAE) module generally depicted in FIG. 57 (5700)-FIG. 60 (6000) may be electrically connected to the exemplary power supply electronics module generally depicted in FIG. 61 (6100)-FIG. 64 (6400) via the use of a male/female power connector (not shown) that allows the GAE module to be easily replaced with another unit having different voltage transfer characteristics that mimic a different vacuum tube amplifier configuration.

Thus, the system as depicted may be customized to a variety of vacuum tube amplifier designs as well as adjusted as needed to accommodate different speaker characteristics and/or auditorium acoustic characteristics.

As generally depicted in FIG. 43 (4300)-FIG. 64 (6400), the present invention may in many preferred embodiments be combined with speaker and cabinet to form an integrated system that is lightweight, highly durable, and rugged. Comparable vacuum tube amplifiers would generally require separate cabinetry and/or be significantly heavier than the exemplary invention embodiment depicted. As such, the lightweight portable nature of the present invention represents a significant improvement over the prior art. Additionally, utilization of solid-state electronics and the absence of output transformers provides for cooler operation and less heat generation when in use.

Exemplary Alternate Construction (6500)-(9600)

Figure 65:
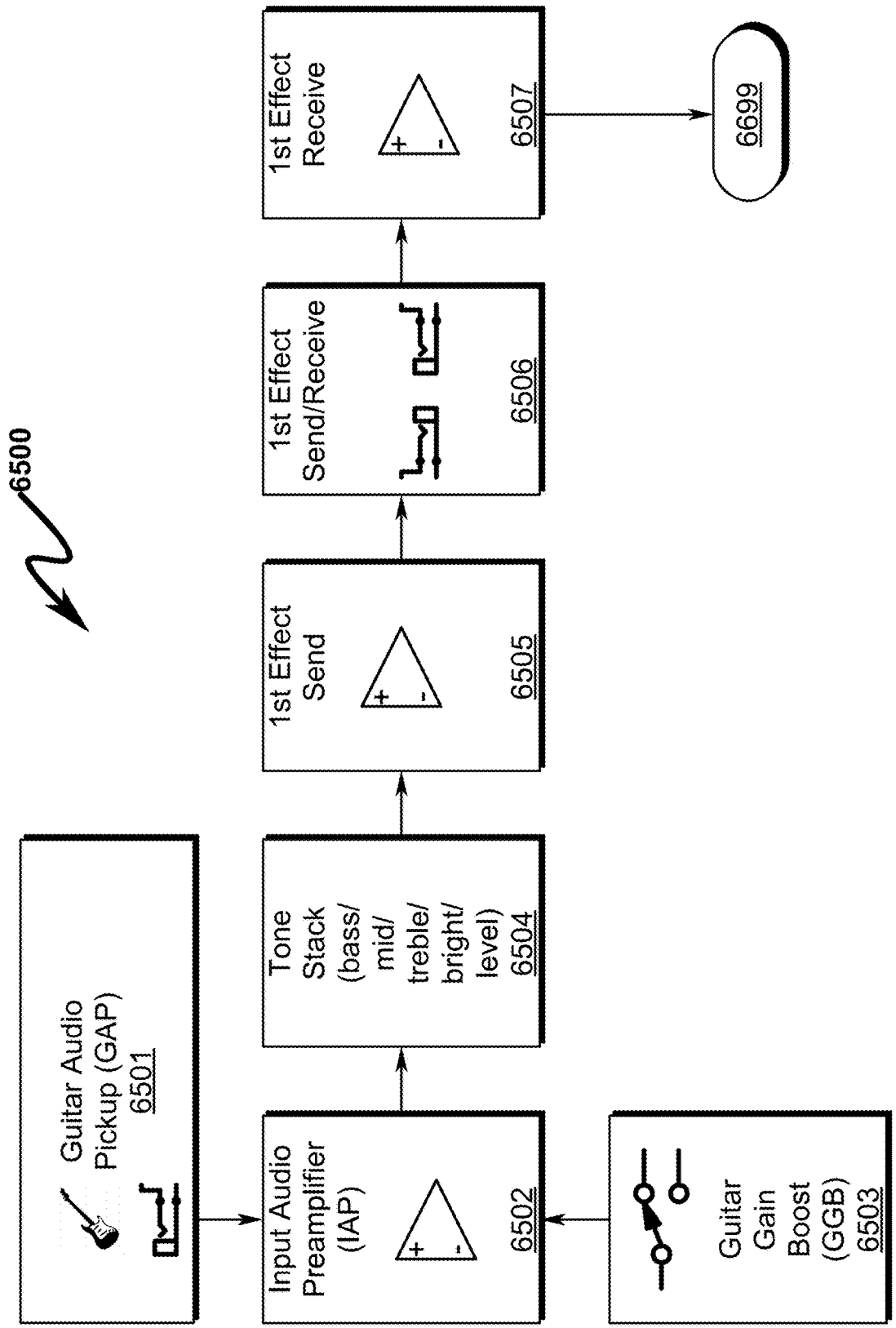
FIG. 65 illustrates an exemplary system block diagram of an alternate preferred exemplary system embodiment incorporating spring reverberation (page 1/3)
Figure 66:
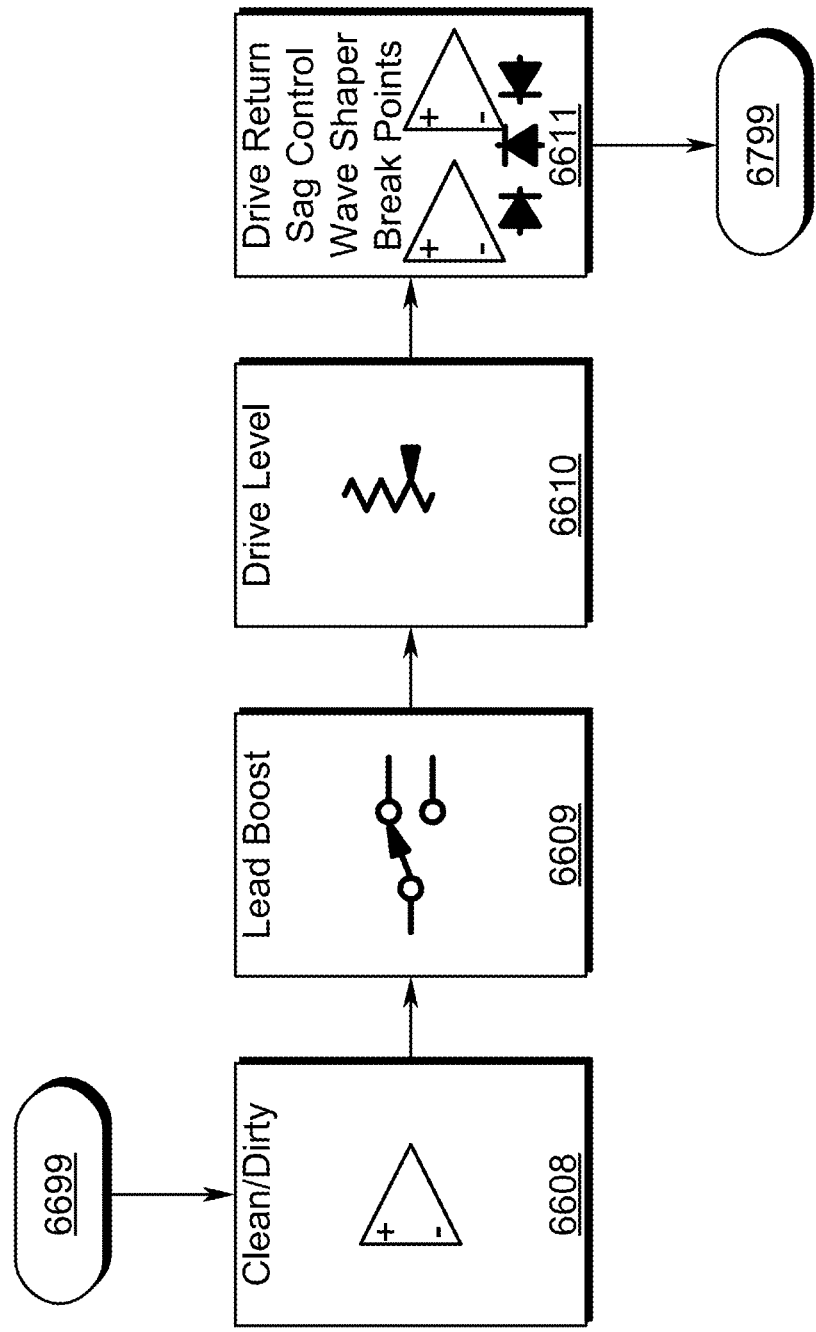
FIG. 66 illustrates an exemplary system block diagram of an alternate preferred exemplary system embodiment incorporating spring reverberation (page 2/3)
Figure 67:
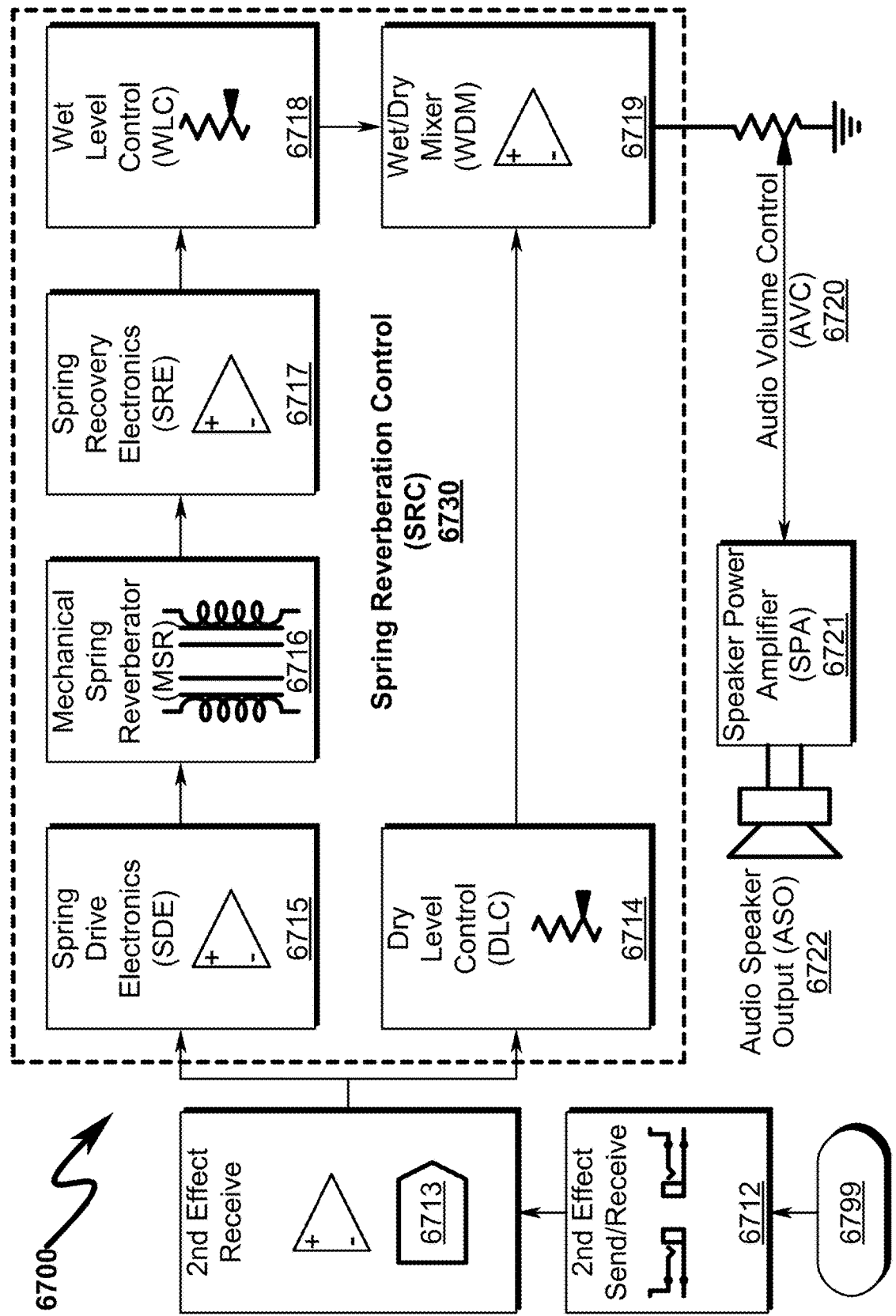
FIG. 67 illustrates an exemplary system block diagram of an alternate preferred exemplary system embodiment incorporating spring reverberation (page 3/3)

While the present invention may be constructed using a wide variety of electrical/mechanical variations, some may incorporate spring reverberation control as generally illustrated by the system block diagrams depicted in FIG. 65 (6500)-FIG. 67 (6700). In these alternative preferred embodiments, a mechanical spring reverberation module may be inserted within the electrical path of the amplifier to provide additional audio effects. While the block diagram of this alternative configuration is generally depicted in FIG. 65 (6500)-FIG. 67 (6700), the general signal flow is similar to that depicted in the overall system diagram of FIG. 1 (0100) and the more detailed system block diagram of FIG. 17 (1700).

Referencing FIG. 65 (6500)-FIG. 67 (6700), this alternate embodiment takes input from a guitar audio pickup (GAP) (6501) into an input audio preamplifier (IAP) (6502) that may be adjusted with a selectable guitar gain boost (GGB) (6503) switch. This pre-amplified signal is then tone adjusted with a tone stack (6504) (depicted in detail in FIG. 20 (2000)) that adjusts base/mid/treble and also brightness/levels before being presented to a first effect send (6505) signal processor that interfaces with a first effect send/receive connector stack (6506). Processed first effects are then input to a first effect receive (6507) circuit and then processed by a clean/dirty signal processor (6608) followed by a lead boost selector (6609). Drive levels are then adjusted (6610) before being signal processed by a drive return sag control wave shaper and break pointe control circuit (6611) (also referred to as a pick attack sag compressor (PAC)) output from this circuitry is then presented to a second effect send/receive connector stack (6712) and subsequently to a second effect receive amplifier (6713). From this point the signal is processed by a spring reverberation control (SRC) circuit (6730) consisting of a dry level control (DLC) (6714), spring drive electronics (SDE) (6715), mechanical spring reverberator (MSR) (6716), spring recovery electronics (SRE) (6717), wet level control (WLC) (6718), and wet/dry mixer (WDM) (6719). Output from the spring reverberation control (SRC) circuit (6730) is then adjusted for level by an audio volume control (AVC) (6720) before being presented to a speaker power amplifier (SPA) (6721) to drive an audio speaker output (ASO) (6722).

One skilled in the art will note the similar signal flows in these two previously discussed embodiments. However, as depicted in FIG. 67 (6700), the spring reverberation control (SRC) block (6730) portion of this alternative construction allows a second effect receive module (6713) to stimulate a dry level control (DLC) (6714) and simultaneously a mechanical reverberation chain (MRC) consisting of spring drive electronics (SDE) (6715), mechanical spring reverberator (MSR) module (6716), spring recovery electronics (SRE) (6717), and wet level control (WLC) (6718). Within this context the spring reverberation control (SRC) block (6730) may be considered as an extension of the pick attack sag compressor (PAC) (0116) portion of the overall system block diagram depicted in FIG. 1 (0100, 0116) and FIG. 17 (1700, 1714, 1715, 1716, 1717). The output of the dry level control (DLC) (6714) and wet level control (WLC) (6718) are mixed with a wet/dry mixing (WDM) amplifier (6719) and input to the audio volume control (AVC) (6720) for presentation to the speaker power amplifier (SPA) (6721) and eventual output to the audio speaker output (ASO) (6722). Adjustment of the dry level control (6714) and wet level control (6718) permit varying degrees of mechanical spring reverberation by the mechanical spring reverberator module (6716) to be inserted within the audio stream presented to the audio speaker output (ASO) (6722) by the wet/dry mixing (WDM) amplifier (6719).

Figure 68:
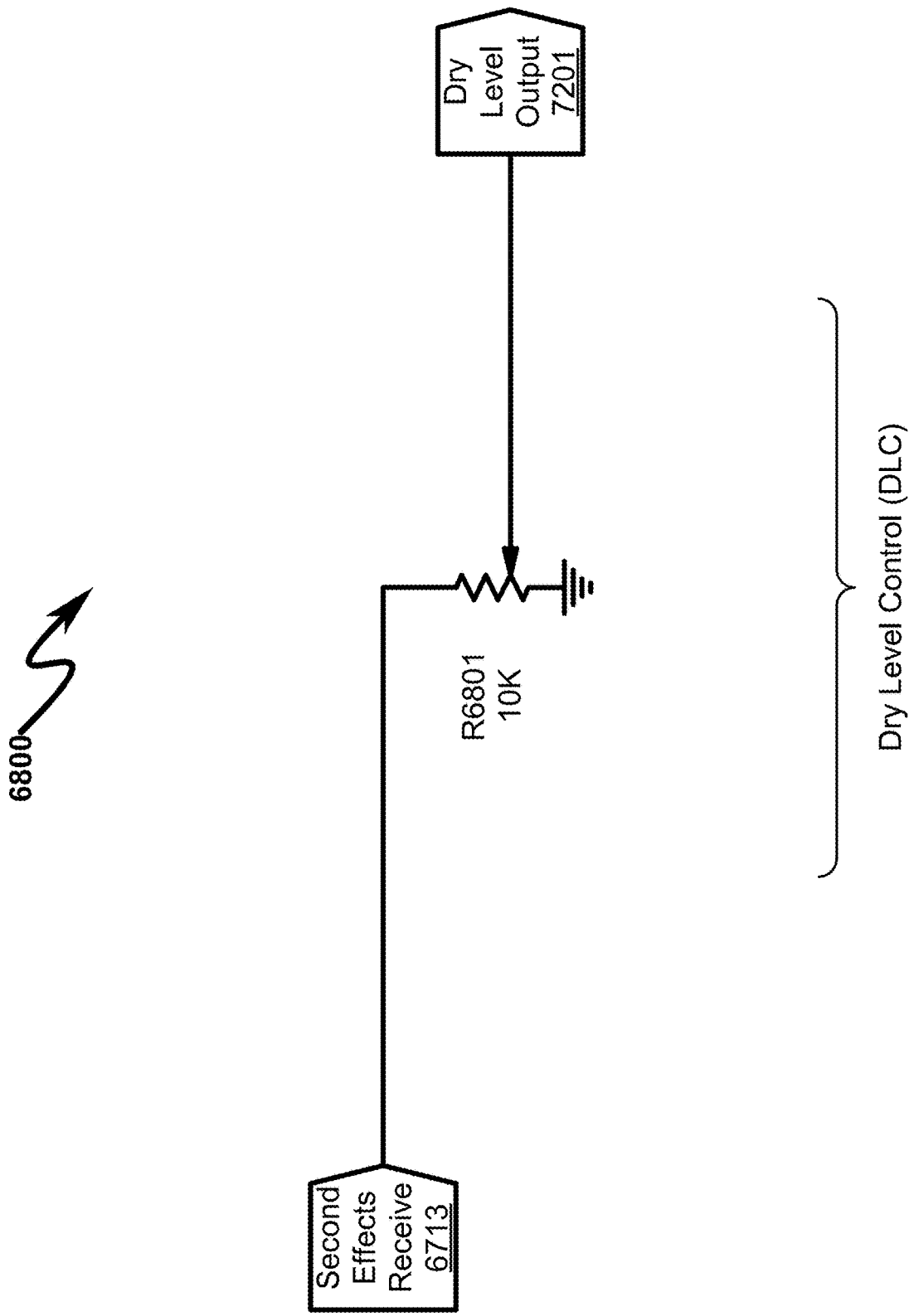
FIG. 68 illustrates an exemplary dry level control (DLC) circuitry schematic.
Figure 69:
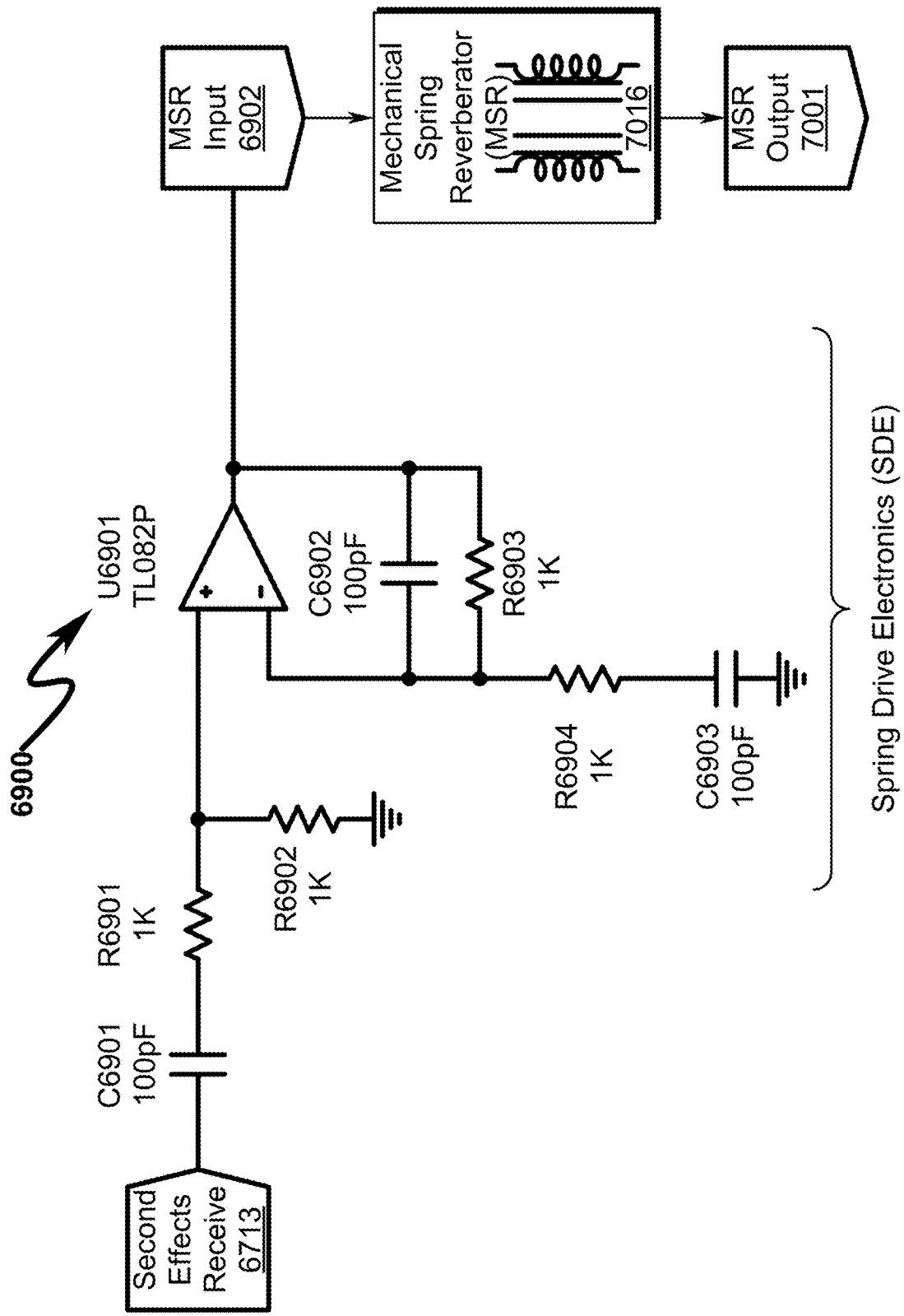
FIG. 69 illustrates an exemplary spring drive electronics (SDE) circuitry schematic.
Figure 70:
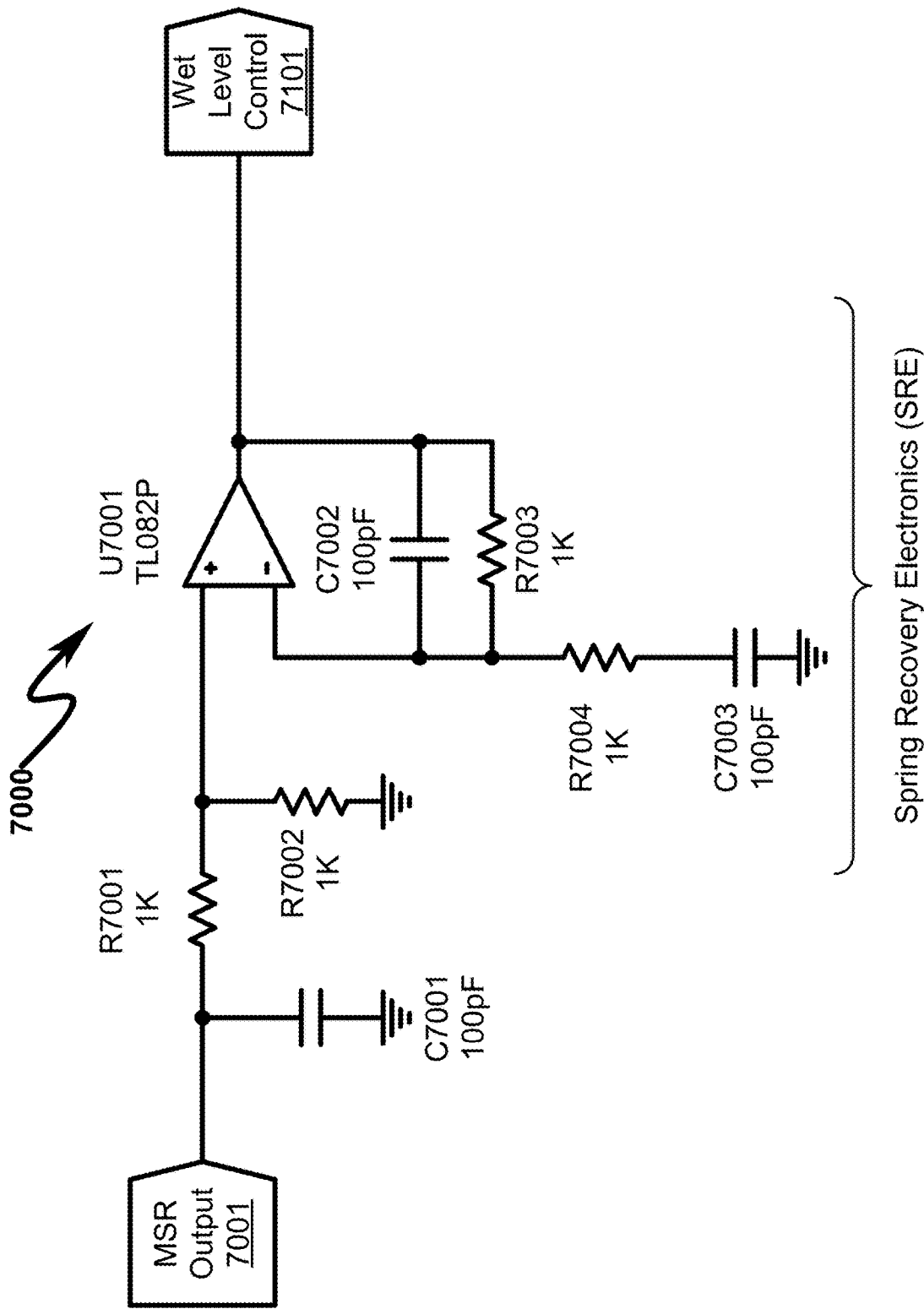
FIG. 70 illustrates an exemplary spring recovery electronics (SRE) circuitry schematic.
Figure 71:
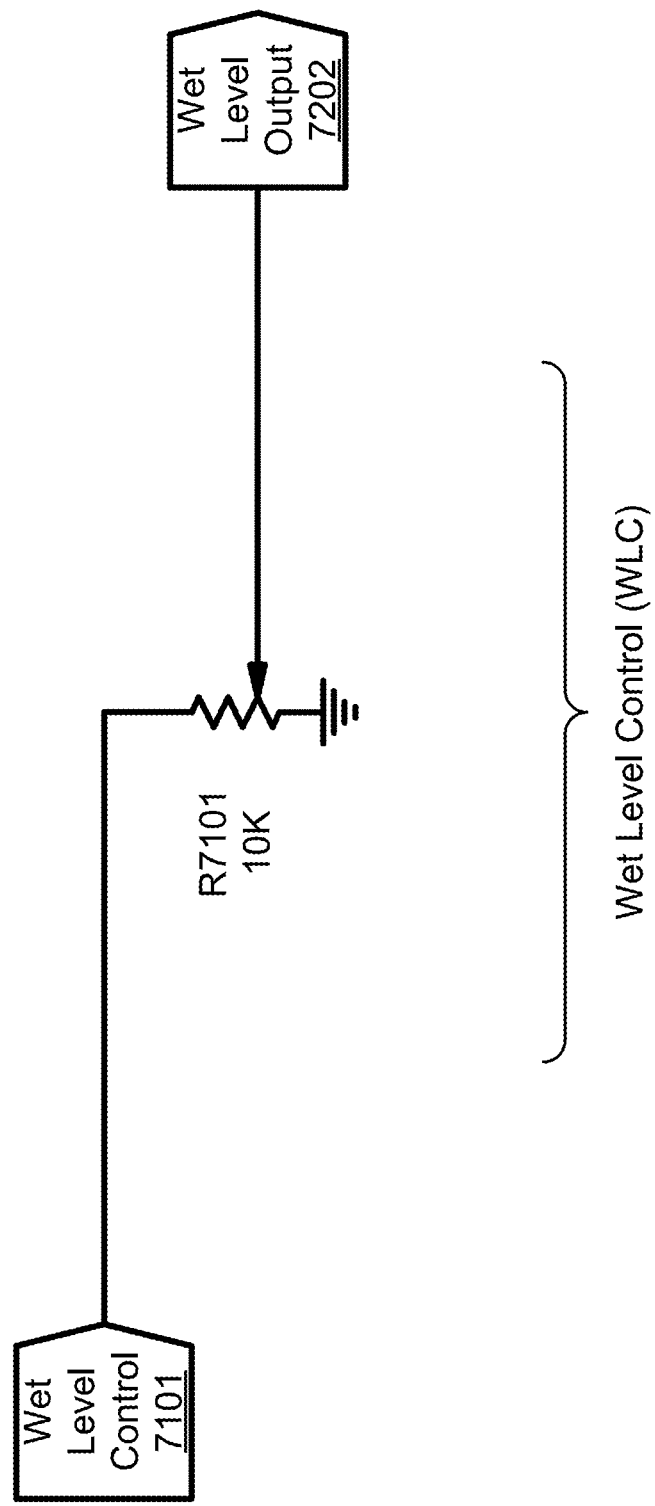
FIG. 71 illustrates an exemplary wet level control (DLC) circuitry schematic.
Figure 72:
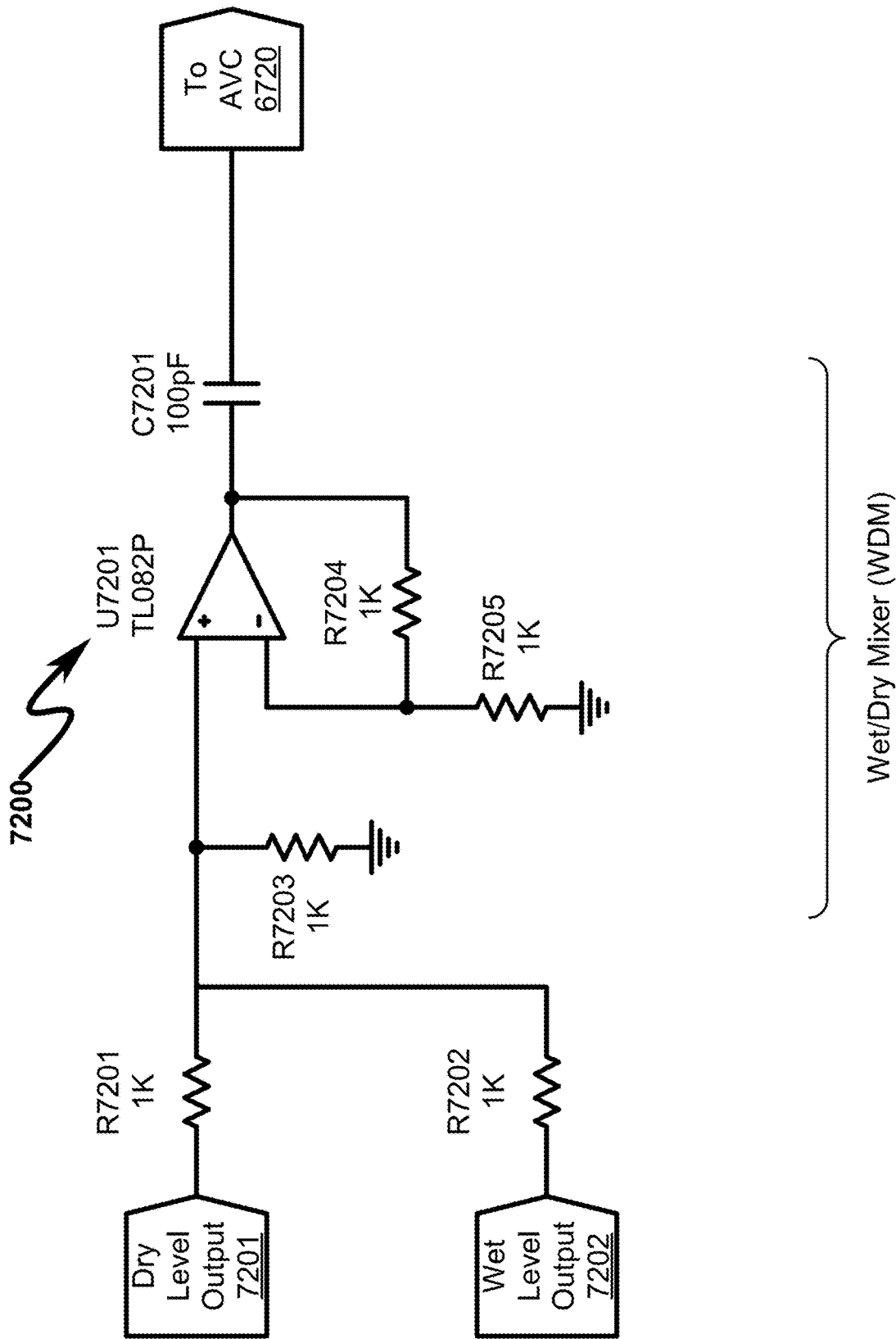
FIG. 72 illustrates an exemplary wet/dry mixer (WDM) circuitry schematic.

One skilled in the art will recognize that the spring reverberation control (SRC) (6730) may be implemented in a wide variety of ways. However, some preferred embodiments are provided in the drawings, including the dry level control (DLC) (FIG. 68 (6800)), spring drive electronics (SDE) (FIG. 69 (6900)), spring recovery electronics (SRE) (FIG. 70 (7000)), wet level control (WLC) (FIG. 71 (7100)), and wet/dry mixer (WDM) (FIG. 72 (7200)).

Figure 73:
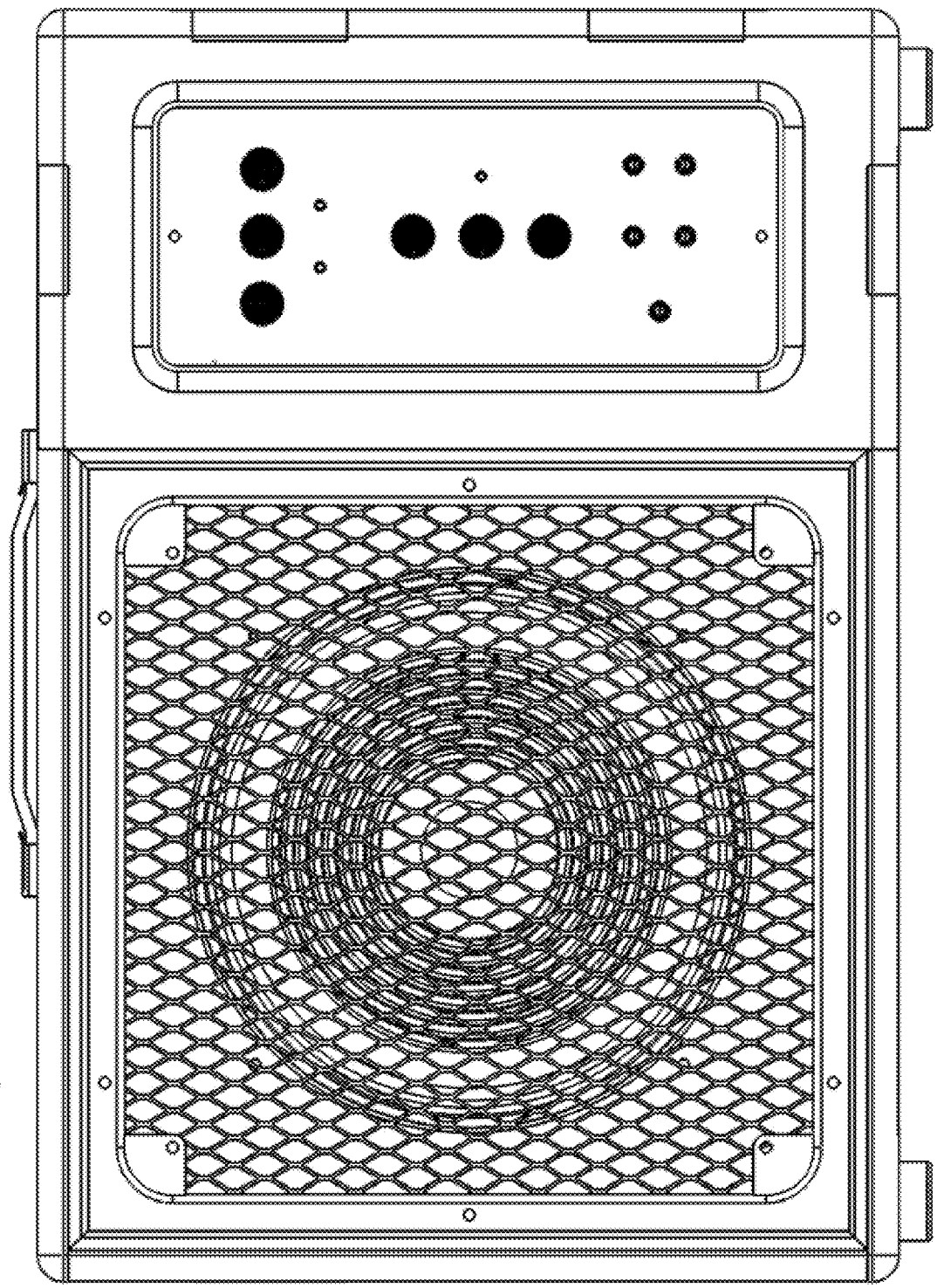
FIG. 73 illustrates a front view depicting construction detail of an alternate preferred exemplary system embodiment.
Figure 74:
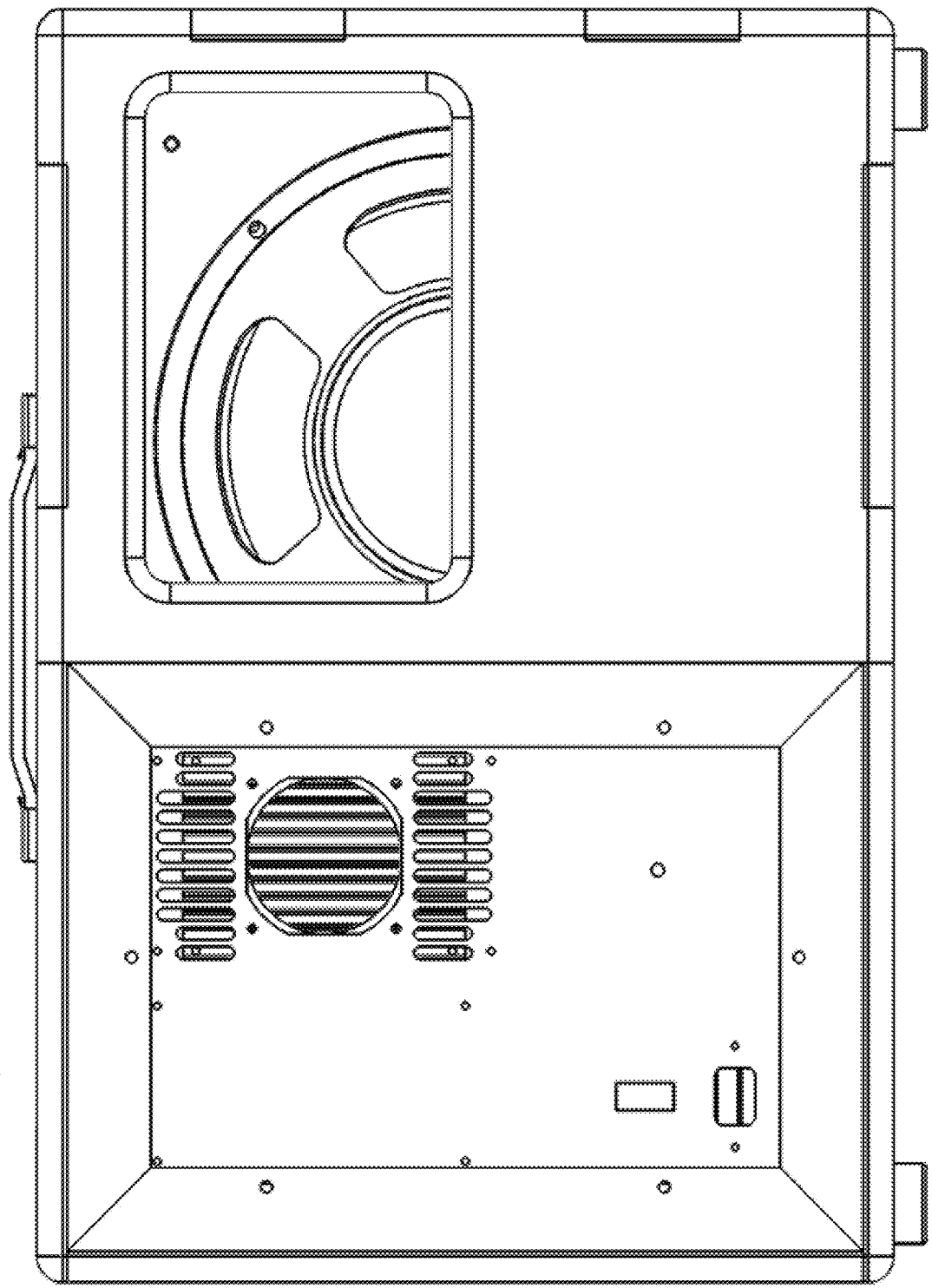
FIG. 74 illustrates a back view depicting construction detail of an alternate preferred exemplary system embodiment.
Figure 75:
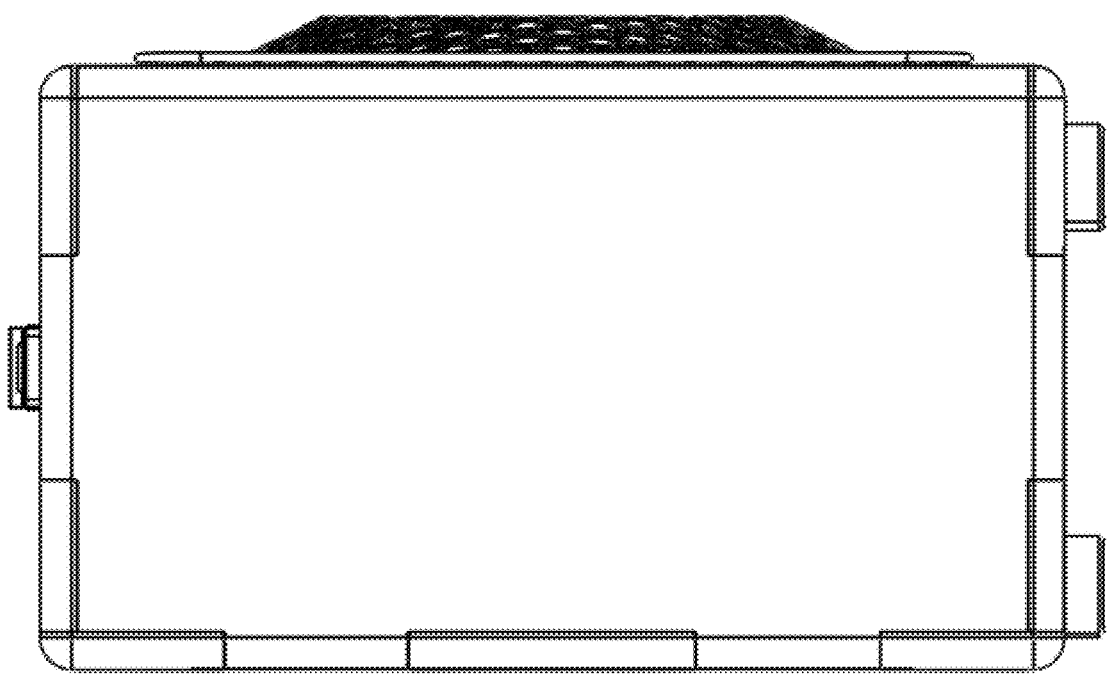
FIG. 75 illustrates a left side view depicting construction detail of an alternate preferred exemplary system embodiment.
Figure 76:
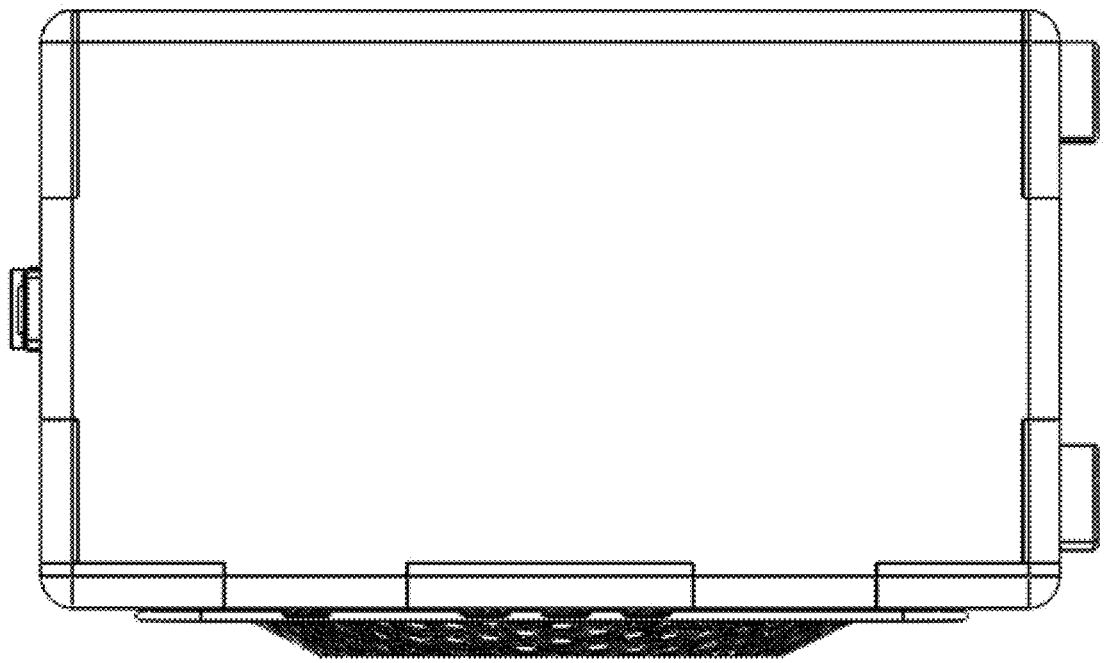
FIG. 76 illustrates a right side view depicting construction detail of an alternate preferred exemplary system embodiment.
Figure 77:
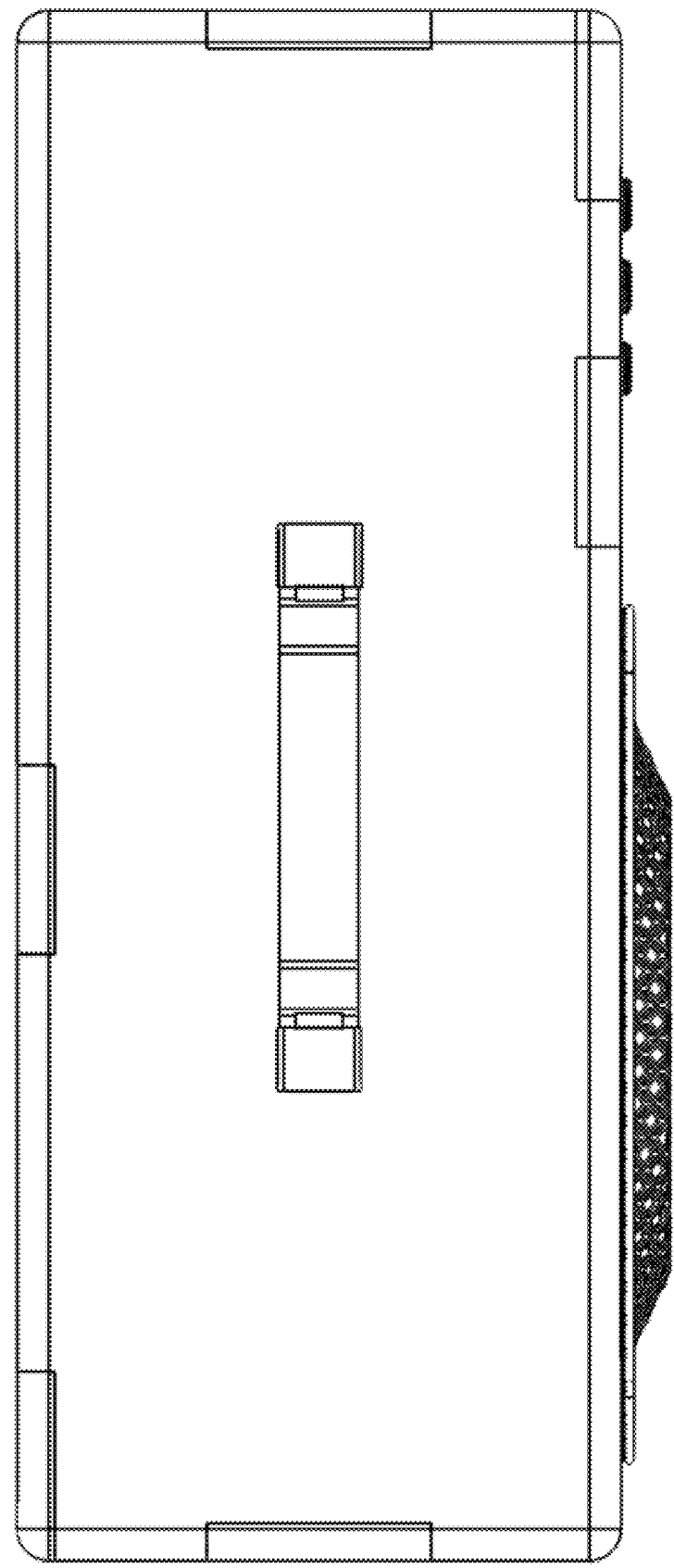
FIG. 77 illustrates a top view depicting construction detail of an alternate preferred exemplary system embodiment.
Figure 86:
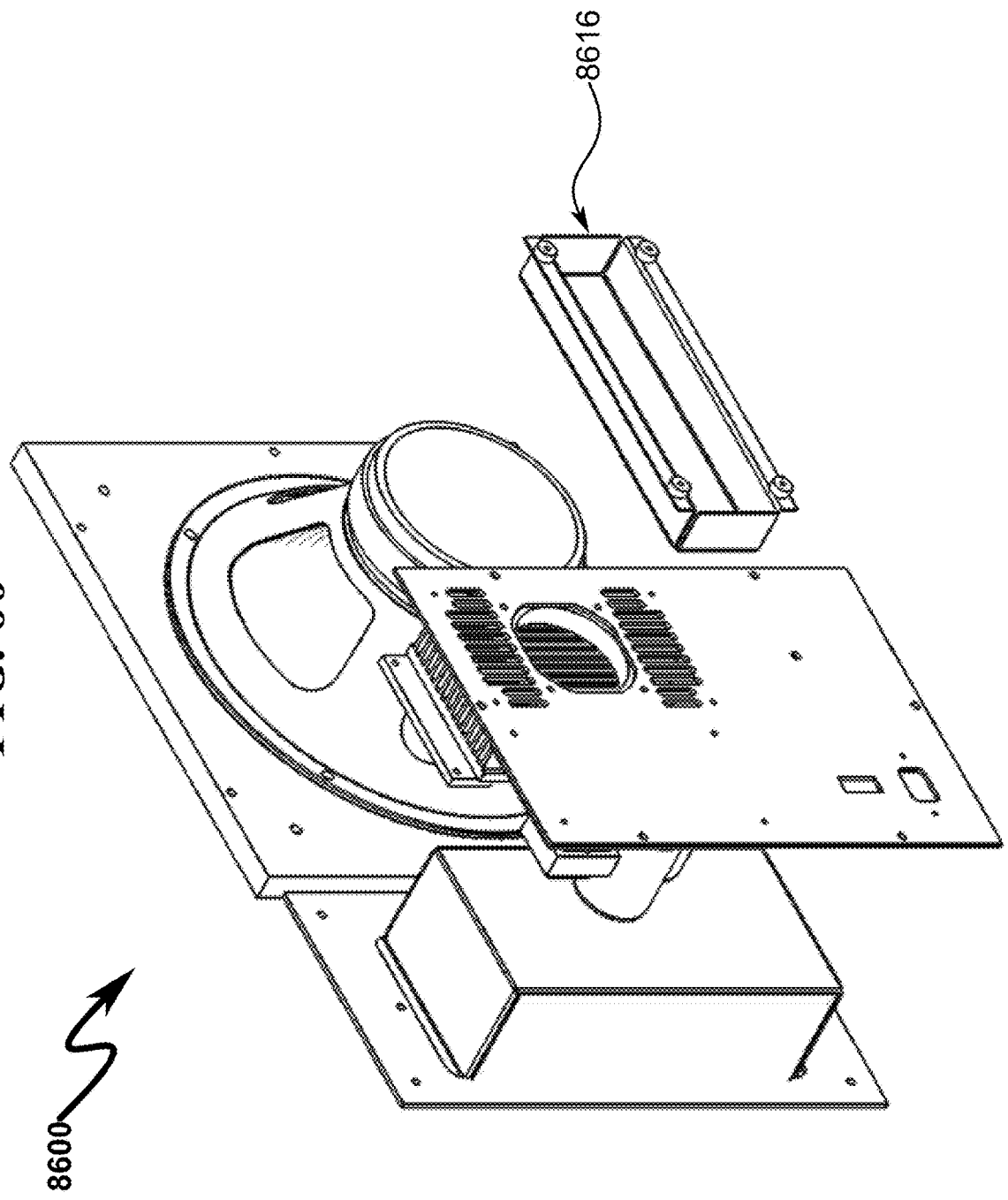
FIG. 86 illustrates a top right rear perspective view depicting construction detail of an alternate preferred exemplary system embodiment showing major internal system component detail with enclosure suppressed.
Figure 87:
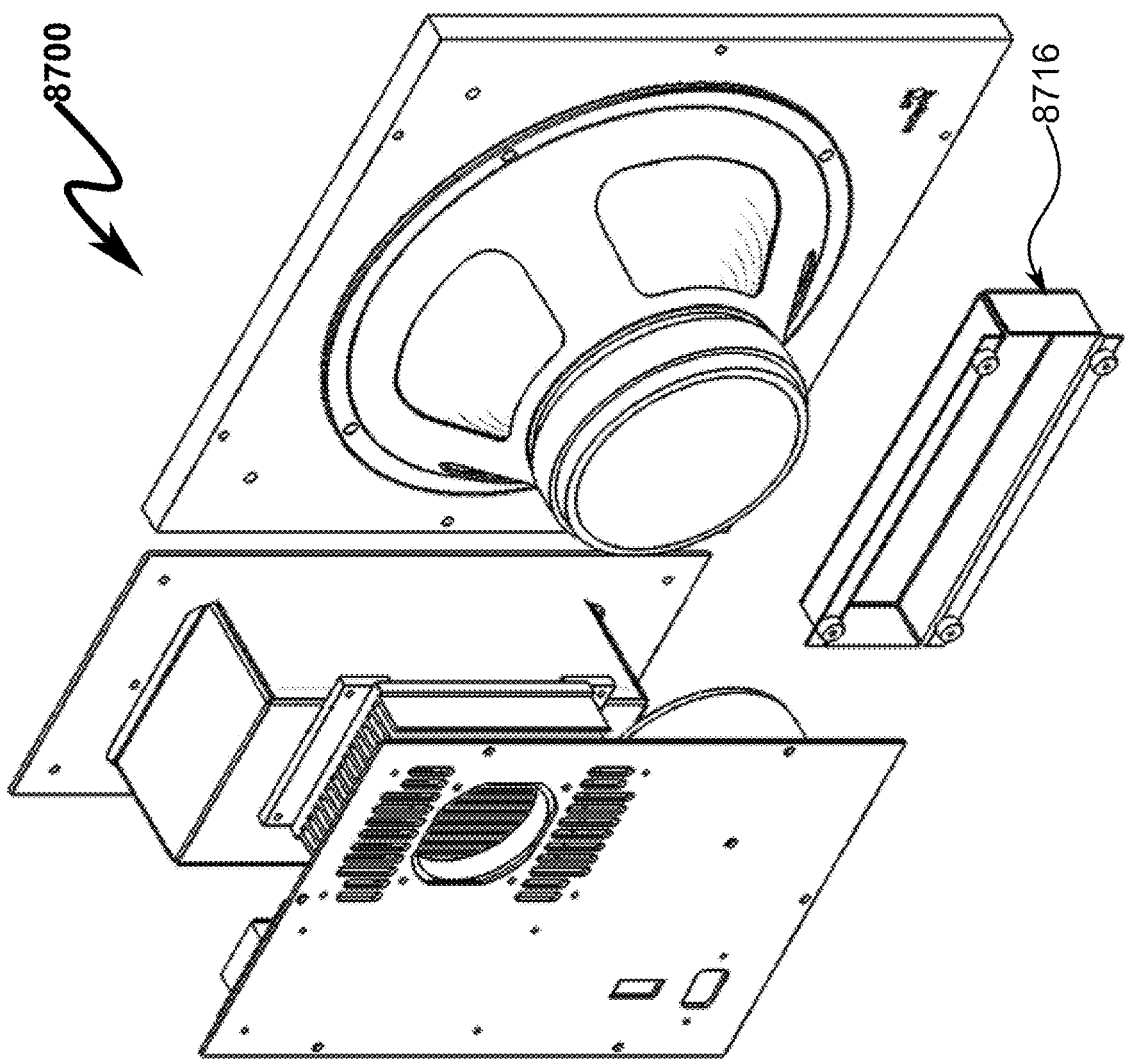
FIG. 87 illustrates a top left rear perspective view depicting construction detail of an alternate preferred exemplary system embodiment showing major internal system component detail with enclosure suppressed.
Figure 88:
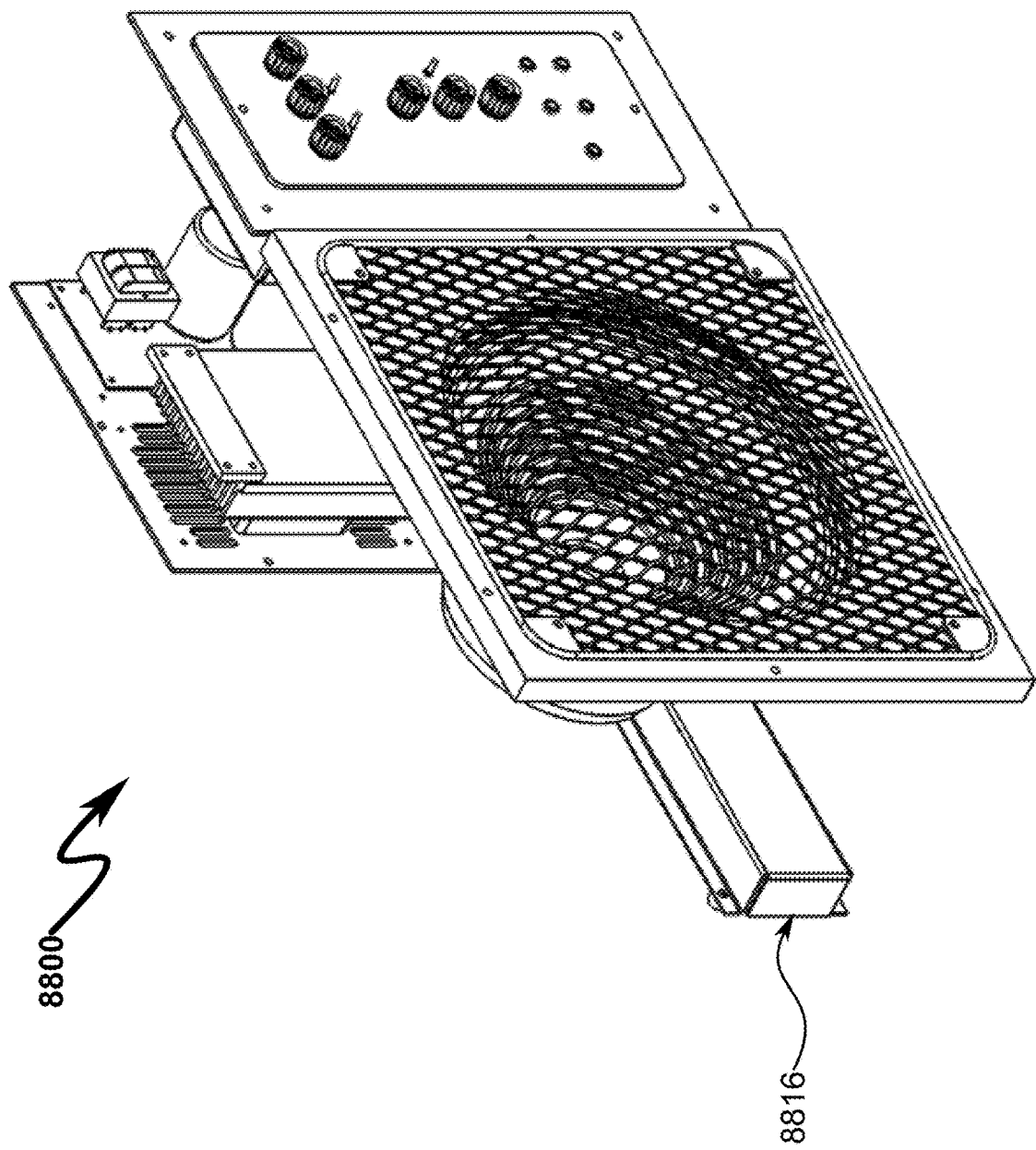
FIG. 88 illustrates a top left front perspective view depicting construction detail of an alternate preferred exemplary system embodiment showing major internal system component detail with enclosure suppressed.
Figure 96:
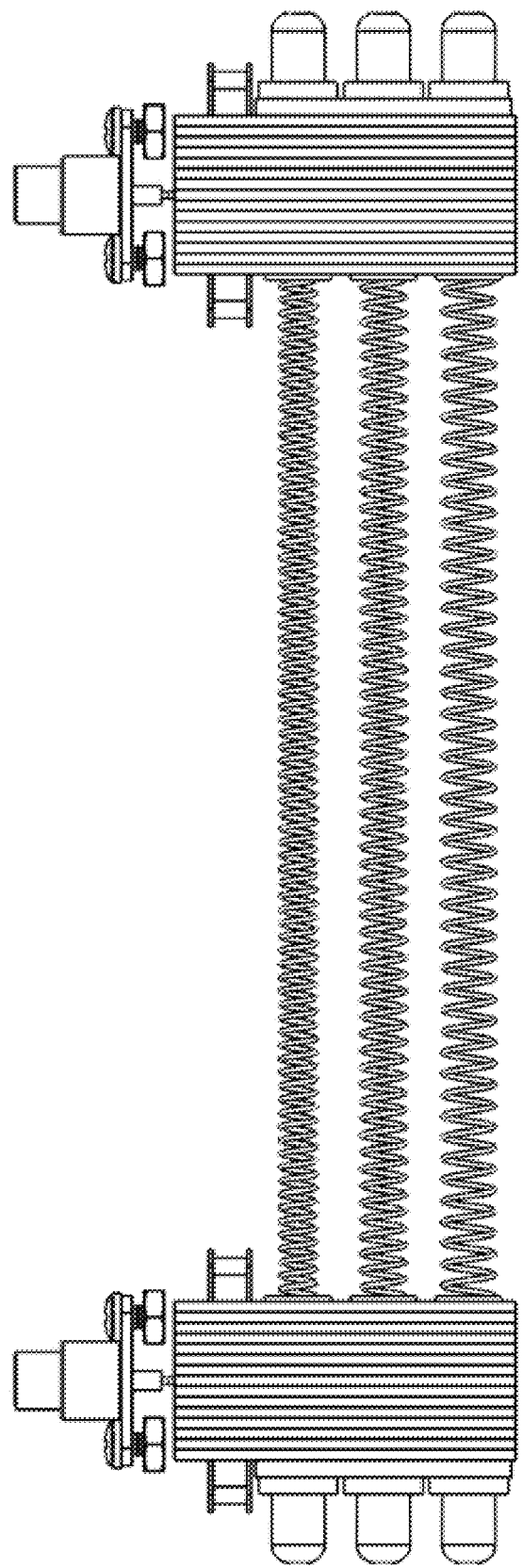
FIG. 96 illustrates a rear internal view of an exemplary mechanical spring reverberator (MSR) useful in some preferred exemplary invention embodiments.
Figure 97:
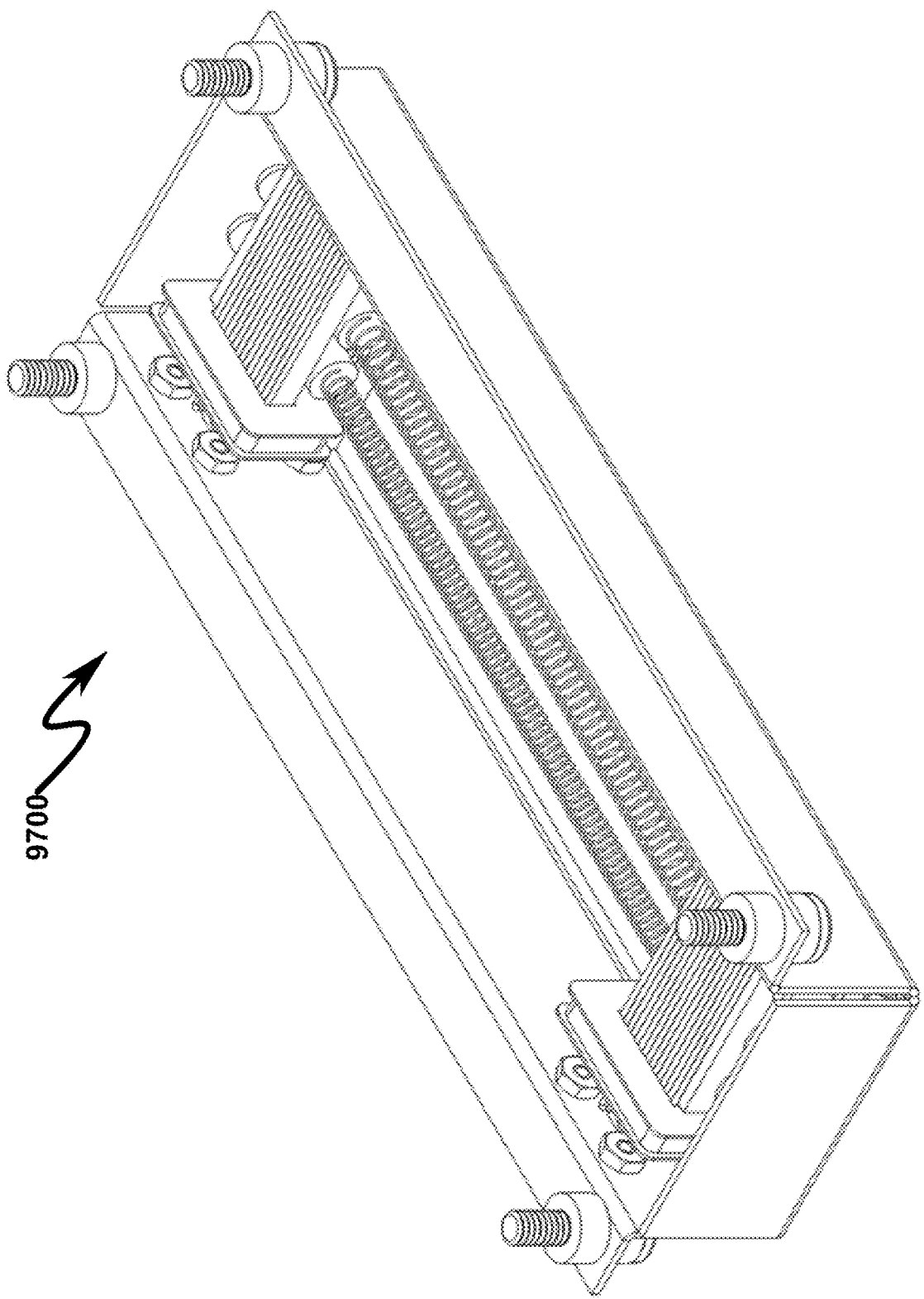
FIG. 97 illustrates a top right side front perspective view of an exemplary mechanical spring reverberator (MSR) useful in some preferred exemplary invention embodiments.
Figure 98:
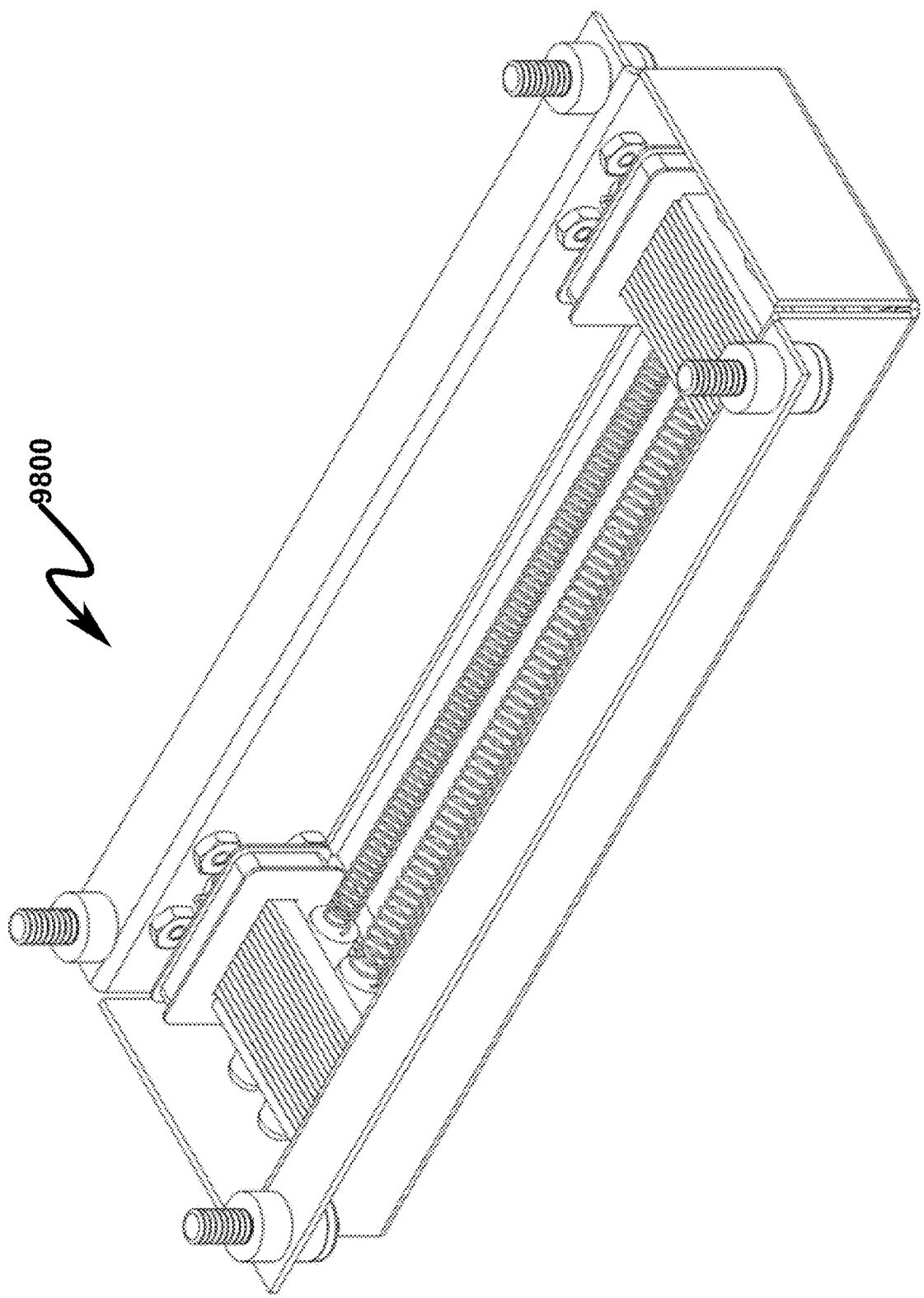
FIG. 98 illustrates a top right side back perspective view of an exemplary mechanical spring reverberator (MSR) useful in some preferred exemplary invention embodiments.
Figure 99:
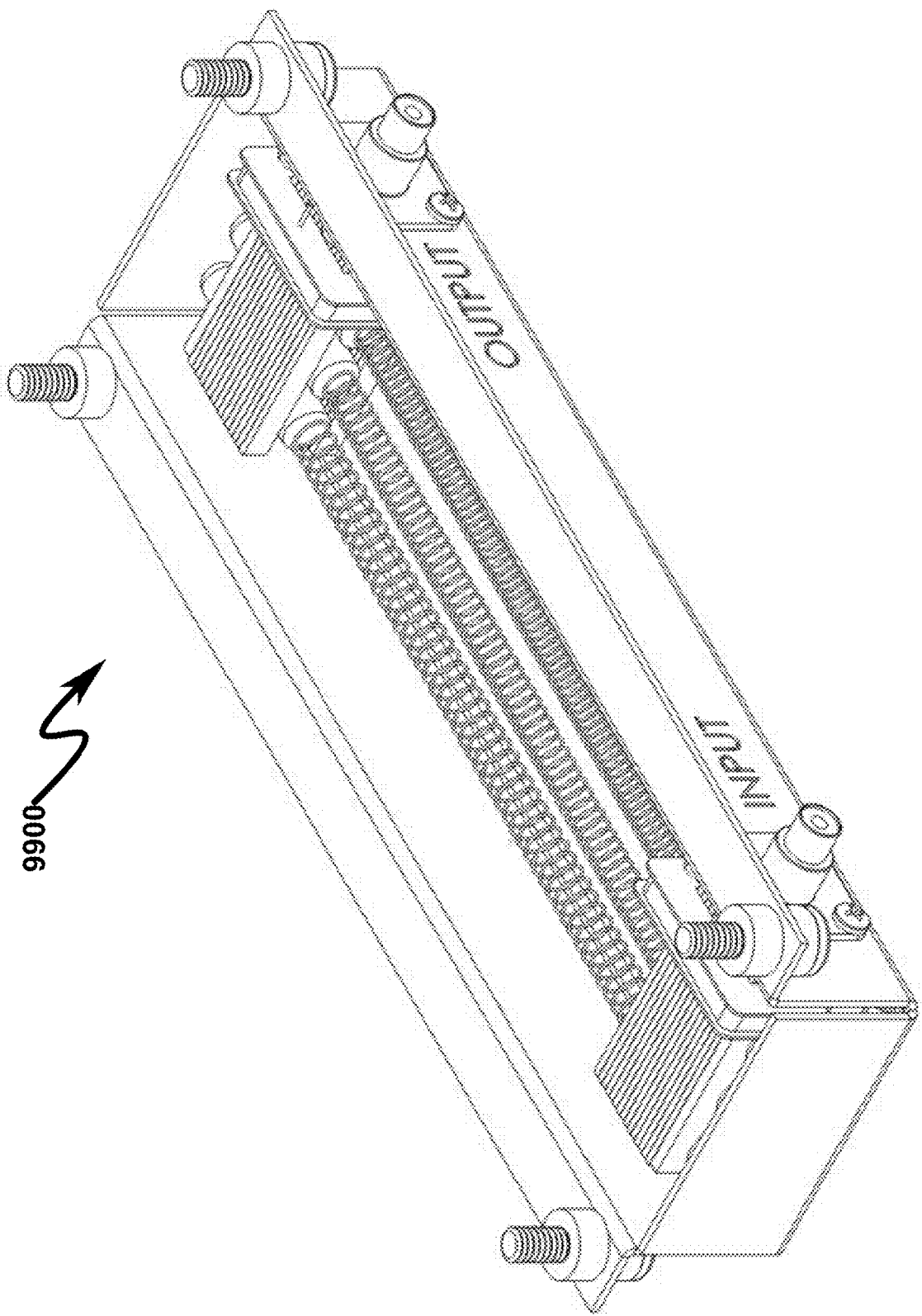
FIG. 99 illustrates a top left side back perspective view of an exemplary mechanical spring reverberator (MSR) useful in some preferred exemplary invention embodiments.
Figure 100:
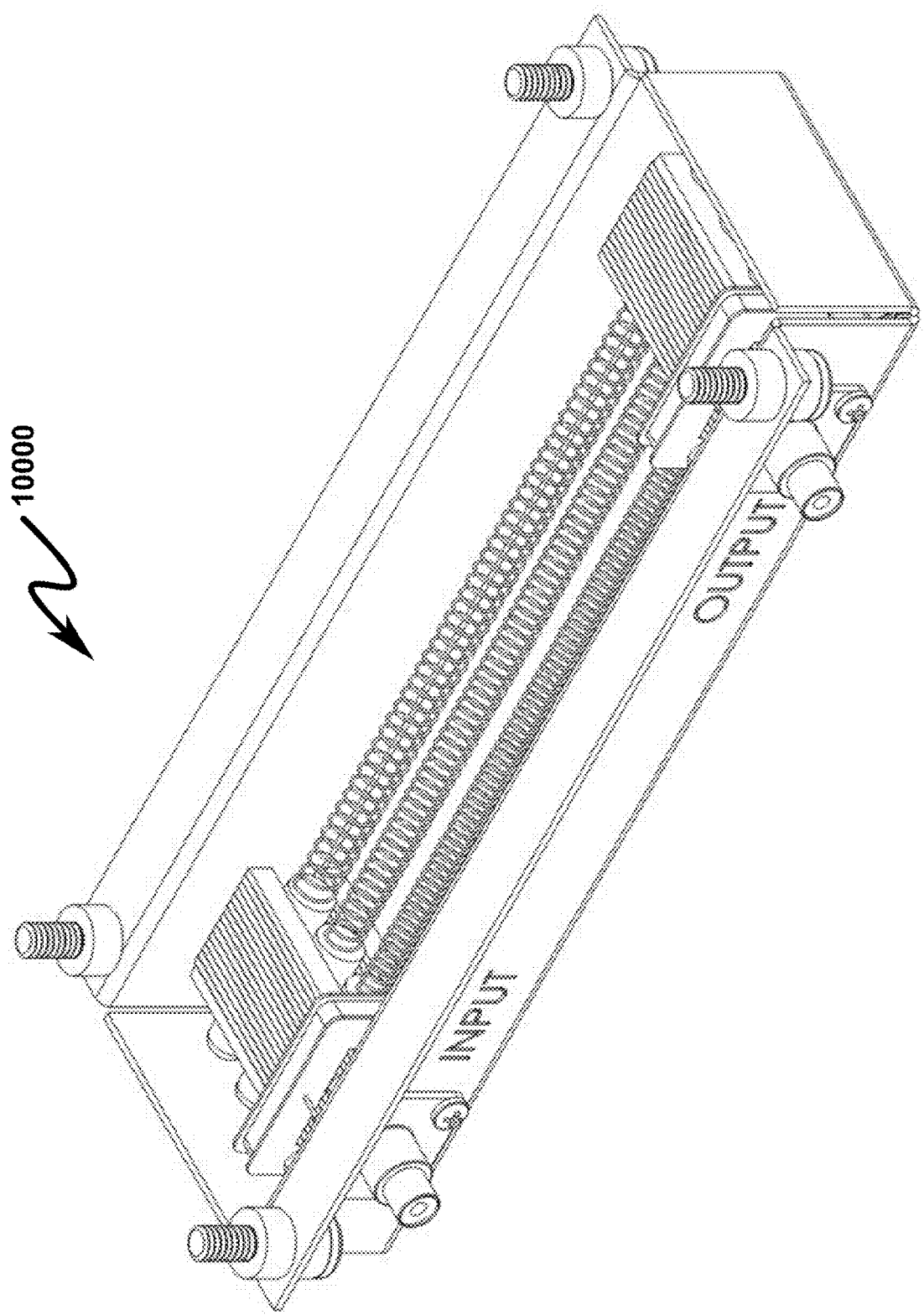
FIG. 100 illustrates a top left side front perspective view of an exemplary mechanical spring reverberator (MSR) useful in some preferred exemplary invention embodiments.
Figure 101:
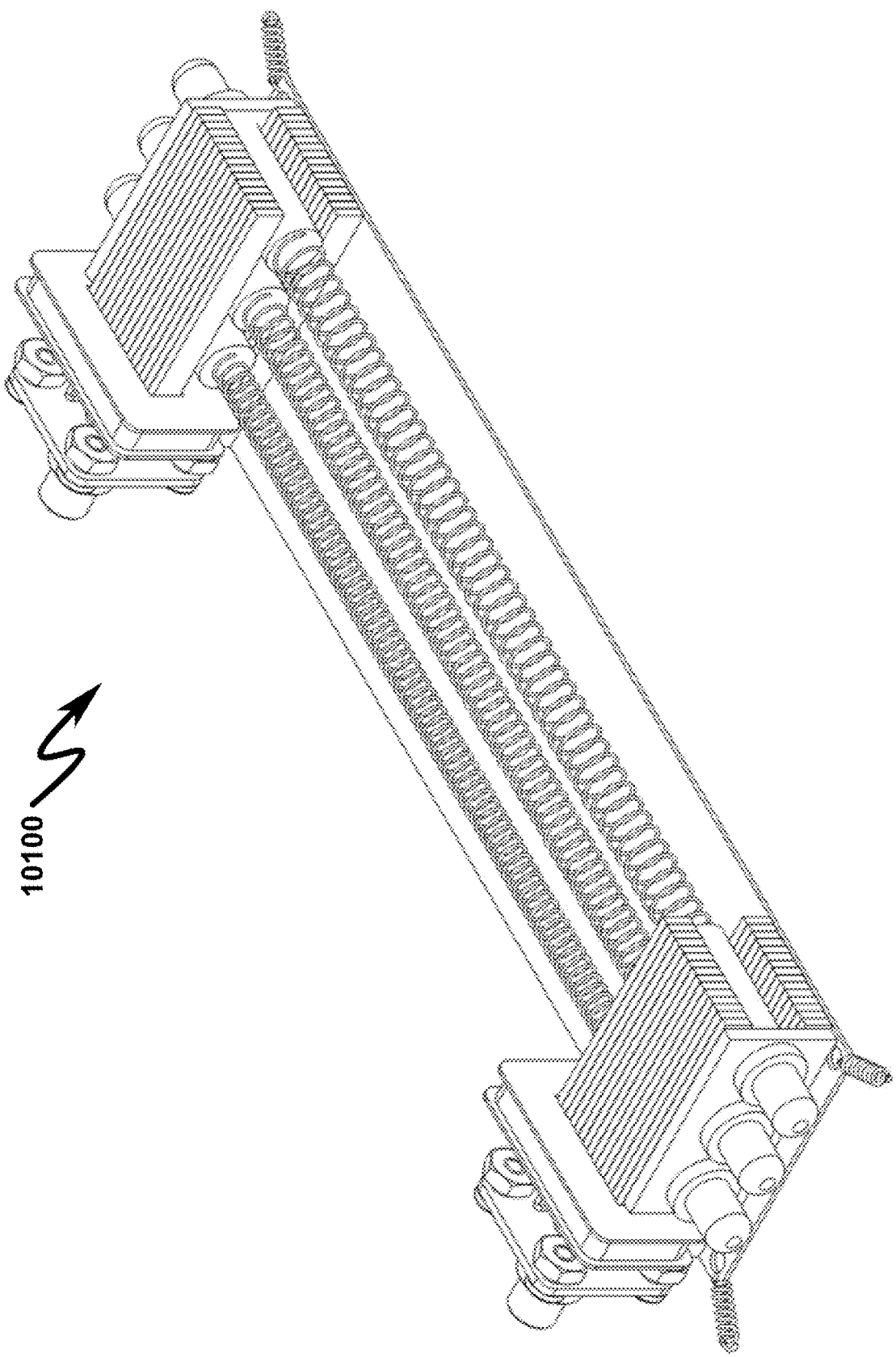
FIG. 101 illustrates a top right side front perspective internal view of an exemplary mechanical spring reverberator (MSR) useful in some preferred exemplary invention embodiments.
Figure 102:
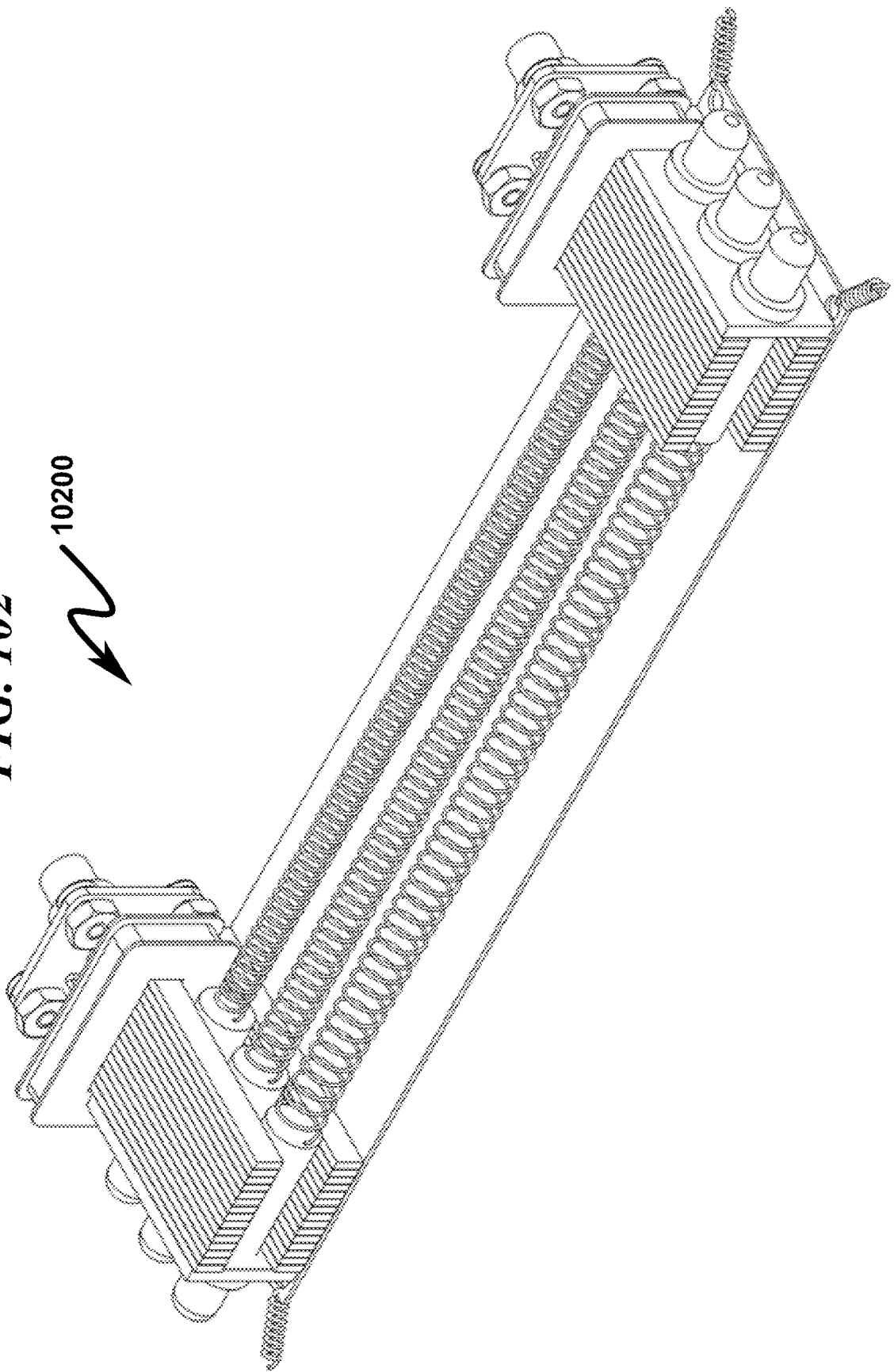
FIG. 102 illustrates a top right side back perspective internal view of an exemplary mechanical spring reverberator (MSR) useful in some preferred exemplary invention embodiments.
Figure 103:
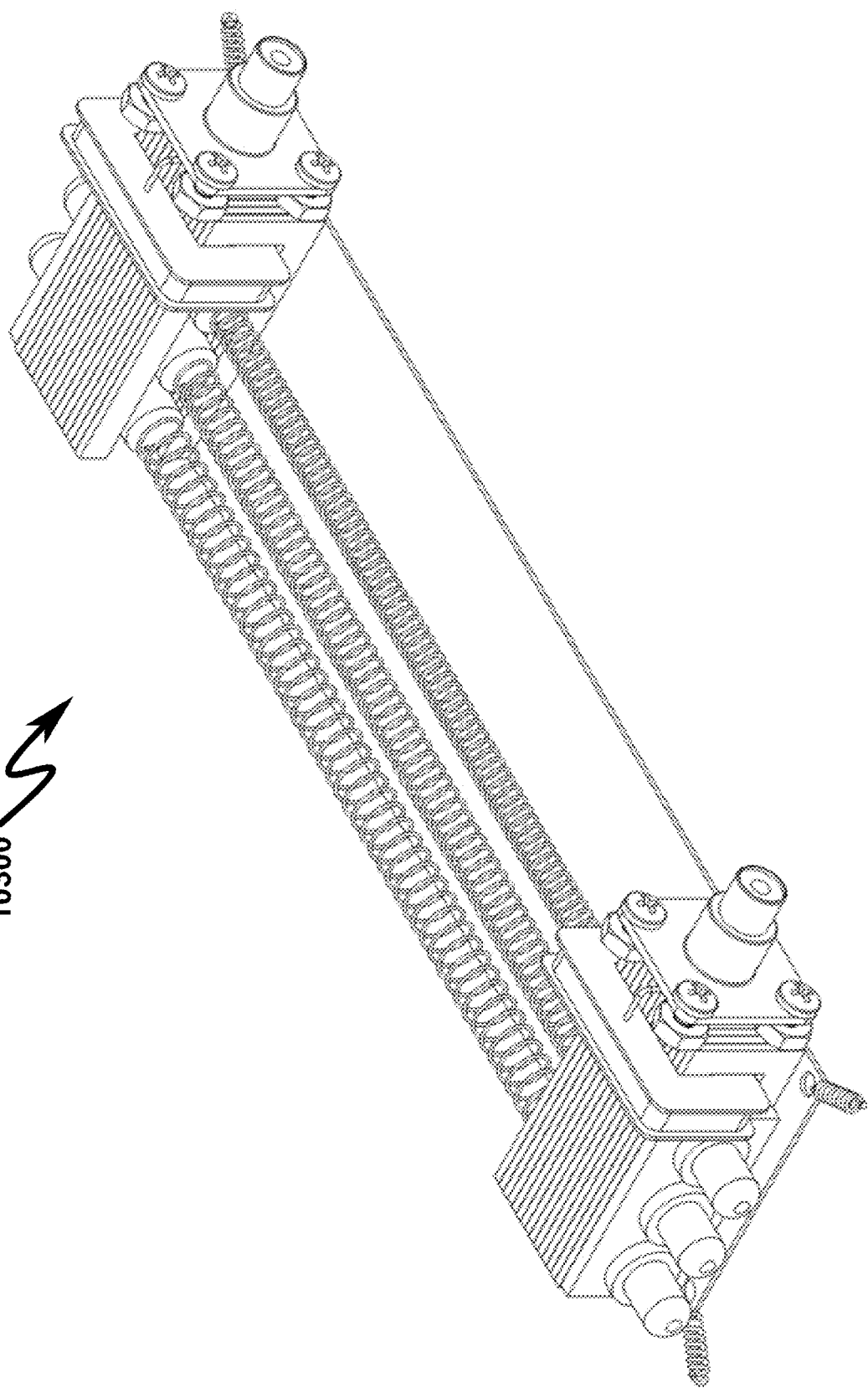
FIG. 103 illustrates a top left side back perspective internal view of an exemplary mechanical spring reverberator (MSR) useful in some preferred exemplary invention embodiments.

An example of this alternative preferred exemplary mechanical construction embodiment is generally depicted in the various views of FIG. 73 (7300)-FIG. 96 (9600). It should be noted that this construction technique permits the overall guitar amplifier system (GAS) to be modularized such that the speaker and power supply are contained within a suitable enclosure and the guitar amplifier electronics (GAE) to be confined to a modularized module that may be inserted or removed into the enclosure to permit different tonal qualities to be selected by the user. As generally depicted in FIG. 86 (8600)-FIG. 88 (8800), the mechanical spring reverberator (MSR) module (6716) depicted in FIG. 67 (6700) may be placed within the context of this modularized guitar amplifier system (GAS) as shown by the typical box enclosures depicted (8616, 8716, 8816). Note that the internal construction of the mechanical spring reverberator (MSR) module (6716) may vary widely and only the outer shell is presented in FIG. 86 (8600)-FIG. 88 (8800) to show its anticipated placement within the scope of a typical portable guitar amplifier system.

Figure 78:
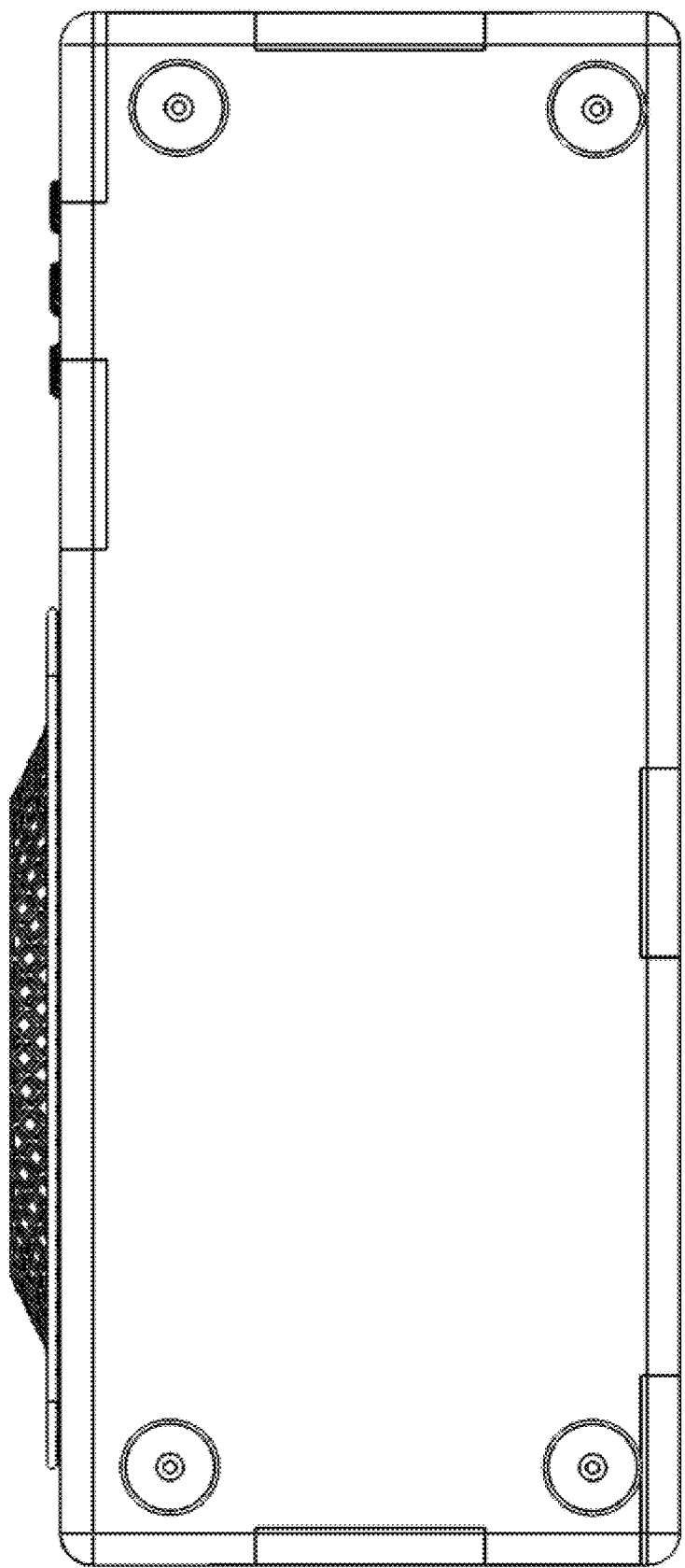
FIG. 78 illustrates a bottom view depicting construction detail of an alternate preferred exemplary system embodiment.
Figure 79:
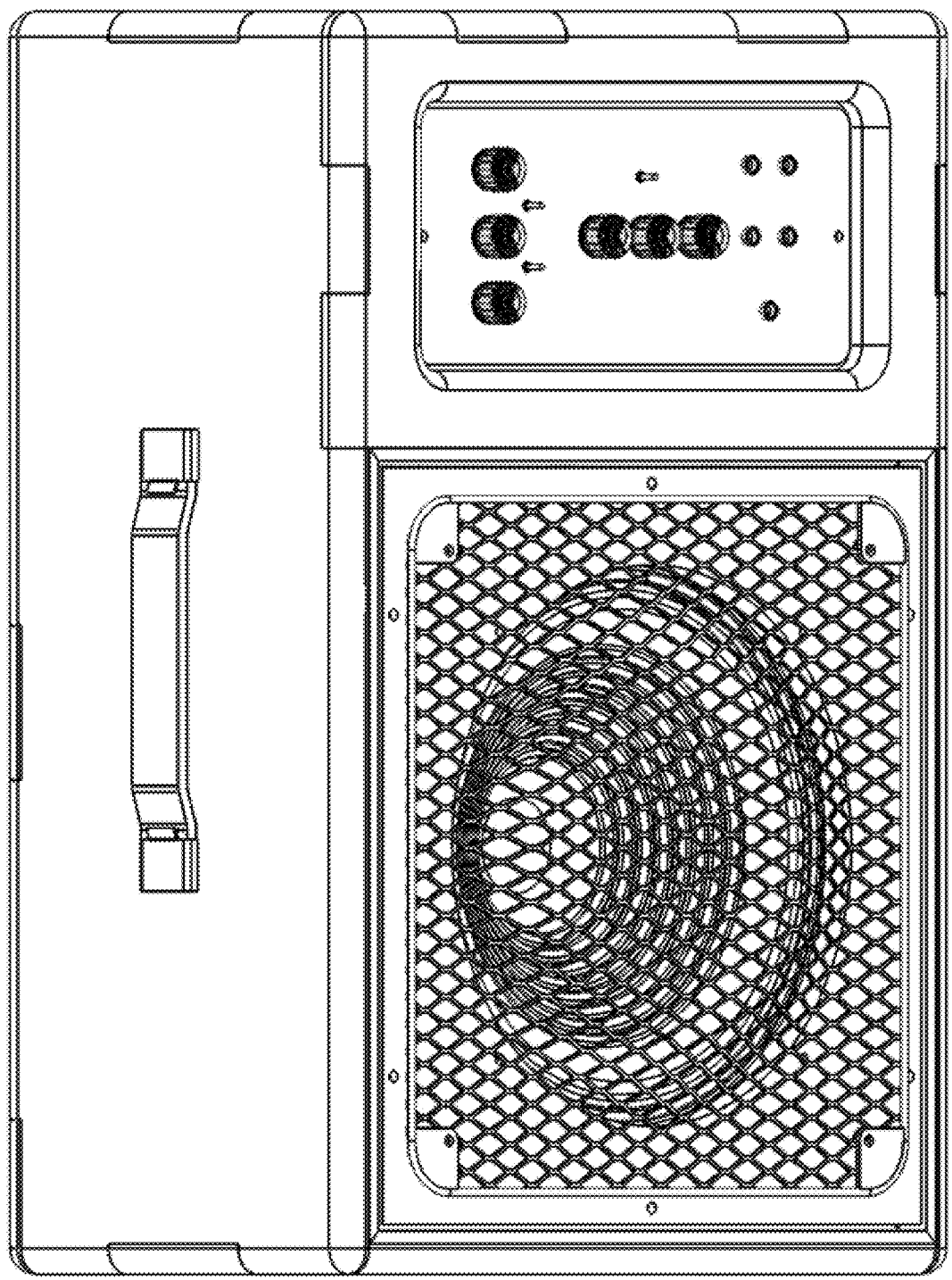
FIG. 79 illustrates a top front perspective view depicting construction detail of an alternate preferred exemplary system embodiment.
Figure 80:
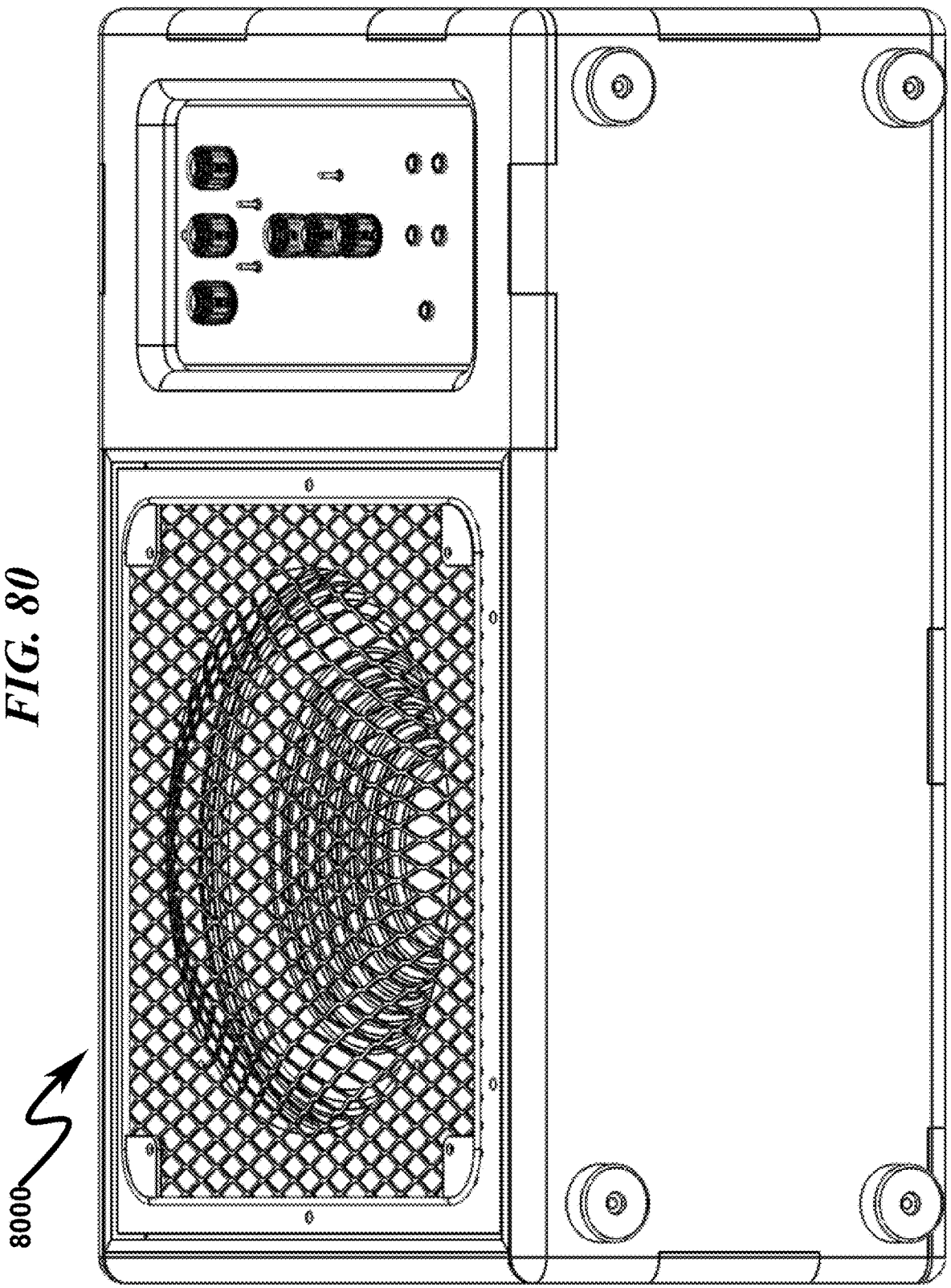
FIG. 80 illustrates a bottom front perspective view depicting construction detail of an alternate preferred exemplary system embodiment.
Figure 81:
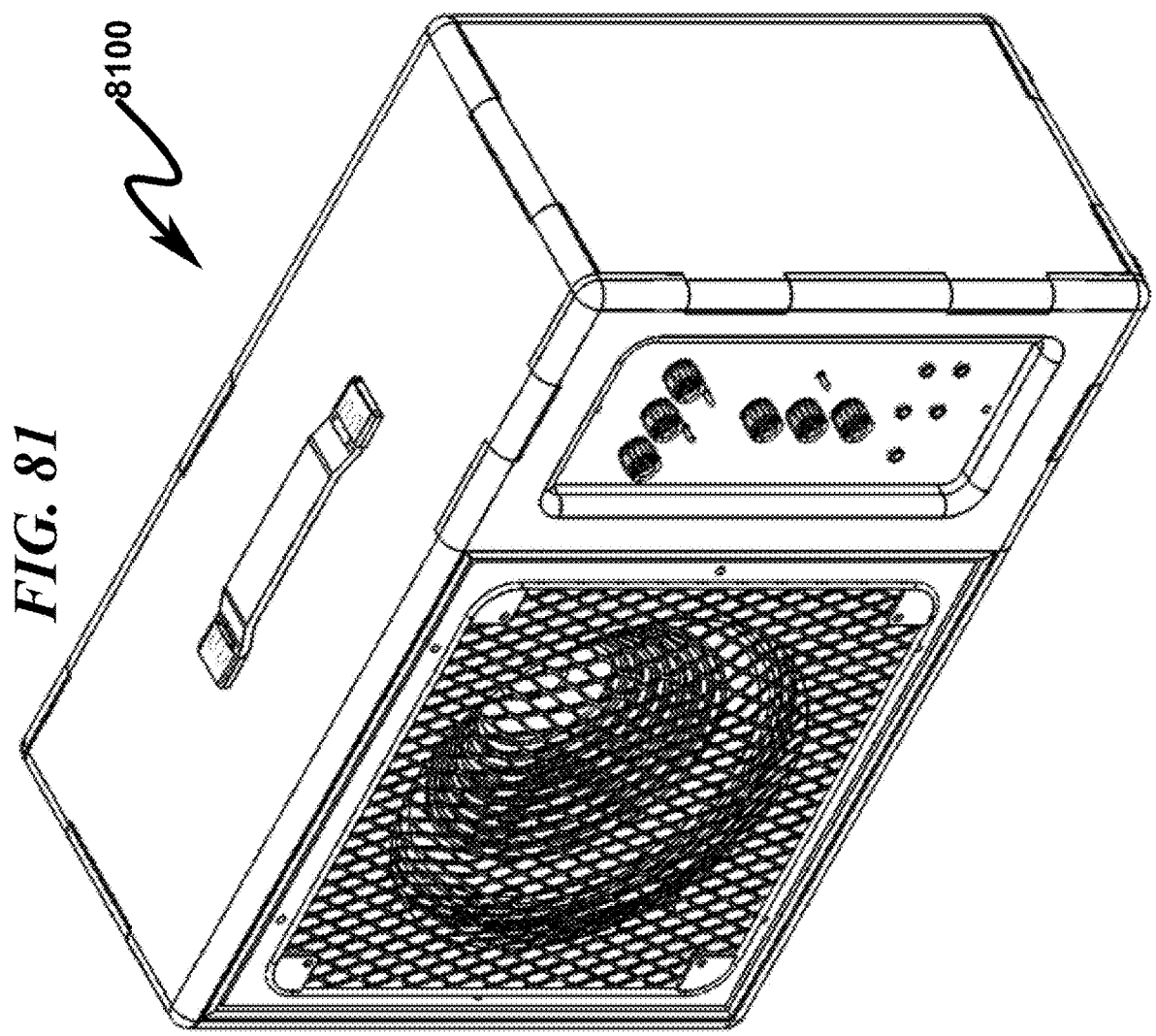
FIG. 81 illustrates a top right front perspective view depicting construction detail of an alternate preferred exemplary system embodiment.
Figure 82:
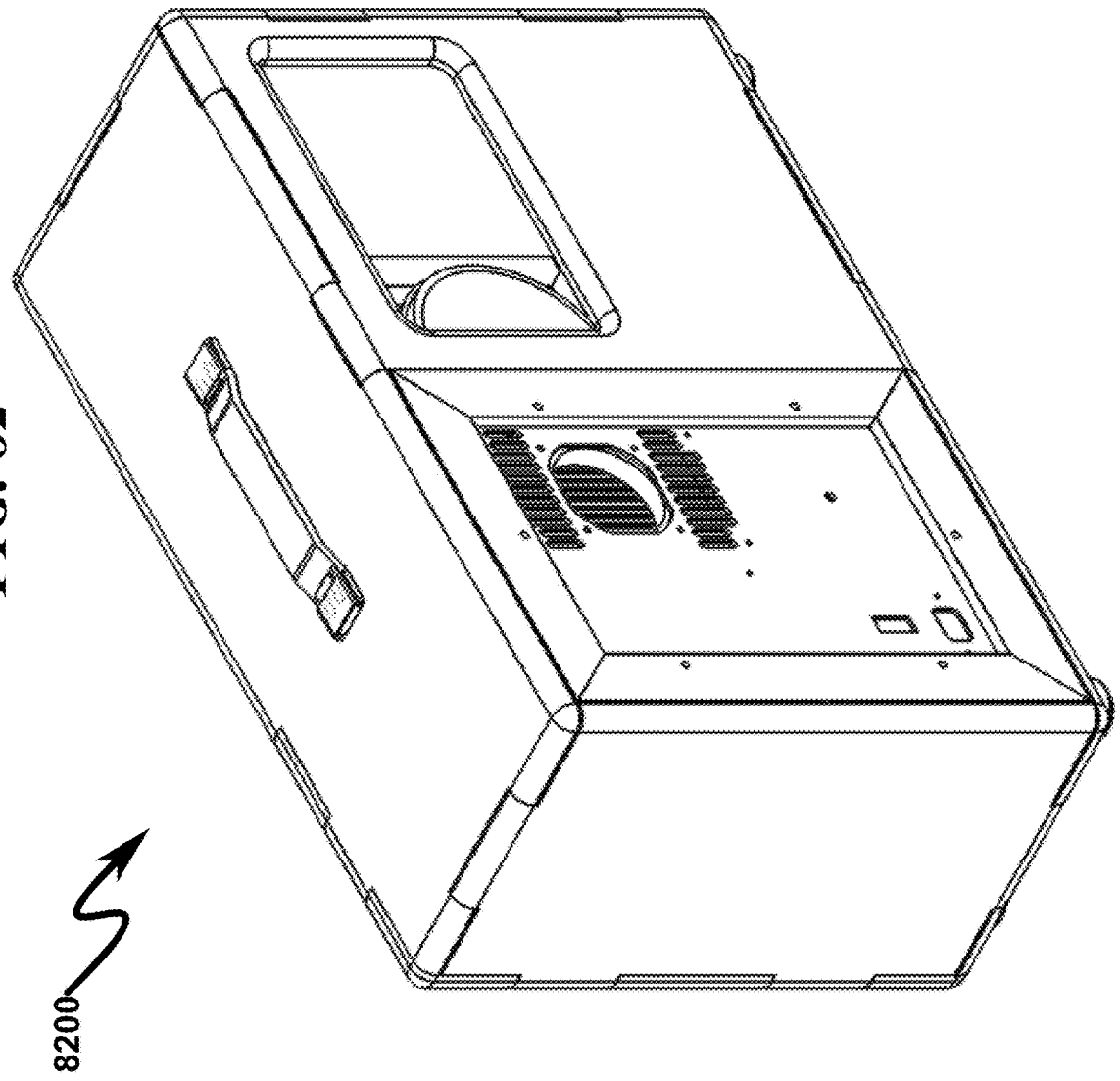
FIG. 82 illustrates a top right rear perspective view depicting construction detail of an alternate preferred exemplary system embodiment.
Figure 83:
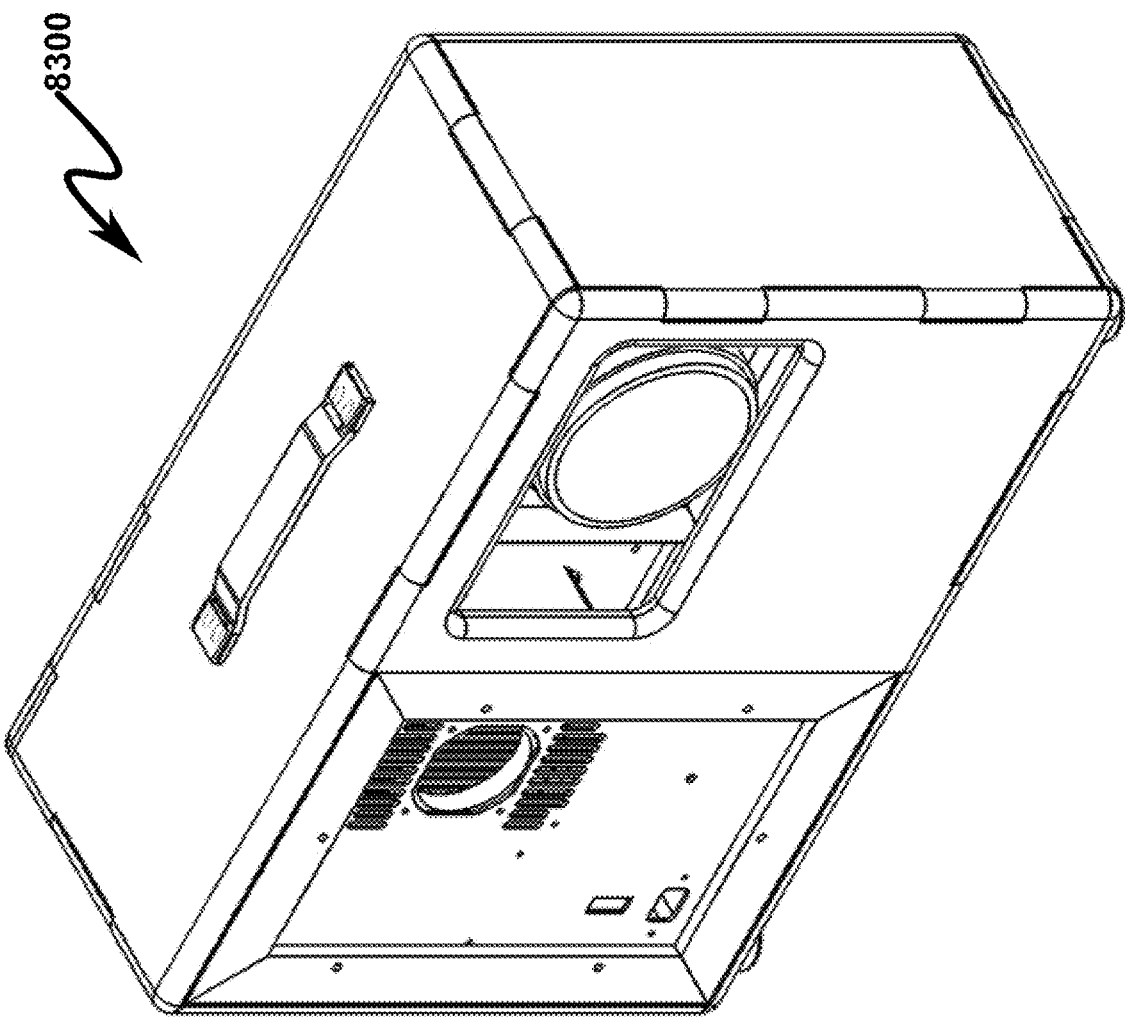
FIG. 83 illustrates a top left rear perspective view depicting construction detail of an alternate preferred exemplary system embodiment.
Figure 84:
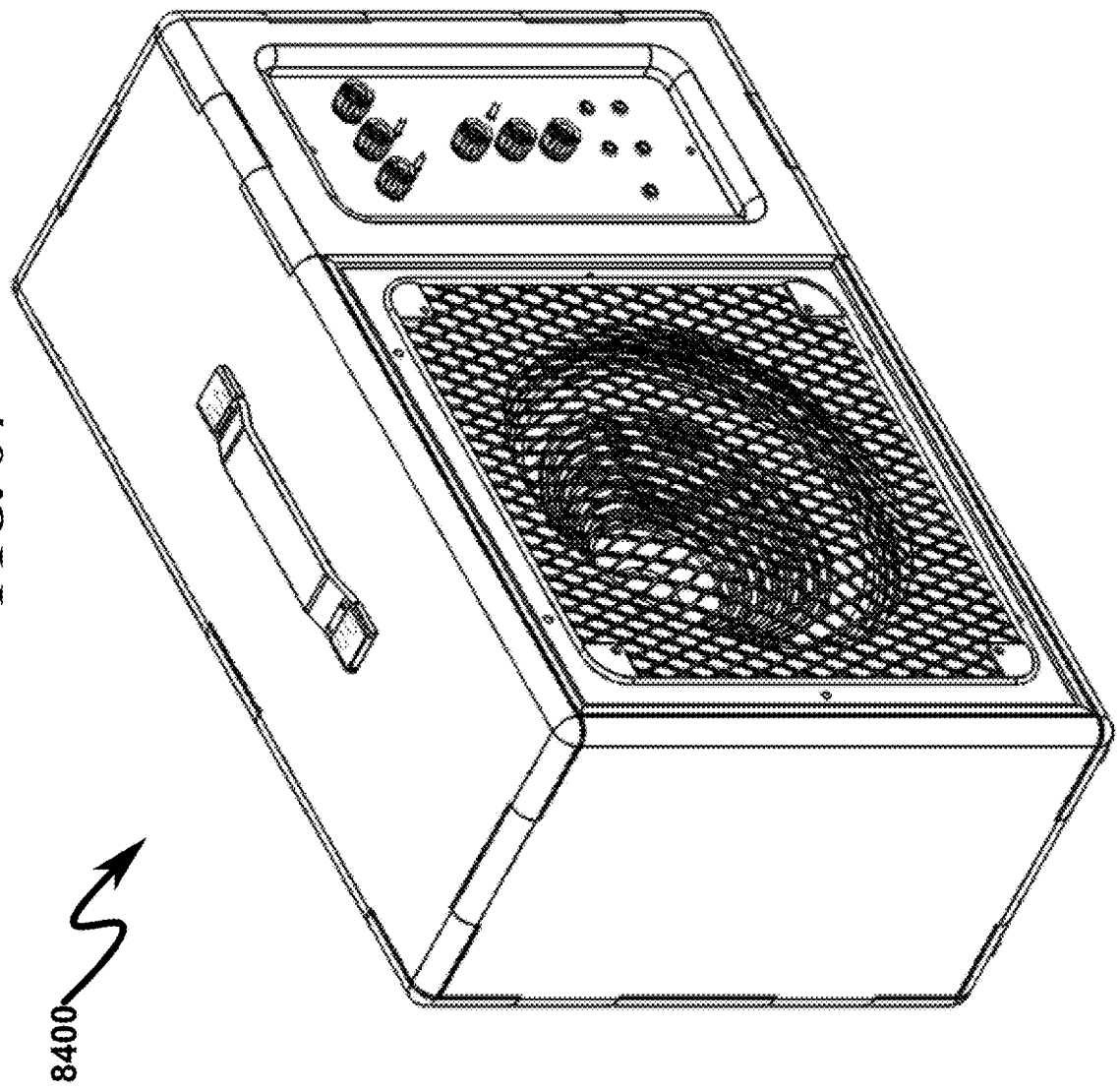
FIG. 84 illustrates a top left front perspective view depicting construction detail of an alternate preferred exemplary system embodiment.
Figure 85:
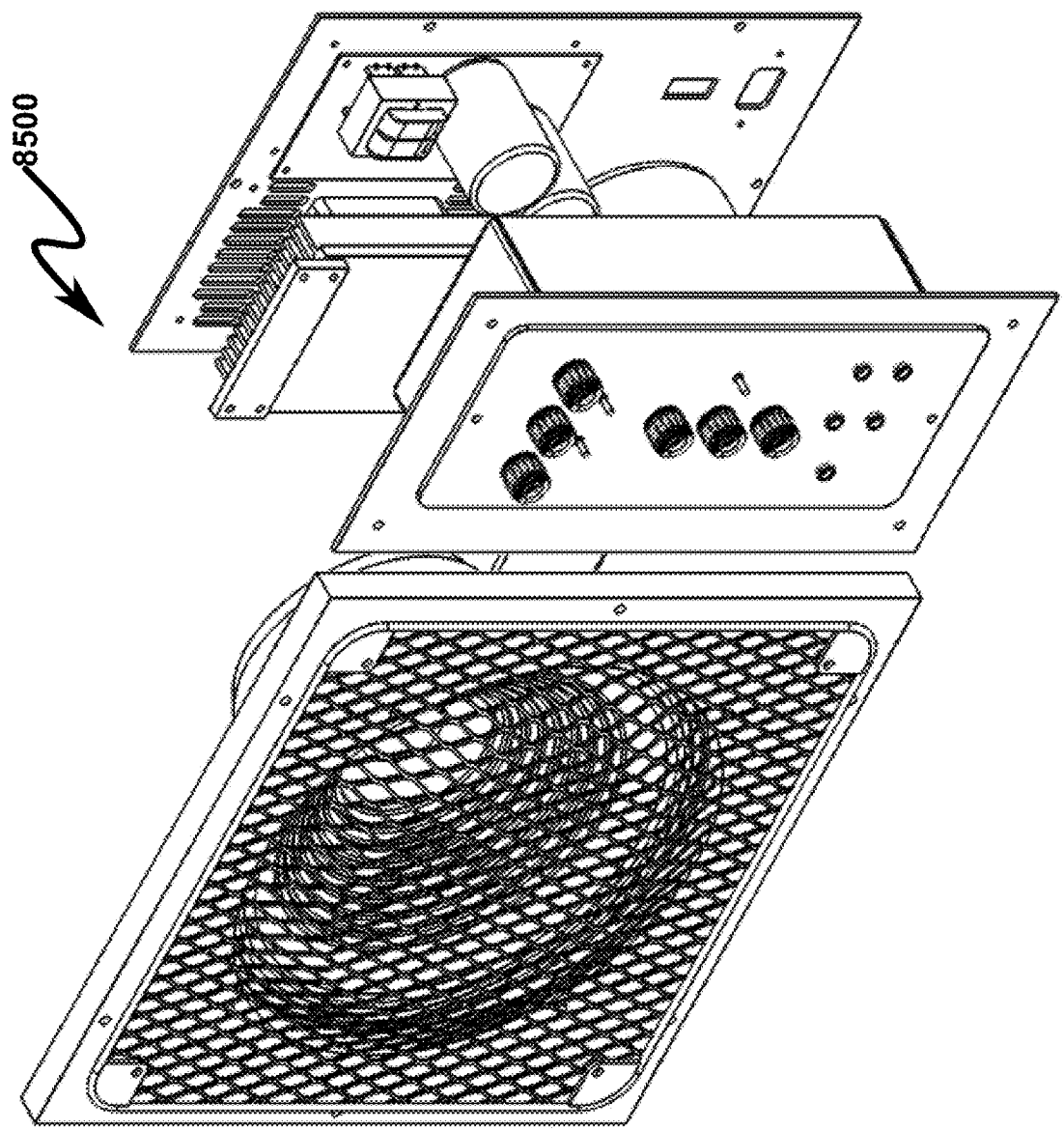
FIG. 85 illustrates a top right front perspective view depicting construction detail of an alternate preferred exemplary system embodiment showing major internal system component detail with enclosure suppressed.

FIG. 73 (7300)-FIG. 78 (7800) depict side views of a preferred exemplary invention embodiment with perspective views depicted in FIG. 79 (7900)-FIG. 84 (8400). Perspective assembly views showing major system components are depicted in FIG. 85 (8500)-FIG. 88 (8800).

Note throughout these drawings that internal cable harnesses are not shown for clarity of visualization. Additionally, note that the preferred exemplary guitar amplifier electronics (GAE) module may be electrically connected to the exemplary power supply electronics module via the use of a male/female power connector (not shown) that allows the GAE module to be easily replaced with another unit having different voltage transfer characteristics that mimic a different vacuum tube amplifier configuration. Thus, the system as depicted may be customized to a variety of vacuum tube amplifier designs as well as adjusted as needed to accommodate different speaker characteristics and/or auditorium acoustic characteristics.

As generally depicted in FIG. 73 (7300)-FIG. 96 (9600), the present invention may in many preferred embodiments be combined with speaker and cabinet to form an integrated system that is lightweight, highly durable, and rugged. Comparable vacuum tube amplifiers would generally require separate cabinetry and/or be significantly heavier than the exemplary invention embodiment depicted. As such, the lightweight portable nature of the present invention represents a significant improvement over the prior art. Additionally, utilization of solid-state electronics and the absence of output transformers provides for cooler operation and less heat generation when in use.

Exemplary Mechanical Spring Reverberator (MSR) (8900)-(10400)

Figure 89:
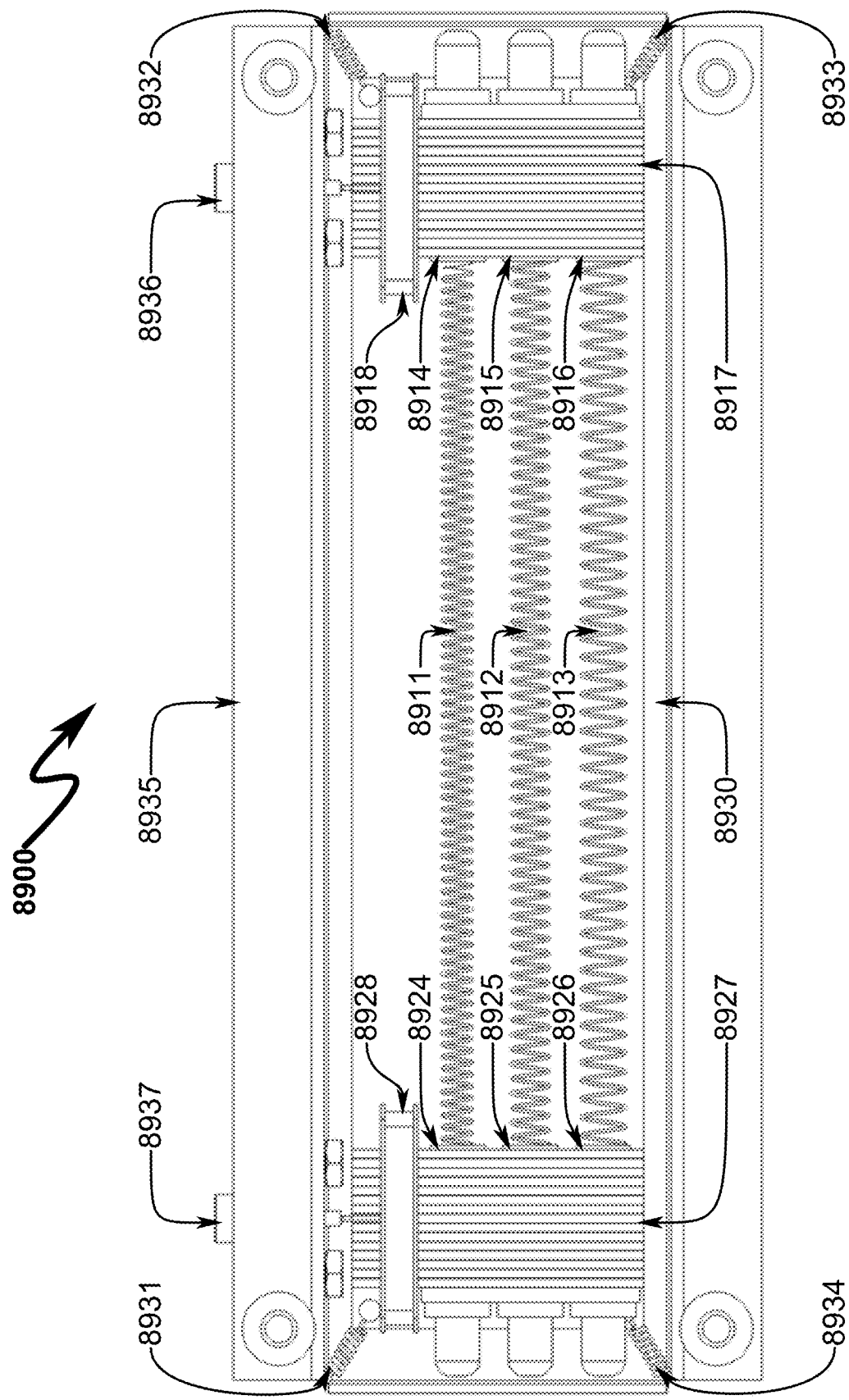
FIG. 89 illustrates a front view of an exemplary mechanical spring reverberator (MSR) useful in some preferred exemplary invention embodiments.
Figure 90:
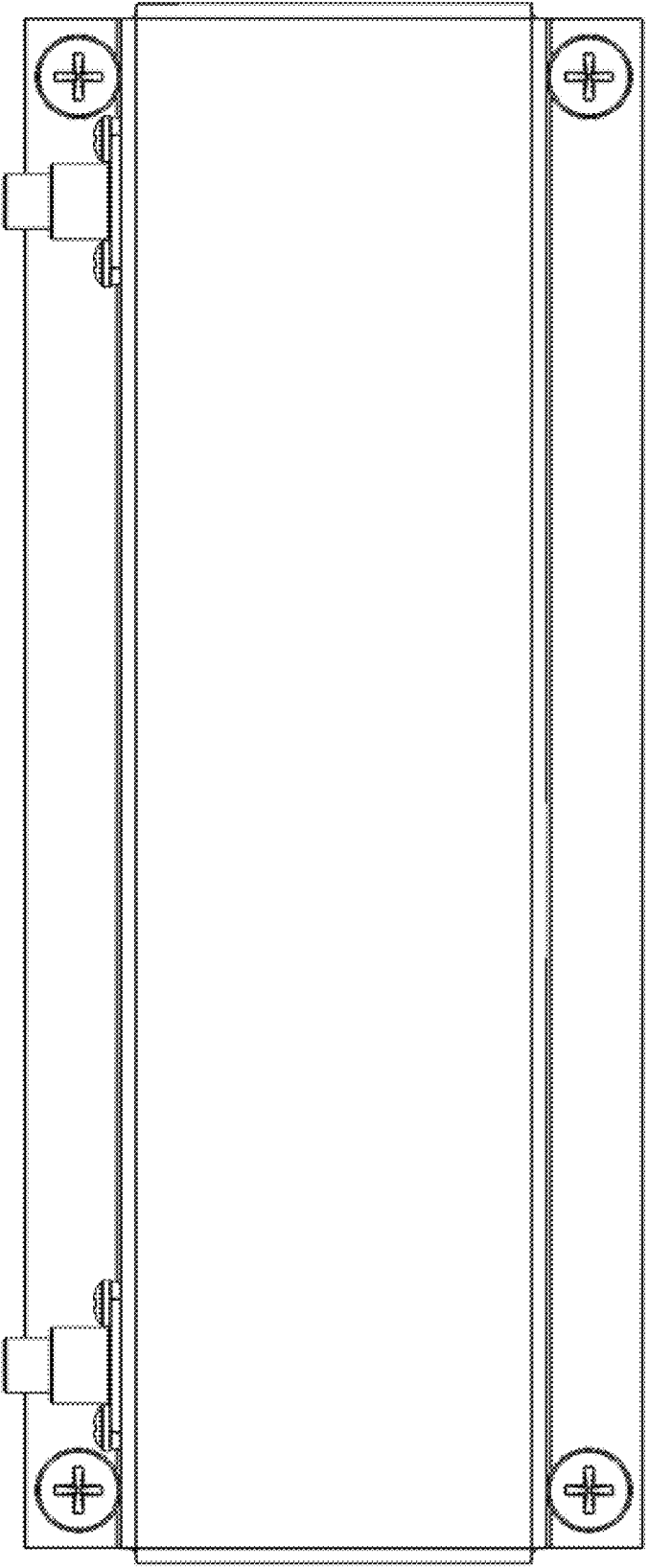
FIG. 90 illustrates a back view of an exemplary mechanical spring reverberator (MSR) useful in some preferred exemplary invention embodiments.
Figure 91:
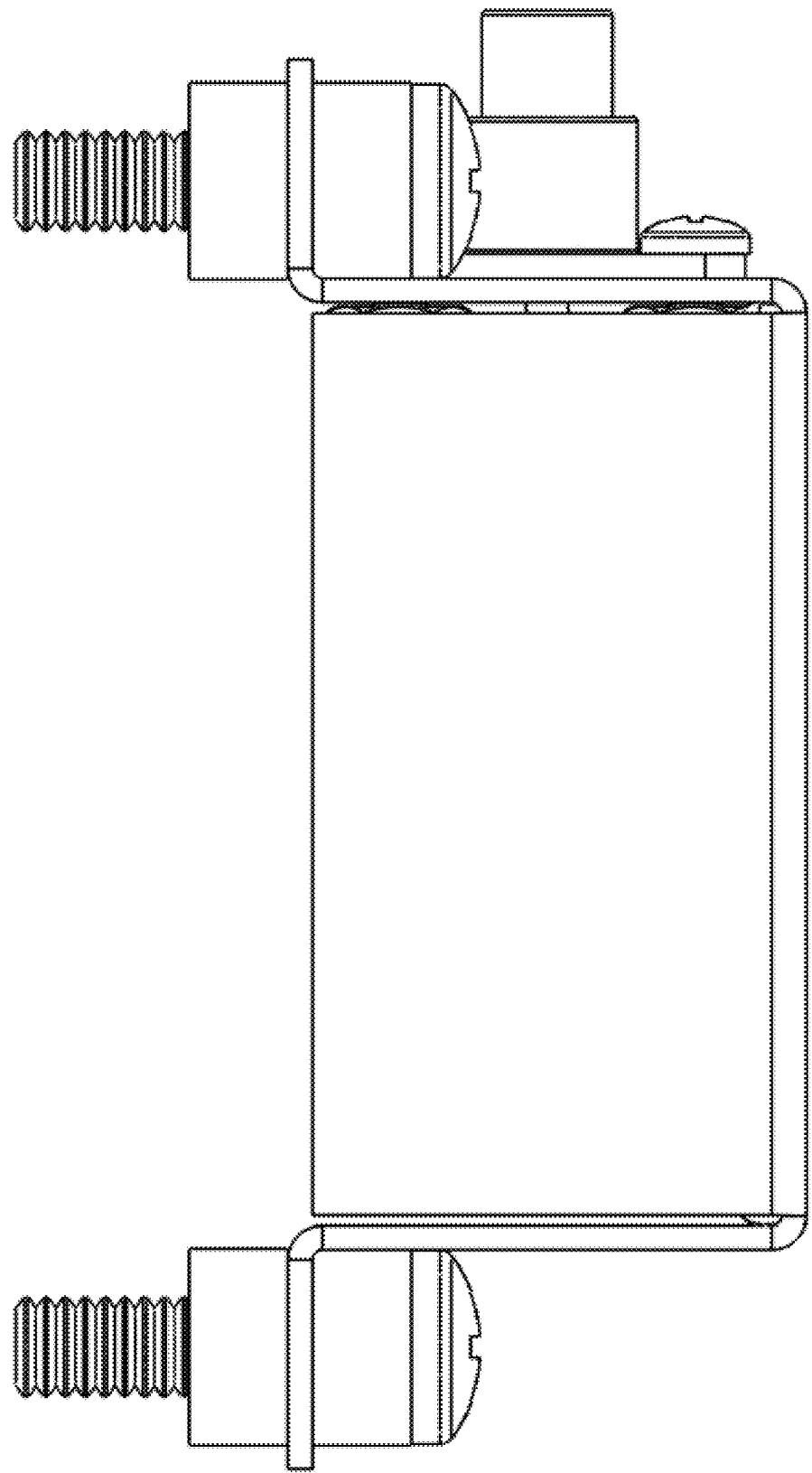
FIG. 91 illustrates a front view with enclosure removed of an exemplary mechanical spring reverberator (MSR) useful in some preferred exemplary invention embodiments.
Figure 92:
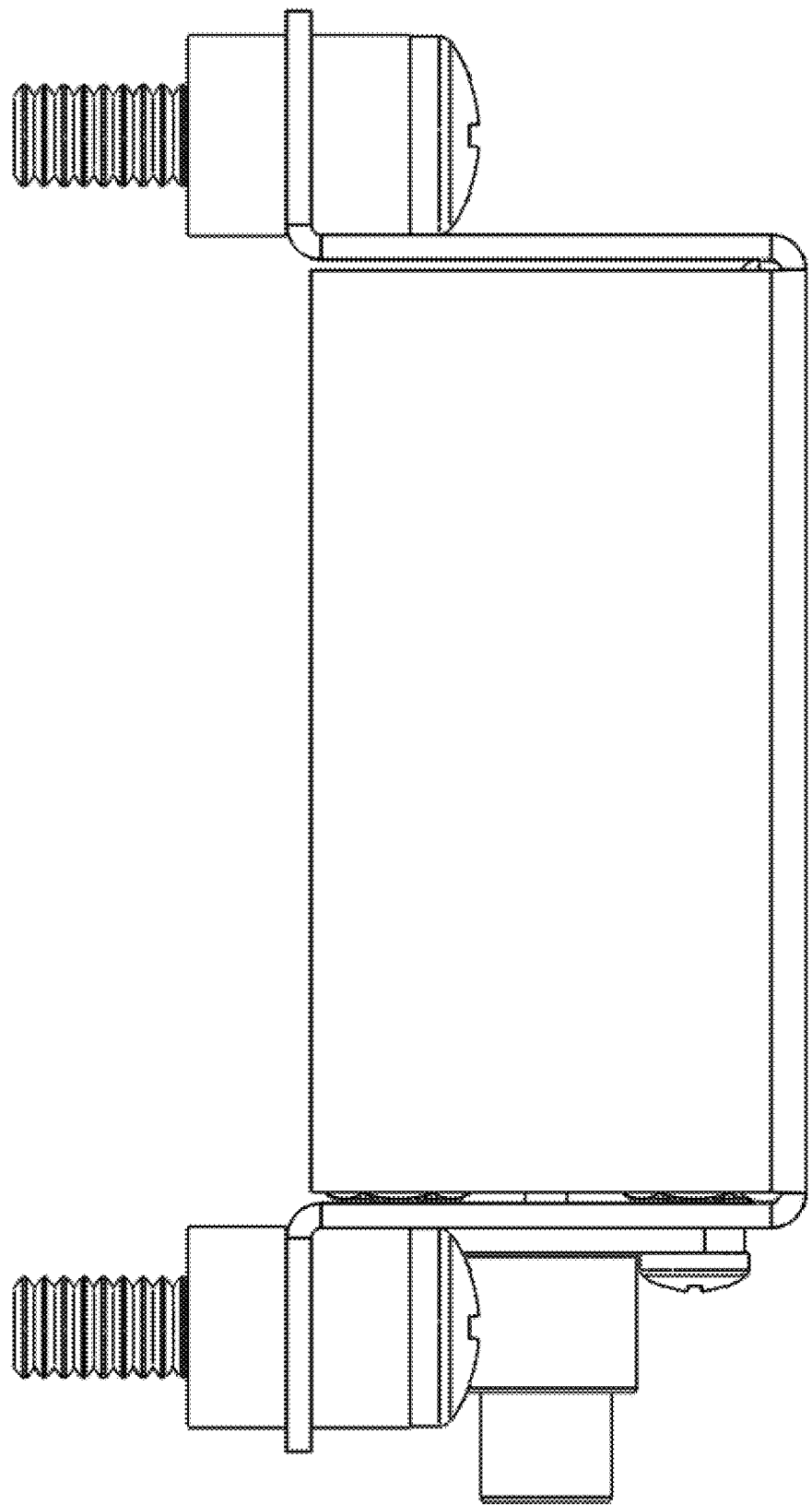
FIG. 92 illustrates a back view with enclosure removed of an exemplary mechanical spring reverberator (MSR) useful in some preferred exemplary invention embodiments.
Figure 93:
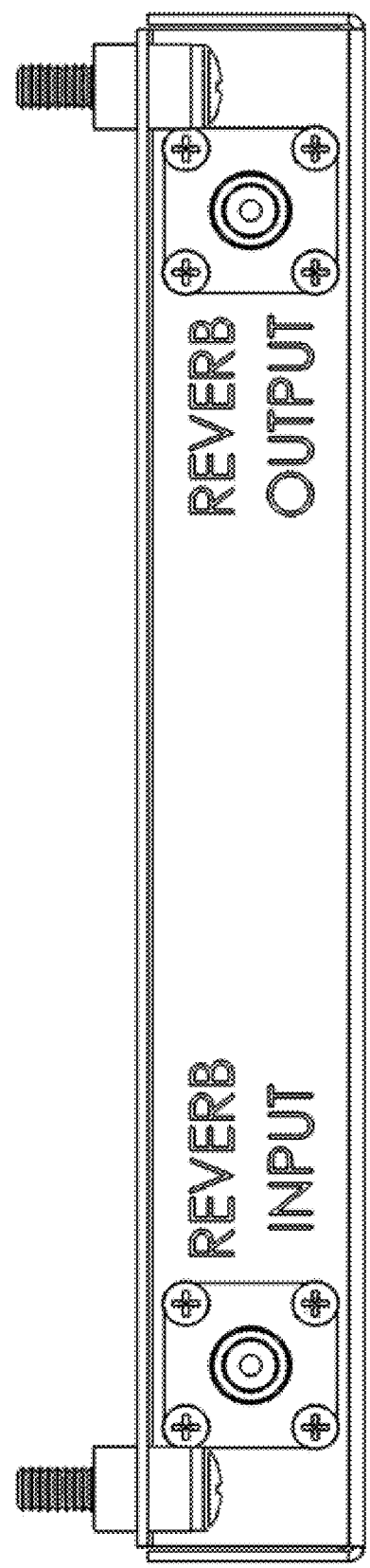
FIG. 93 illustrates a left side view of an exemplary mechanical spring reverberator (MSR) useful in some preferred exemplary invention embodiments.
Figure 94:
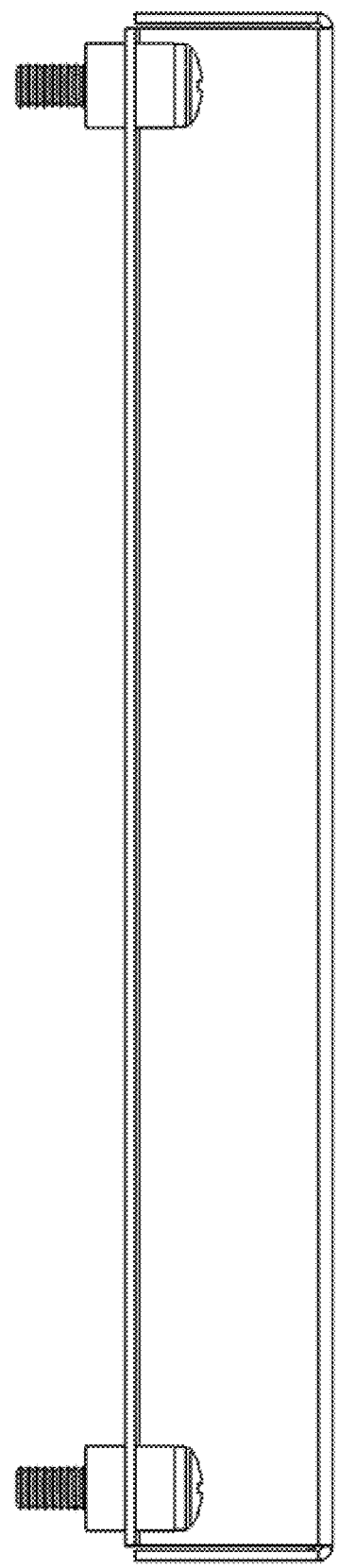
FIG. 94 illustrates a right side view of an exemplary mechanical spring reverberator (MSR) useful in some preferred exemplary invention embodiments.
Figure 95:
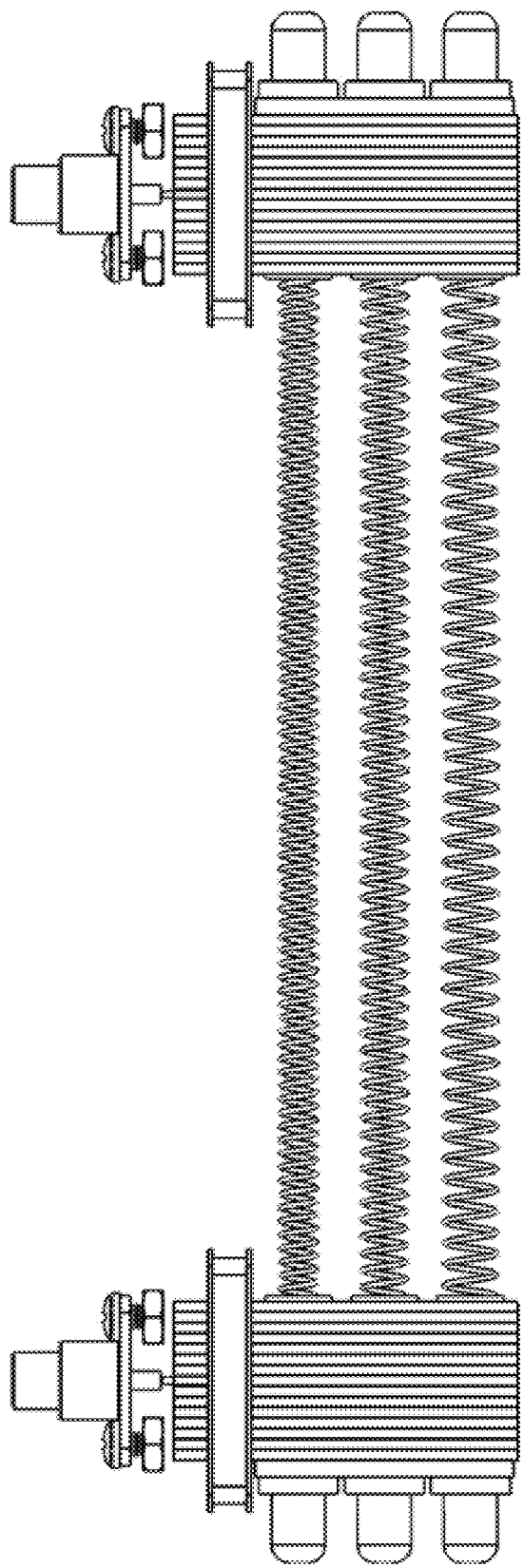
FIG. 95 illustrates a front internal view of an exemplary mechanical spring reverberator (MSR) useful in some preferred exemplary invention embodiments.
Figure 104:
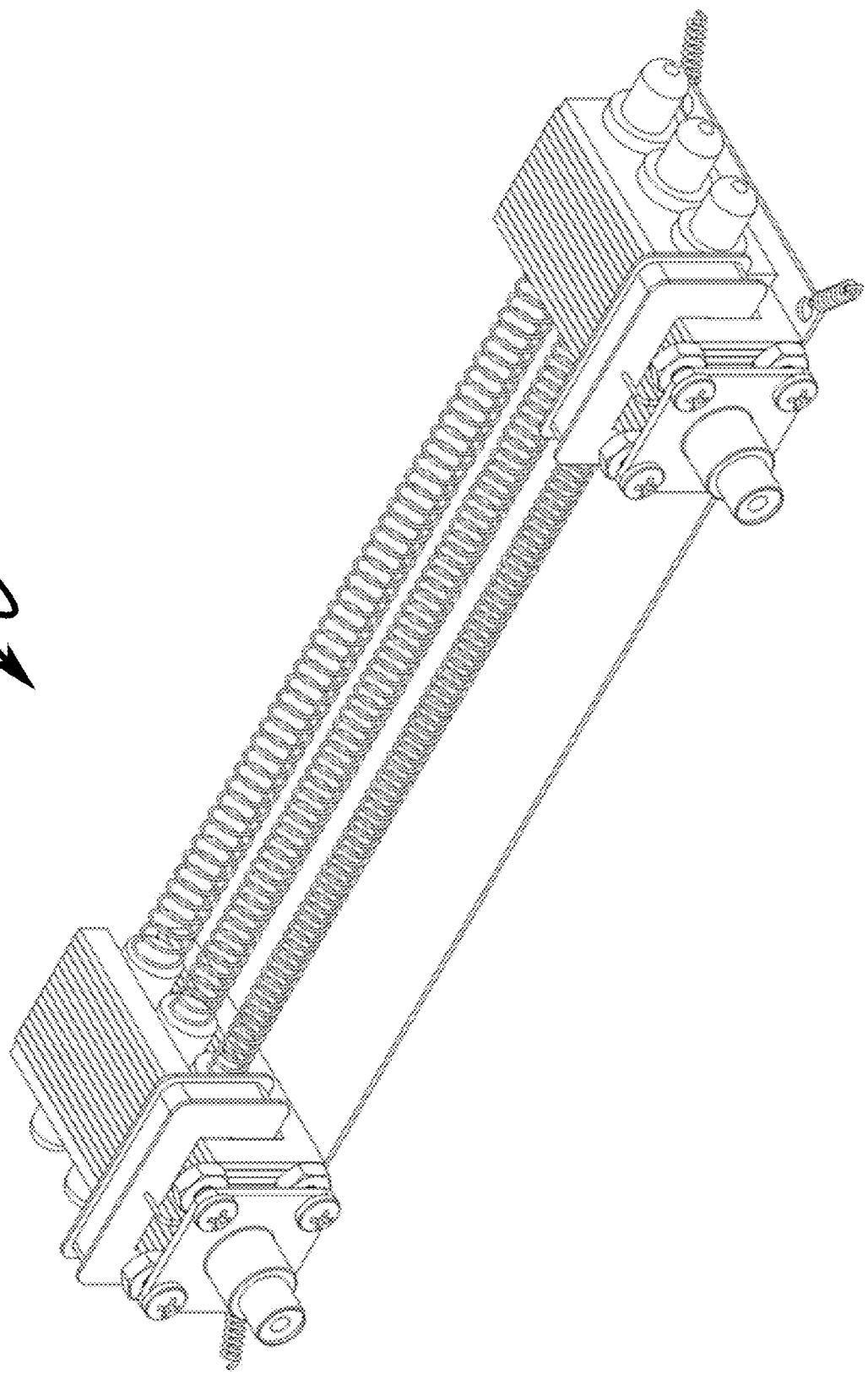
FIG. 104 illustrates a top left side front perspective internal view of an exemplary mechanical spring reverberator (MSR) useful in some preferred exemplary invention embodiments.

While many forms of mechanical spring reverberator (MSR) may be utilized in various invention embodiments, a typical unit is depicted in FIG. 89 (8900)-FIG. 104 (10400). The unit depicted has three reverberation coils (8911, 8912, 8913) each having an input magnet (8914, 8915, 8916) that are individually mechanically manipulated by a magnetic field created by a laminated input core (8917) via an excitation input coil (8918). Each reverberation coil (8911, 8912, 8913) is individually linked to an output magnet (8924, 8925, 8926) that induces a magnetic field individually within a laminated output core (8927) via an output excitation coil (8928). An isolation baseplate (8930) and isolation springs (8931, 8932, 8933, 8934) help mechanically isolate the reverberation coils (8911, 8912, 8913) from the overall MSR enclosure (8935). Electrical input (8936) and output (8937) connections are typically RCA style connectors or equivalent. One skilled in the art will recognize that the number of reverberation coils (8911, 8912, 8913), their size, tension, and specific construction may vary widely depending on application context.

Theory of Operation (10500)-(11200)

Background

A musical note has a fundamental pitch with harmonic overtones of higher frequencies. The note is changing in time with features known as attack, sustain, and decay. However, it is the repetitive frequency of pitch and its overtones of tone that is the basis of this analysis. A pure sine wave, sometimes likened to the pure sound of a flute, has little or no higher frequencies and is sometimes called a pure tone.

Jean-Baptiste Joseph Fourier (21 Mar. 1768-16 May 1830) was a French mathematician who discovered that any periodic waveform could be resolved into a series of pure sine waves of various amplitudes and phases of different, higher frequencies usually multiples of the fundamental. This analysis of complex tones is sometimes referred to as spectrum analysis. And the higher frequency components are known as harmonics.

When the waveform amplitude is sampled and digitized, this method is called the Discrete Fourier Transform (DFT) which is available in various software packages, including MICROSOFT® EXCEL®.

This description will compare the mathematical analysis of the vacuum push-pull output stage transfer to a simpler method of 'amplitude clip' used in some form in solid-state amplifiers. This will demonstrate the present invention circuit ability to create pleasing overtones similar to vacuum tube amplifiers.

Figure 105:
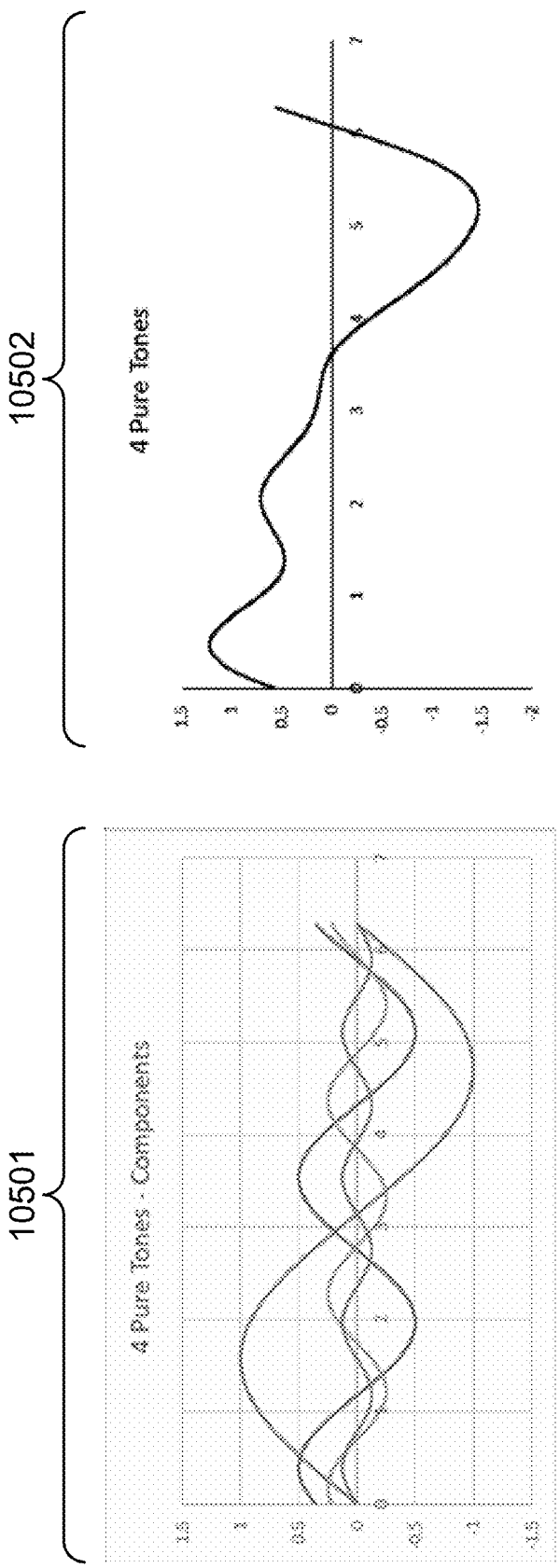
FIG. 105 illustrates graphs depicting individual spectral tones and a combined spectral tone.

The first graph depicted in FIG. 105 (10501) shows the four individual sine waves, pure tones that make up the test waveform. The second chart in FIG. 105 (10502) shows the sum of these four waveforms into one complex tone waveform.

Input/Output Transfer Function Transform

A pure amplifier will accept a given input voltage waveform and will make its amplitude larger or smaller by a given gain factor. A non-fixed gain amplifier will accept the same input waveform and make its output larger or smaller by a more complex linear function.

This can be graphed as an input versus output function sometimes called an input/output transform. When an audio waveform is processed by a non-constant gain input/output transform, the shape of the waveform will be changed, and in this manner the various harmonics which create the tone is changed.

It this creation of harmonics is done well, then the additional output frequencies are usually created only on the integer harmonics of the fundamental frequency and a pleasant, rich tone is created. If too many harmonics are created, and not a multiple of the fundamental, the new tone can be harsh and unpleasant.

This article will demonstrate the difference between different input/output transfer functions and will demonstrate that the present invention methodology is equivalent to vacuum tube amplifiers.

EXCEL Demonstration

The following is an EXCEL analysis of a complex waveform with a fundamental frequency and three harmonics, the first-harmonic is two times the frequency of the fundamental, the second-harmonic is three times, the third harmonic is four times.

Figure 106:
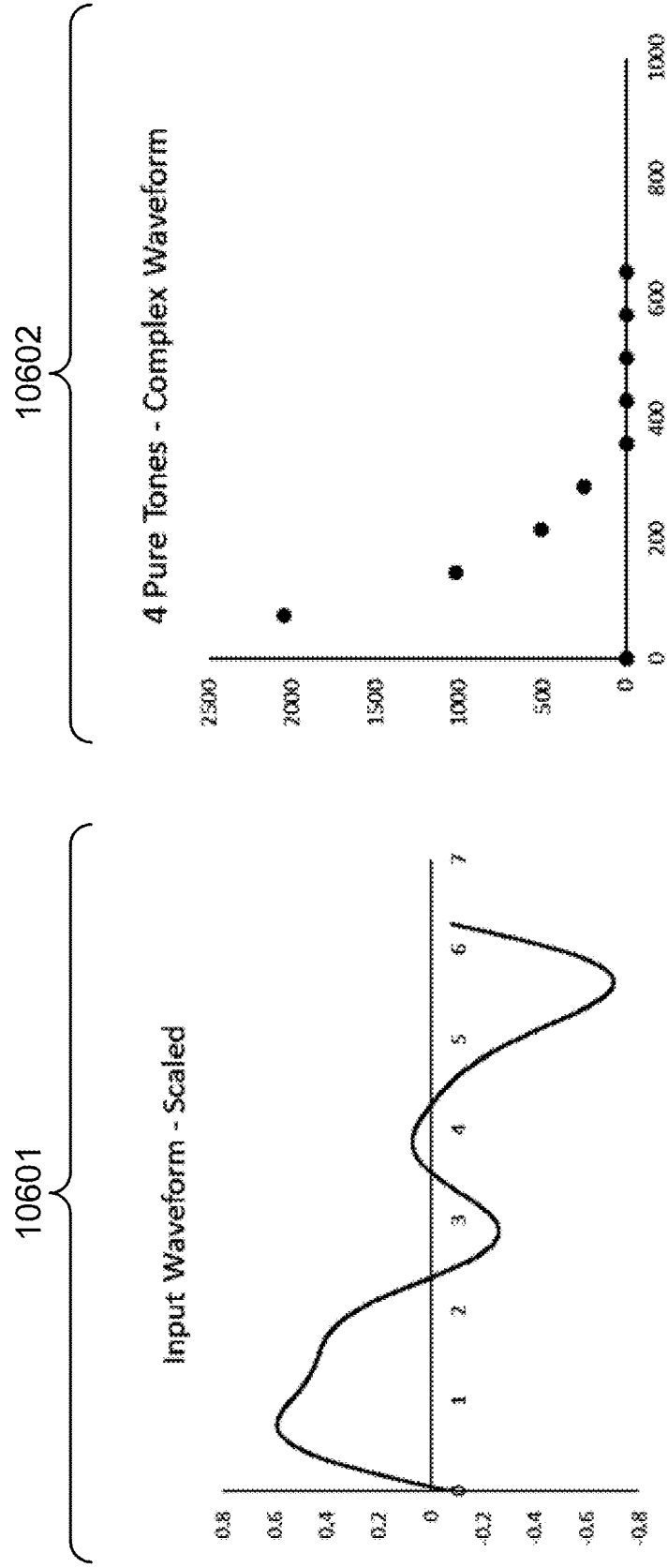
FIG. 106 illustrates graphs depicting an arbitrary signal waveform and its spectral components.

The graph in FIG. 106 (10601) shows the time-domain signal of the waveform tone, this signal was adjusted for amplitude, that is, the gain was reduced. The horizontal axis is an arbitrary scale which goes from 0 to 2*n. The graph depicted in FIG. 106 (10602) is the DFT of this waveform.

Again, the horizontal axis is an arbitrary frequency scale. Note that there is no DC component; that is, the amplitude of 'zero frequency' is zero. There are four components, the fundamental and three harmonics.

Two Input/Out Transforms

Two different will be evaluated here, the first is the third-order polynomial of this patent, representing the input/out transfer function of the classic vacuum tube push-pull output power stage, the other a simple clipping circuit.

Figure 107:
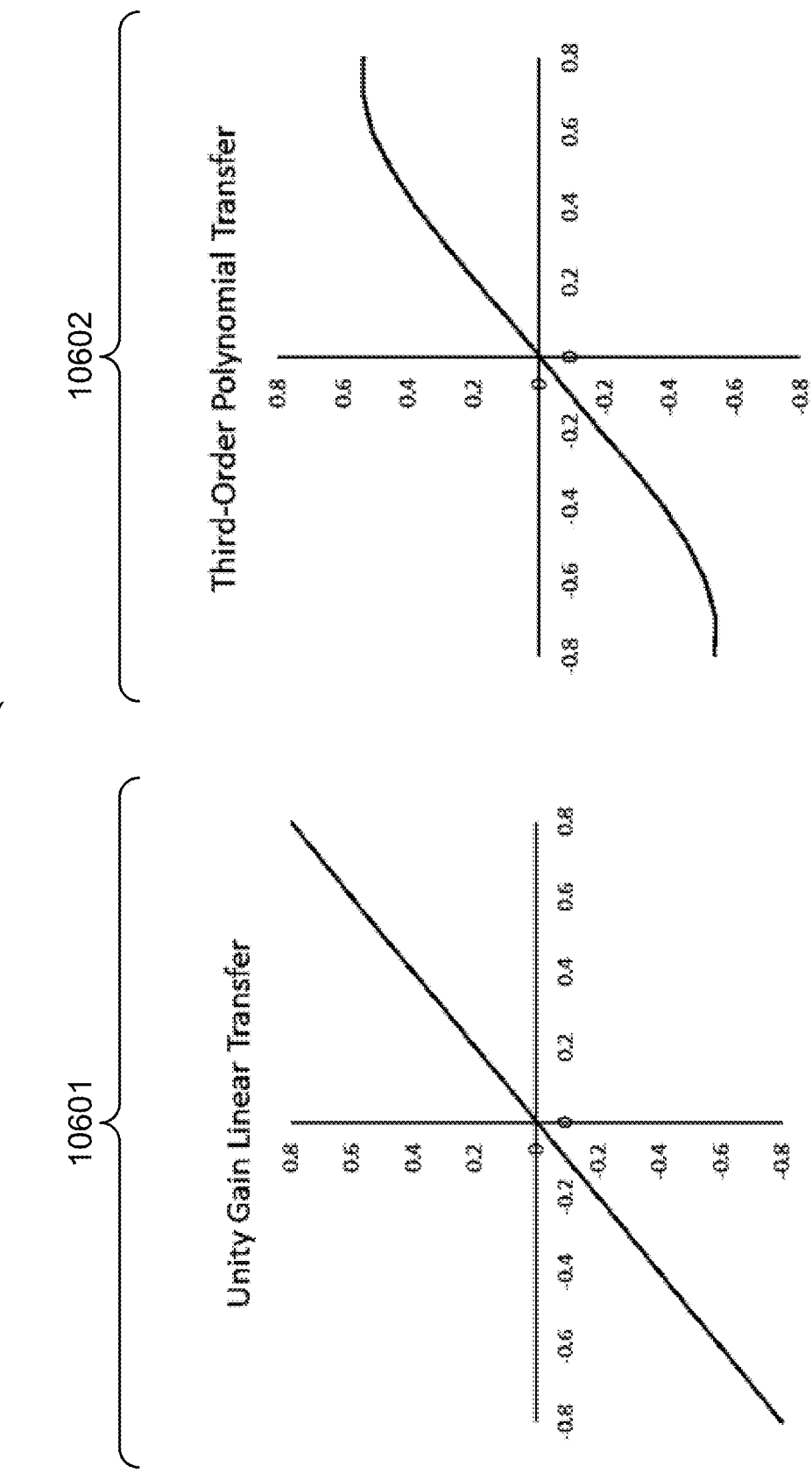
FIG. 107 illustrates graphs depicting a unity gain transfer function and a third order polynomial transfer function.
Figure 108:
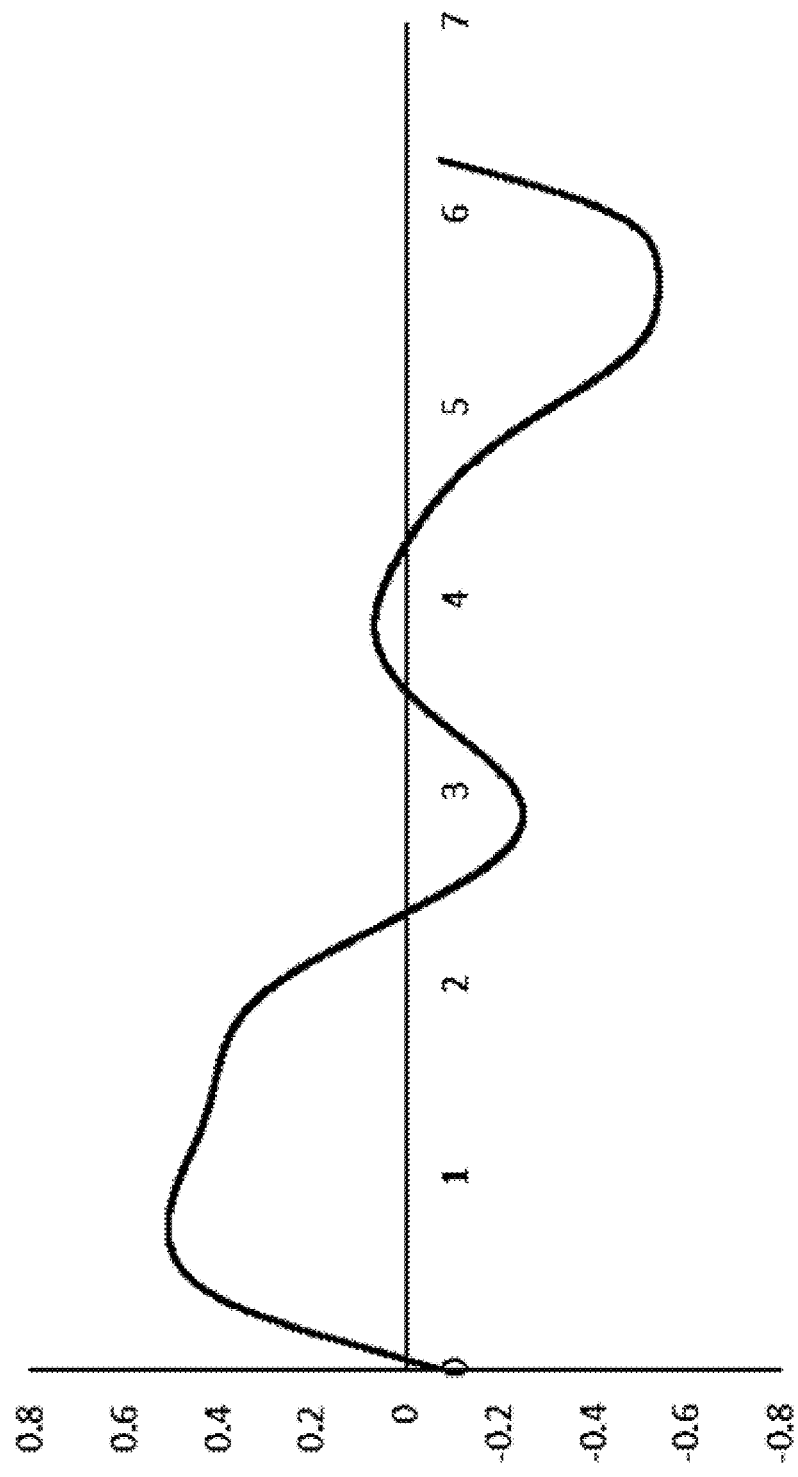
FIG. 108 illustrates a graph depicting a arbitrary signal waveform transformed by a third order polynomial transfer function.

The first transfer function is represented as a linear gain function, shown in FIG. 107 (10701). The output is simply the same as the input. Please note that the input is on the horizontal scale and the output is on the vertical scale. In contrast, the transfer function depicted in FIG. 107 (10702) is the third-order polynomial of the classic vacuum tube push-pull output power stage. Notice that the output voltage on the vertical scale is limited to approximately 0.5 Volts even as the input voltage goes over 0.8 Volts.

Figure 109:
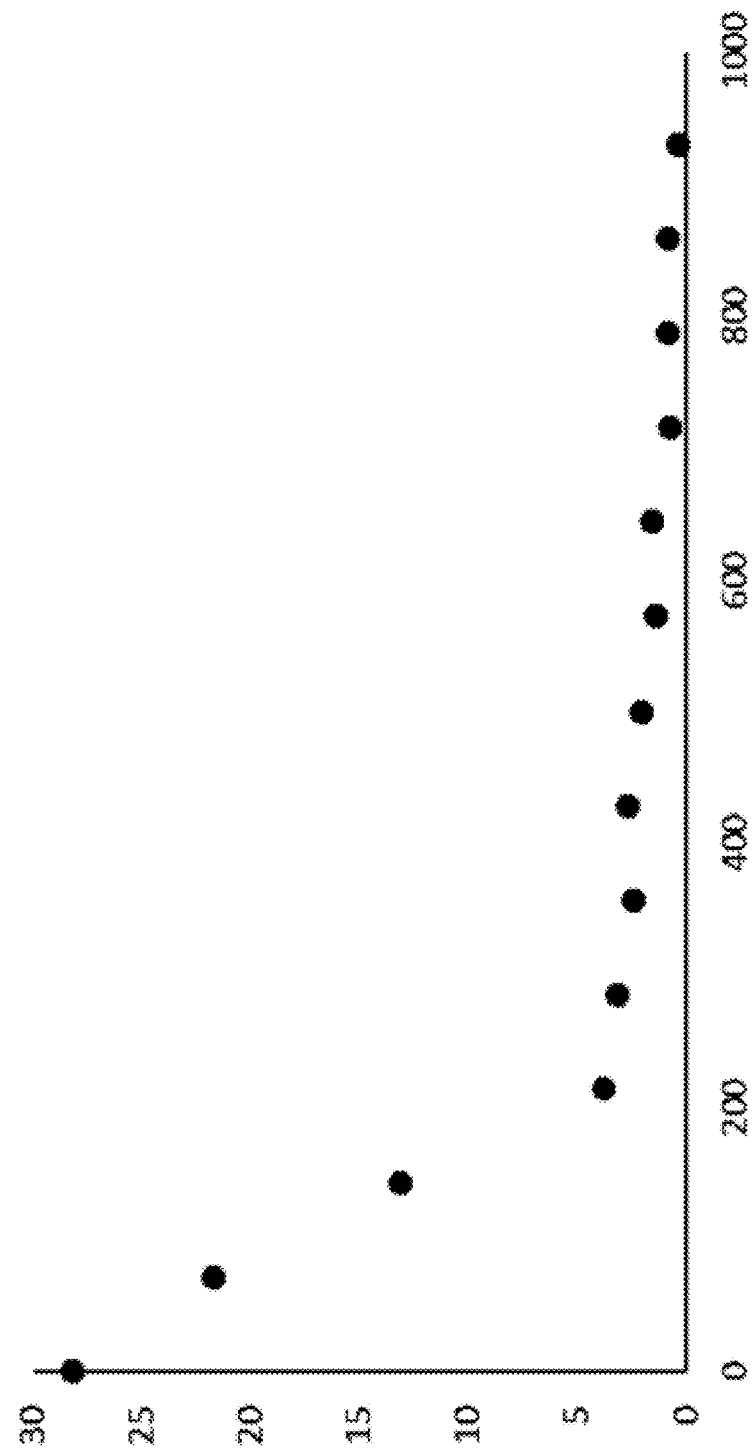
FIG. 109 illustrates a spectral graph depicting a arbitrary signal waveform transformed by a third order polynomial transfer function.

The graph depicted in FIG. 109 (10900) shows the output of this transfer function, applied with the composite waveform as the input. Please observe closely the results of this transform. First, notice that the peak amplitude of this signal is lowered, and the peaks have been gently rounded. However, the small 'bumps' near zero volts remain largely unchanged. This brings out the higher frequency components in the overall sound FIG. 109 (10900) depicts the Frequency Analysis, or Spectrum Analysis of this waveform. There are several things to note about this spectrum. First is that there is now a DC offset to the signal. Further advanced analysis of actual guitar pickup signals will show a small, shifting DC offset as the phase of the harmonics shift with respect to the fundamental. Next, notice that the amplitude on the vertical axis is greatly reduced. However, it is clear from the time domain waveform that the signal has not greatly changed in 'size'. Further, there are now frequency components which extend up to higher frequencies. This is the representation of accentuating the higher frequency components of the input signal. There is a shifting of the power of the frequency response to the higher frequencies.

Figure 110:
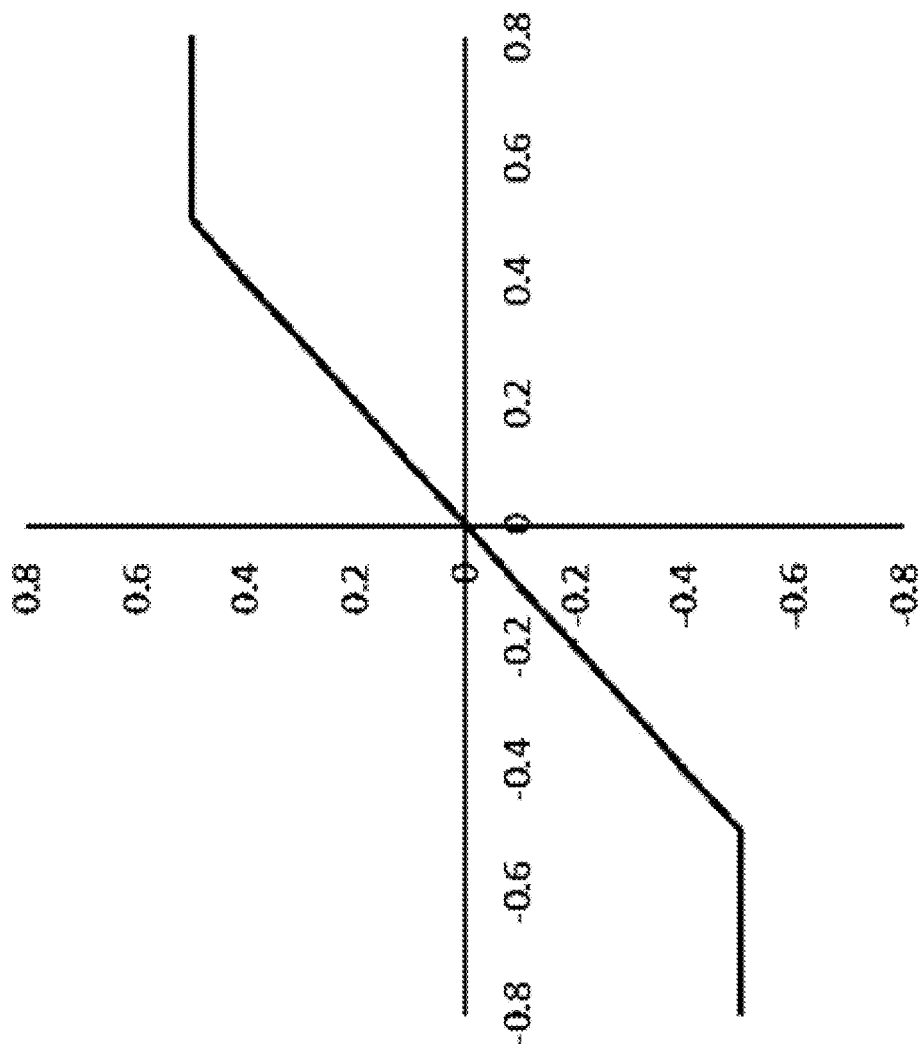
FIG. 110 illustrates a graph depicting a simple clip transfer function.

FIG. 110 (11000) depicts a transfer function termed a hard clip. That is, below a given clip voltage, the output voltage is the same as the input voltage, and above that input voltage, the output remains at the clip voltage, in this case 0.5 Volts. This is used in some well-known distortion boxes by many guitarists. The distortion is very strong in these configurations. This is an exaggeration or idealization of the effect which is generated in the power stage of solid-state amplifiers that predominate the prior art.

Figure 111:
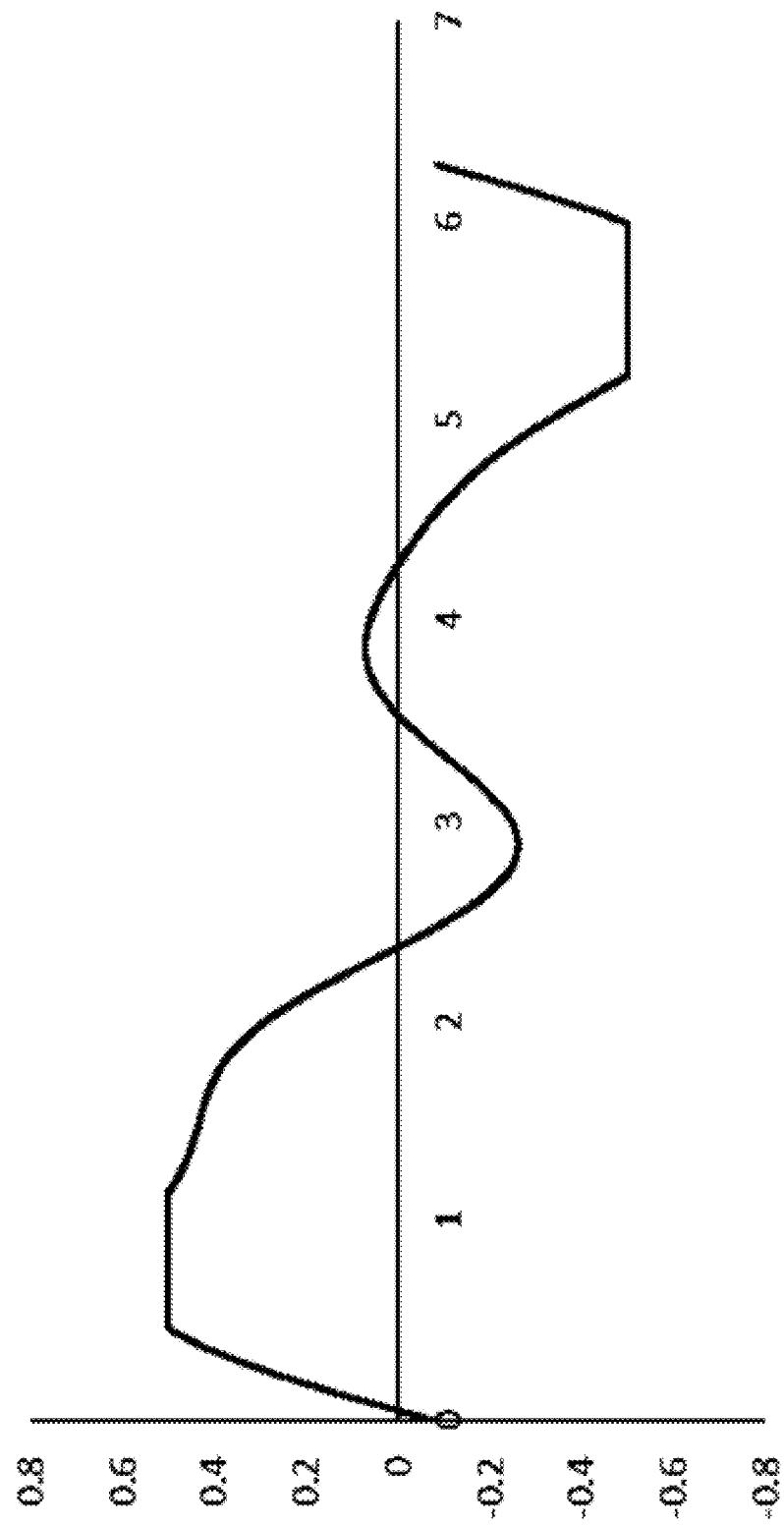
FIG. 111 illustrates a signal waveform transformed by a simple clipping transfer function.
Figure 112:
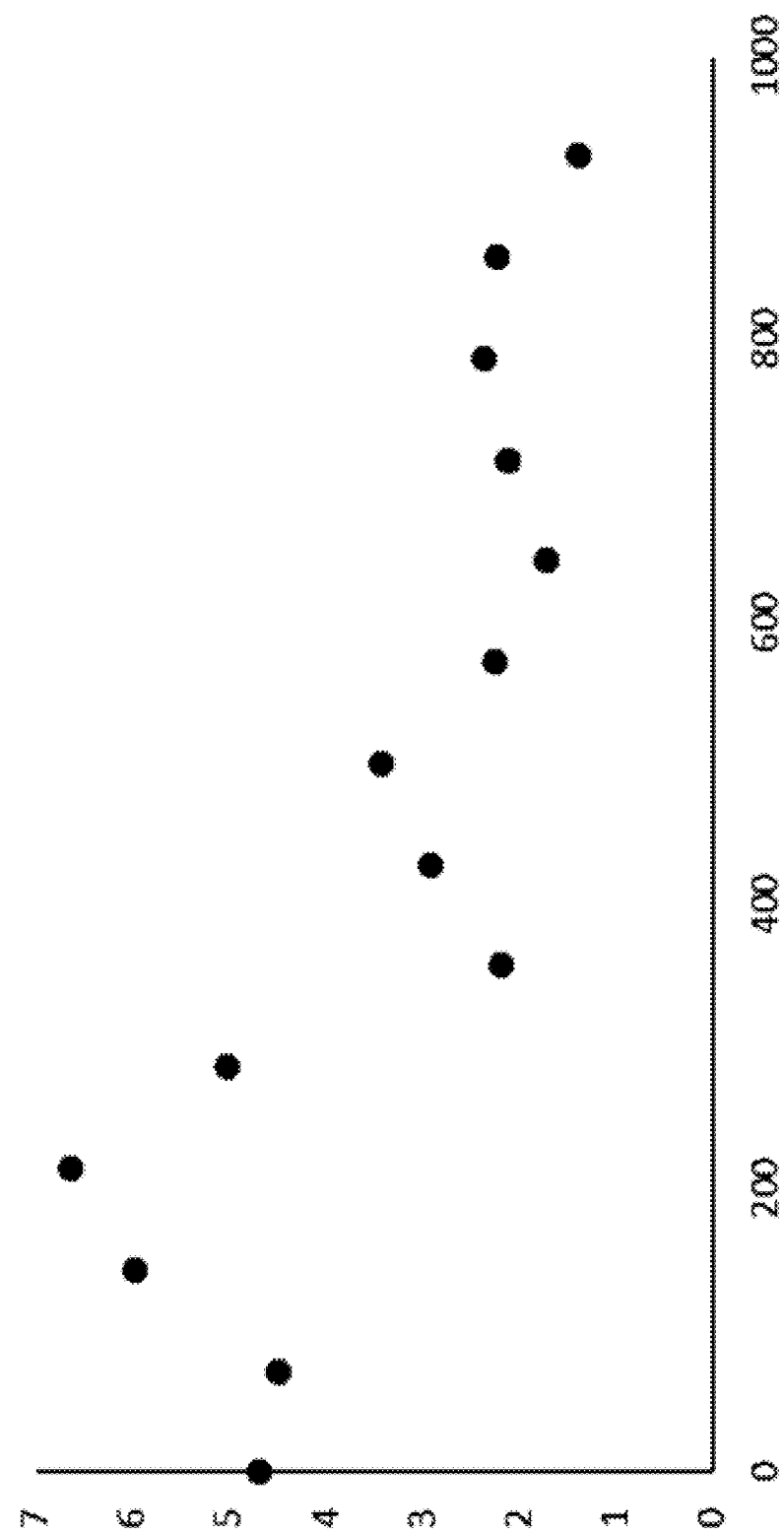
FIG. 112 illustrates a spectral graph of a signal waveform transformed by a simple clipping transfer function.

FIG. 111 (11100) depicts the output waveform of this transfer function on the same input waveform. Again, the peak voltages are lower than in the input waveform, but sharp edges are created at the clip voltage. The rule is that sharp edges require high frequencies: a square wave has a tremendous amount of high frequency content. FIG. 112 (11200) depicts the frequency content or spectrum of this waveform. Note the dramatic increase of harmonic content. The actual note of the signal is indistinguishable next to the harmonics. This is referred to as 'muddy'. Notice also that the harmonics are not related by octaves to the input fundamental frequency. This results in the note as having an indistinguishable, or unrecognizable note.

System Summary

The present invention system may be broadly generalized as a system comprising:
(a) input audio preamplifier (IAP);
(b) wave shape transformer (WST);
(c) pick attack sag compressor (PAC);
(d) audio volume control (AVC); and
(e) speaker power amplifier (SPA);
wherein:
the IAP, WST, PAC, and SPA comprise solid-state semiconductor components;
the IAP is configured to receive guitar audio signaling (GAS) from a guitar audio pickup (GAP);
the IAP is configured to pre-amplify the GAS under control of asymmetric gain control (AGC) solid-state semiconductor circuitry and generate a pre-amplified signal (PAS);
the WST is configured to process the PAS using a piecewise/diodes breakpoints (PDB) transform in conjunction with an offset bias determined by a breakpoint threshold control (BTC) to produce a wave-shaped signal (WSS);
the PAC is configured to peak compress the WSS based on time constants provided by a positive sag control (PSC) and negative sag control (NSC) to produce a peak-compressed signal (PSC); and
the SPA is configured to amplify the PSC based on gain information determined by the AVC and producing a speaker power output (SPO) that is applied to an audio speaker output (ASO).

This general system summary may be augmented by the various elements described herein to produce a wide variety of invention embodiments consistent with this overall design description.

Method Summary

The present invention method may be broadly generalized as a method comprising:
(1) with an input audio preamplifier (IAP), receiving guitar audio signaling (GAS) from a guitar audio pickup (GAP);
(2) with the IAP, pre-amplifying the GAS under control of asymmetric gain control (AGC) solid-state semiconductor circuitry and generate a pre-amplified signal (PAS);
(3) with a wave shape transformer (WST), processing the PAS using a piecewise/diodes breakpoints (PDB) transform in conjunction with an overall transfer function breakpoint shift determined by a breakpoint threshold control (BTC) to produce a wave-shaped signal (WSS);
(4) with a pick attack sag compressor (PAC), peak compressing the WSS based on time constants provided by a positive sag control (PSC) and negative sag control (NSC) to produce a peak-compressed signal (PSC) modulated by a signal waveform level;
(5) with a speaker power amplifier (SPA), amplifying the PSC based on gain information determined by an audio volume control (AVC) and producing a speaker power output (SPO); and
(6) applying the SPO to an audio speaker output (ASO);
wherein:
the IAP, WST, PAC, and SPA comprise solid-state semiconductor components.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

System/Method Variations

The present invention anticipates a wide variety of variations in the basic theme of construction. The examples presented previously do not represent the entire scope of possible usages. They are meant to cite a few of the almost limitless possibilities.

This basic system, method, and product-by-process may be augmented with a variety of ancillary embodiments, including but not limited to:

An embodiment wherein the PDB transform implements a vacuum tube voltage-current (V-I) characteristic.

An embodiment wherein the PDB transform implements a vacuum tube voltage-current (V-I) characteristic, the vacuum tube voltage-current (V-I) characteristic selected from a group consisting of: 12AX7; ECC83; 12AT7; 12AU7; EL34; EL84; 6L6; 6V6; and 5881.

An embodiment wherein the PDB transform implements a vacuum tube voltage-current (V-I) characteristic using a plurality of linear approximation regions.

An embodiment wherein the PDB transform implements a vacuum tube voltage-current (V-I) characteristic using at least five approximation regions.

An embodiment wherein the SPA comprises a power amplifier selected from a group consisting of: TEXAS INSTRUMENTS INCORPORATED model LM3886 audio power amplifier; and STMICROELECTRONICS NV model TDA7293 audio power amplifier.

An embodiment wherein the IAP comprises manual audio tonal controls for bass, middle, treble, and brightness.

An embodiment wherein the PSC comprises a manual adjustment control.

An embodiment wherein the NSC comprises a manual adjustment control.

An embodiment wherein the PSC and the NSC each comprise a manual adjustment control.

An embodiment wherein the PAC comprises a manual reverberation control.

An embodiment wherein the PAC comprises a spring reverberation control (SRC), said SRC comprising: dry level control (DLC); mechanical reverberation chain (MRC) comprising spring drive electronics (SDE), mechanical spring reverberator (MSR), spring recovery electronics (SRE), and wet level control (WLC); and a wet/dry mixing amplifier (WDM).

One skilled in the art will recognize that other embodiments are possible based on combinations of elements taught within the above invention description.

CONCLUSION

A solid-state semiconductor guitar amplifier system/method mimicking the audio performance characteristics of conventional vacuum tube guitar amplifiers has been disclosed. The disclosed system/method incorporates solid-state semiconductor circuitry implementing an input audio preamplifier (IAP) having asymmetric gain control (AGC) that feeds wave shape transformer (WST) circuitry implementing a piecewise/diode breakpoint (PDB) transform that emulates a conventional vacuum tube voltage-current transfer (VIT) characteristic. A breakpoint threshold controller (BTC) determines the offset associated with application of the PDB operation to the audio signal. Once the PDB transform has been applied to the audio signal, it is further processed by pick attack sag compressor (PAC) circuitry that applies positive sag control (PSC) and negative sag control (NSC) compression envelopes to the overall signal shape before presenting the resulting peak compressed signal through an audio volume control (AVC) and conventional solid-state semiconductor speaker power amplifier (SPA) for application to an audio speaker.

CLAIMS INTERPRETATION

The following rules apply when interpreting the CLAIMS of the present invention:

The CLAIM PREAMBLE should be considered as limiting the scope of the claimed invention.

"WHEREIN" clauses should be considered as limiting the scope of the claimed invention.

"WHEREBY" clauses should be considered as limiting the scope of the claimed invention.

"ADAPTED TO" clauses should be considered as limiting the scope of the claimed invention.

"ADAPTED FOR" clauses should be considered as limiting the scope of the claimed invention.

The term "MEANS" specifically invokes the means-plus-function claims limitation recited in 35 U.S.C. § 112(f) and such claim shall be construed to cover the corresponding structure, material, or acts described in the specification and equivalents thereof.

The phrase "MEANS FOR" specifically invokes the means-plus-function claims limitation recited in 35 U.S.C. § 112(f) and such claim shall be construed to cover the corresponding structure, material, or acts described in the specification and equivalents thereof.

The phrase "STEP FOR" specifically invokes the step-plus-function claims limitation recited in 35 U.S.C. § 112(f) and such claim shall be construed to cover the corresponding structure, material, or acts described in the specification and equivalents thereof.

The step-plus-function claims limitation recited in 35 U.S.C. § 112(f) shall be construed to cover the corresponding structure, material, or acts described in the specification and equivalents thereof ONLY for such claims including the phrases "MEANS FOR", "MEANS", or "STEP FOR".

The phrase "AND/OR" in the context of an expression "X and/or Y" should be interpreted to define the set of "(X and Y)" in union with the set "(X or Y)" as interpreted by Ex Parte Gross (USPTO Patent Trial and Appeal Board, Appeal 2011-004811, Ser. No. 11/565,411, ("'and/or' covers embodiments having element A alone, B alone, or elements A and B taken together").

The claims presented herein are to be interpreted in light of the specification and drawings presented herein with sufficiently narrow scope such as to not preempt any abstract idea.

The claims presented herein are to be interpreted in light of the specification and drawings presented herein with sufficiently narrow scope such as to not preclude every application of any idea.

The claims presented herein are to be interpreted in light of the specification and drawings presented herein with sufficiently narrow scope such as to preclude any basic mental process that could be performed entirely in the human mind.

The claims presented herein are to be interpreted in light of the specification and drawings presented herein with sufficiently narrow scope such as to preclude any process that could be performed entirely by human manual effort.

What is claimed is:

1. A guitar amplifier system comprising:
(a) input audio preamplifier (IAP);
(b) wave shape transformer (WST);
(c) pick attack sag compressor (PAC);
(d) audio volume control (AVC); and
(e) speaker power amplifier (SPA);
wherein:
said TAP, WST, PAC, and SPA comprise solid-state semiconductor components;
said IAP is configured to receive guitar audio signaling (GAS) from a guitar audio pickup (GAP);
said IAP is configured to pre-amplify said GAS under control of asymmetric gain control (AGC) solid-state semiconductor circuitry and generate a pre-amplified signal (PAS);
said WST is configured to process said PAS using a piecewise/diodes breakpoints (PDB) transform in conjunction with an offset bias determined by a breakpoint threshold control (BTC) to produce a wave-shaped signal (WSS);
said PAC is configured to peak compress said WSS based on time constants provided by a positive sag control (PSC) and negative sag control (NSC) to produce a peak-compressed signal (PSC); and said SPA is configured to amplify said PSC based on gain information determined by said AVC and producing a speaker power output (SPO) that is applied to an audio speaker output (ASO).

2. The guitar amplifier system of claim 1 wherein said PDB transform implements a vacuum tube voltage-current (V-I) characteristic.

3. The guitar amplifier system of claim 1 wherein said PDB transform implements a vacuum tube voltage-current (V-I) characteristic, said vacuum tube voltage-current (V-I) characteristic selected from a group consisting of: 12AX7; ECC83; 12AT7; 12AU7; EL34; EL84; 6L6; 6V6; and 5881.

4. The guitar amplifier system of claim 1 wherein said PDB transform implements a vacuum tube voltage-current (V-I) characteristic using a plurality of linear approximation regions.

5. The guitar amplifier system of claim 1 wherein said PDB transform implements a vacuum tube voltage-current (V-I) characteristic using at least five approximation regions.

6. The guitar amplifier system of claim 1 wherein said SPA comprises a power amplifier selected from a group consisting of: TEXAS INSTRUMENTS INCORPORATED model LM3886 audio power amplifier; and STMICROELECTRONICS NV model TDA7293 audio power amplifier.

7. The guitar amplifier system of claim 1 wherein said IAP comprises manual audio tonal controls for bass, middle, treble, and brightness.

8. The guitar amplifier system of claim 1 wherein said PSC and said NSC each comprise a manual adjustment control.

9. The guitar amplifier system of claim 1 wherein said PAC comprises a manual reverberation control.

10. The guitar amplifier system of claim 1 wherein said PAC comprises a spring reverberation control (SRC), said SRC comprising: dry level control (DLC); mechanical reverberation chain (MRC) comprising spring drive electronics (SDE), mechanical spring reverberator (MSR), spring recovery electronics (SRE), and wet level control (WLC); and a wet/dry mixing amplifier (WDM).

11. A guitar amplifier method comprising:
(1) with an input audio preamplifier (IAP), receiving guitar audio signaling (GAS) from a guitar audio pickup (GAP);
(2) with said IAP, pre-amplifying said GAS under control of asymmetric gain control (AGC) solid-state semiconductor circuitry and generate a pre-amplified signal (PAS);
(3) with a wave shape transformer (WST), processing said PAS using a piecewise/diodes breakpoints (PDB) transform in conjunction with an overall transfer function breakpoint shift determined by a breakpoint threshold control (BTC) to produce a wave-shaped signal (WSS);
(4) with a pick attack sag compressor (PAC), peak compressing said WSS based on time constants provided by a positive sag control (PSC) and negative sag control (NSC) to produce a peak-compressed signal (PSC) modulated by a signal waveform level;
(5) with a speaker power amplifier (SPA), amplifying said PSC based on gain information determined by an audio volume control (AVC) and producing a speaker power output (SPO); and
(6) applying said SPO to an audio speaker output (ASO); wherein:
said IAP, WST, PAC, and SPA comprise solid-state semiconductor components.

12. The guitar amplifier method of claim 11 wherein said PDB transform implements a vacuum tube voltage-current (V-I) characteristic.

13. The guitar amplifier method of claim 11 wherein said PDB transform implements a vacuum tube voltage-current (V-I) characteristic, said vacuum tube voltage-current (V-I) characteristic selected from a group consisting of: 12AX7; ECC83; 12AT7; 12AU7; EL34; EL84; 6L6; 6V6; and 5881.

14. The guitar amplifier method of claim 11 wherein said PDB transform implements a vacuum tube voltage-current (V-I) characteristic using a plurality of linear approximation regions.

15. The guitar amplifier method of claim 11 wherein said PDB transform implements a vacuum tube voltage-current (V-I) characteristic using at least five approximation regions.

16. The guitar amplifier method of claim 11 wherein said SPA comprises a power amplifier selected from a group consisting of: TEXAS INSTRUMENTS INCORPORATED model LM3886 audio power amplifier; and STMICROELECTRONICS NV model TDA7293 audio power amplifier.

17. The guitar amplifier method of claim 11 wherein said IAP comprises manual audio tonal controls for bass, middle, treble, and brightness.

18. The guitar amplifier method of claim 11 wherein said PSC and said NSC each comprise a manual adjustment control.

19. The guitar amplifier method of claim 11 wherein said PAC comprises a manual reverberation control.

20. The guitar amplifier method of claim 11 wherein said PAC comprises a spring reverberation control (SRC), said SRC comprising: dry level control (DLC); mechanical reverberation chain (MRC) comprising spring drive electronics (SDE), mechanical spring reverberator (MSR), spring recovery electronics (SRE), and wet level control (WLC); and a wet/dry mixing amplifier (WDM).

* * * * *